US010790195B2

(12) United States Patent
Chang et al.

(10) Patent No.: US 10,790,195 B2
(45) Date of Patent: Sep. 29, 2020

(54) ELONGATED PATTERN AND FORMATION THEREOF

(71) Applicant: TAIWAN SEMICONDUCTOR MANUFACTURING CO., LTD., Hsinchu (TW)

(72) Inventors: Po-Chin Chang, Taichung (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/285,052

(22) Filed: Feb. 25, 2019

(65) Prior Publication Data

US 2020/0043795 A1 Feb. 6, 2020

Related U.S. Application Data

(60) Provisional application No. 62/712,830, filed on Jul. 31, 2018.

(51) Int. Cl.
*H01L 21/8234* (2006.01)
*H01L 21/3213* (2006.01)
(Continued)

(52) U.S. Cl.
CPC ................ *H01L 21/823431* (2013.01); *H01L 21/02263* (2013.01); *H01L 21/3213* (2013.01);
(Continued)

(58) Field of Classification Search
CPC ....... H01L 21/823431; H01L 21/02263; H01L 21/3213; H01L 21/76802; H01L 21/823475; H01L 23/5226; H01L 29/7851
(Continued)

(56) References Cited

U.S. PATENT DOCUMENTS 9,105,490 B2 8/2015 Wang et al.
9,165,764 B2 * 10/2015 Inoue ............... H01J 37/32192
(Continued)

OTHER PUBLICATIONS

Ruffel, Simon and Renau, Anthony, "Directed ribbon-beam capability for novel etching applications", Jounral of Vacuum Science and Technology B, Nontechnology and Microelectronics: Materials, Processing, Measurement, and Phenomena 33, Sep. 30, 2015.

*Primary Examiner* — Tu-Tu V Ho
(74) *Attorney, Agent, or Firm* — Maschoff Brennan

(57) ABSTRACT

A method includes following steps. A semiconductor fin is formed on a substrate and extends in a first direction. A source/drain region is formed on the semiconductor fin and a first interlayer dielectric (ILD) layer over the source/drain region. A gate stack is formed across the semiconductor fin and extends in a second direction substantially perpendicular to the first direction. A patterned mask having a first opening is formed over the first ILD layer. A protective layer is formed in the first opening using a deposition process having a faster deposition rate in the first direction than in the second direction. After forming the protective layer, the first opening is elongated in the second direction. A second opening is formed in the first ILD layer and under the elongated first opening. A conductive material is formed in the second opening.

20 Claims, 105 Drawing Sheets

(51) Int. Cl.

| | |
|---|---|
| ***H01L 21/02*** | (2006.01) |
| ***H01L 21/768*** | (2006.01) |
| ***H01L 29/78*** | (2006.01) |
| ***H01L 23/522*** | (2006.01) |

(52) U.S. Cl.
CPC .................. *H01L 21/76802* (2013.01); *H01L 21/823475* (2013.01); *H01L 23/5226* (2013.01); *H01L 29/7851* (2013.01)

(58) Field of Classification Search
USPC .......................................................... 257/401
See application file for complete search history.

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |

* cited by examiner

M1

WA

WA

WA

WA

WA

WA

WA

WA

WA2

WA2

WA2

WA2

WA2

WA2

WA2

WA2

WA2

WA2

WA2

WA2

WA3

WA3

WA3

WA3

WA4

WA4

WA4

WA4

WA4

WA4

WA4

WA4

WA4

WA4

WA4

ELONGATED PATTERN AND FORMATION THEREOF

PRIORITY CLAIM AND CROSS-REFERENCE

This application claims priority to U.S. Provisional Application Ser. No. 62/712,830, filed Jul. 31, 2018, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
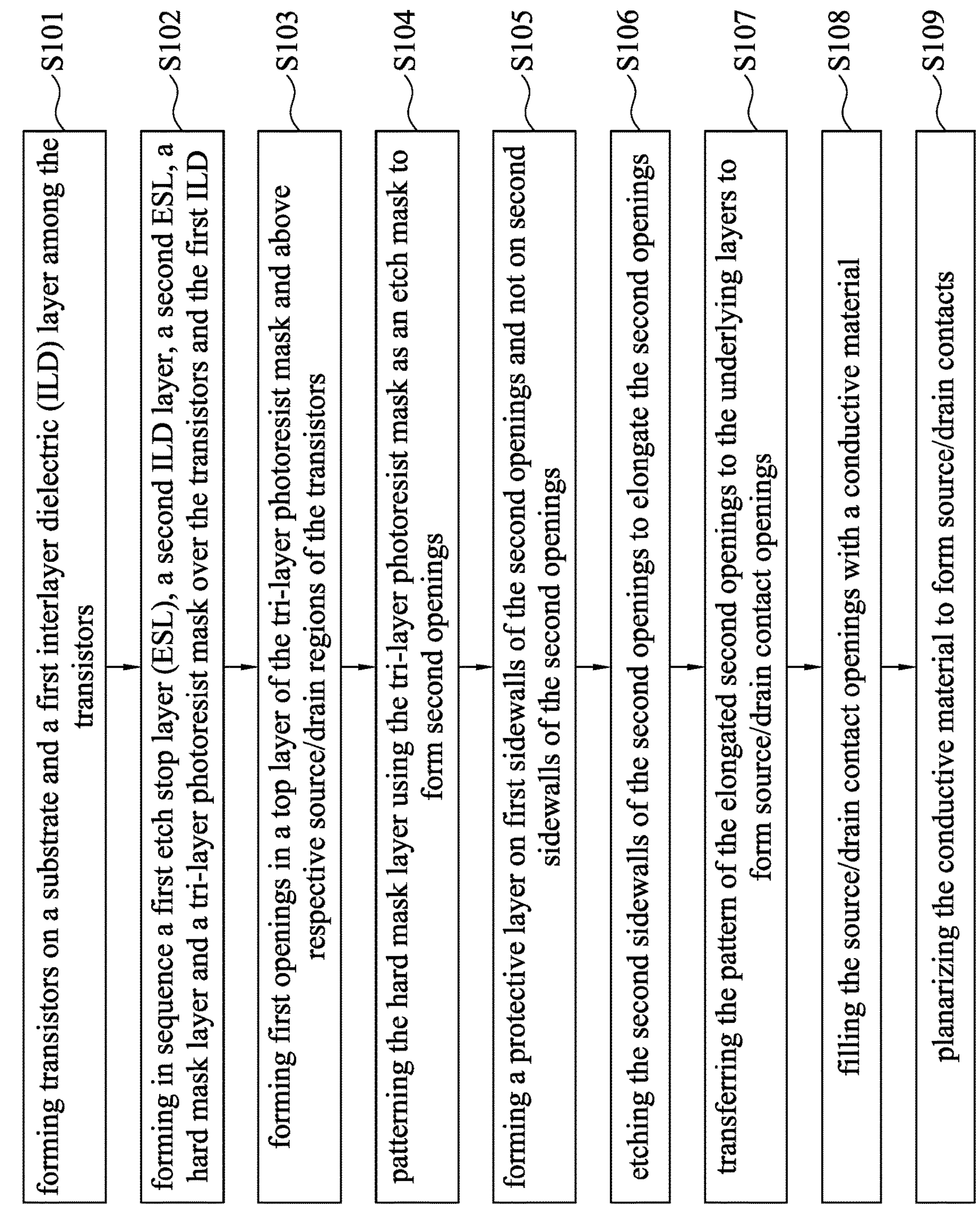
FIG. 1 is a flow chart of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins of FinFETs as discussed below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Illustrated in FIG. 1 is a method M1 of forming a semiconductor device in accordance with some embodiments of the present disclosure. FIGS. 2A-10C illustrate various processes at various stages of the method M1 of FIG. 1 in accordance with some embodiments of the present disclosure. Throughout the various views and illustrative embodiments, like reference numbers are used to designate like elements. In FIGS. 2A-3C, the "A" figures (e.g., FIGS. 2A and 3A) illustrate a perspective view, the "B" figures (e.g., FIGS. 2B and 3B) illustrate a cross-sectional view along X-direction corresponding the lines B-B illustrated in the "A" figures, and the "C" figures (e.g., FIGS. 2C and 3C) illustrate a cross-sectional view along Y-direction corresponding the lines C-C illustrated in the "A" figures. In FIGS. 4A-10C, the "A" figures (e.g., FIGS. 4A, 5A, etc.) illustrate a top view, the "B" figures (e.g., FIGS. 4B and 5B) illustrate a cross-sectional view along X-direction corresponding the lines B-B illustrated in the "A" figures, and the "C" figures (e.g., FIGS. 4C and 5C) illustrate a cross-sectional view along Y-direction corresponding the lines C-C illustrated in the "A" figures. It is understood that additional operations can be provided before, during, and after the processes shown by FIGS. 2A-10C, and some of the operations described below can be replaced or eliminated, for additional embodiments of the method. The order of the operations/processes may be interchangeable.

Figure 2A:
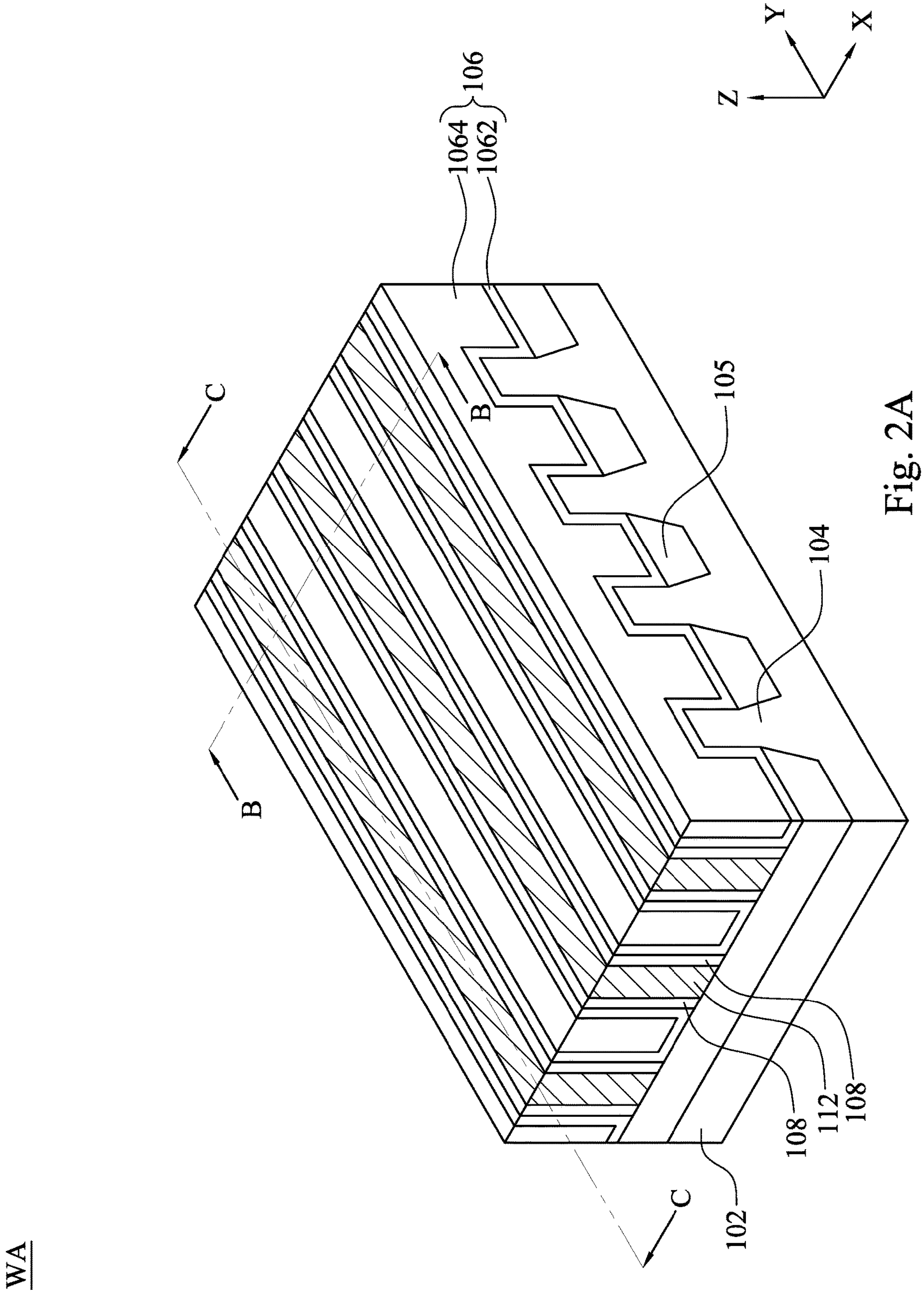
FIGS. 2A and 3A illustrate a perspective view of a semiconductor device at various stages of the method of FIG. 1 in accordance with some embodiments of the present disclosure.
Figure 2B:
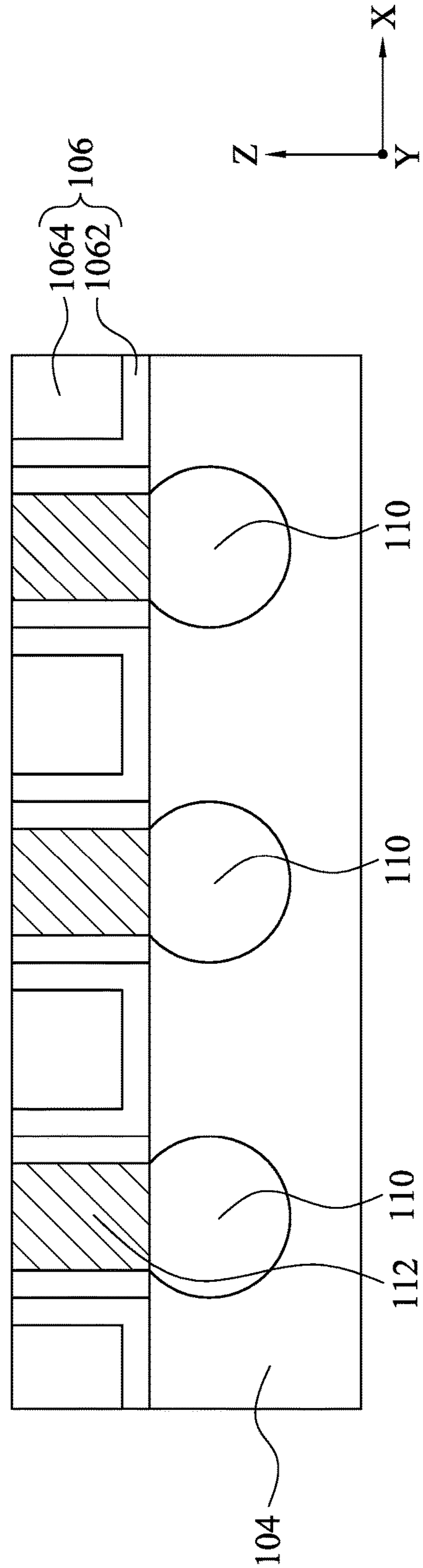
FIGS. 2B, 3B, 4B, 5B, 6B, 7B, 8B, 9B and 10B illustrate a cross-sectional view of a semiconductor device at various stages of the method of FIG. 1 in accordance with some embodiments of the present disclosure.
Figure 2C:
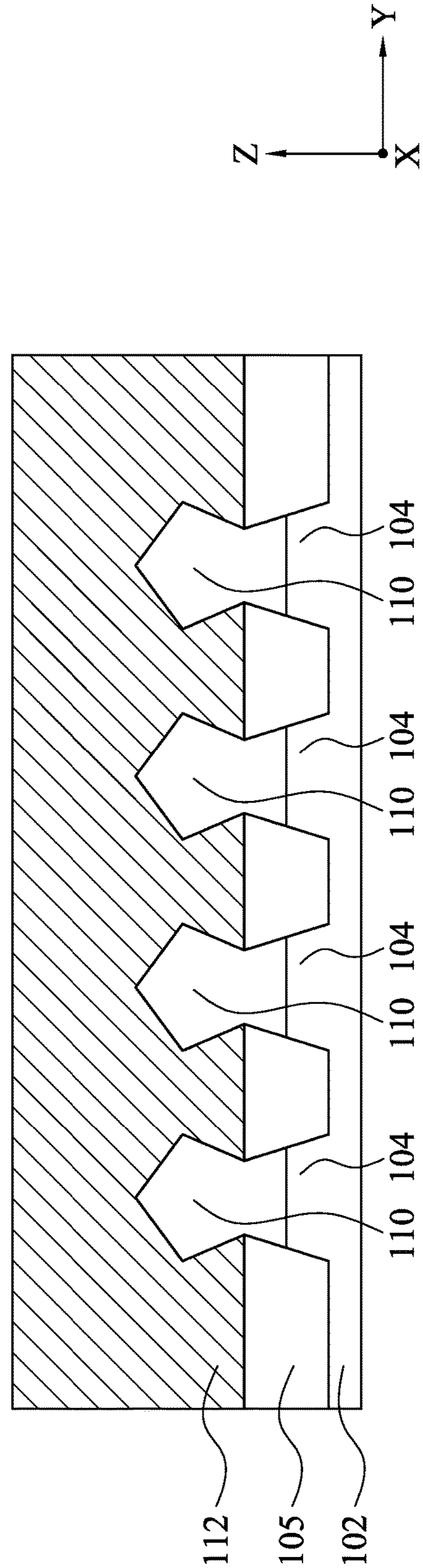
FIGS. 2C, 3C, 4C, 5C, 6C, 7C, 8C, 9C and 10C illustrate another cross-sectional view of a semiconductor device at various stages of the method of FIG. 1 in accordance with some embodiments of the present disclosure.

In operation S101 of the method M1, transistors (e.g., FinFETs) and a first interlayer dielectric (ILD) layer are formed on a substrate. For example, as shown in FIGS. 2A-2C, there is shown a semiconductor wafer WA having a substrate 102 formed with one or more semiconductor fins 104 and one or more gate stacks 106. It is understood that four semiconductor fins are illustrated for purposes of illustration, but other embodiments may include any number of semiconductor fins. The semiconductor fins 104 extend in the X-direction and protrude from the substrate 102 in the Z direction, while the gate stacks 106 extend in the Y-direction. The gate stacks 106 extend across the semiconductor fins 104, thus forming FinFETs on the substrate 102.

The substrate 102 may comprise various doped regions. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 102 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 102 may include an epitaxial layer (epi-layer), which may be strained for performance enhancement, and/or may include a silicon-on-insulator (SOI) structure.

The semiconductor fins 104 may be formed using, for example, a patterning process to form trenches in the substrate 102 such that a trench is formed between adjacent semiconductor fins 104. Isolation regions, such as shallow trench isolations (STI) 105, are disposed in the trenches over the substrate 102. The isolation region can be equivalently referred to as an isolation insulating layer in some embodiments. The isolation insulating layer 105 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 105 is formed through a process such as chemical vapor deposition (CVD), flowable CVD (FCVD), or a spin-on-glass process, although any acceptable process may be utilized. Subsequently, portions of the isolation insulating layer 105 extending over the top surfaces of the semiconductor fins 104, are removed using, for example, an etch back process, chemical mechanical polishing (CMP), or the like.

In some embodiments, the isolation insulating layer 105 is recessed to expose upper portions of the semiconductor fins 104 as illustrated in FIGS. 2A-2C. In some embodiments, the isolation insulating layer 105 is recessed using a single etch processes, or multiple etch processes. In some embodiments in which the isolation insulating layer 105 is made of silicon oxide, the etch process may be, for example, a dry etch, a chemical etch, or a wet cleaning process. For example, the chemical etch may employ fluorine-containing chemical such as dilute hydrofluoric (dHF) acid.

After the semiconductor fins 104 are formed, dummy gate structures (e.g., polysilicon gate structures) are formed across the semiconductor fins 104 and will be replaced with the gate stacks 106 as described below in greater detail. After forming the dummy gate structures, gate spacers 108 are formed alongside sidewalls of the dummy gate structures. Next, source/drain regions 110 are formed in the semiconductor fins 104. Formation of the source/drain regions 110 includes, for example, recessing portions of the semiconductor fins 104 uncovered by the dummy gate structures and the gate spacers 108 using suitable etching techniques, and epitaxially growing source/drain regions 110 from the recessed portions of the semiconductor fins 104.

In some embodiments, recessing the semiconductor fins 104 may include a dry etching process, a wet etching process, or combination dry and wet etching processes. This etching process may include reactive ion etch (RIE) using the dummy gate structures and gate spacers 108 as masks, or by any other suitable removal process. After the etching process, a pre-cleaning process may be performed to clean the recesses in the semiconductor fins 104 with hydrofluoric acid (HF) or other suitable solution in some embodiments.

In some embodiments, the source/drain regions 110 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 104. In some embodiments, lattice constants of the source/drain region 110 are different from that of the semiconductor fins 104, so that the channel region between the source/drain regions 110 can be strained or stressed by the source/drain regions 110 to improve carrier mobility of the semiconductor device and enhance the device performance.

The epitaxy process of forming the source/drain regions 110 includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 104 (e.g., silicon, silicon germanium, silicon phosphate, or the like). The epitaxial source/drain regions 110 may be in-situ doped. The doping species include p-type dopants, such as boron or $BF_2$; n-type dopants, such as phosphorus or arsenic; and/or other suitable dopants including combinations thereof. If the epitaxial source/drain regions 110 are not in-situ doped, an implantation process is performed to dope the epitaxial source/drain regions 110. One or more annealing processes may be performed to activate the epitaxial source/drain regions 110. The annealing processes include rapid thermal annealing (RTA) and/or laser annealing processes.

After formation of the source/drain regions 110, a first ILD layer 112 is formed over the source/drain regions 110, the dummy gate structures and the gate spacers 108, and a CMP process is then performed to remove excessive material of the first ILD layer 112 to expose the dummy gate structures. In some embodiments, the first ILD layer 112 includes silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD layer 112 may be formed using, for example, CVD, ALD, spin-on-glass (SOG) or other suitable techniques. In some embodiments, a contact etch stop layer (CESL) is optionally formed over the source/drain regions 110 prior to forming the first ILD layer 112, and the first ILD layer 112 is then formed over the CESL. The CESL has a different material than the first ILD layer 112. By way of example, the CESL includes silicon nitride, silicon oxynitride or other suitable materials. The CESL can be formed using, for example, plasma enhanced CVD, low pressure CVD, ALD or other suitable techniques.

Thereafter, the dummy gate structures are replaced with the gate stacks 106. The gate replacement process includes, for example, removing the dummy gate structures to form gate trenches between gate spacers 108, and forming gate stacks 106 in the gate trenches. An exemplary method of forming the gate stacks 106 may include blanket forming a gate dielectric layer 1062 over the wafer WA, forming one or more metal layers 1064 over the blanket gate dielectric layer 1062, and performing a CMP process to remove excessive materials of the one or more metal layers 1064 and the gate dielectric layer 1062 outside the gate trenches. As a result of the gate replacement process, each gate stack 106 includes a gate dielectric layer 1062 and one or more metal layers 1064 wrapped around by the gate dielectric layer 1062.

In some embodiments, the gate dielectric layer 1062 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 1062 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta2O5), yttrium oxide (Y2O3), strontium titanium oxide (SrTiO3, STO), barium titanium oxide (BaTiO3, BTO), barium zirconium oxide (BaZrO), hafnium lanthanum oxide (HfLaO), lanthanum silicon oxide (LaSiO), aluminum silicon oxide (AlSiO), aluminum oxide (Al2O3), silicon nitride (Si3N4), oxynitrides (SiON), and combinations thereof. In alternative embodiments, the gate dielectric layer 1062 may have a multilayer structure such as one layer of silicon oxide (e.g., interfacial layer) and another layer of high-k material.

In some embodiments, the metal layer 1064 is a multilayer structure including one or more work function metal layers and a fill metal wrapped around by the one or more work function metal layers. The one or more work function metal layers may include one or more n-type work function metals and/or one or more p-type work function metals. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The fill metal may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 3A:
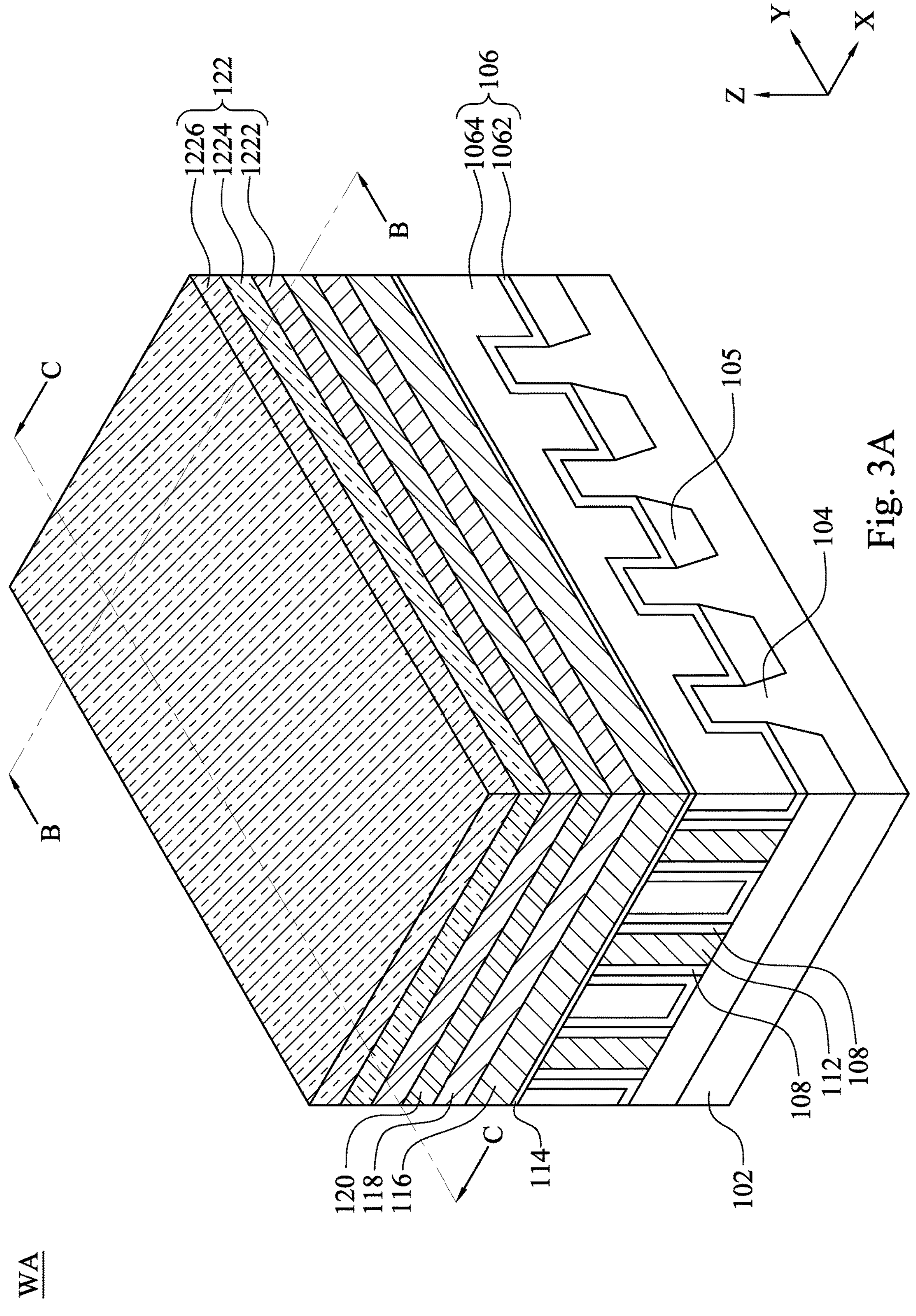
Figure 3B:
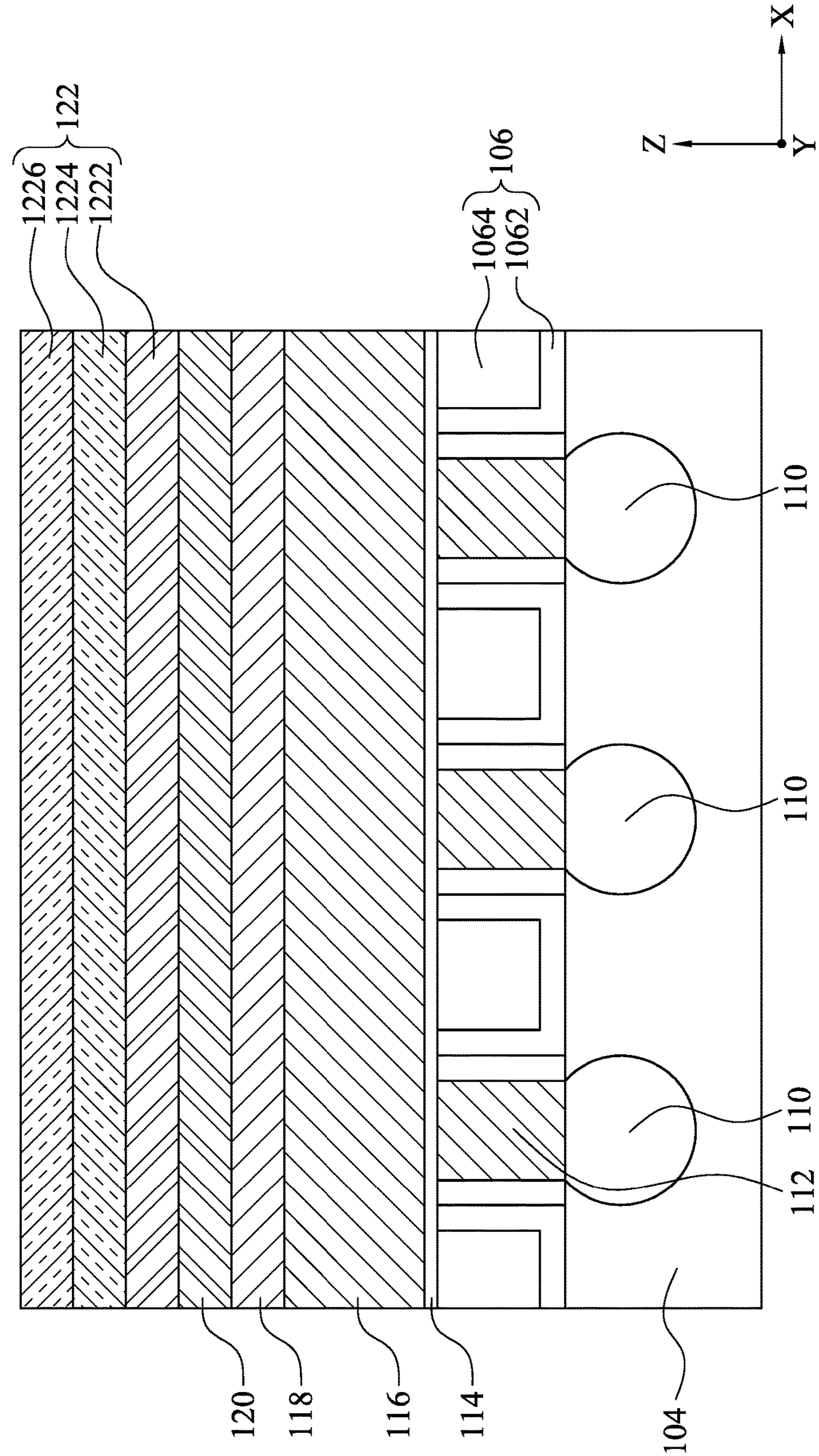
Figure 3C:
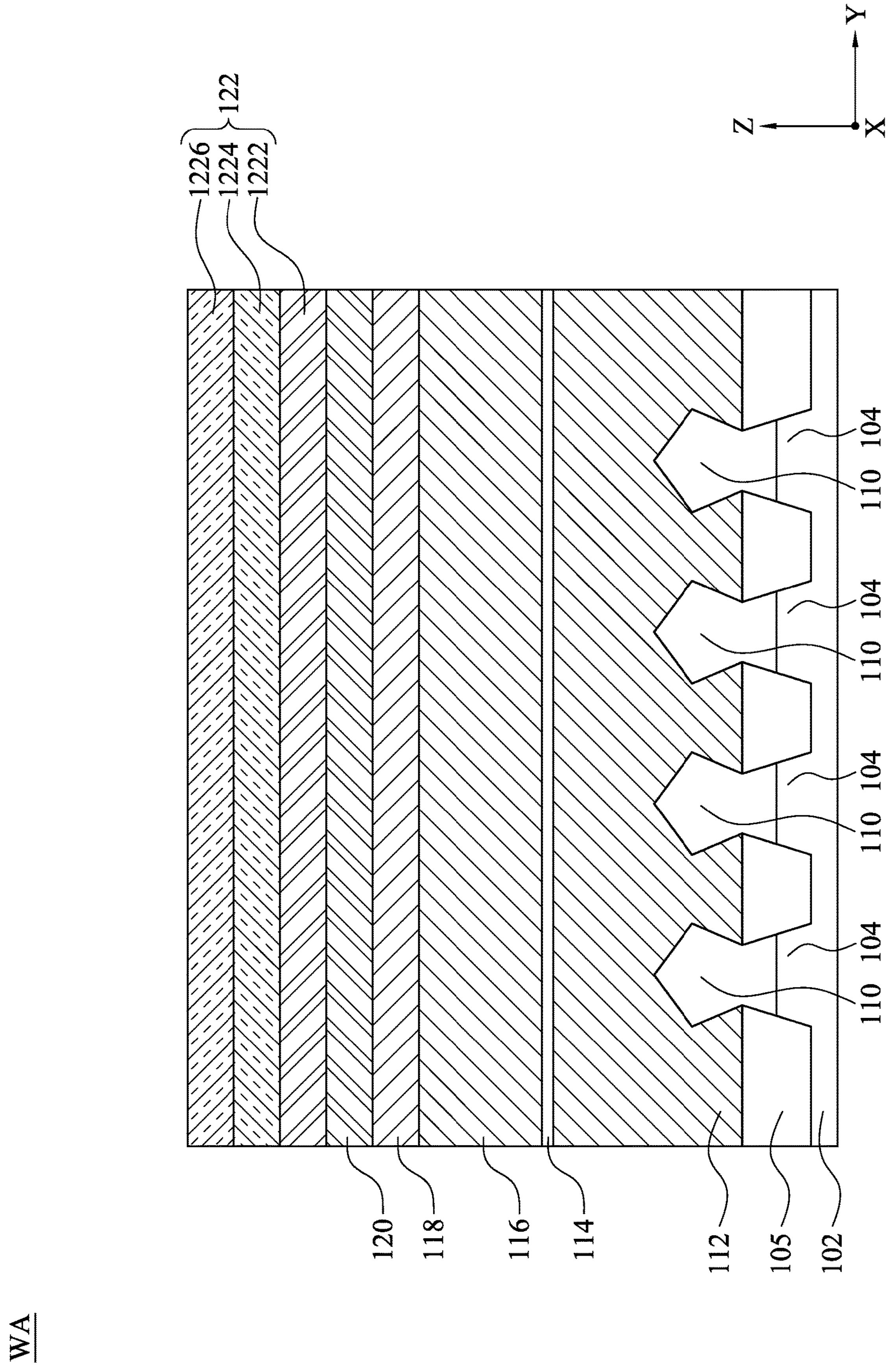

Returning to FIG. 1, the method M1 then proceeds to block S102 where a first etch stop layer (ESL), a second ILD layer, a second ESL, a hard mask layer, and a tri-layer photomask are formed over the transistors and the first ILD layer. With reference to FIGS. 3A-3C, in some embodiments of block S102, a first ESL 114, a second ILD 116, a second ESL 118, a hard mask layer 120 and a tri-layer photomask 122 is formed in sequence over the first ILD 112 and the gate stack 106. In some embodiments, the first ESL 114 may include a nitride material, such as silicon nitride, titanium nitride or the like, and may be formed using a deposition process, such as CVD or PVD. In some embodiments, the second ILD layer 116 may include the same material as the first ILD layer 112, and may be formed using, for example, CVD, ALD, spin-on-glass (SOG) or other suitable techniques. For example, the second ILD layer 116 may include silicon oxide, silicon nitride, silicon oxynitride, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The second ILD layer 116 has a higher etch rate than the ESL 114, so that the ESL 114 can slow down or even stop an etching process performed on the second ILD 116.

In some embodiments, the second ESL 118 may include a carbide material, such as tungsten carbide, and may be formed using a deposition process, such as CVD or PVD. In some embodiments, the hard mask layer 120 may include an oxide material, such as silicon oxide, and may be formed using a deposition process, such as CVD or PVD. The tri-layer photoresist mask 122 includes a bottom layer 1222 over the hard mask layer 120, a middle layer 1224 over the bottom layer 1222, and a top layer 1226 over the middle layer 1224. In some embodiments, the bottom layer 1222 may comprise an organic material, such as a spin-on carbon (SOC) material, or the like, and may be formed using spin-on coating, CVD, ALD, or the like. The middle layer 1224 may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer 1226 may comprise an organic material, such as a photoresist material, and may be formed using a spin-on coating, or the like. In some embodiments, the middle layer 1224 has a higher etch rate than the top layer 1226, and the top layer 1226 can be used as an etching mask for patterning of the middle layer 1224. In some embodiments, the bottom layer 1222 has a higher etch rate than the middle layer 1224, and the middle layer 1224 can be used as an etching mask for patterning of the bottom layer 1222.

Figure 4A:
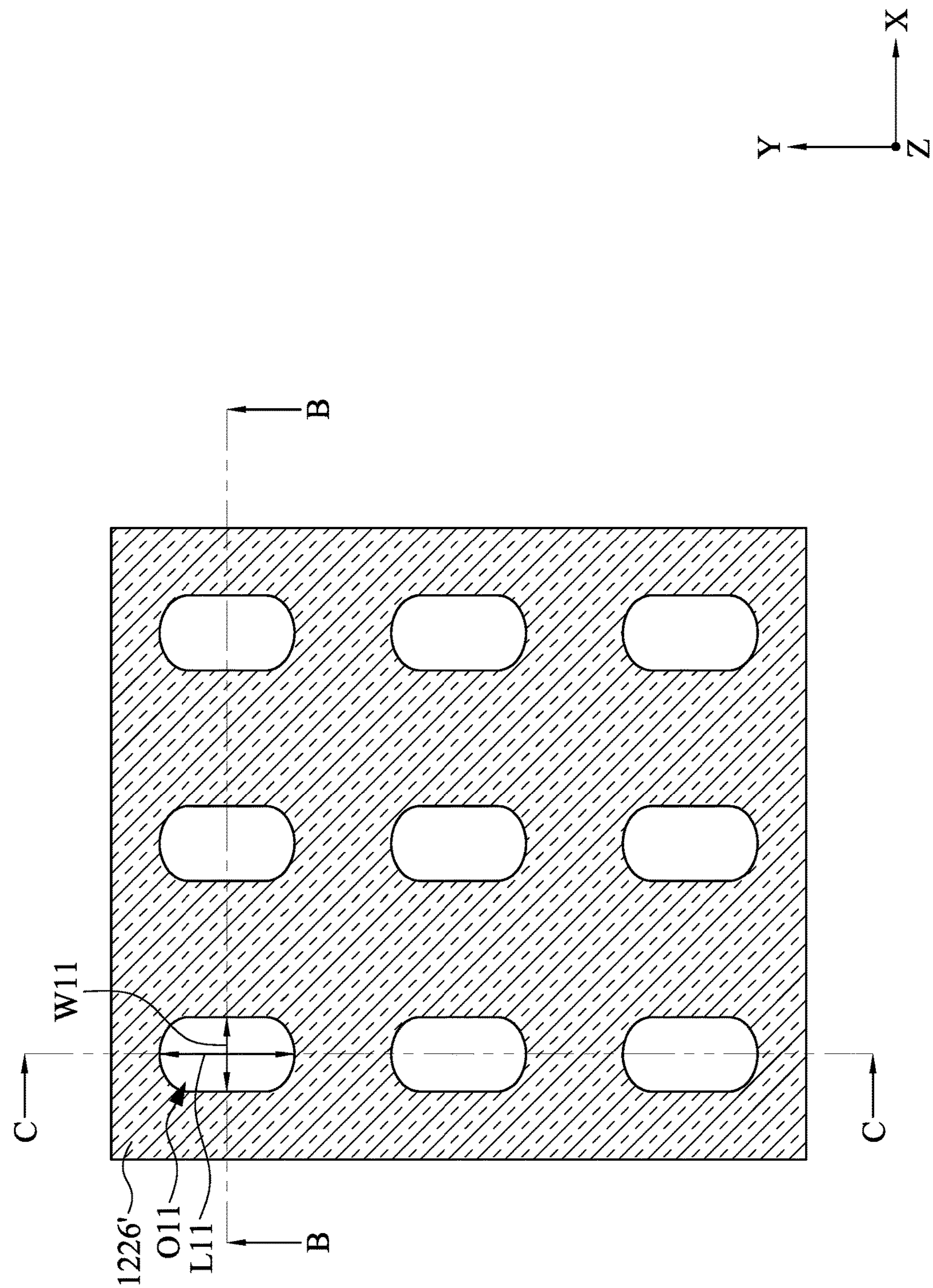
FIGS. 4A, 5A, 6A, 7A, 8A, 9A and 10A illustrate a top view of a semiconductor device at various stages of the method of FIG. 1 in accordance with some embodiments of the present disclosure.
Figure 4B:
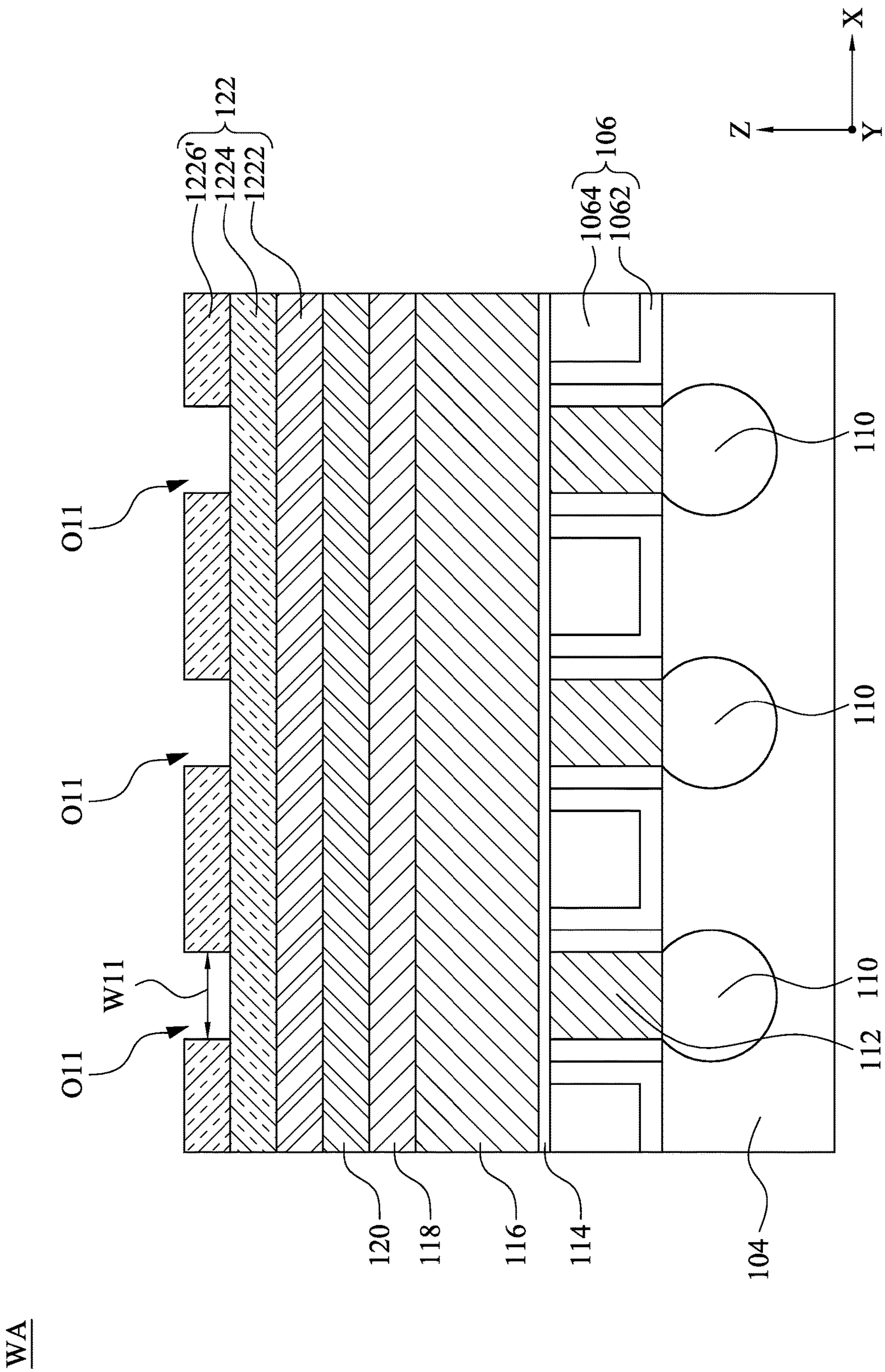
Figure 4C:
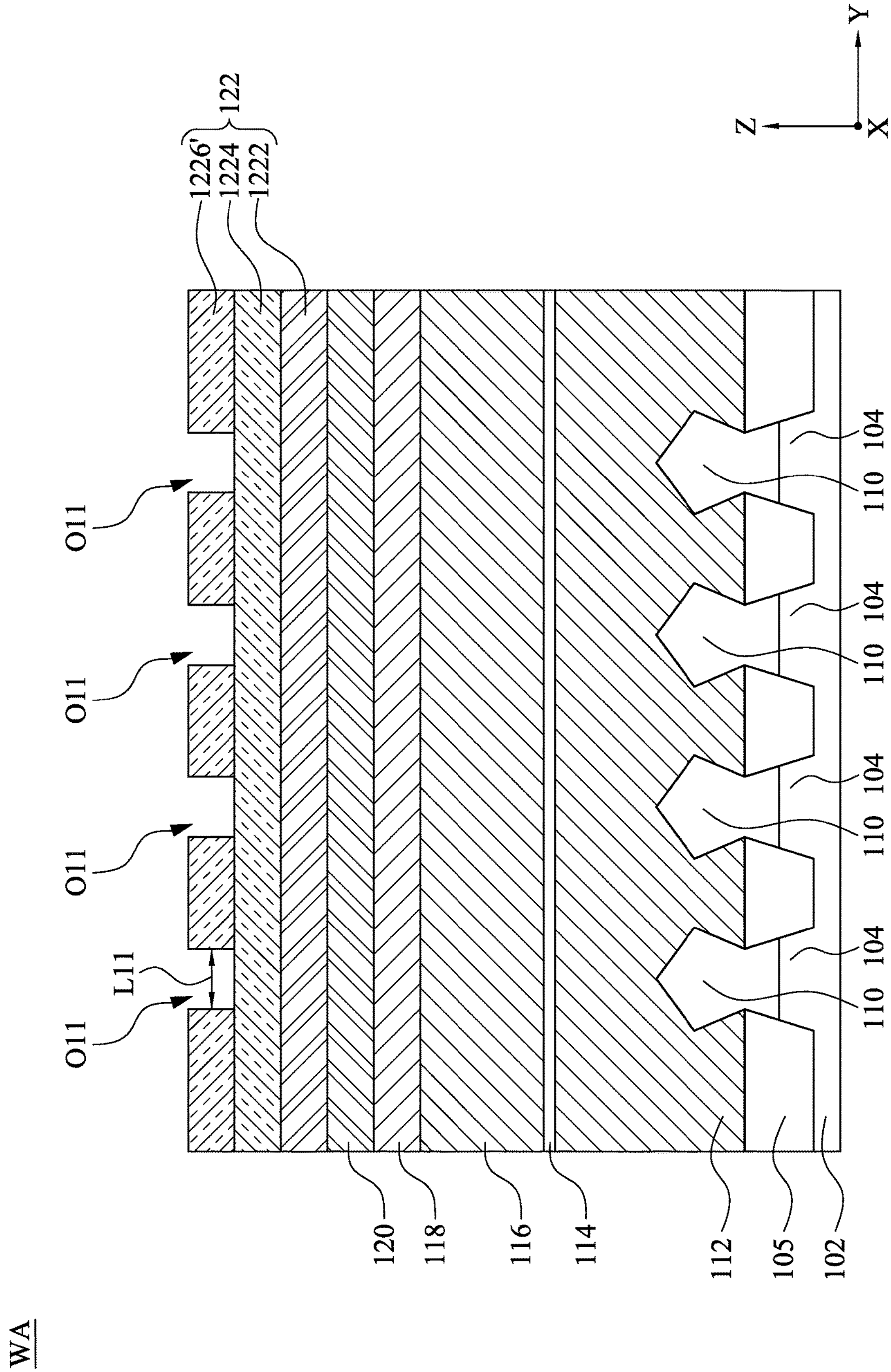

Returning to FIG. 1, the method M1 then proceeds to block S103 where first openings are formed in a top layer of the tri-layer photoresist mask and above respective source/drain regions. With reference to FIGS. 4A-4C, in some embodiments of block S103, the top layer 1226 of the tri-layer photoresist mask 122 is patterned, using suitable photolithography techniques, to form first openings O11 in the patterned top layer 1226' and vertically above respective source/drain regions 110. In some embodiments where the top layer 1226 comprises a photoresist material, the photoresist material is irradiated (exposed) and developed to remove portions of the photoresist material. For example, a photomask or reticle (not shown) may be disposed over the top photoresist layer 1226, which may then be exposed to a radiation beam which may be ultraviolet (UV) or an excimer laser such as a Krypton Fluoride (KrF) excimer laser, or an Argon Fluoride (ArF) excimer laser. Exposure of the top photoresist layer 1226 may be performed using an immersion lithography system to increase resolution and decrease the minimum achievable pitch. A bake or cure operation may be performed to harden the top photoresist layer 1226, and a developer may be used to remove either the exposed or unexposed portions of the top photoresist layer 1226 depending on whether a positive or negative resist is used. Thus, the first openings O11 illustrated in FIGS. 4A-4C are formed in the patterned top photoresist layer 1226'.

These first openings O11 in the patterned top layer 1226' are used to define the pattern of source/drain contact openings which will be formed in the first ILD layer 112 in following steps. As illustrated in FIG. 4A, each first opening O11 has a length L11 in Y-direction and a width W11 in X-direction, and the length L11 is greater than the width W11. Therefore, the subsequently formed source/drain contact openings will have a length in Y-direction greater than a width in X-direction, which in turn will result in increased source/drain contact area while preventing source/drain contacts from contacting the gate stacks 106, which will be discussed below in greater detail. In some embodiments, the width W11 is greater than about 10 nm. If the width W11 is less than about 10 nm, the following directional deposition and/or directional etching using directional ions might be unsatisfactory.

Figure 5A:
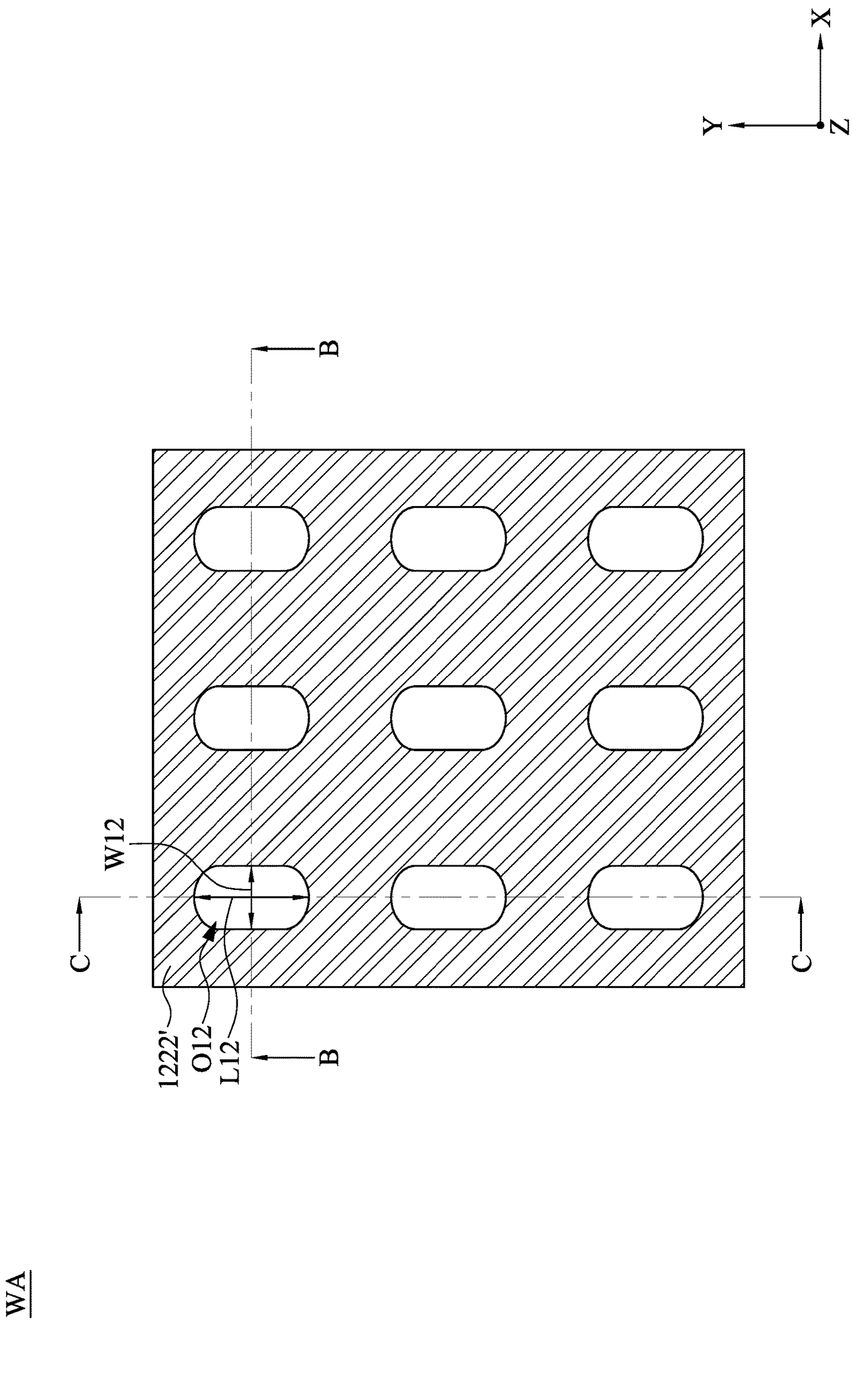
Figure 5B:
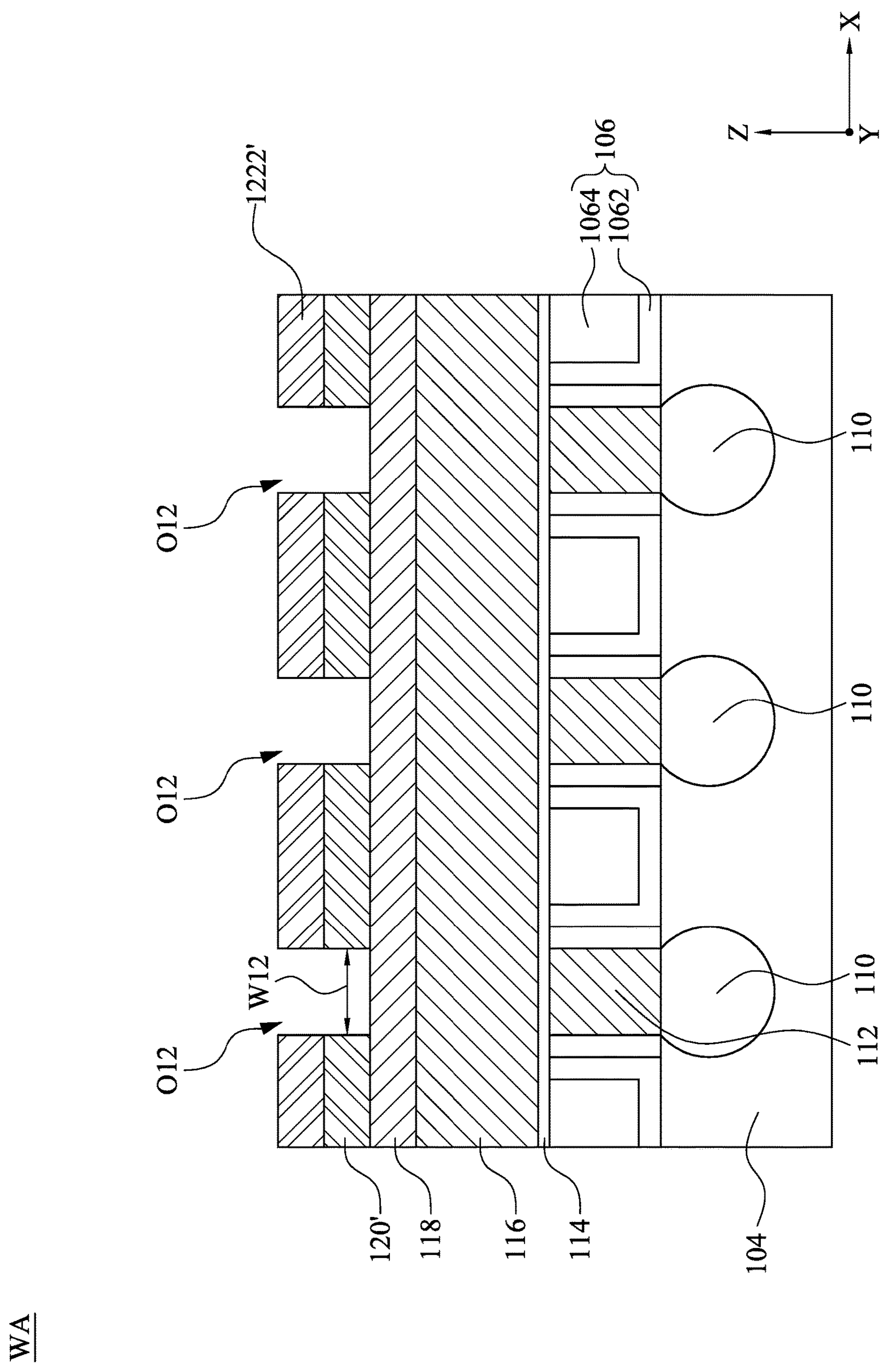
Figure 5C:
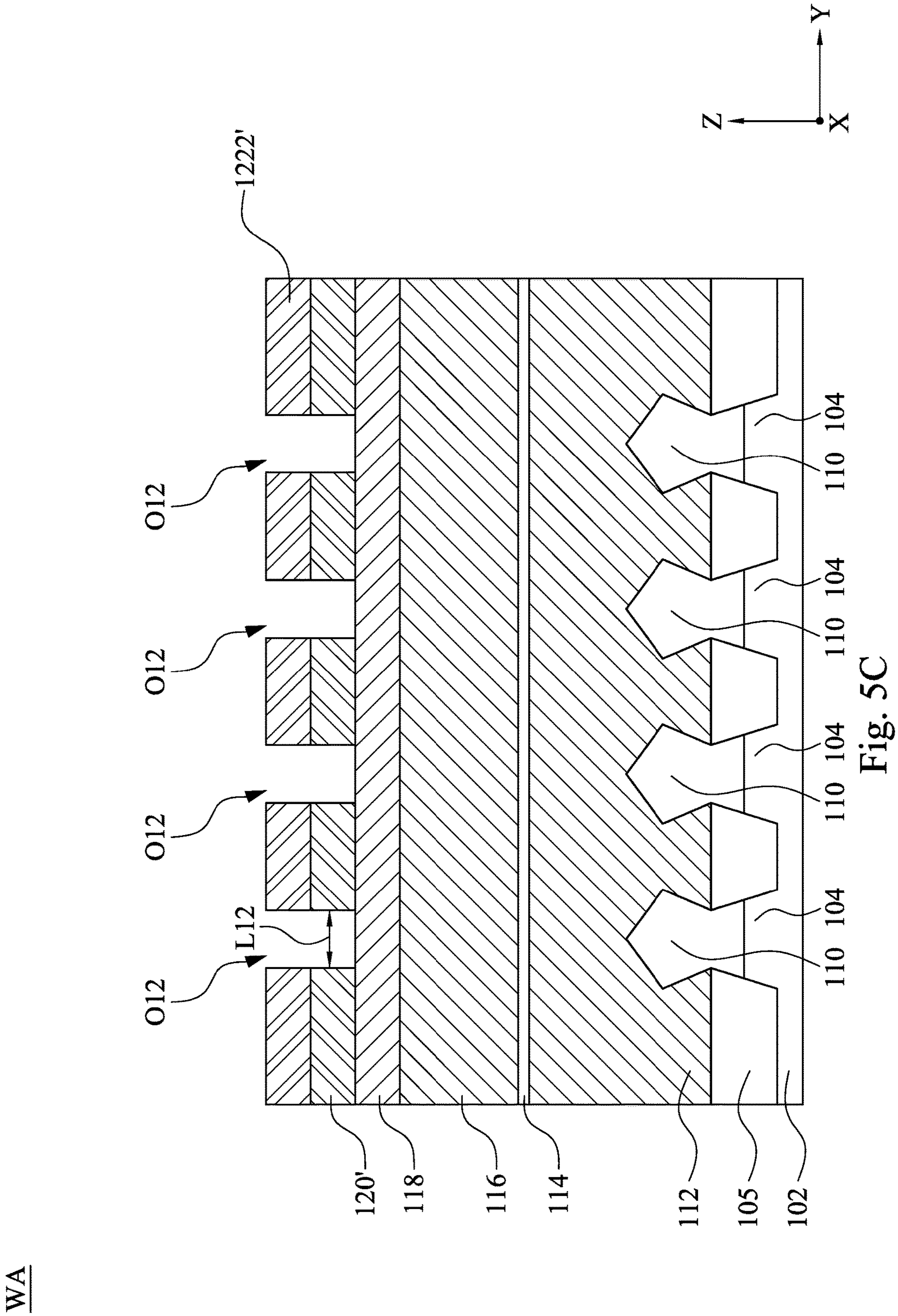

Returning to FIG. 1, the method M1 then proceeds to block S104 where the hard mask layer is patterned using the tri-layer photoresist mask as an etch mask to form second openings through the hard mask layer and the bottom layer of the tri-layer photoresist mask. With reference to FIGS. 5A-5C, in some embodiments of block S104, a patterning process is performed on the hard mask layer 120 to transfer the pattern of the first openings O11 in the patterned top photoresist layer 1226' to the hard mask layer 120, resulting in second openings O12 in the hard mask layer 120'. In some embodiments, the patterning process comprises one or more etching processes, where the tri-layer photoresist mask 122 is used as an etch mask. The one or more etching processes may include anisotropic wet etching processes, anisotropic dry etching processes, or combinations thereof. During the patterning process, the patterned top layer 1226' and the middle layer 1224 of the photoresist mask 122 may be consumed, and portions of the bottom layer 1222 may remain after the patterning process. In this way, the patterning process also results in a patterned bottom layer 1222' over the patterned hard mask layer 120'. In some embodiments, a thickness of a combination of the patterned bottom layer 1222' and the patterned hard mask layer 120' is in a range from about 20 nm to about 150 nm. If the thickness of the combination of the patterned bottom layer 1222' and the patterned hard mask layer 120' is out of this range, the following directional deposition and/or directional etching might be unsatisfactory.

Because the patterning process is performed using the patterned top photoresist layer 1226' (as shown in FIG. 4A) as an etch mask, the patterned bottom layer 1222' and the patterned mask layer 120' inherit the pattern in the top photoresist layer 1226. In this way, the second openings O12 extending through the patterned bottom layer 1222' and patterned mask layer 120 may have substantially the same shapes, sizes and spacing as the respective first openings O11 in the patterned top photoresist layer 1226'. For example, each second opening O12 has a length L12 in Y-direction and a width W12 in X-direction, and the length L12 is greater than the width W12. The pattern of the second openings O12 vertically above the respective source/drain regions 110 can be transferred to the underlying first ILD layer 112 in following steps, and thus the second openings O12 can be used to define the pattern of the source/drain contact openings in the first ILD layer 112. In this way, the subsequently formed source/drain contact openings will have a length in Y-direction greater than a width in X-direction.

The length L12 of the second opening O12 in Y-direction is in positive correlation with a source/drain contact area. Stated differently, the greater the length L12 of the second opening O12, the larger the source/drain contact area. Therefore, one or more lateral etching processes might be used to elongate the second openings O12 in Y-direction. However, if the patterned bottom layer 1222' and the hard mask layer 120' undergo the one or more lateral etching processes, the second openings O12 would be inevitably elongated in both X-direction and Y-direction, which in turn would lead to increased widths W12 of the second openings O12, which in turn might cause damage to the gate stacks 106 arranged in X-direction during transferring the pattern of the elongated second openings O12 to the first ILD layer 112. Therefore, in some embodiments of the present disclosure, a directional deposition process having a higher deposition rate in X-direction than in Y-direction is performed on the wafer WA (block S105 of the method MD, followed by a direction etching process having a higher etch rate in Y-direction than in X-direction (block S106 of the method MD. In this way, the second openings O12 can be elongated in Y-direction but substantially not in X-direction, as described below in greater detail.

Figure 6A:
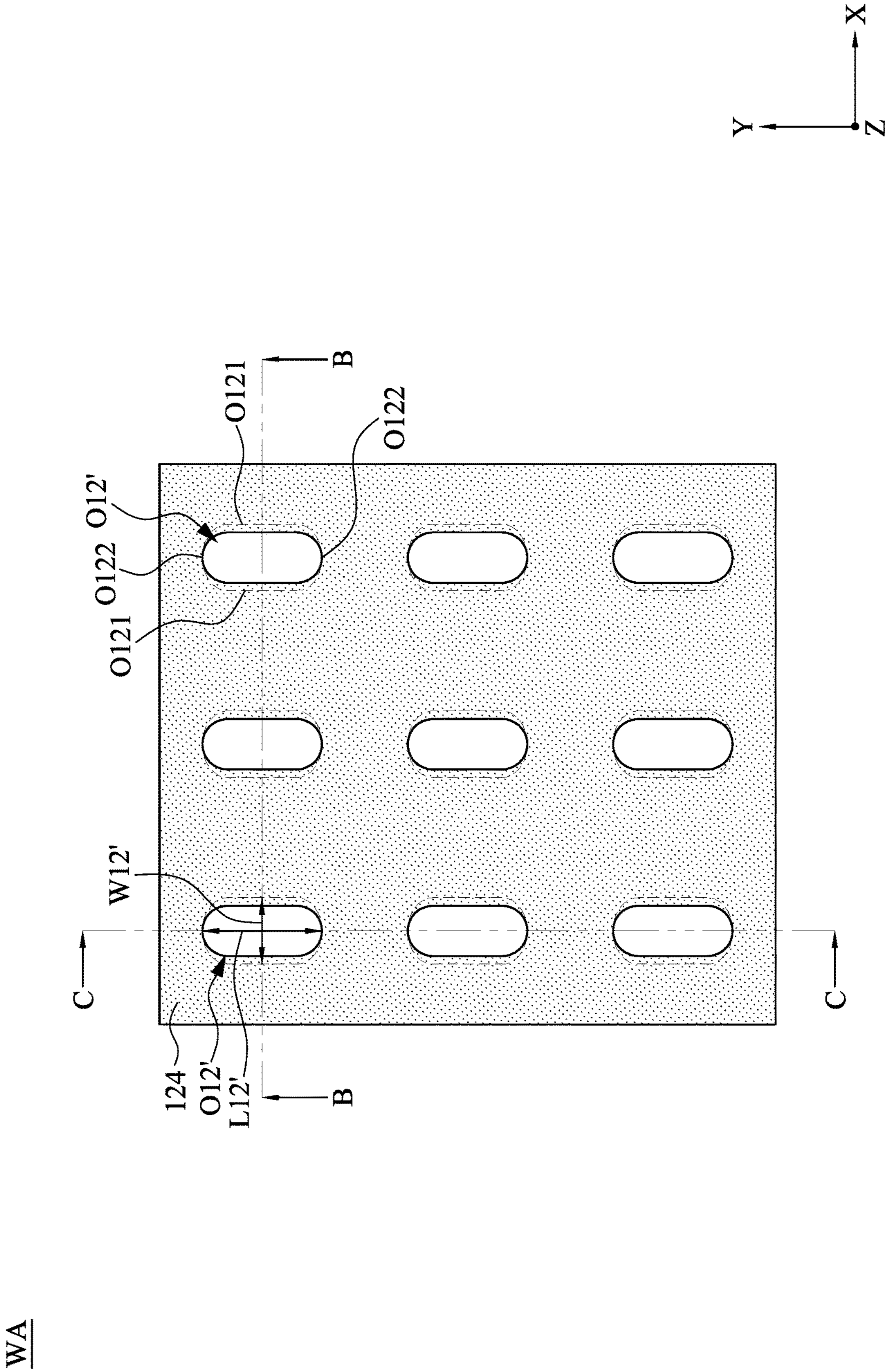
Figure 6B:
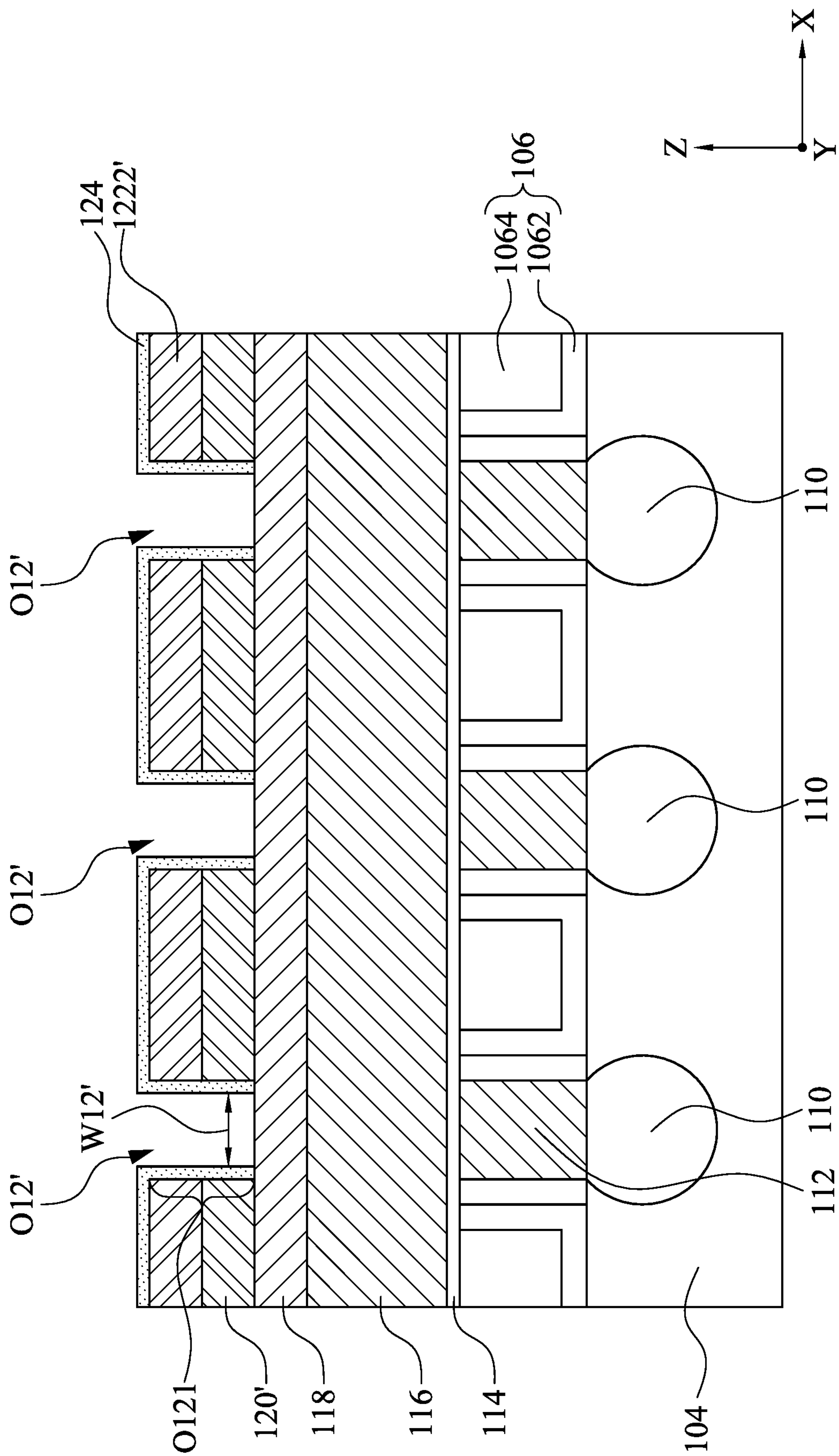
Figure 6C:
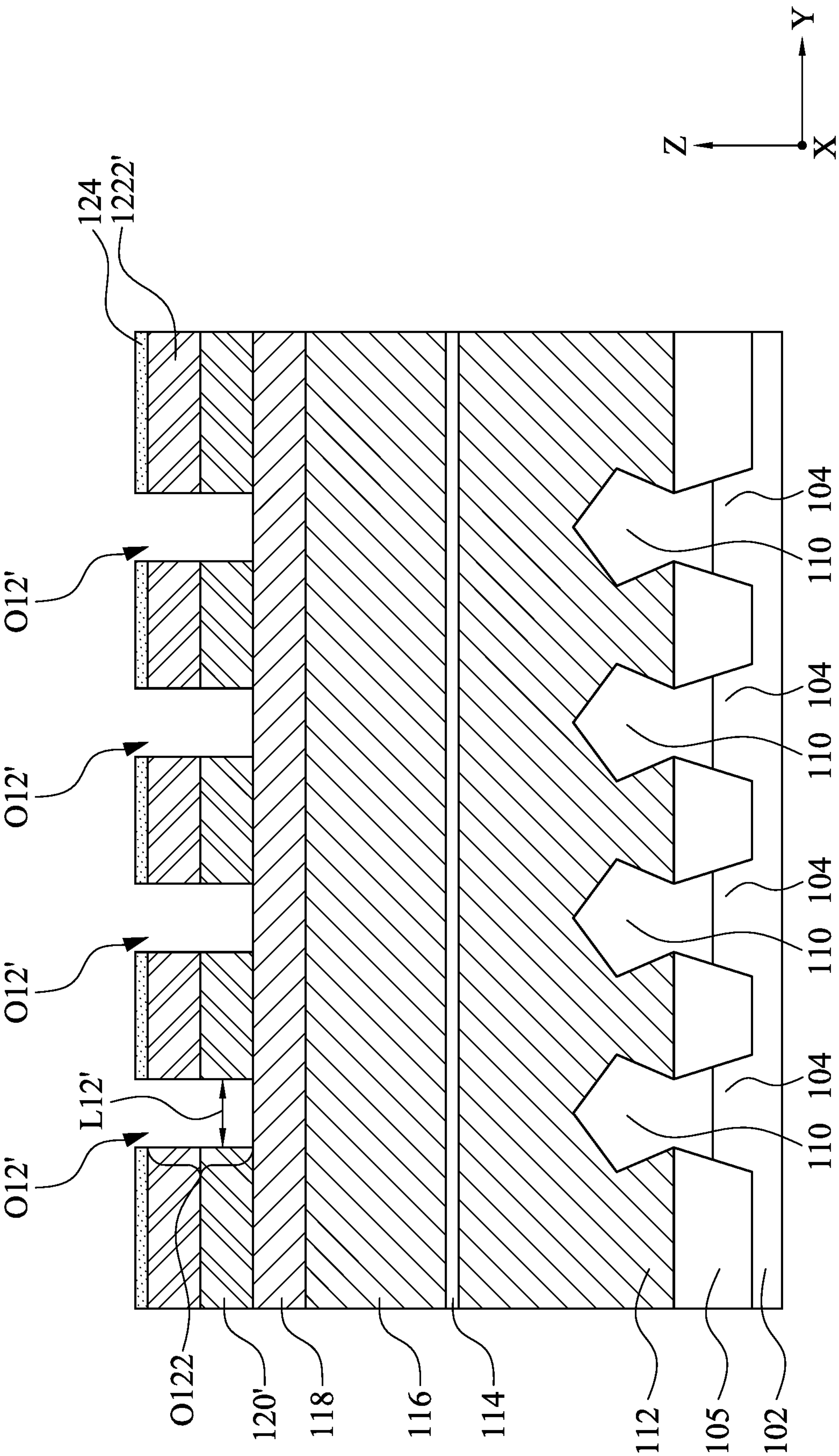

Returning to FIG. 1, the method M1 then proceeds to block S105 where a protective layer is formed on first sidewalls of the second openings. With reference to FIGS. 6A-6C, in some embodiments of block S105, a directional deposition process is performed to form a protective layer 124 on first sidewalls O121 of the second opening O12' that extend in Y-direction and substantially not on second sidewalls O122 of the second opening O12' that extend in X-direction. The directional deposition process is performed using directional ions extracted from plasma and directed to the wafer WA at non-zero angles with respect to a perpendicular to the wafer surface, as described in greater detail below.

Figure 38:
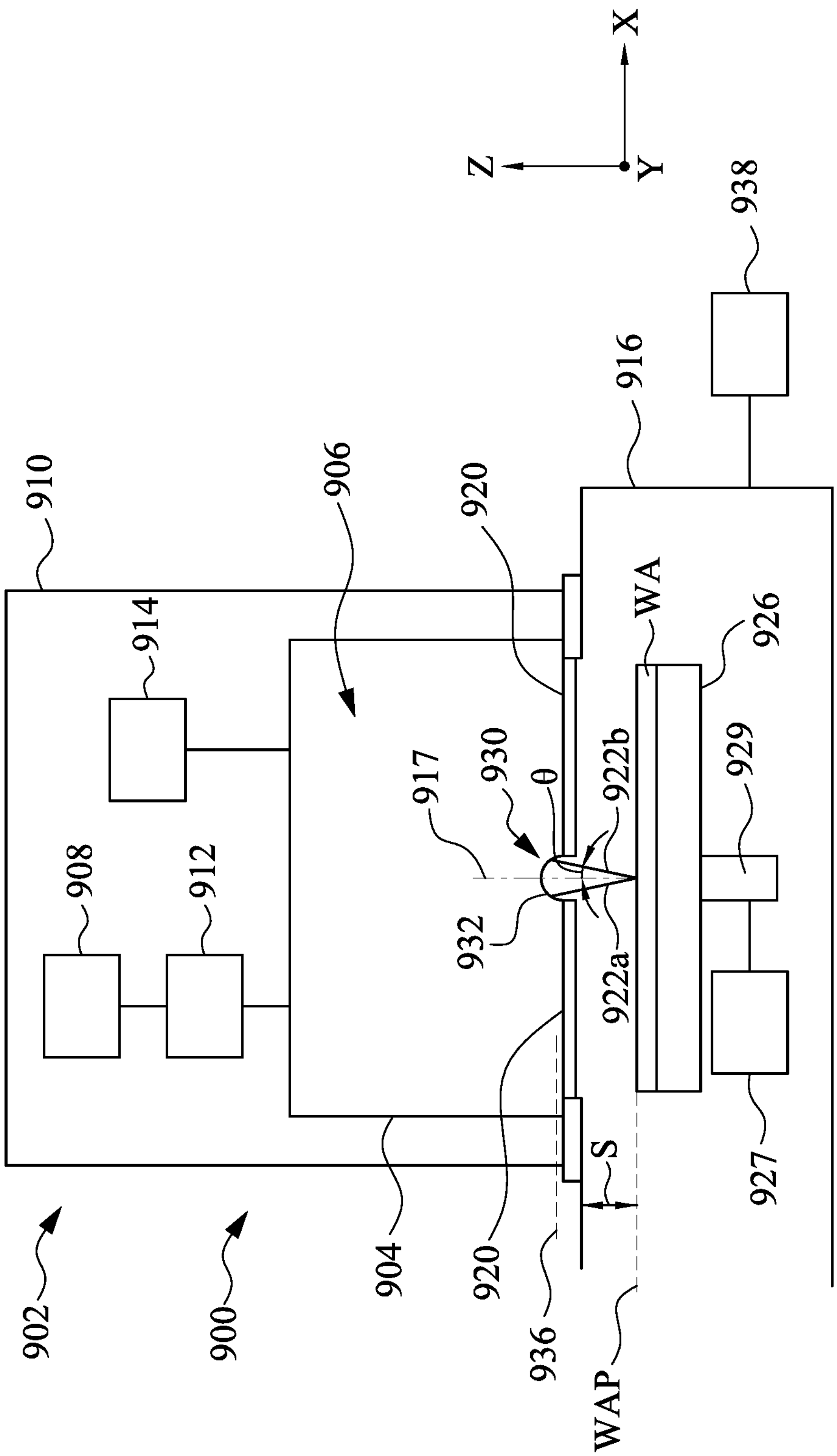
FIG. 38 illustrates a schematic and block diagram in side view of a plasma tool in accordance with some embodiments of the present disclosure.

FIG. 38 illustrates a schematic and block diagram in side view of a plasma tool 900 capable of performing the directional deposition process and the directional etching process in accordance with some embodiments of the present disclosure. The plasma tool 900 includes a plasma source 902 that includes a plasma chamber 904 to contain a plasma 906. The plasma chamber 904 can generate the plasma 906, although it will be understood that the plasma 906 is generated when power and the appropriate gaseous species are provided to the plasma chamber 904. A gas source 914 is connected to the plasma source 902 and more particularly to the plasma chamber 904 to provide gaseous species for generating plasma 906. The gas source 914 may represent multiple independent gas sources in some embodiments.

The plasma source 902 or other components of the plasma tool 900 also may be connected to a pump (not shown), such as a turbopump. The plasma source 902 that generates the plasma 906 may be, for example, an RF plasma source, inductively-coupled plasma (ICP) source, a capacitively-coupled plasma (CCP) source, an indirectly heated cathode (IHC), or other suitable plasma sources. In some embodiments, the plasma source 902 is an RF plasma source having a power supply 908 and an RF inductor 912 to generate an inductively couple plasma. In some embodiments, the plasma source 902 is surrounded by an enclosure 910.

Figure 39:
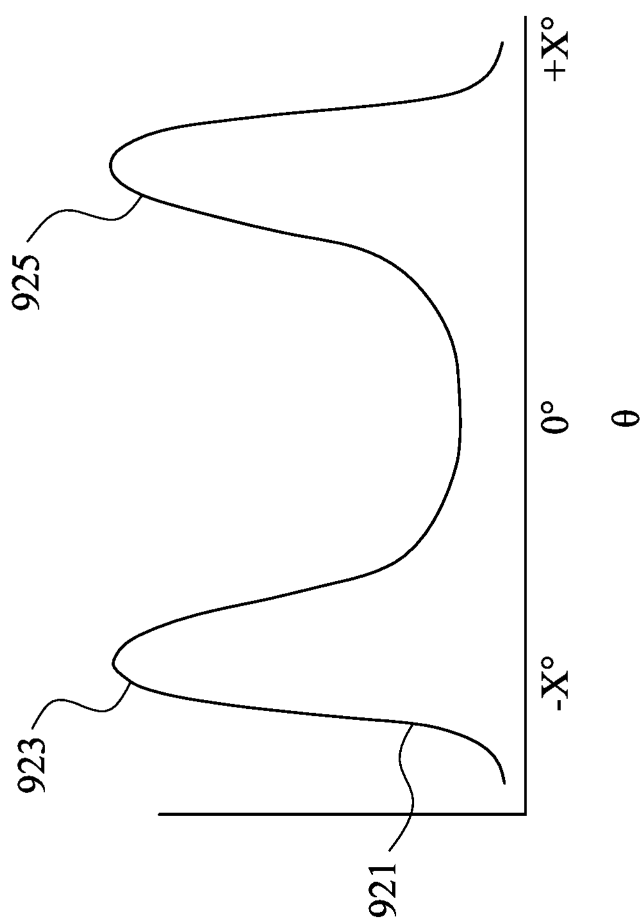
FIG. 39 illustrates an exemplary ion distribution chart associated with ions generated from the plasma tool of FIG. 38.

Adjacent the plasma chamber 904 is a process chamber 916 that houses the wafer WA during substrate processing. An extraction plate 920 is provided to extract ions 922*a* and 922*b* from the plasma 906 and direct the ions 922*a* and 922*b* to the wafer WA, wherein the ions 922*a* have different trajectories than the ions 922*b*. In greater detail, the extraction plate 920 has a aperture 930, which generates ions 922*a* and 922*b* that form an angle of incident ⊖ with respect to a perpendicular 917 to a plane WAP of the wafer WA (i.e., top surface of the wafer WA). In this way, the extraction plate 920 can generate an ion distribution 921 (as shown in FIG. 39), which has a bimodal distribution of angles of incidence centered about zero degrees, in which two peaks 923 and 925 are located on opposite sides of zero degrees. The process chamber 916 includes a platen 926 that is configured to support the wafer WA. The platen 926 may be connected to a drive mechanism 927 so that the platen 926 may move along one or more of X-direction, Y-direction and Z-direction and rotate about a shaft 929 that supports the platen 926 and extends in Z-direction. In some embodiments, the platen 926 may move in X-direction and/or Y-direction so that scanning of the wafer WA takes place with respect to the extraction aperture 930. In some embodiments, the extraction aperture 930 may be an elongated extraction aperture having a longer dimension along Y-direction as opposed to X-direction. In this configuration, the wafer WA may be scanned along the X-direction, in order to expose the entirety of the wafer WA to ions 922*a* and 922*b* extracted from the plasma 906. In other embodiments, an extraction aperture may have different shapes, or an extraction plate may include multiple extraction apertures.

As shown in FIG. 38, the positioning of the extraction plate 920 with the extraction aperture 930 may generate a plasma sheath boundary 932 that has a curvature. In the depicted embodiments, the plasma sheath boundary 932 has a concave shape with respect to a plane WAP of the wafer WA (i.e., top surface of the wafer WA), and with respect to a plane 936 of the extraction plate 920. This curvature results in the extraction of ions 922*a* and 922*b* from the plasma 906 at the plasma sheath boundary 932 in which ion trajectories may deviate from a perpendicular incidence with respect to the plane WAP of the wafer WA. By varying plasma-processing conditions of the plasma tool 900, the shape and curvature of the plasma sheath boundary 932 may be varied, thus resulting in control of ion trajectories. This may allow control of the directionality or angle of incidence of ions with respect to features on the wafer WA to be processed (e.g., second openings O12 in the patterned hard mask layer 120' and the patterned bottom layer 1222' as shown in FIGS. 5A-5C).

As shown in FIG. 38, specific ion directions can be provided to ions 922*a* and 922*b* that are extracted from the plasma 906. Directionality of ions 922*a* and 922*b* (e.g., angle of incidence of ions 922*a* and 922*b* with reference to a reference direction such as a perpendicular to the wafer WA) can be controlled by using parameters such as the width of the extraction aperture 930, RF power from plasma source (i.e., combination of the power supply 908 and the RF inductor 912), gas pressure of gases from the gas source 914, extraction voltage applied between the plasma chamber 904 and the wafer WA (e.g., voltage from a pulsed DC bias source 938), and so on. The ions can be controlled in such a way that the ion trajectories extend in X-direction and Z-direction, but substantially not in Y-direction in FIG. 38. This control of ion directionality thus facilitates selectively treating (e.g., forming polymers on or etching) desired surfaces on the wafer WA substantially without treating other surfaces.

Returning to FIGS. 6A-6C, the directional deposition process can be performed using the directional ions (e.g., ions 922*a* and 922*b* as shown in FIG. 38), thus resulting in a higher deposition rate in X-direction than in Y-direction, so that the Y-directional sidewalls O121 as shown in FIG. 6A can be deposited with more polymers than the X-directional sidewalls O122 as shown in FIG. 6A. In greater detail, ions can be directed at first sidewalls O121 of the second openings O12' while substantially not being directed at second sidewalls O122 of the second openings O12'. For example, a ratio of the deposition rate in X-direction to the deposition rate in Y-direction is in a range from about 10:1 to about 30:1. In some embodiments, the process conditions are selected such that polymerization phenomenon resulting from ions is dominant over etching phenomenon resulting from ions, so that the ions 922*a* and 922*b* directed at the first sidewalls O121 but substantially not at second sidewalls O122 of the second openings O12' can result in deposition of polymers on first sidewalls O121 but substantially not on second sidewalls O122. These deposited polymers can be referred to as a protective layer (or polymer layer) 124.

In some embodiments, the directional deposition process may be performed using gases including $CH_4$, $SiCl_4$, $O_2$, $N_2$, HBr, $BCl_3$, or combinations thereof, at pressure in a range from about 0.1 mTorr to about 20 mTorr, RF power in a range from about 100 W to about 2000 W, a bias voltage from about 0 to about 5 kV, using a process gas with a volume flow rate in a range from about 1 sccm to about 100 sccm. If the process conditions are out of the above selected range, the directional deposition phenomenon might be unsatisfactory. In some embodiments where the directional deposition process is performed using gases including $CH_4$, the resultant protective layer 124 includes carbon-containing polymers. In some embodiments where the directional deposition process is performed using gases including $SiCl_4$, $BCl_3$, or combinations thereof, the resultant protective layer 124 includes chlorine-containing polymers. In some embodiments where the directional deposition process is performed using gases including HBr, the resultant protective layer 124 includes bromine-containing polymers.

As a result of the directional deposition, the length L12' of the second opening O12' in Y-direction remains substantially the same as the length L12 of the second opening O12 (as shown in FIG. 5A), but the width W12' of the second opening O12' in X-direction is less than the width W12 of the second opening O12. The difference between the width W12' of the second opening O12' after directional deposition and the width W12 of the second opening O12 before directional deposition is substantially twice the thickness of the protective layer 124. In some embodiments, the directional deposition results in deposition of polymers over a top surface of the patterned bottom layer 1222', so that the protective layer 124 extends over the top surface of the patterned bottom layer 1222'. In some embodiments, the second ESL 118 at bottoms of the second openings O12' may be free from coverage by the protective layer 124 (i.e., polymers) because of the shadowing effect resulting from slanted trajectories of the directional ions.

Figure 7A:
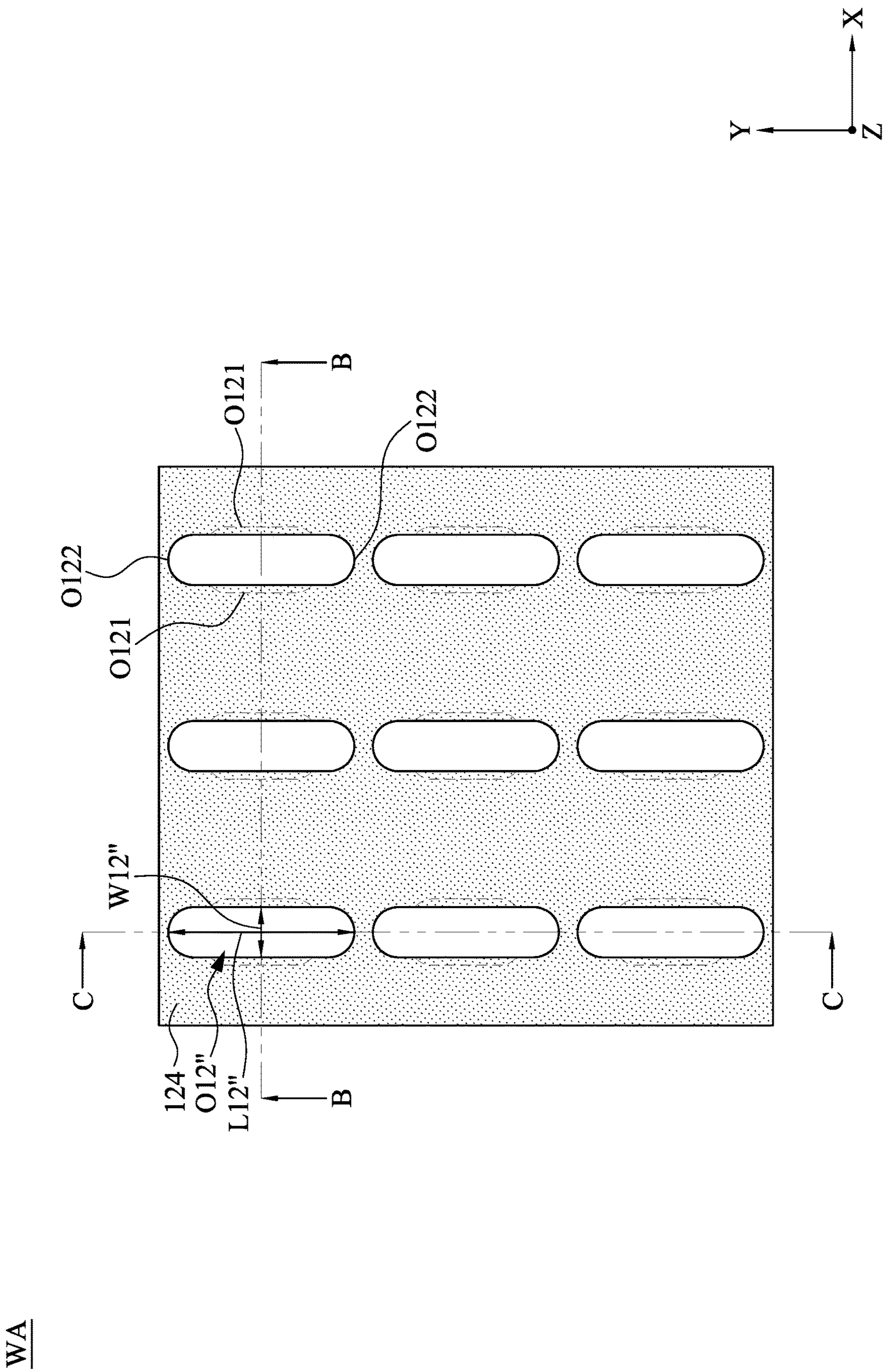
Figure 7B:
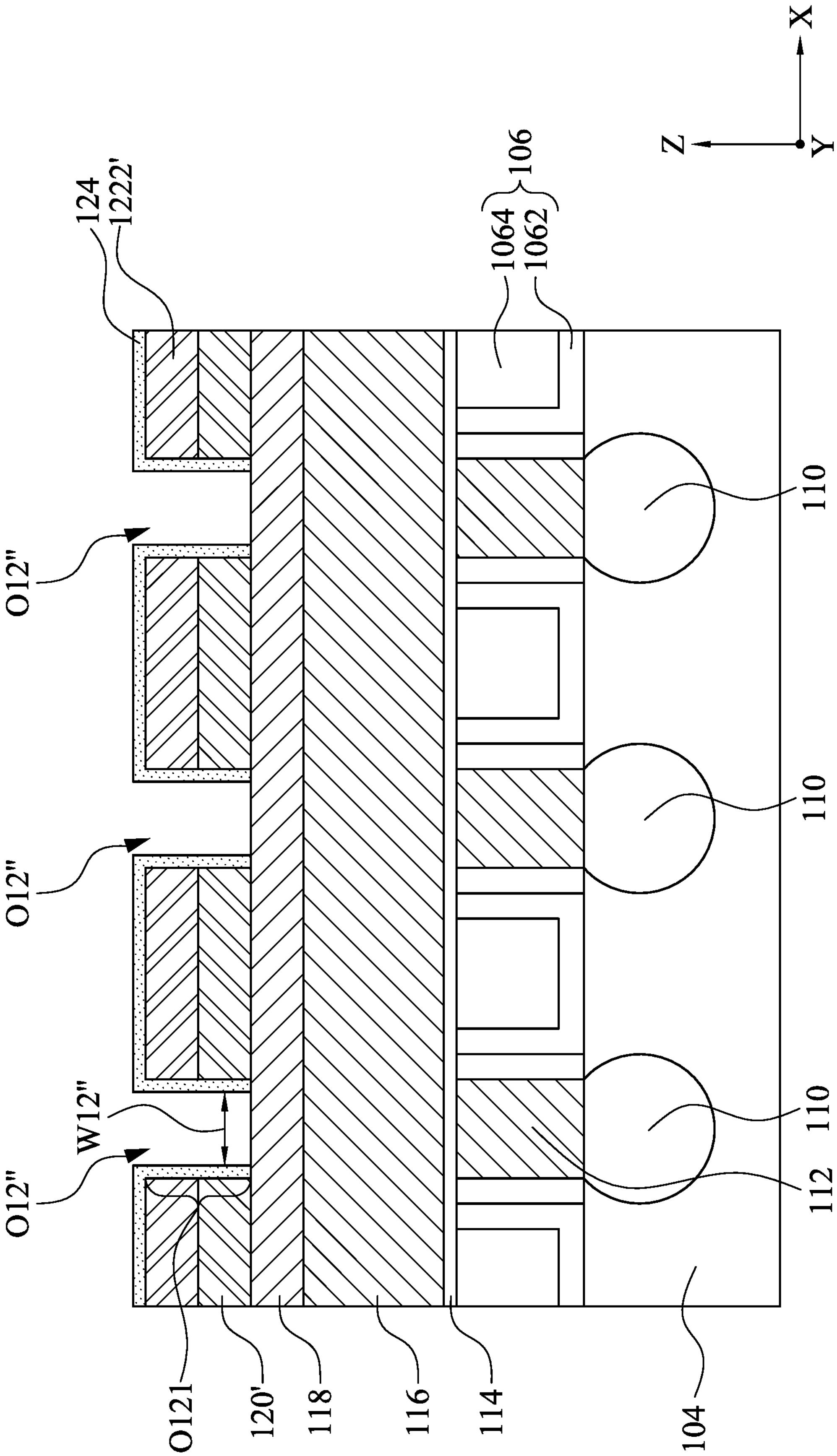
Figure 7C:
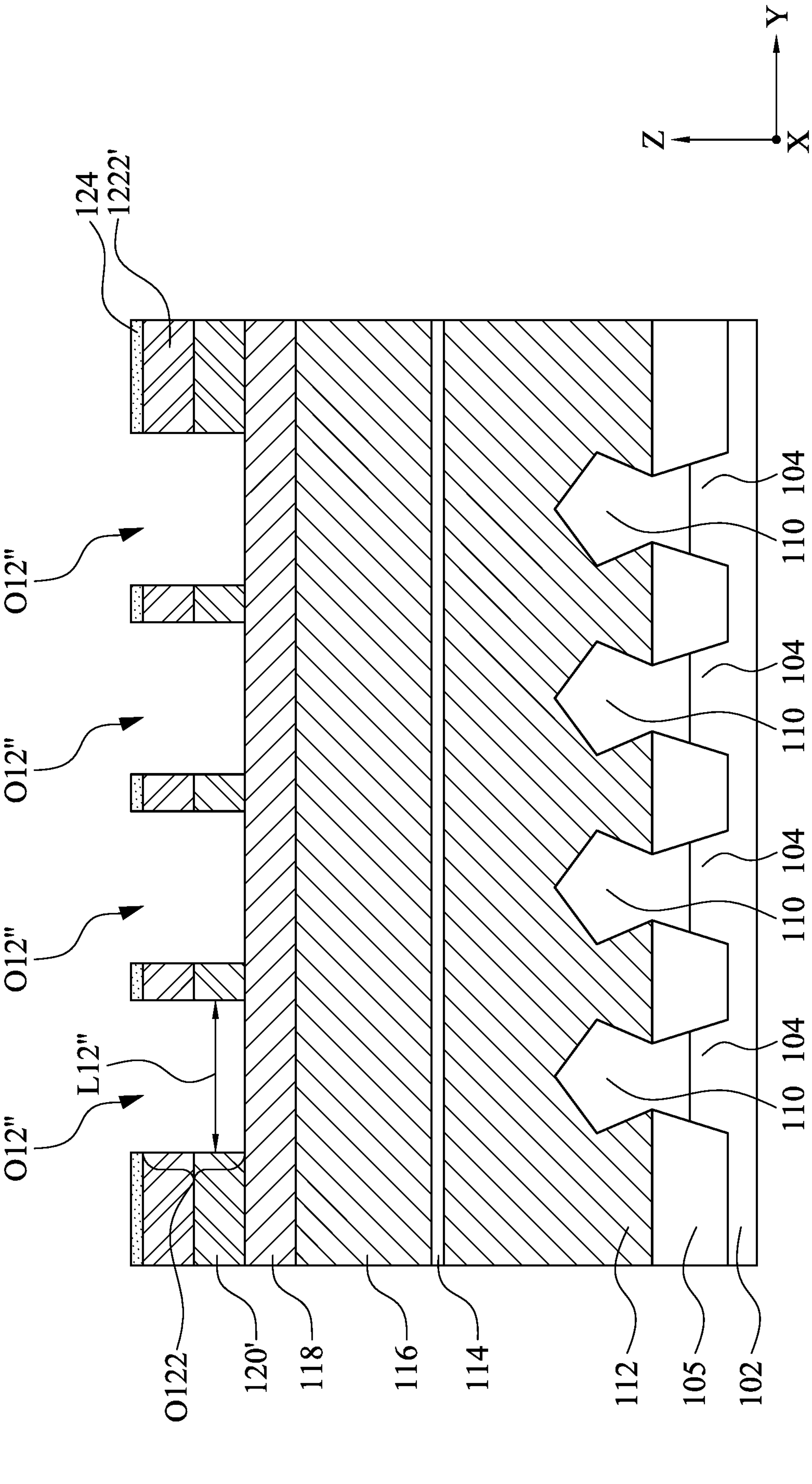

Returning to FIG. 1, the method M1 then proceeds to block S106 where second sidewalls of the second openings are etched to elongate the second openings. In some embodiments of block S106, a directional etching process is performed on the second sidewalls O122 of the second opening O12', thus resulting in elongated openings O12" as shown in FIGS. 7A-7C. The directional etching process is performed using directional ions. For example, the directional etching process can be performed using the plasma tool 900 as illustrated in FIG. 38, as described below in detail.

After performing the direction deposition process on the wafer WA in the plasma tool 900, the wafer WA can be rotated about the Z-directional shaft 929 by about 88-92 degrees (e.g., about 90 degrees). In this way, the second sidewalls O122 of the second opening O12' can be arranged in X-direction in FIG. 38. After rotating the wafer WA, the ions 922*a* and 922*b* can be extracted and directed to the wafer WA. Because trajectories of the ions 922*a* and 922*b* extend in X-direction and Z-direction but substantially not in Y-direction in FIG. 38, the ions 922*a* and 922*b* can be directed at the second sidewalls O122 of the second openings O12' while substantially not being directed at the protective layer 124 alongside the first sidewall O121 of the second opening O12'. In some embodiments, the process conditions are selected such that etching phenomenon resulting from ions is dominant over polymerization phenomenon resulting from ions. As a result, the ions 922*a* and 922*b* can be used to perform a directional etching process that has a higher etch rate in X-direction than in Y-direction in FIG. 38. For example, a ratio of the etch rate in X-direction to the etch rate in Y-direction is in a range from about 10:1 to about 30:1. As a result, the ions 922*a* and 922*b* can be directed at the second sidewalls O122 but substantially not at first sidewalls O121 of the second openings O12', thus resulting in etching second sidewalls O122 but substantially not etching the protective layer 124 alongside the first sidewalls O121. In this way, the directional etching process can elongate the second openings O12' by etching the second sidewalls O122 but substantially not etching the first sidewalls O121, thus resulting in elongated openings O12" as illustrated in FIGS. 7A-7C.

In some embodiments, the protective layer 124 has a higher etch resistance to the directional etching process than that of the patterned bottom layer 1222' and the hard mask layer 120', so that the protective layer 124 can protect the first sidewalls O121 against the directional etching process. In some embodiments, the directional etching process may be performed using gases including $CH_3F$, $CHF_3$, $CH_4$, $CF_4$, $C_2F_2$, $SO_2$, $SF_6$, $O_2$, $N_2$, $NF_3$, $Cl_2$, $BCl_3$, $SiCl_4$, HBr, He, Ar, Kr, or combination thereof, at pressure in a range from about 0.1 mTorr to about 10 mTorr, RF power in a range from about 100 W to about 2000 W, a bias voltage from 0 to 10 kV, and at a gas flow rate in a range from about 1 sccm to about 100 sccm. If the process conditions are out of the selected range, the directional etching phenomenon might be unsatisfactory. The process gases and/or other process conditions of the directional etching process are different from that of the directional deposition process.

Referring to FIG. 7A, as a result of the directional etching, the length L12" of the elongated opening O12' is greater than the length L12' of the second opening O12' (as shown in FIG. 6A), but the W12" of the elongated opening O12" remains substantially the same as the width W12' of the second opening O12'. Because the elongated openings O12" have increased lengths, the subsequently formed source/drain contacts that inherit the pattern of the elongated openings O12" can have increased lengths in Y-direction, thus resulting in improved source/drain contact area. Moreover, because the elongation process does not increase the widths of the openings O12', the subsequently formed source/drain contacts that inherit the pattern of the elongated openings O12" will be separated from the gate stacks 106, thus preventing unwanted shorting between the source/drain contacts and the gate stacks 106. An example ratio of the resultant length L12" to the resultant width W12" is in a range from about 2.7:1 to about 4.6:1, which is higher than the ratio of the length L11 to the width W11 of the patterned photoresist layer 1226' as shown in FIG. 4A.

In some embodiments, the directional etching process of block S106 may be in-situ performed with the directional deposition process of block S105, which in turn will prevent contamination on the wafer WA. As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system). For example, the directional deposition process of block S105 is performed in the plasma tool 900 as shown in FIG. 38, followed by rotating the wafer WA in the plasma tool 900 about the shaft 929 using the drive mechanism 927. Thereafter, the directional etching process of block S106 is performed in the plasma tool 900. In this way, no vacuum break occurs from the block S105 to the block S106.

Figure 8A:
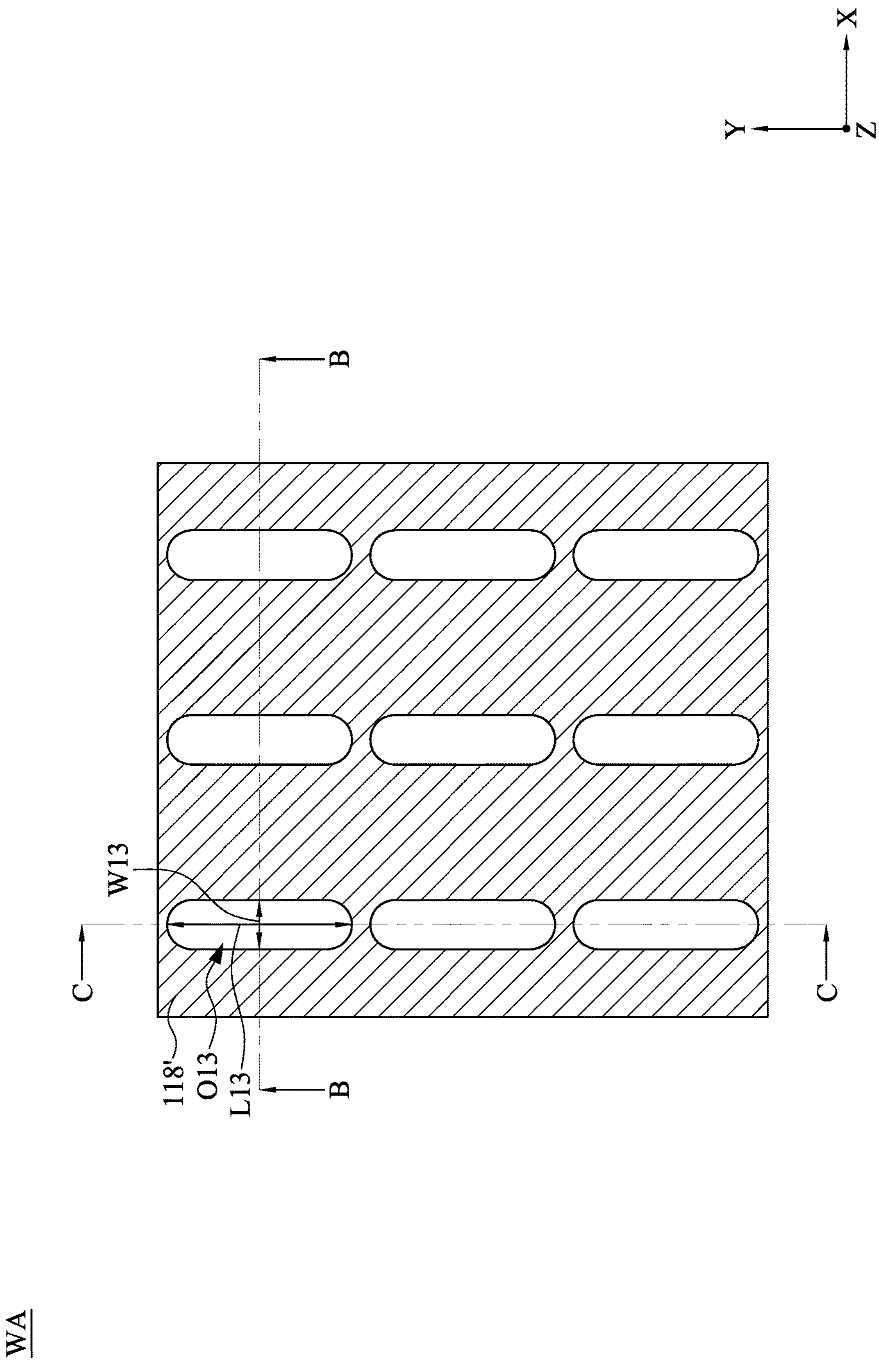
Figure 8B:
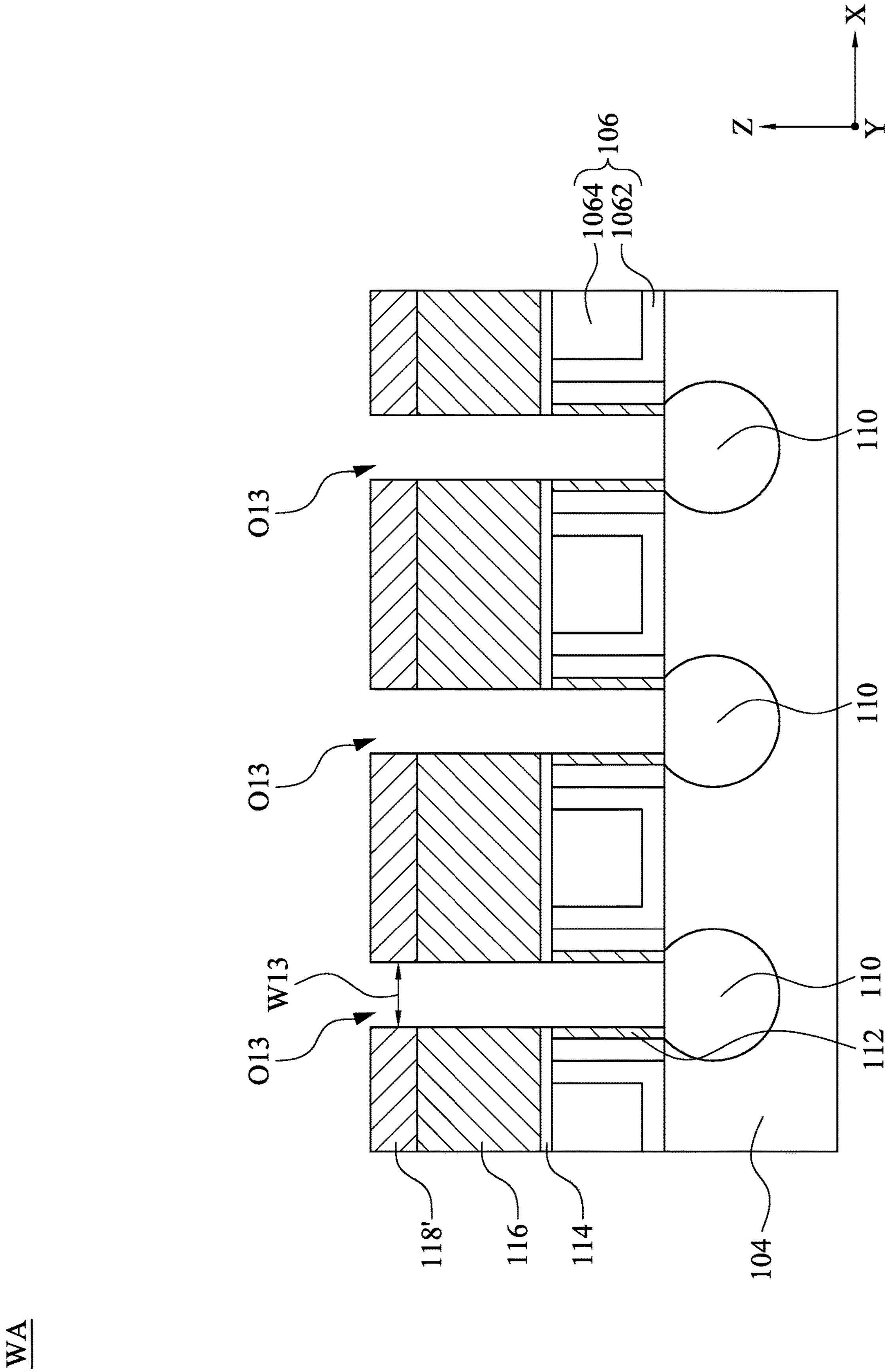
Figure 8C:
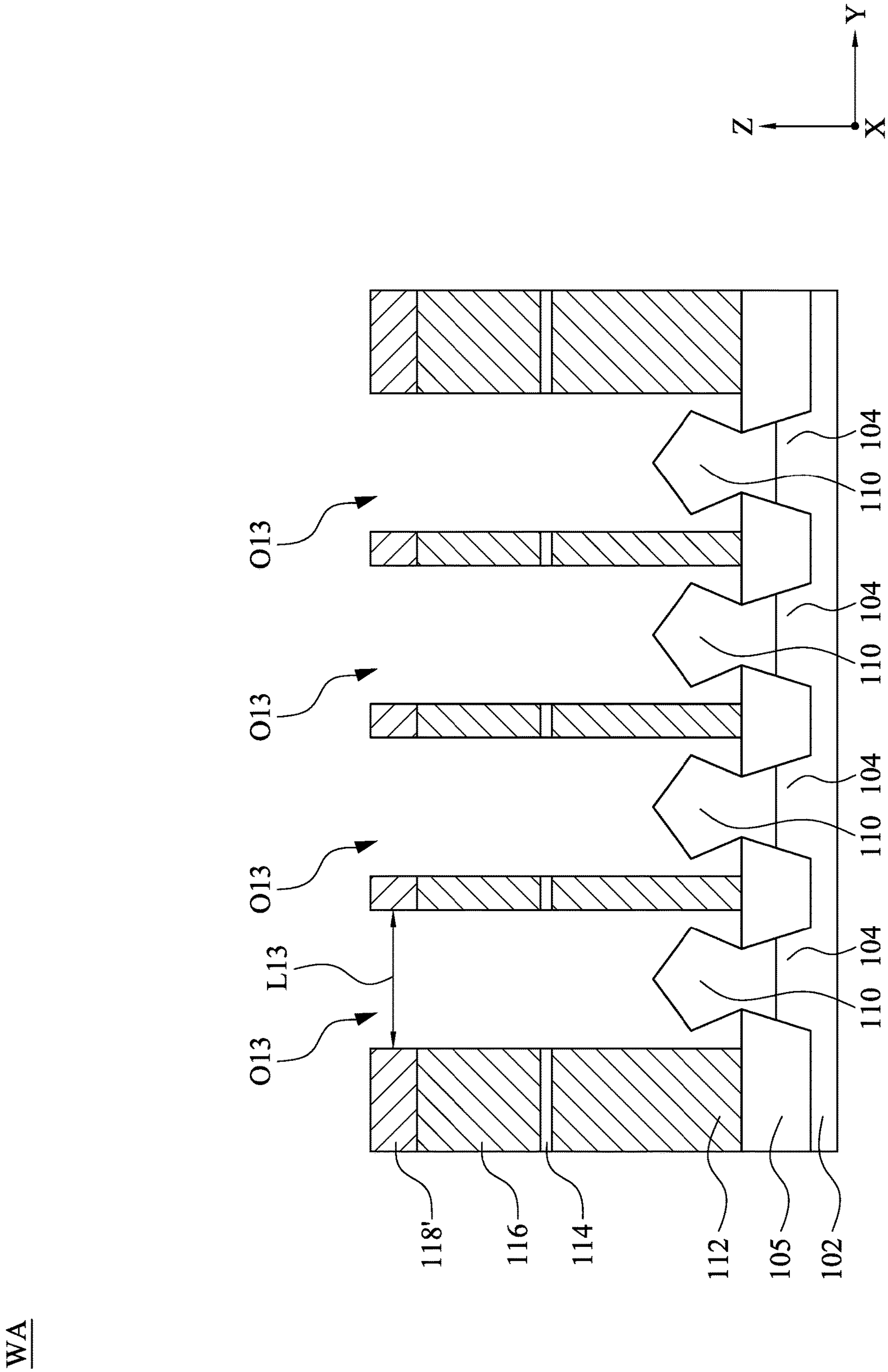

Returning to FIG. 1, the method M1 then proceeds to block S107 where the pattern of the elongated second openings is transferred to the underlying layers to form source/drain contact openings. With reference to FIGS. 8A-8C, in some embodiments of block S104, a patterning process is performed on the second ESL 118, the second ILD 116, the first ESL 114 and the first ILD 112 to transfer the pattern of the elongated openings O12" to these layers, resulting in source/drain contact openings O13 in these layers and exposing the source/drain regions 110. In some embodiments, the patterning process comprises one or more etching processes, where a combination of the protective layer 124, the patterned bottom layer 1222' and the patterned hard mask layer 120' is used as an etch mask. The one or more etching processes may include anisotropic wet etching processes, anisotropic dry etching processes, or combinations thereof. During the patterning process, the protective layer 124, the patterned bottom layer 1222' and the patterned hard mask layer 120' may be consumed. In some embodiments, remaining portions of the protective layer 124, the patterned bottom layer 1222' and the patterned hard mask layer 120' may be removed using suitable etchants.

As a result of the patterning process, the source/drain contact openings O13 inherit the pattern of the elongated openings O12" (as shown in FIGS. 7A-7C). In greater detail, the length L13 of the source/drain contact opening O13 is substantially the same as the length L12" of the elongated opening O12, and the width W13 of the source/drain contact opening O13 is substantially the same as the width W12" of the elongated opening O12". As shown in FIG. 8B, the width W13 of the source/drain contact opening O13 is controlled such that the gate stacks 106 arranged on opposite sides of the source/drain contact opening O13 along X-direction will not be exposed by the source/drain contact opening O13. This is advantageous for preventing damaging the gate stacks 106 resulting from the etchants used in the patterning process.

Figure 9A:
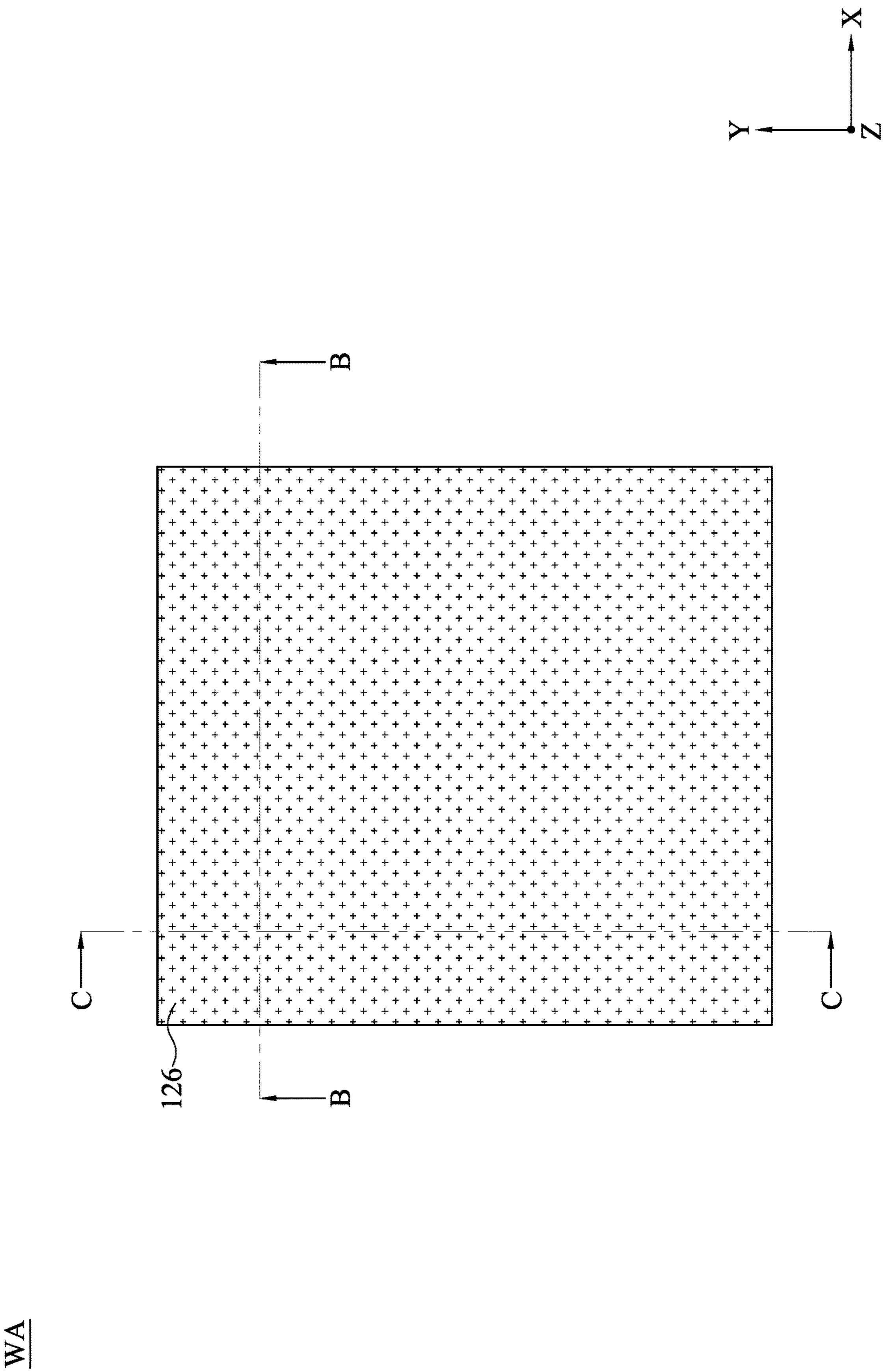
Figure 9B:
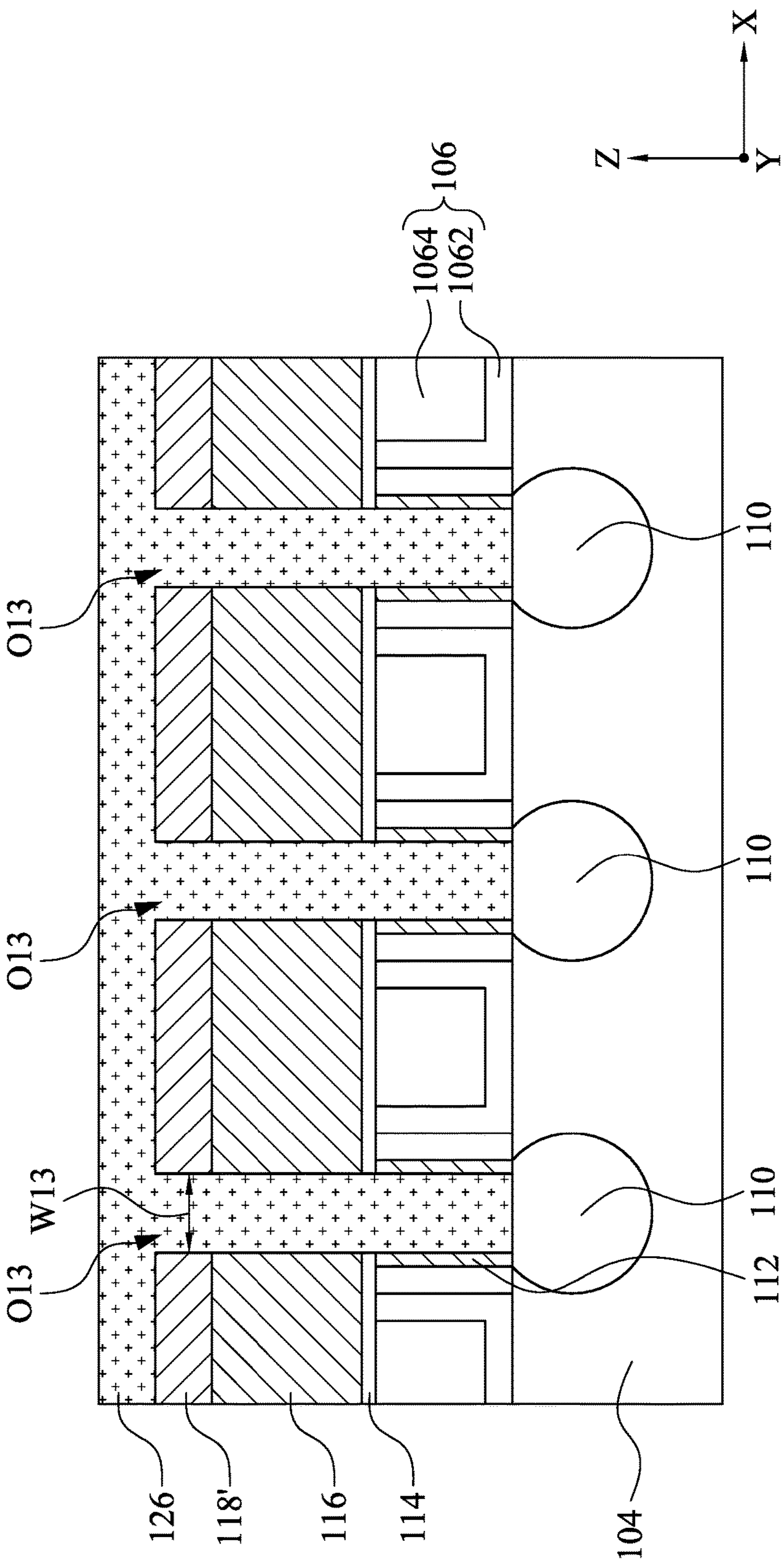
Figure 9C:
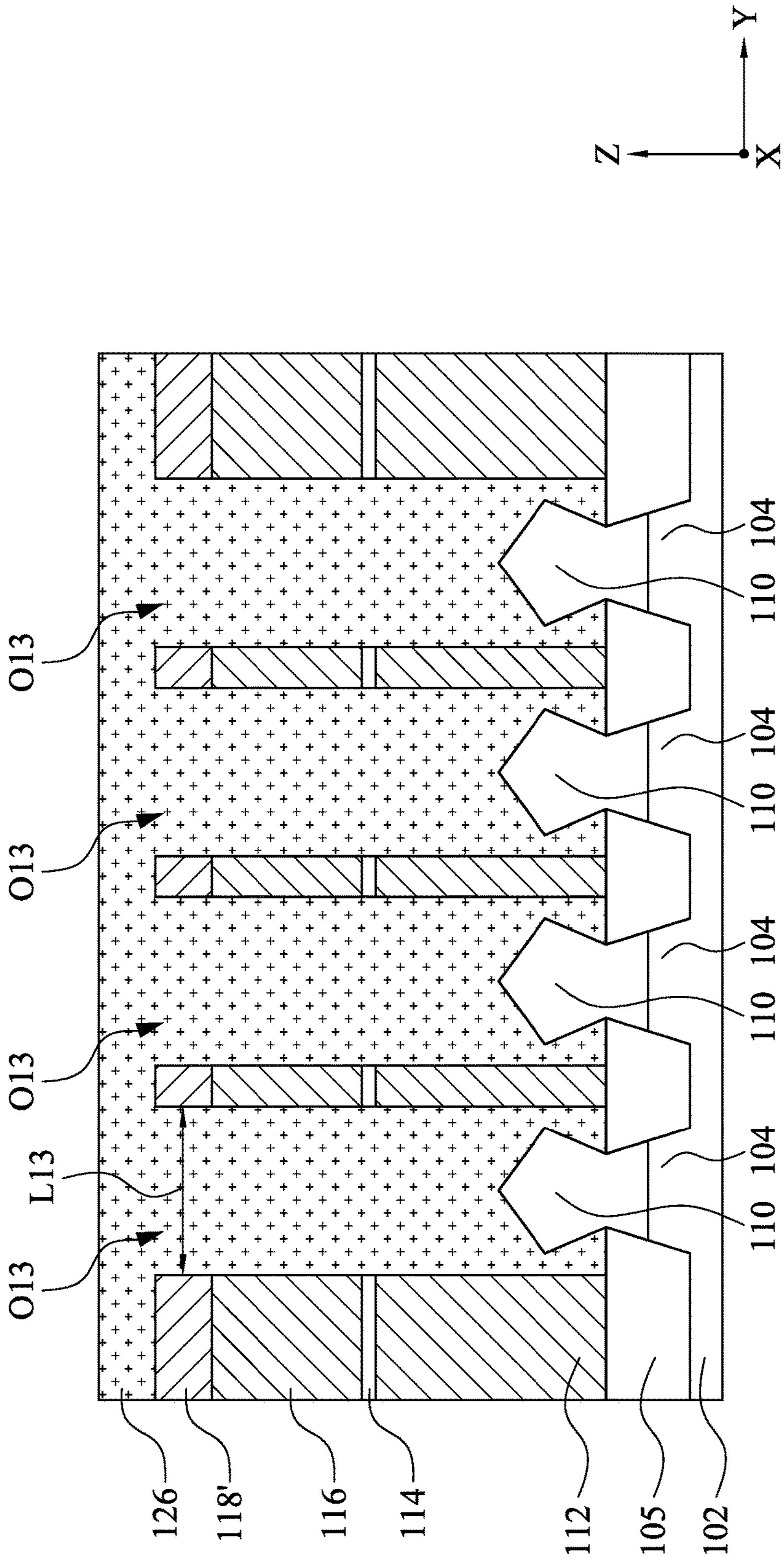

Returning to FIG. 1, the method M1 then proceeds to block S108 where the source/drain contact openings are filled with a conductive material. With reference to FIGS. 9A-9C, in some embodiments of block S108, one or more conductive materials 126 are deposited on the wafer WA and overfill the source/drain contact openings O13. The one or more conductive materials 126 include, for example, any suitable metal such as Co, W, Ti, Ta, Cu, Al and/or Ni and/or nitride of Ti or Ta.

Figure 10A:
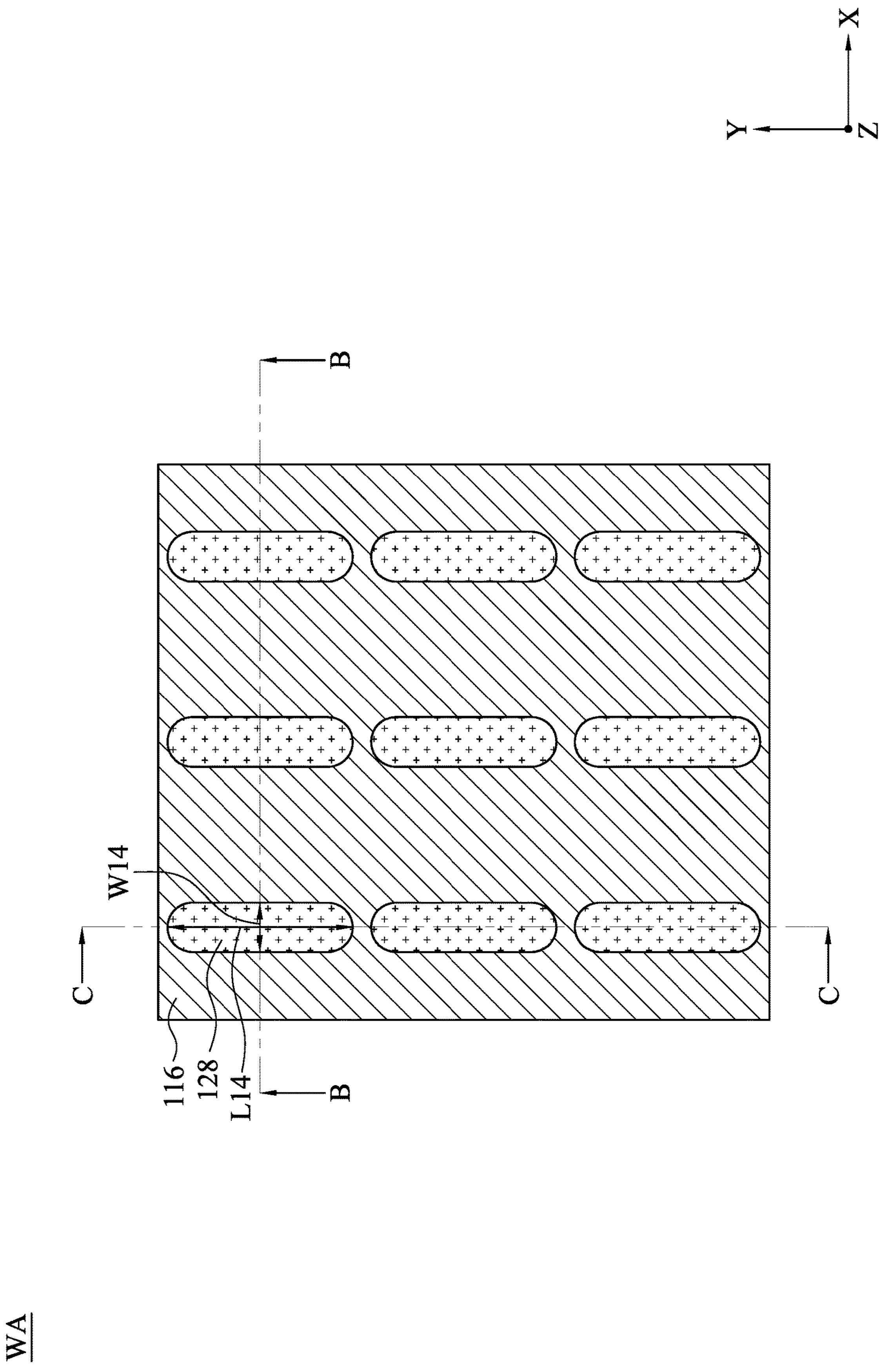
Figure 10B:
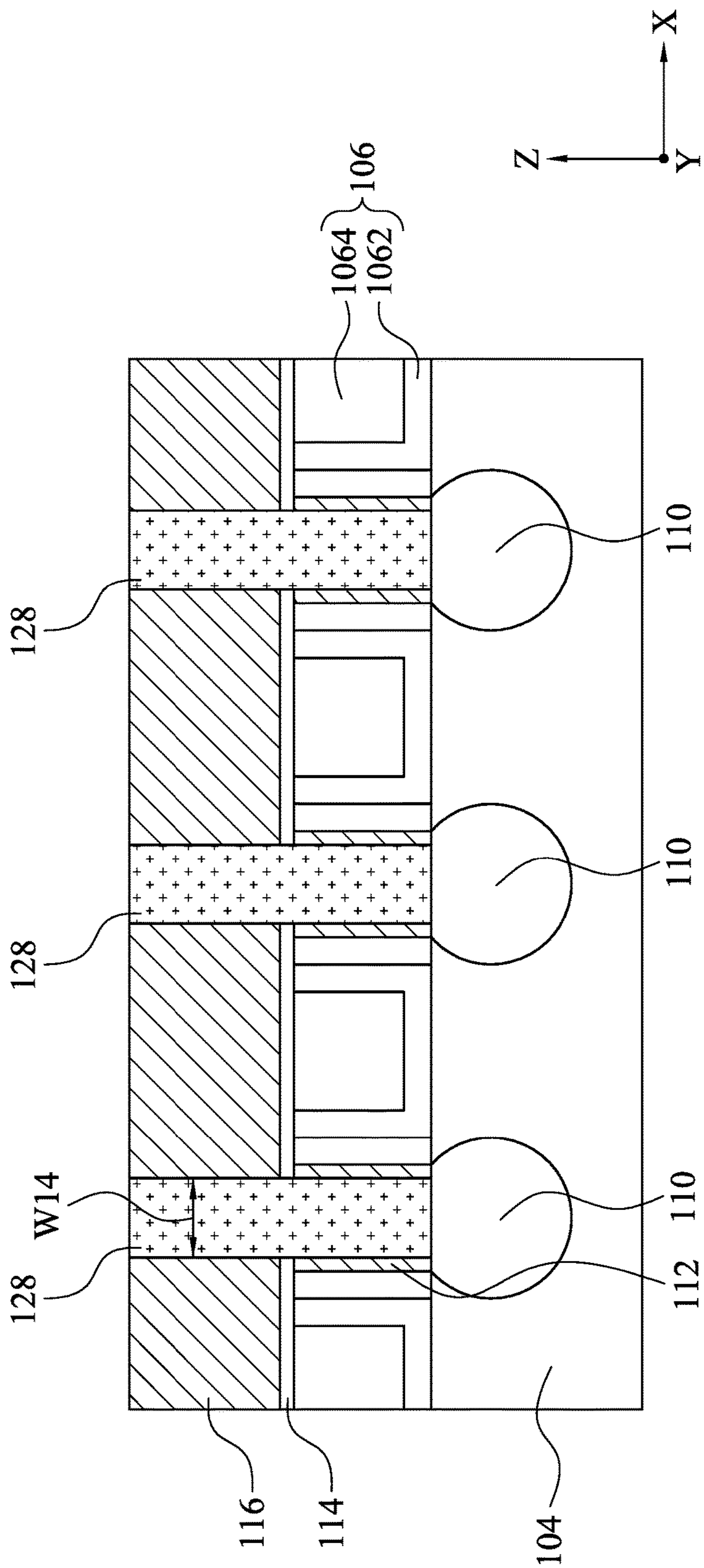
Figure 10C:
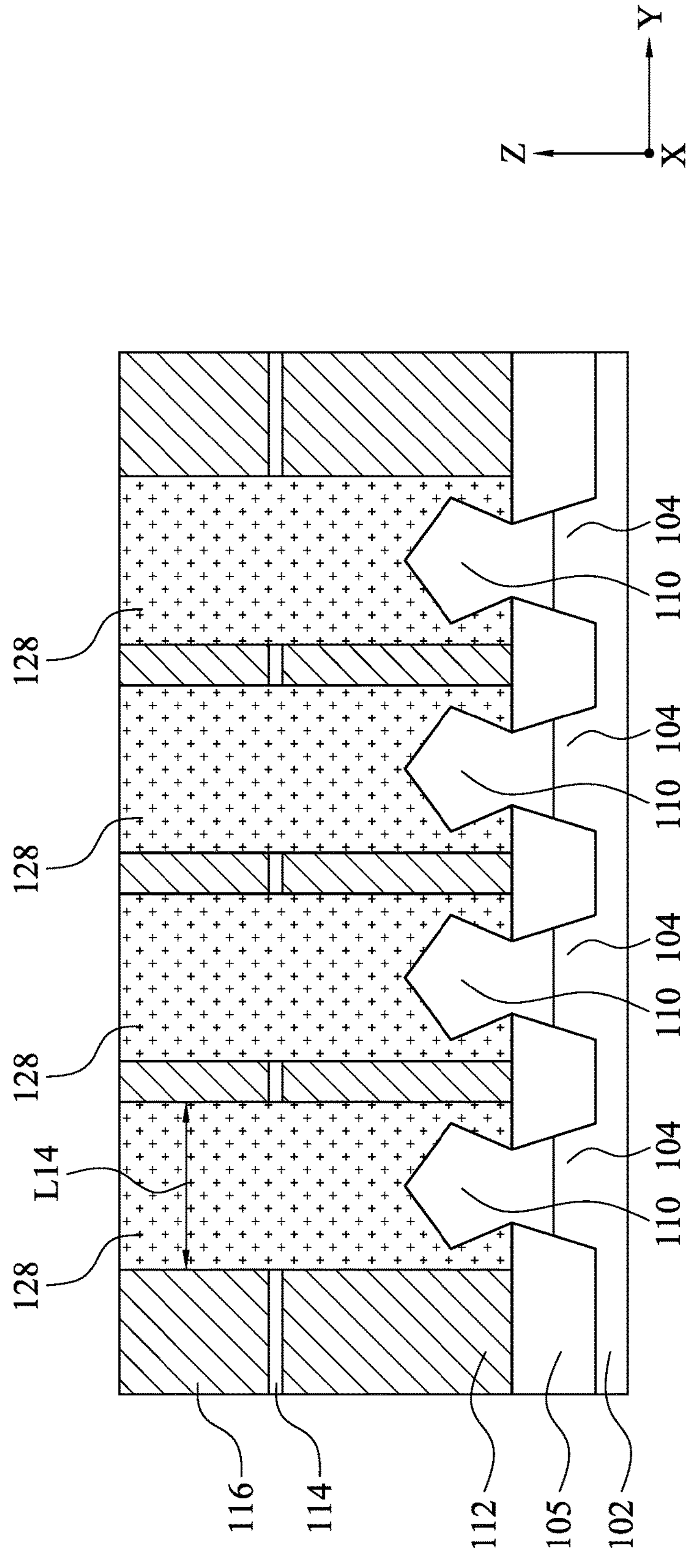

Returning to FIG. 1, the method M1 then proceeds to block S109 where the conductive material is planarized to form source/drain contacts. With reference to FIGS. 10A-10C, in some embodiments of block S109, a CMP process is performed to remove excess conductive materials 126 outside the source/drain contact openings O13 until reaching the second ILD 116. The remaining conductive materials 126 in the source/drain contact openings O13 can serve as source/drain contacts 128 in contact with the respective source/drain regions 110.

Because the source/drain contact openings O13 are filled with the source/drain contacts 128, the source/drain contacts 128 inherit the pattern of the source/drain contact openings O13 (as shown in FIGS. 8A-8C). In greater detail, the length L14 of the source/drain contact 128 is substantially the same as the length L13 of the source/drain contact opening O13, and the width W14 of the source/drain contact 128 is substantially the same as the width W13 of the source/drain contact opening O13. The widths W14 of the source/drain contacts 128 are controlled such that the source/drain contacts 128 are separated from the gate stacks 106, and the lengths L14 of the source/drain contacts 128 are controlled such that the contact area between the source/drain contacts 128 and the source/drain regions 110 can be increased.

Figure 11A:
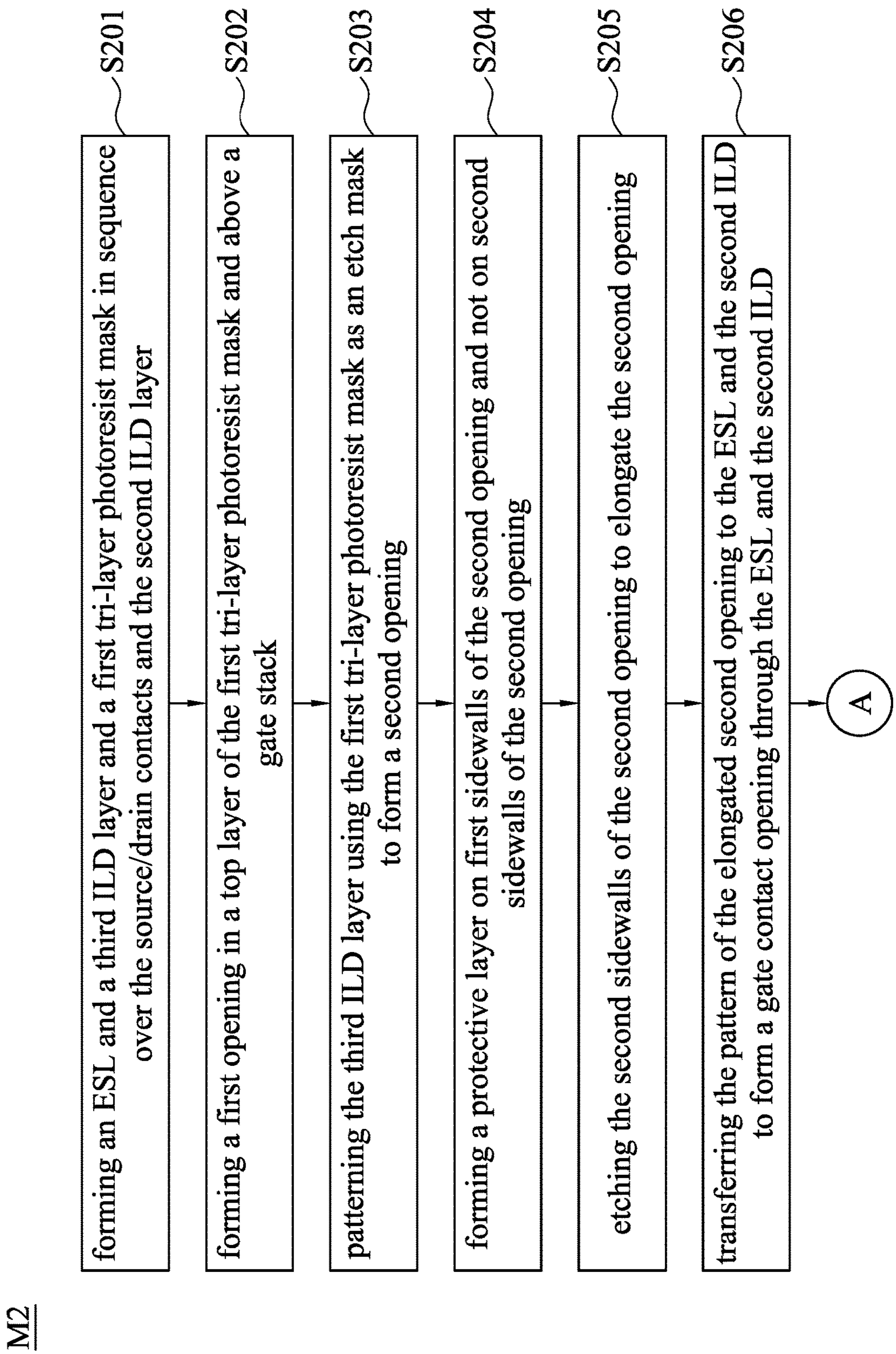
FIGS. 11A and 11B are a flow chart of a method of forming a semiconductor device in accordance with some embodiments of the present disclosure.
Figure 11B:
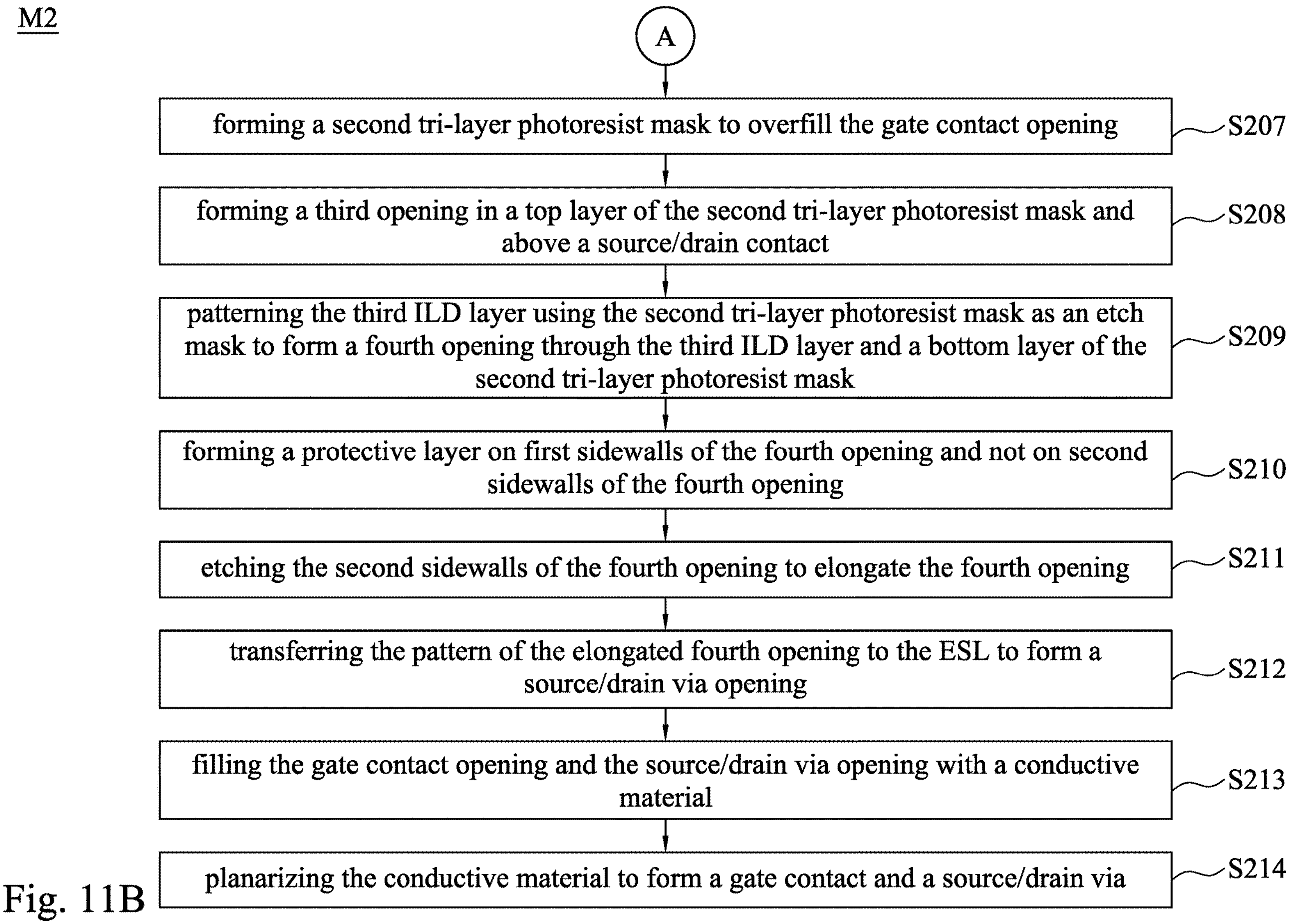

Formation of elongated source/drain contacts using the directional deposition process and the directional etching process as discussed above can be used to form other elongated features. For example, referring now to FIGS. 11A and 11B, illustrated are a method M2 that includes forming elongated gate contacts and elongated source/drain vias using the directional deposition process and the directional etching process as discussed above. FIGS. 12A-22D illustrate various processes at various stages of the method M2 of FIGS. 11A and 11B in accordance with some embodiments of the present disclosure. Throughout the various views and illustrative embodiments, like reference numbers are used to designate like elements. In FIGS. 12A-22D, the "A" figures (e.g., FIGS. 12A, 13A, etc.) illustrate a top view, the "B" figures (e.g., FIGS. 12B, 13B, etc.) illustrate a cross-sectional view along X-direction corresponding the lines B-B illustrated in the "A" figures, the "C" figures (e.g., FIGS. 12C, 13C, etc.) illustrate a cross-sectional view along Y-direction corresponding the lines C-C illustrated in the "A" figures, and the "D" figures (e.g., FIGS. 17D, 21D, etc.) illustrate a cross-sectional view along Y-direction corresponding the lines D-D illustrated in the "A" figures. It is understood that additional operations can be provided before, during, and after the processes shown by FIGS. 12A-22D, and some of the operations described below can be replaced or eliminated, for additional embodiments of the method. The order of the operations/processes may be interchangeable.

Figure 12A:
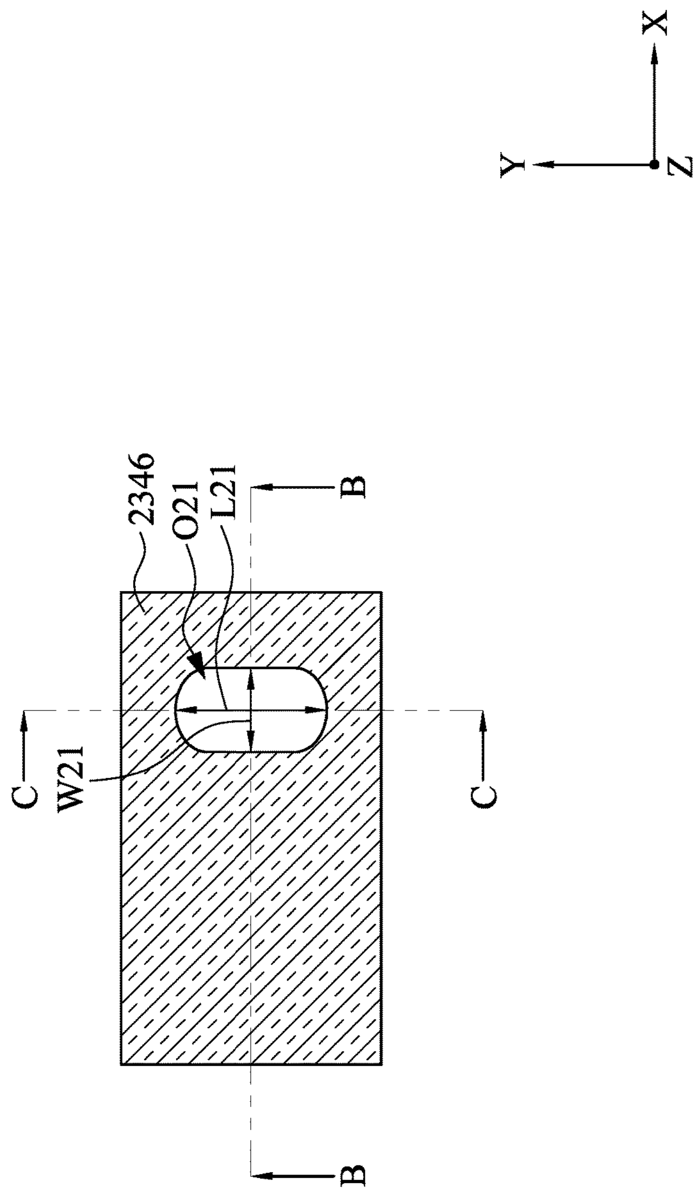
FIGS. 12A, 13A, 14A, 15A, 16A, 17A, 18A, 19A, 20A, 21A and 22A illustrate a top view of a semiconductor device at various stages of the method of FIGS. 11A and 11B in accordance with some embodiments of the present disclosure.
Figure 12B:
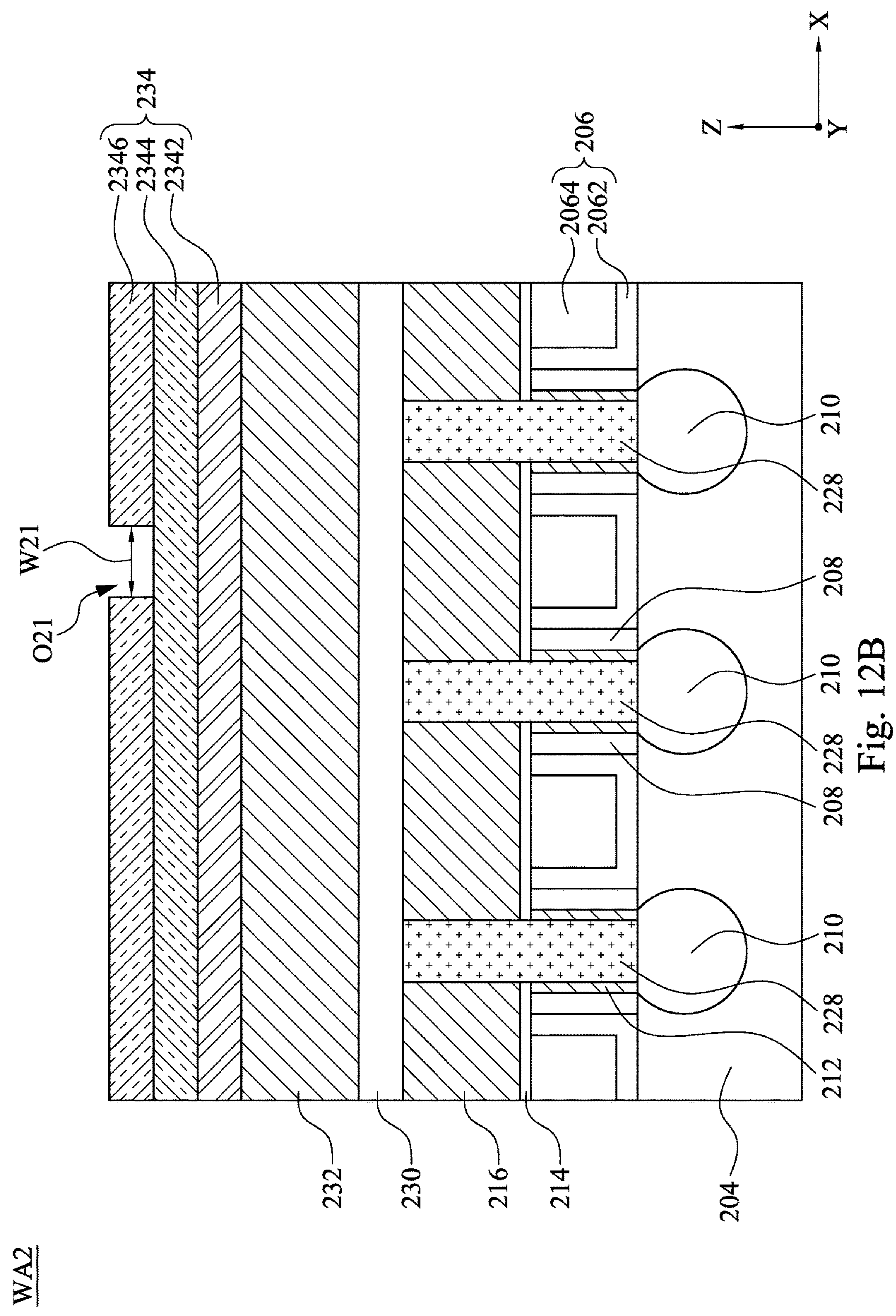
FIGS. 12B, 13B, 14B, 15B, 16B, 17B, 18B, 19B, 20B, 21B and 22B illustrate a cross-sectional view of a semiconductor device at various stages of the method of FIGS. 11A and 11B in accordance with some embodiments of the present disclosure.
Figure 12C:
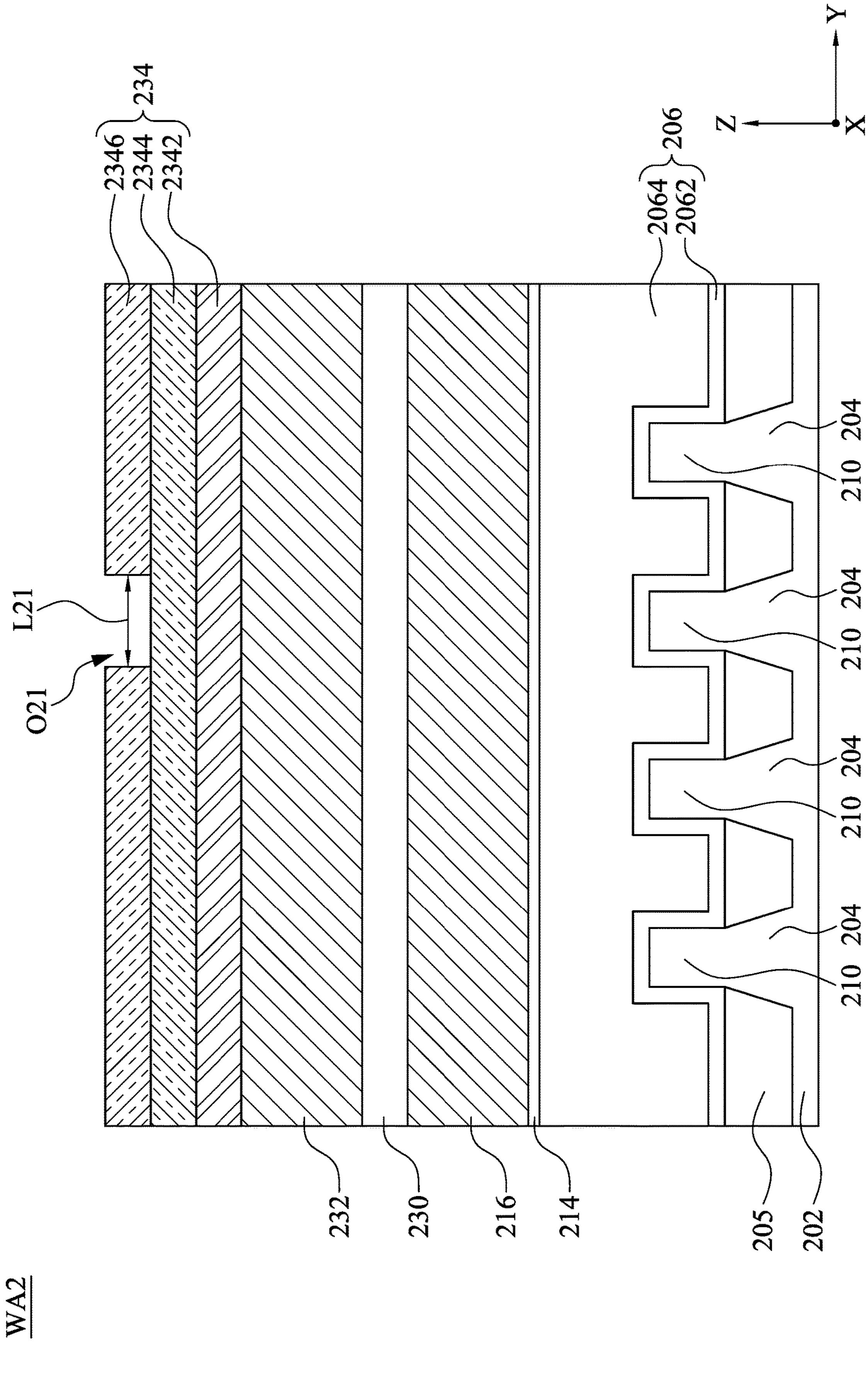
FIGS. 12C, 13C, 14C, 15C, 16C, 17C, 18C, 19C, 20C, 21C and 22C illustrate another cross-sectional view of a semiconductor device at various stages of the method of FIGS. 11A and 11B in accordance with some embodiments of the present disclosure.

As illustrated in FIGS. 12A-12C, a semiconductor wafer WA2 is substantially similar to the semiconductor wafer WA in many respects, and includes a substrate 202, semiconductor fins 204, STIs 205, gate stacks 206 having gate dielectric layers 2062 and metal layers 2064, gate spacers 208, source/drain regions 210, a first ILD layer 212, a first ESL 214 and a second ILD layer 216, each substantially as described above with respect to the substrate 102, semiconductor fins 104, STIs 105, gate stacks 106 having gate dielectric layers 1062 and metal layers 1064, gate spacers 108, source/drain regions 110, the first ILD layer 112, the first ESL 114 and the second ILD layer 116. The semiconductor wafer WA2 also includes source/drain contacts 228. In some embodiments, the source/drain contacts 228 are formed using an elongating process involving a directional deposition process and a directional etching process, as described above with respect to the source/drain contacts 128. In some other embodiments, the source/drain contacts 228 are formed without using the directional deposition process and a directional etching process and thus may have different shapes than the source/drain contacts 128.

In block S201, an ESL 230 and a third ILD layer 232 and a first tri-layer photoresist mask 234 are formed in sequence over the source/drain contacts 228 and the second ILD layer 216 using suitable deposition techniques. In some embodiments, the ESL 230 may include a nitride material, such as silicon nitride, titanium nitride or the like, and may be formed using a deposition process, such as CVD or PVD.

The third ILD layer 232 may be formed using, for example, CVD, ALD, spin-on-glass (SOG) or other suitable techniques and include the same material as the first ILD layer 212 and/or the second ILD layer 216, and thus description about the third ILD 232 is not repeated herein for the sake of brevity. The first tri-layer photoresist mask 234 includes a bottom layer 2342, a middle layer 2344 and a top layer 2346, respectively similar to the bottom layer 1222, the middle layer 1224 and the top layer 1226 of the tri-layer photoresist mask 122 as discussed previously with respect to FIGS. 3A-3C. Description about the bottom layer 2342, the middle layer 2344 and the top layer 2346 is thus not repeated for the sake of brevity.

In block S202, a first opening O21 is formed in the top layer 2346 and above a gate stack 206. Formation of the first opening O21 includes irradiating the top layer 2346 and developing the top layer 2346 to remove portions of the top layer 2346, as discussed previously with respect to FIGS. 4A-4C. The first opening O21 in the top photoresist layer 2346 is used to define the pattern of gate contact opening that will be formed in the second ILD 216 in following steps. As illustrated in FIG. 12A, the first opening O21 has a length L21 in Y-direction and a width W21 in X-direction, and the length L21 is greater than the width W21. Therefore, the subsequently formed gate contact opening will have a length in Y-direction greater than a width in X-direction, which in turn will result in increased gate contact area while preventing gate contacts from contacting the source/drain contacts 228, which will be discussed below in greater detail.

Figure 13A:
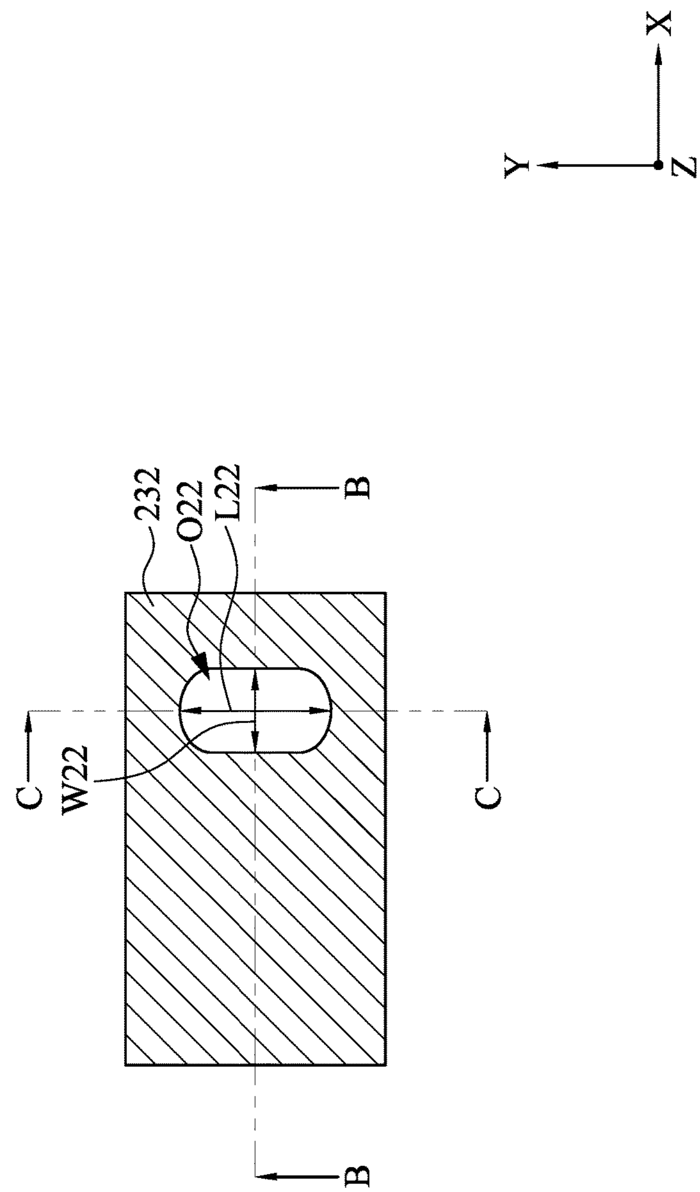
Figure 13B:
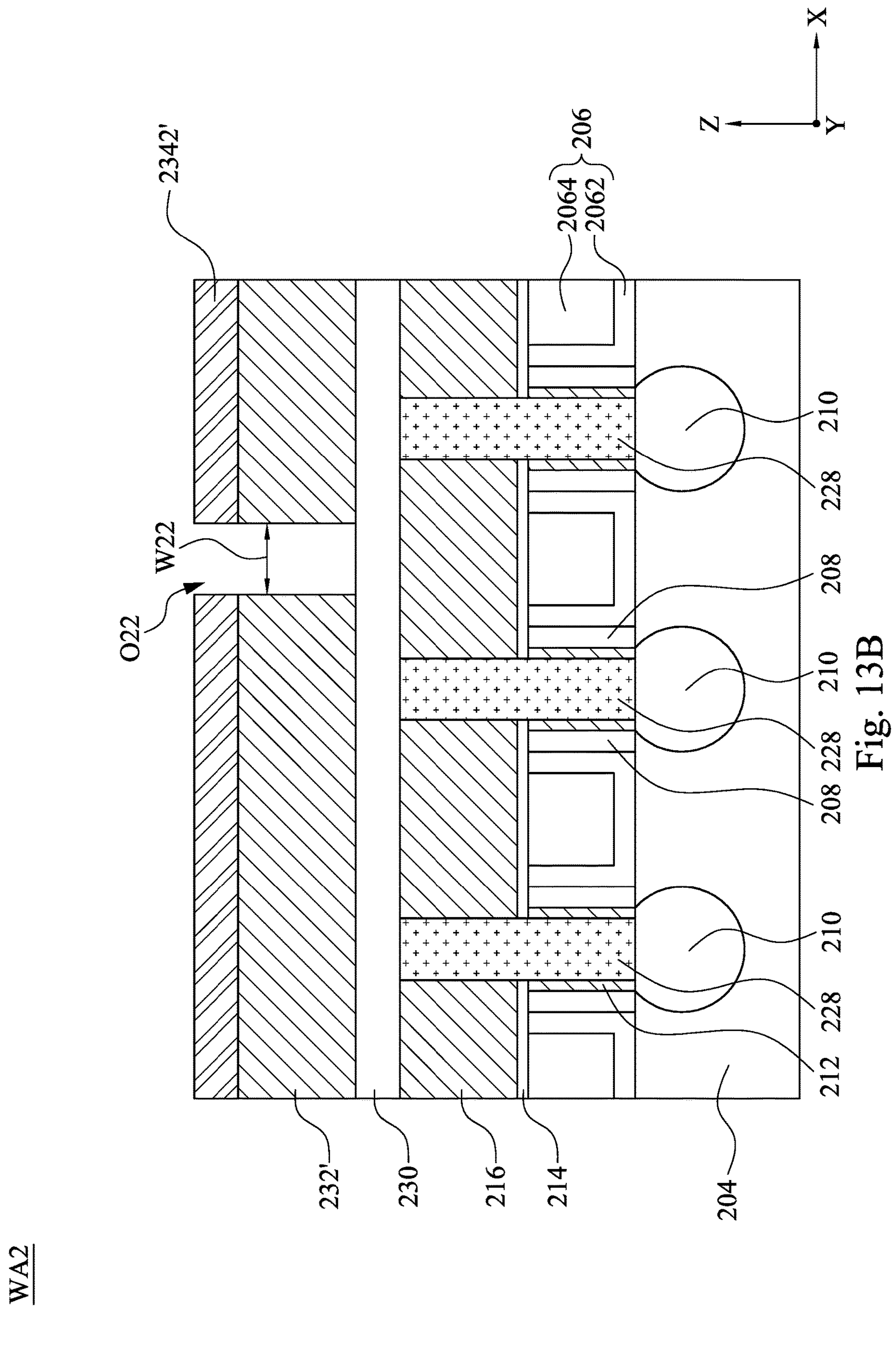
Figure 13C:
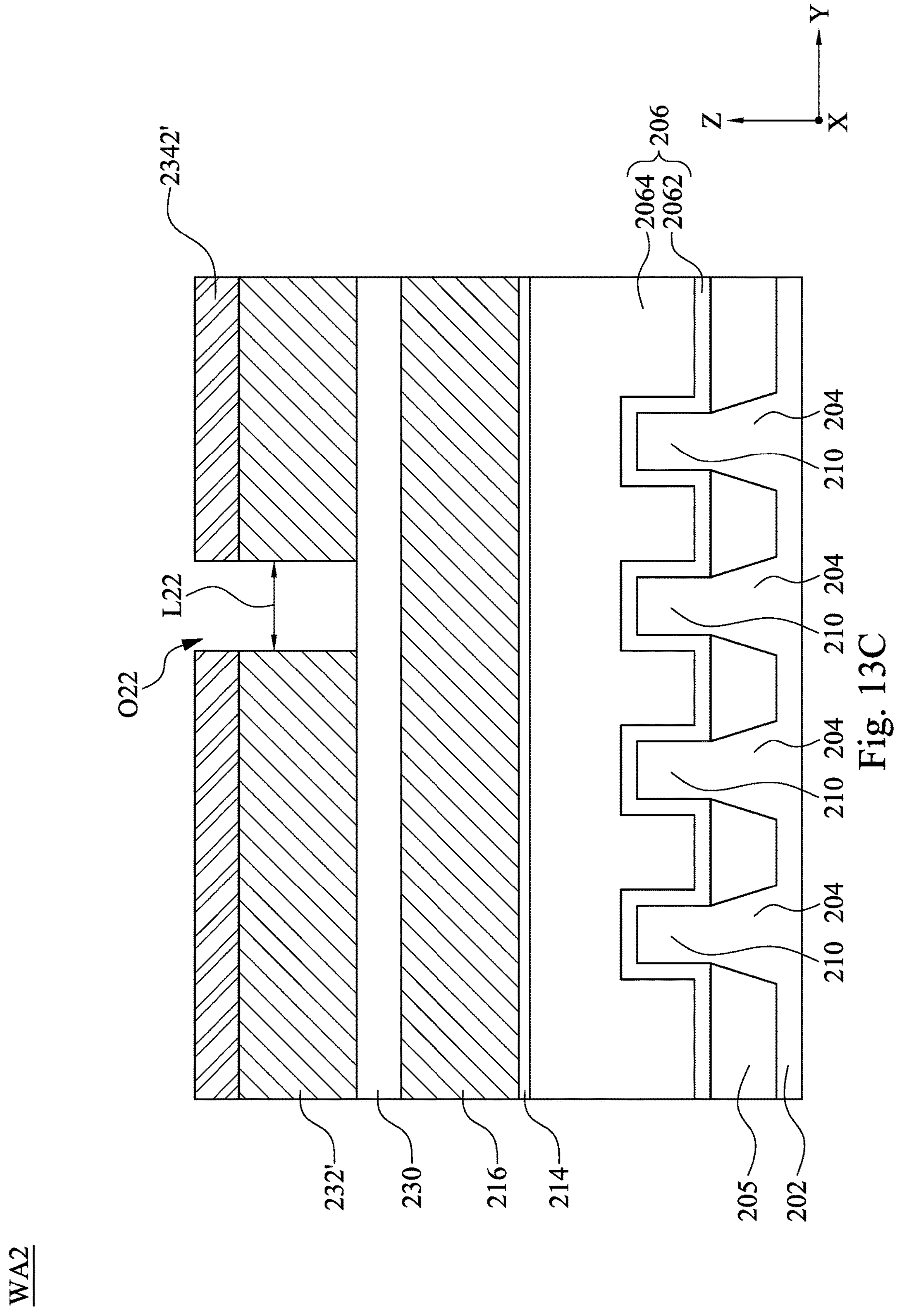

Returning to FIG. 11A, the method M2 then proceeds to block S203 where the third ILD layer is patterned using the first tri-layer photoresist mask as an etch mask to form a second opening. With reference to FIGS. 13A-13C, in some embodiments of block S203, a patterning process is performed on the third ILD layer 232 to transfer the pattern of the first opening O21 in the patterned top photoresist layer 2346 to the third ILD layer 232, resulting in a second opening O22 in the third ILD layer 232'. In some embodiments, the patterning process comprises one or more etching processes, where the tri-layer photoresist mask 234 is used as an etch mask. The one or more etching processes may include anisotropic wet etching processes, anisotropic dry etching processes, or combinations thereof. During the patterning process, the patterned top layer 2346 and the middle layer 2344 of the photoresist mask 234 may be consumed, and portions of the bottom layer 2342 may remain after the patterning process. In this way, the patterning process also results in a patterned bottom layer 2342' over the patterned ILD layer 232'.

The patterned bottom layer 2342' and the patterned ILD layer 232' inherit the pattern in the top photoresist layer 2346, and thus the second opening O22 has substantially the same shape, size and position as the first opening O21 in the patterned top photoresist layer 2346. For example, the second opening O22 has a length L22 in Y-direction and a width W22 in X-direction, and the length L22 is greater than the width W22. The pattern of the second opening O22 vertically above the gate stack 206 can be transferred to the underlying second ILD layer 216 in following steps, and thus the second opening O22 can be used to define the pattern of the gate contact opening in the second ILD layer 216. In this way, the subsequently formed gate contact opening will have a length in Y-direction greater than a width in X-direction.

The length L22 of the second opening O22 in Y-direction is in positive correlation with a gate contact area. Stated differently, the greater the length L22 of the second opening O22, the larger the gate contact area. Therefore, one or more lateral etching processes might be used to elongate the second openings O22 in Y-direction. However, if the patterned bottom layer 2342' and the third ILD layer 232' undergo the one or more lateral etching processes, the second opening O22 would be inevitably elongated in both X-direction and Y-direction, which in turn would lead to increased width W22 of the second opening O22, which in turn might cause damage to the source/drain contacts 228 arranged in X-direction during transferring the pattern of the elongated second opening O22 to the second ILD layer 216. Therefore, in some embodiments of the present disclosure, a directional deposition process having a higher deposition rate in X-direction than in Y-direction is performed on the wafer WA2 (block S204 of the method M2), followed by a direction etching process having a higher etch rate in Y-direction than in X-direction (block S205 of the method M2). In this way, the second opening O22 can be elongated in Y-direction but substantially not in X-direction, as described below in greater detail.

Figure 14A:
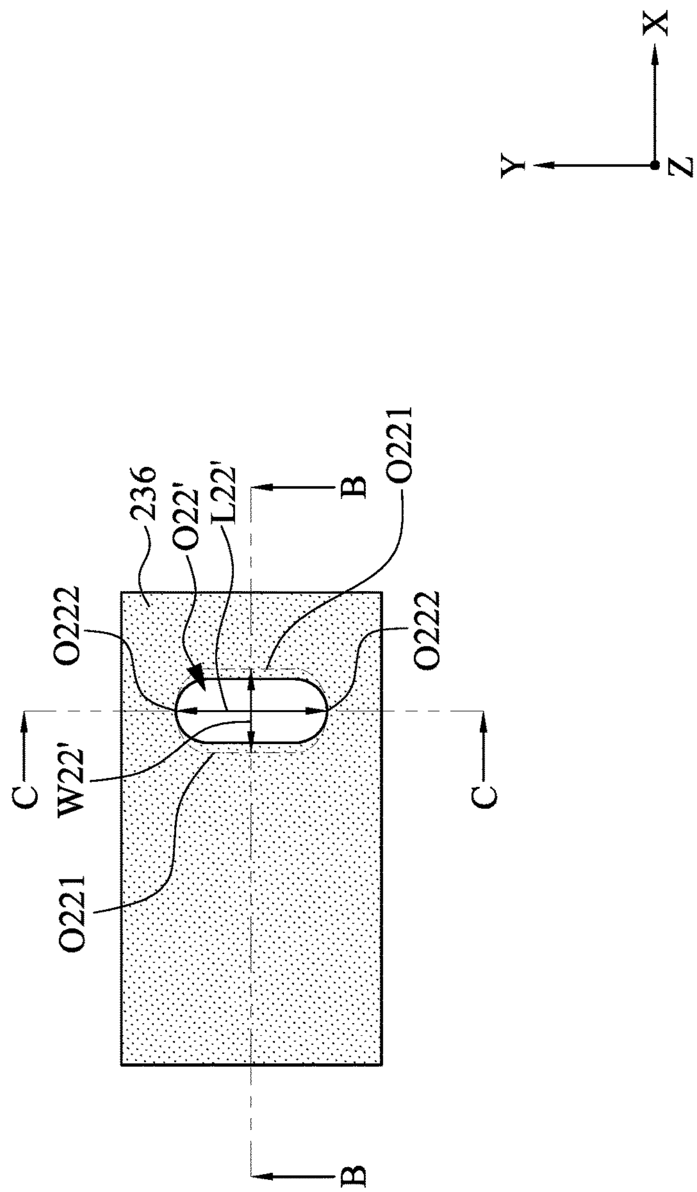
Figure 14B:
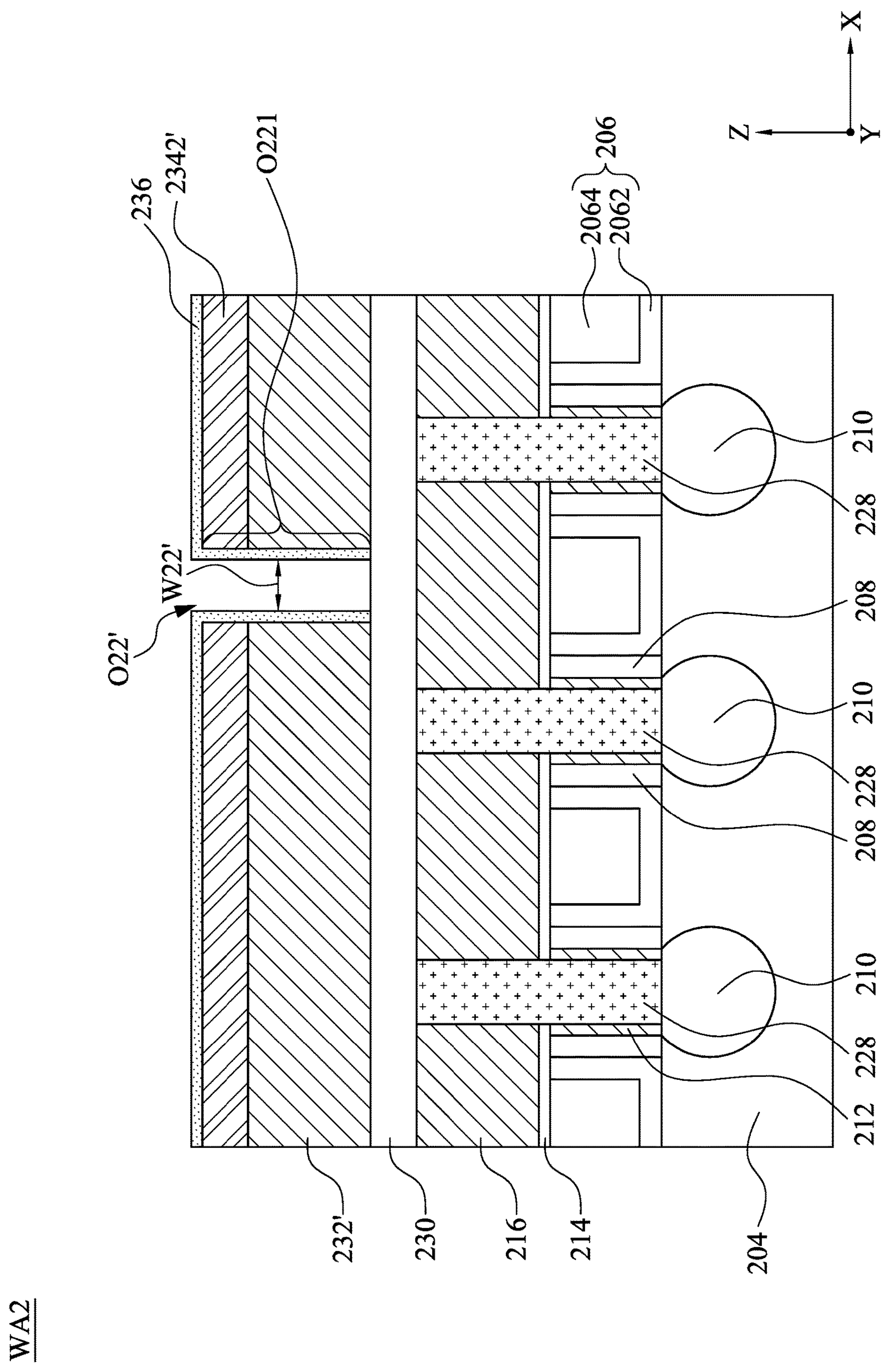
Figure 14C:
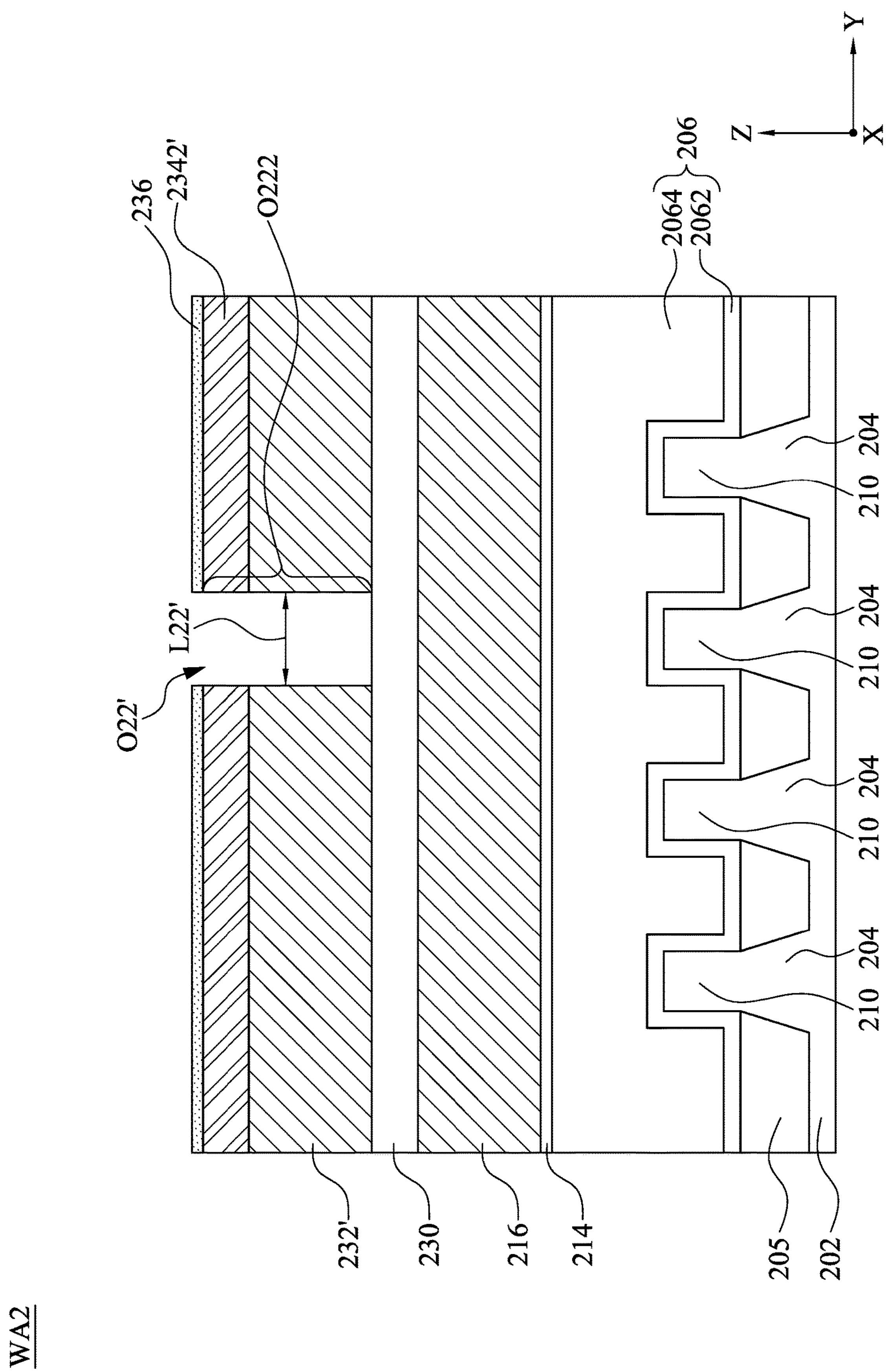

With reference to FIGS. 14A-14C, in some embodiments of block S204, a directional deposition process is performed to form a protective layer 236 on first sidewalls O221 of the second opening O22' that extend in Y-direction and substantially not on second sidewalls O222 of the second opening O22' that extend in X-direction. The directional deposition process is performed using directional ions, thus resulting in a higher deposition rate in X-direction than in Y-direction, so that the Y-directional sidewalls O221 as shown in FIG. 14A can be deposited with more polymers (e.g., carbon-containing polymers, chlorine-containing polymers and/or bromine-containing polymers) than the X-directional sidewalls O222 as shown in FIG. 14A. In some embodiments, a ratio of the deposition rate in X-direction to the deposition rate in Y-direction is in a range from about 10:1 to about 30:1.

The directional deposition process can be performed using, for example, the plasma tool 900 as illustrated in FIG. 38. In greater detail, the ions 922*a* and 922*b* can be extracted and directed to the wafer WA2. Because trajectories of the ions 922*a* and 922*b* can be controlled to extend in X-direction and Z-direction but substantially not in Y-direction in FIG. 38 as discussed previously, the ions 922*a* and 922*b* can be directed at first sidewalls O221 while substantially not being directed at the second sidewalls O222. In some embodiments, the process conditions are selected such that polymerization phenomenon resulting from ions is dominant over etching phenomenon resulting from ions, so that the ions 922*a* and 922*b* directed at the first sidewalls O221 but substantially not at second sidewalls O222 of the second opening O22' can result in deposition of polymers on first sidewalls O221 but substantially not on second sidewalls O222. These deposited polymers can be referred to as a protective layer (or polymer layer) 236. In some embodiments, process conditions of the directional deposition process are similar to those of the directional deposition process as discussed previously with respect to FIGS. 6A-6C, and are not repeated for the sake of brevity.

As a result of the directional deposition, the length L22' of the second opening O22' in Y-direction remains substantially the same as the length L22 of the second opening O22 (as shown in FIG. 13A), and the width W22' of the second opening O22' in X-direction is less than the width W22 of the second opening O22. The difference between the width W22' of the second opening O22' after directional deposition and the width W22 of the second opening O22 before directional deposition is substantially twice the thickness of the protective layer 236. In some embodiments, the directional deposition results in deposition of polymers over a top surface of the patterned bottom layer 2342', so that the protective layer 236 extends over the top surface of the patterned bottom layer 2342'. In some embodiments, the ESL 230 at a bottom of the second opening O22' may be free from coverage by the protective layer 236 (i.e., polymers) because of the shadowing effect resulting from slanted trajectories of the directional ions.

Figure 15A:
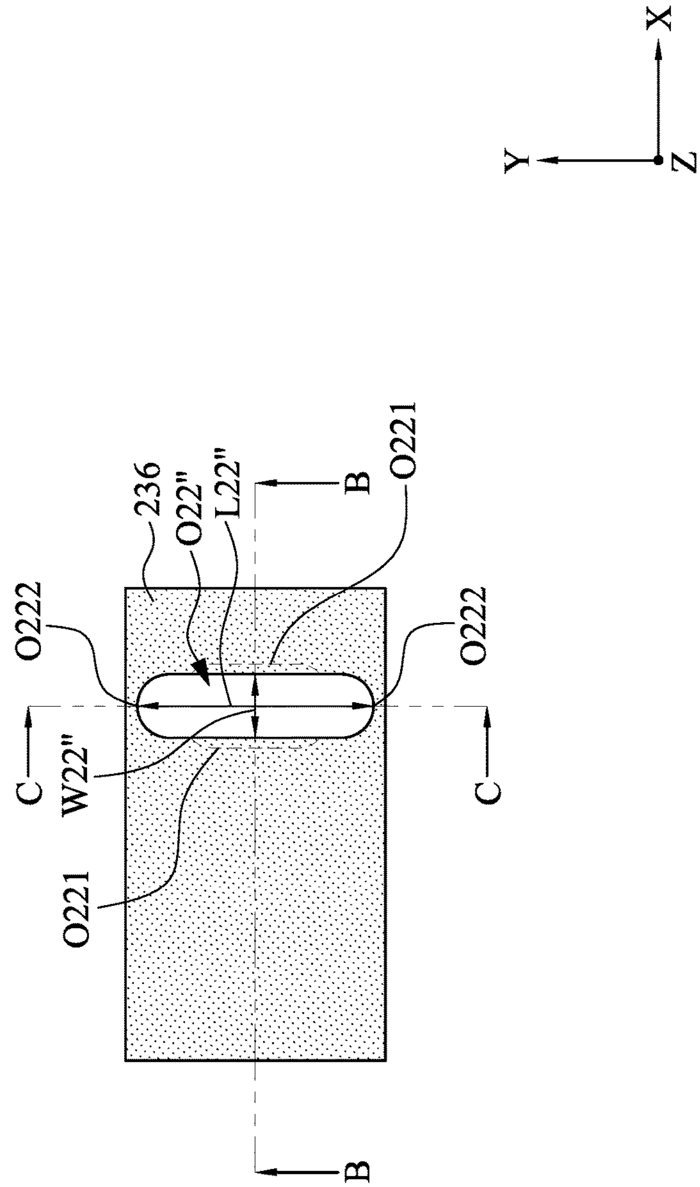
Figure 15B:
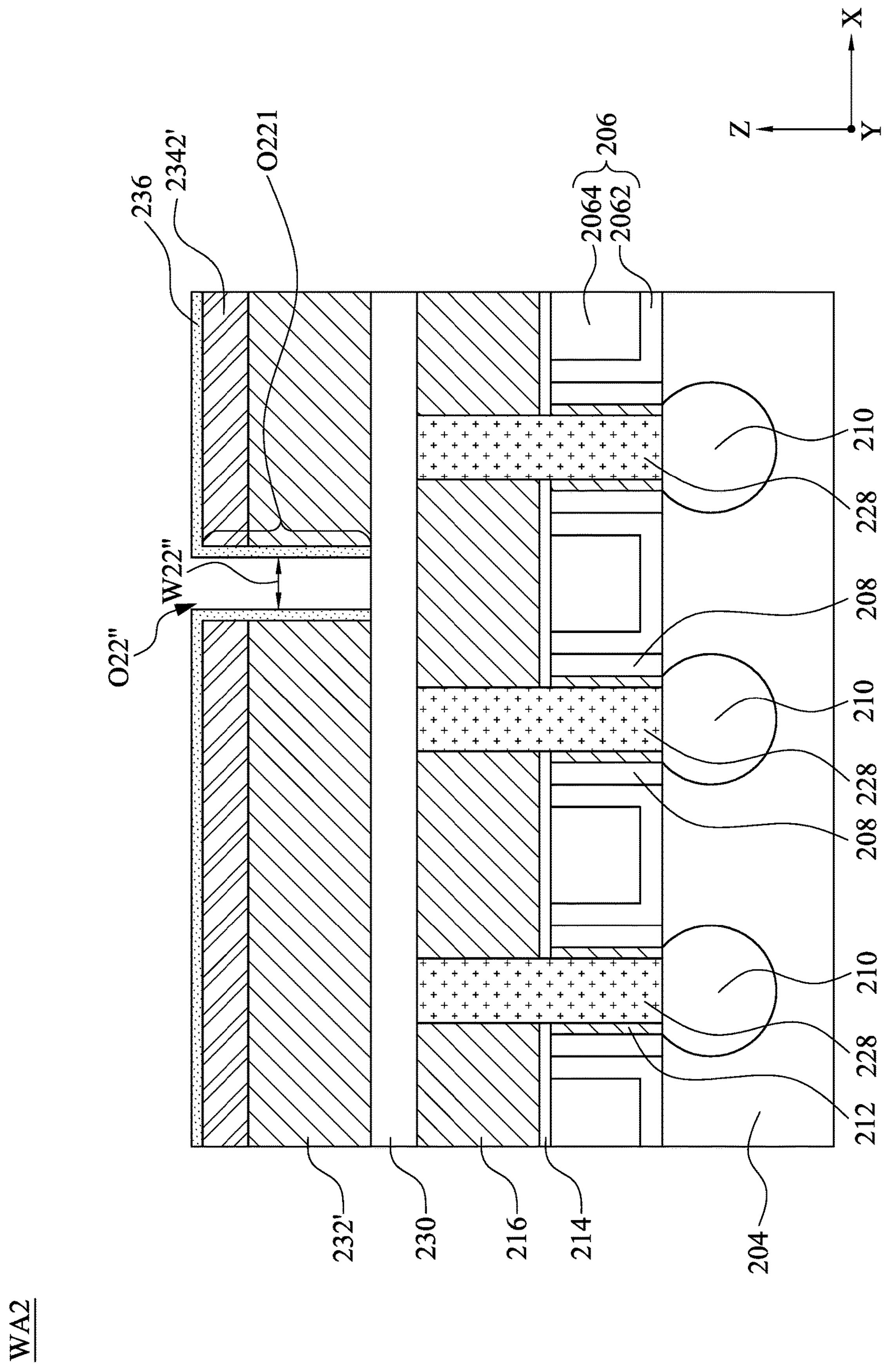
Figure 15C:
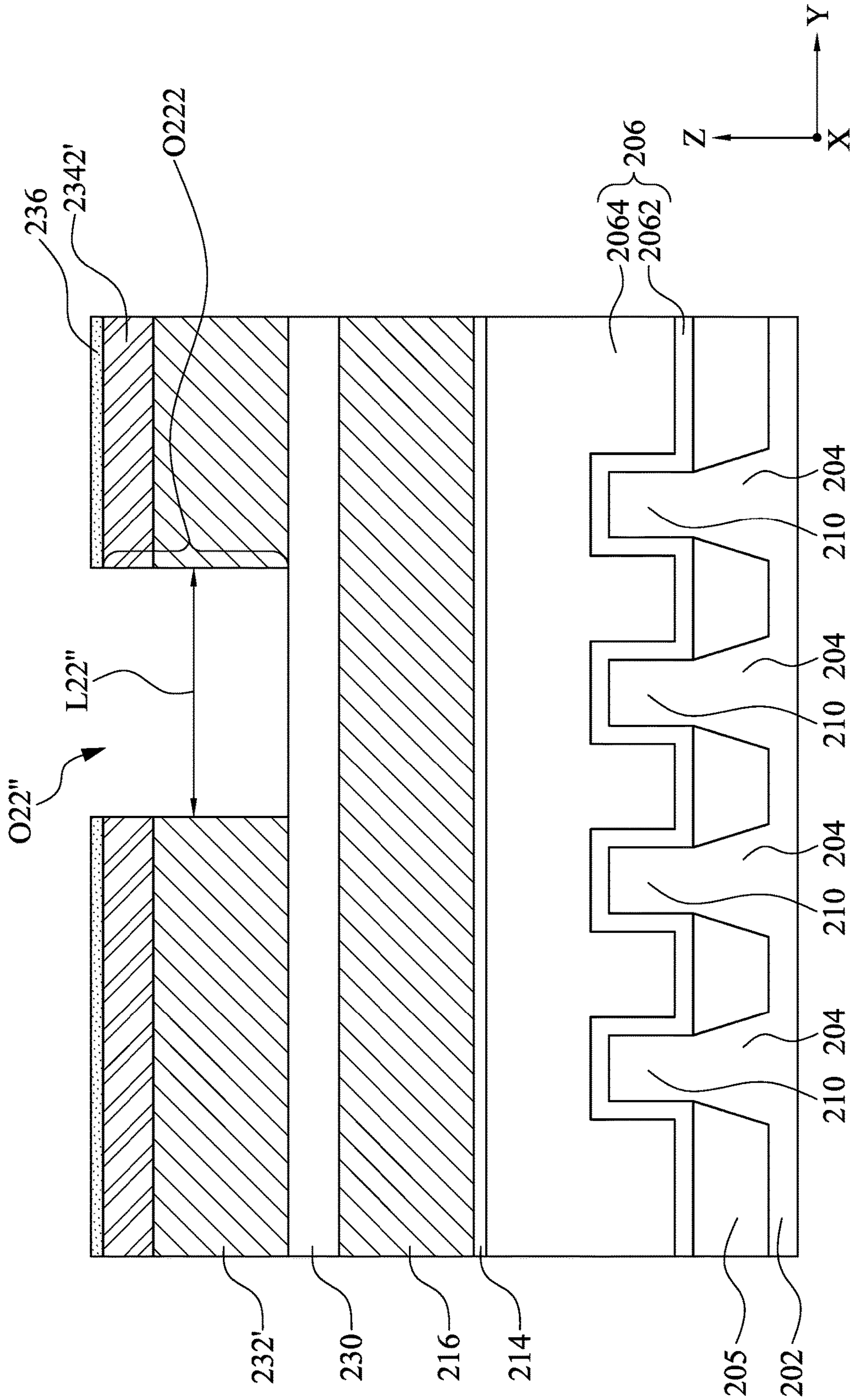

Returning to FIG. 11A, the method M2 then proceeds to block S205 where second sidewalls of the second opening are etched to elongate the second opening. In some embodiments of block S205, a directional etching process is performed on the second sidewalls O222 of the second opening O22', thus resulting in elongated opening O12" as shown in FIGS. 15A-15C. The directional etching process is performed using directional ions. For example, the directional etching process can be performed using the plasma tool 900 as illustrated in FIG. 38, as described below in detail.

After performing the direction deposition process on the wafer WA2 in the plasma tool 900, the wafer WA2 can be rotated about the Z-directional shaft 929 by about 88-92 degrees (e.g., about 90 degrees). In this way, the second sidewalls O222 of the second opening O22' can be arranged in X-direction in FIG. 38. After rotating the wafer WA, the ions 922*a* and 922*b* can be extracted and directed to the wafer WA2. Because trajectories of the ions 922*a* and 922*b* extend in X-direction and Z-direction but substantially not in Y-direction in FIG. 38, the ions 922*a* and 922*b* can be directed at the second sidewalls O222 of the second opening O22' while substantially not being directed at the protective layer 236 alongside the first sidewall O221 of the second opening O22'. In some embodiments, the process conditions are selected such that etching phenomenon resulting from ions is dominant over polymerization phenomenon resulting from ions. As a result, the ions 922*a* and 922*b* can be used to perform a directional etching process that has a higher etch rate in X-direction than in Y-direction in FIG. 38. For example, a ratio of the etch rate in X-direction to the etch rate in Y-direction is in a range from about 10:1 to about 30:1. In greater detail, the ions 922*a* and 922*b* can be directed at the second sidewalls O222 but substantially not at first sidewalls O221 of the second opening O12', thus resulting in etching second sidewalls O222 but substantially not etching the protective layer 236 alongside the first sidewalls O221. In this way, the directional etching process can elongate the second openings O22' by etching the second sidewalls O222 but substantially not etching the first sidewalls O221, thus resulting in elongated openings O12" as illustrated in FIGS. 15A-15C. In some embodiments, process conditions of the directional etching process are similar to those of the directional etching process as discussed previously with respect to FIGS. 7A-7C, and are not repeated for the sake of brevity.

Referring to FIG. 15A, as a result of the directional etching, the length L22" of the elongated opening O22" is greater than the length L22' of the second opening O22' (as shown in FIG. 14A), and the W22" of the elongated opening O22" remains substantially the same as the width W22' of the second opening O22'. Because the elongated opening O22" has an increased length, the subsequently formed gate contact that inherits the pattern of the elongated opening O22" can have an increased length in Y-direction, thus resulting in improved gate contact area. Moreover, because the elongation process does not increase the width of the opening O22', the subsequently formed gate contact that inherits the pattern of the elongated opening O22" will be separated from the source/drain contacts 228, thus preventing unwanted shorting between the gate contact and the source/drain contacts 228. An example ratio of the resultant length L22" to the resultant width W22" is in a range from about 2.7:1 to about 4.6:1. In some embodiments, the directional etching process of block S205 may be in-situ performed with the directional deposition process of block S204, which in turn will prevent contamination on the wafer WA2.

Figure 16A:
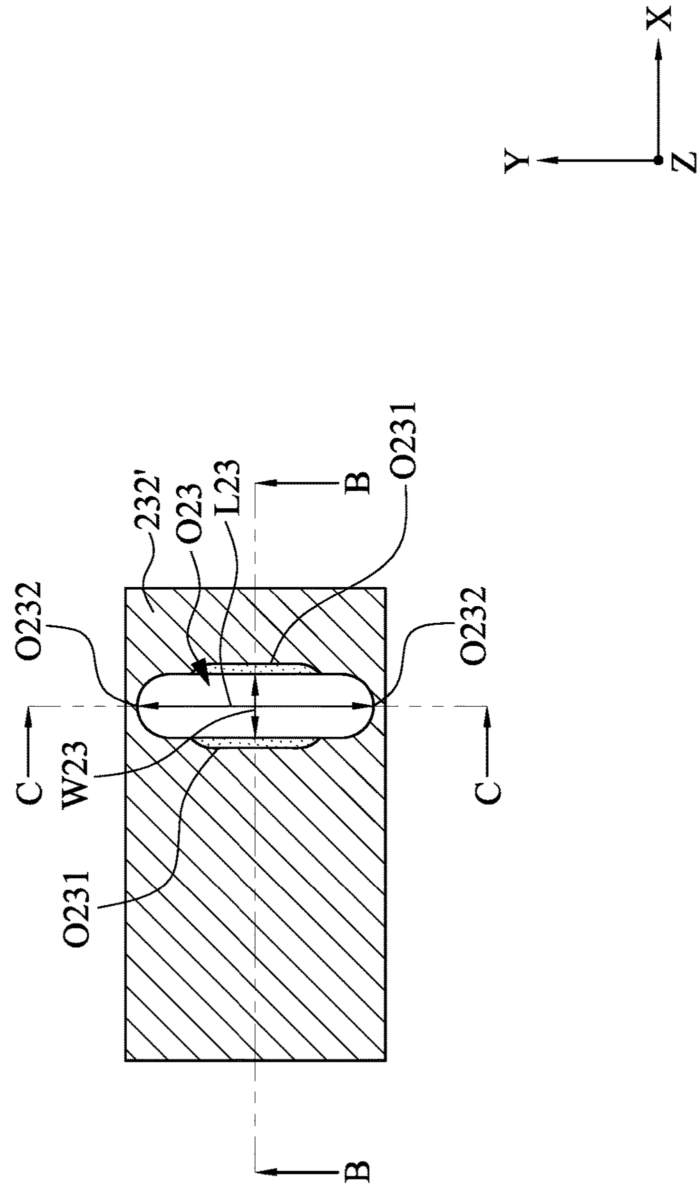
Figure 16B:
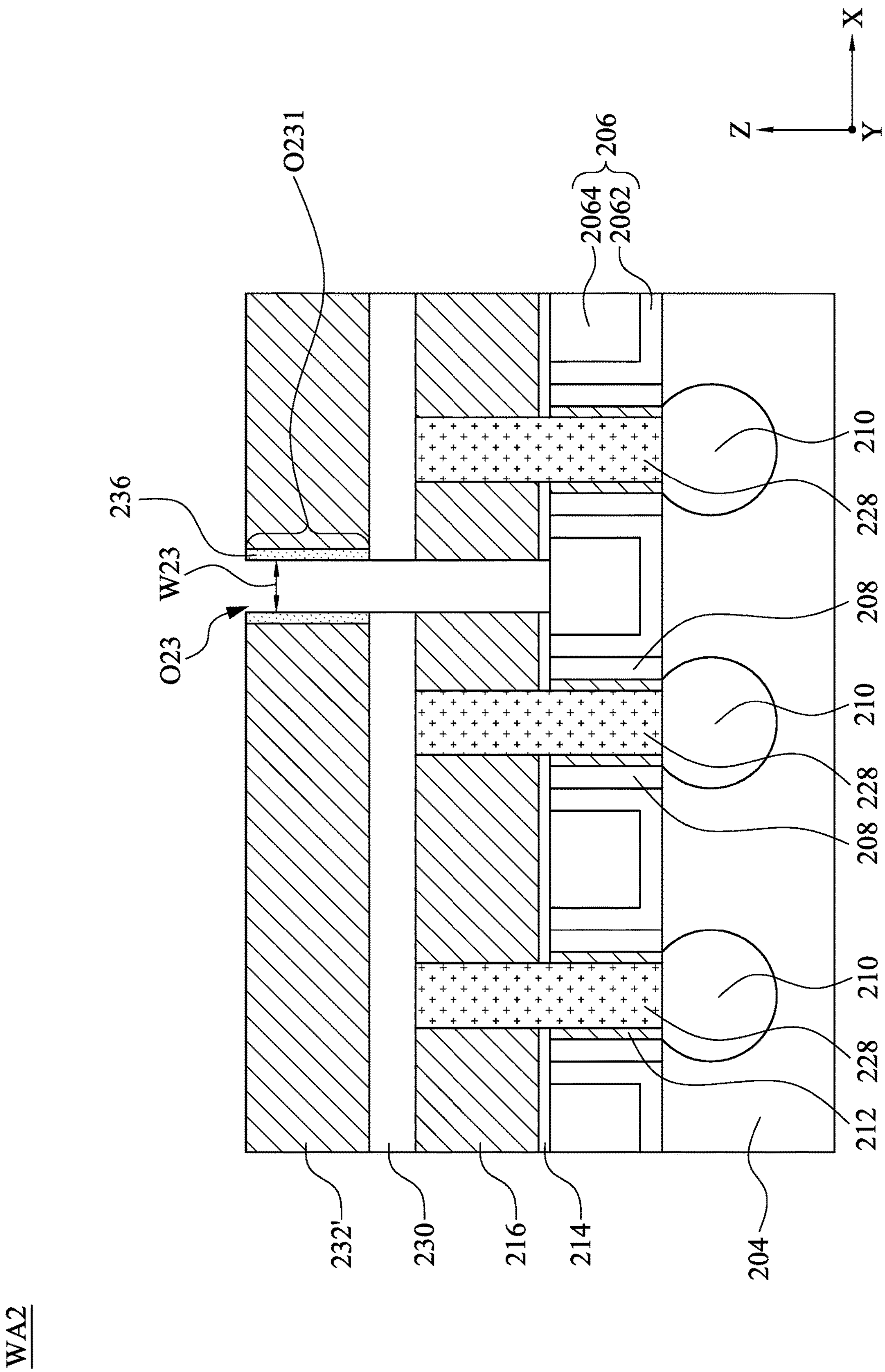
Figure 16C:
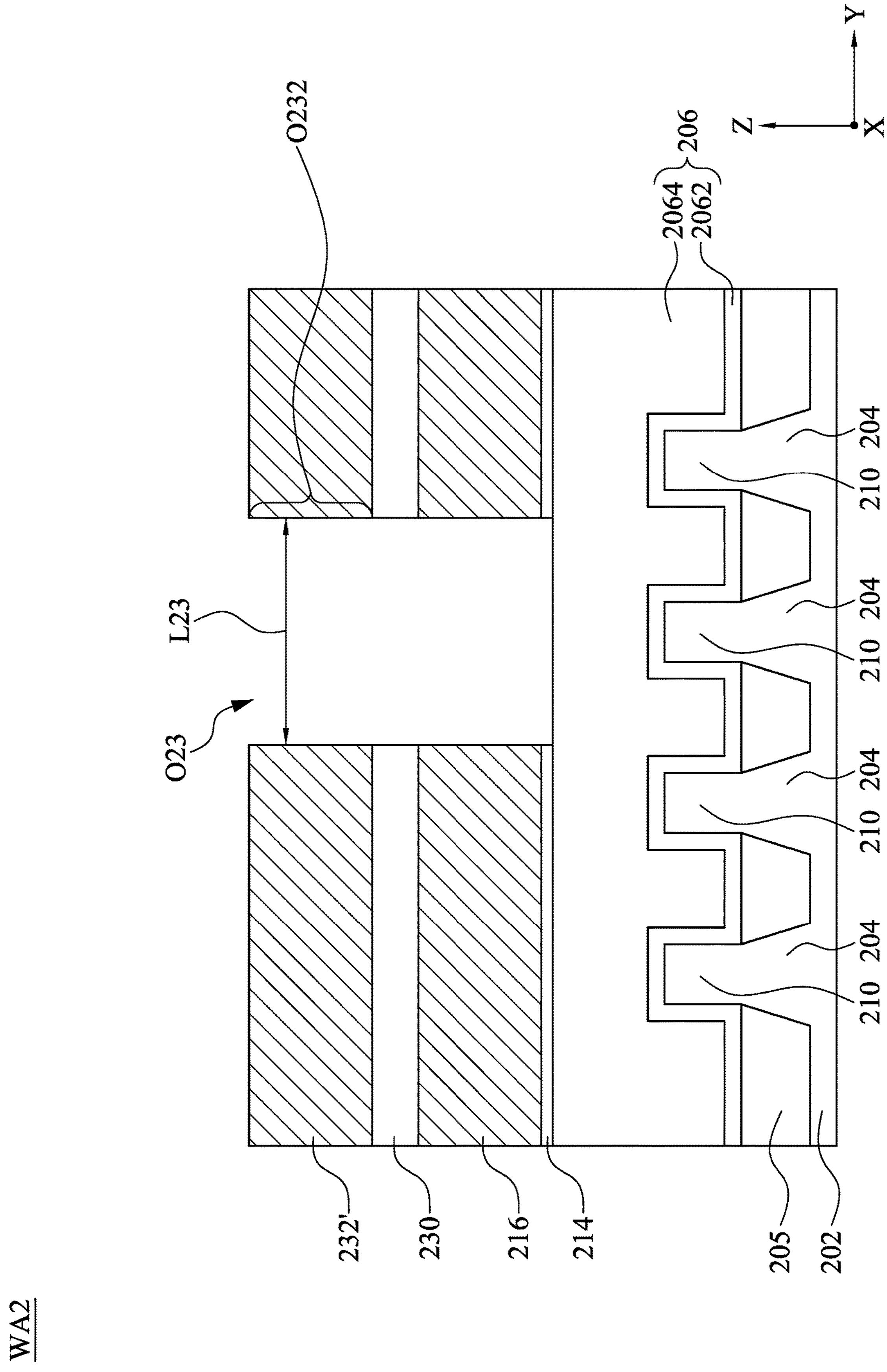

Returning to FIG. 11A, the method M2 then proceeds to block S206 where the pattern of the elongated opening is transferred to the underlying layers to form a gate contact opening. With reference to FIGS. 16A-16C, in some embodiments of block S206, a patterning process is performed on the ESL 230, the second ILD 216 and the first ESL 114 to transfer the pattern of the elongated opening O22" to these layers, resulting in a gate contact opening O23 in these layers and exposing the gate metal layer 2064. In some embodiments, the patterning process comprises one or more etching processes, where a combination of the protective layer 236, the patterned bottom layer 2342' and the patterned ILD layer 232' is used as an etch mask. The one or more etching processes may include anisotropic wet etching processes, anisotropic dry etching processes, or combinations thereof. During the patterning process, the patterned bottom layer 2342' may be consumed. In some embodiments, remaining portions of the patterned bottom layer 2342' may be removed using suitable etchants.

As a result of the patterning process, the gate contact opening O23 inherits the pattern of the elongated opening O22" (as shown in FIGS. 15A-15C). In greater detail, the length L23 of the gate contact opening O23 is substantially the same as the length L22" of the elongated opening O22", and the width W23 of the gate contact opening O23 is substantially the same as the width W22" of the elongated opening O22". As shown in FIG. 16B, the width W23 of the gate contact opening O23 is controlled such that the source/drain contacts 228 arranged on opposite sides of the gate contact opening O23 along X-direction will not be exposed by the gate contact opening O23. This is advantageous for preventing the source/drain contacts 228 from damages caused by the etchants used in the patterning process.

In some embodiments, the patterned third ILD layer 232' remains over the ESL 230, portions of the protective layer 236 remain alongside first sidewalls O231 of the gate contact opening O23 that extends in Y-direction, and second sidewalls O232 of the gate contact opening O23 that extends in X-direction are free from coverage by the protective layer 236.

Returning to FIG. 11B, the method M2 then proceeds to block S207 where a second tri-layer photoresist mask is formed to overfill the gate contact opening. With reference to FIGS. 17A-17D, a second tri-layer photoresist mask 238 is formed over the wafer WA2 such that the gate contact opening O23 is overfilled with a bottom layer 2382 of the second tri-layer photoresist mask 238. The second tri-layer photoresist mask 238 includes a bottom layer 2382, a middle layer 2384 and a top layer 2386, respectively similar to the bottom layer 1222, the middle layer 1224 and the top layer 1226 of the tri-layer photoresist mask 122 as discussed previously with respect to FIGS. 3A-3C. Description about the bottom layer 2382, the middle layer 2384 and the top layer 2386 is thus not repeated for the sake of brevity.

Figure 17A:
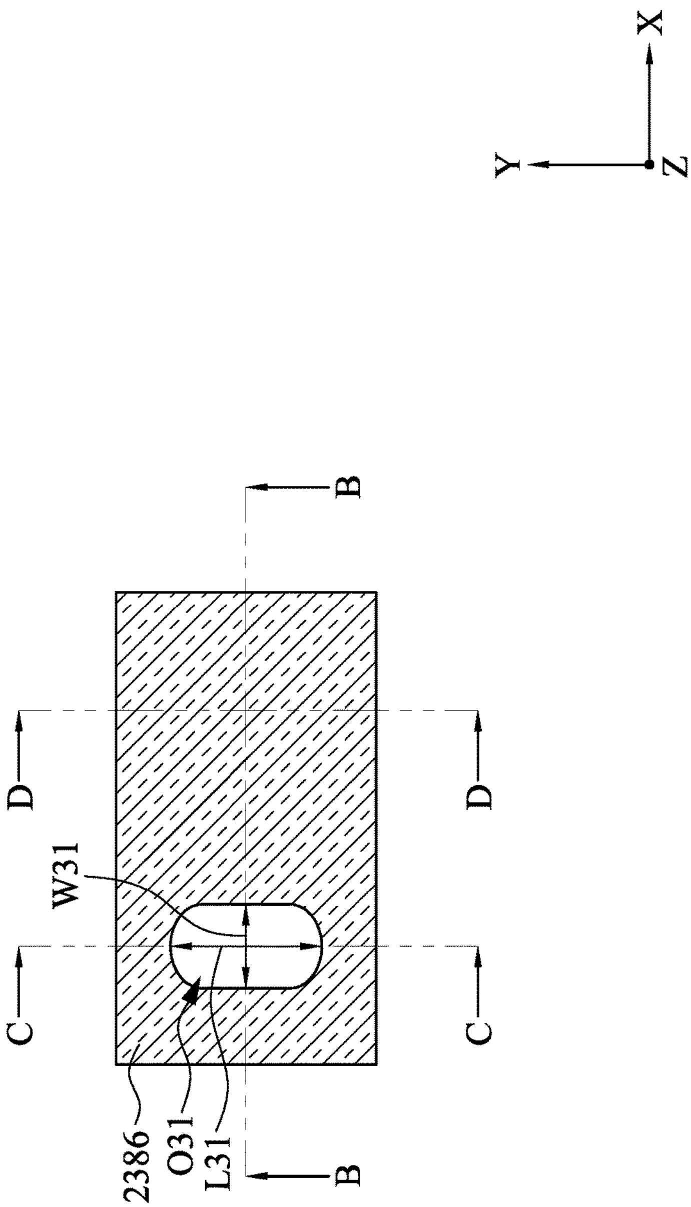

In block S208, a third opening O31 is formed in the top layer 2386 and above a source/drain contact 228. Formation of the third opening O31 includes irradiating the top layer 2386 and developing the top layer 2386 to remove portions of the top layer 2386, as discussed previously with respect to FIGS. 4A-4C. The third openings O31 in the top photoresist layer 2386 are used to define the pattern of a source/drain via opening that will be formed in the patterned third ILD 232' in following steps. As illustrated in FIG. 17A, each third opening O31 has a length L31 in Y-direction and a width W31 in X-direction, and the length L31 is greater than the width W31. Therefore, the subsequently formed source/drain via opening will have a length in Y-direction greater than a width in X-direction, which in turn will result in increased contact area between the source/drain via and the source/drain contact while preventing from contacting a gate contact that will be subsequently formed in the gate contact opening O23, which will be discussed below in greater detail.

Figure 18A:
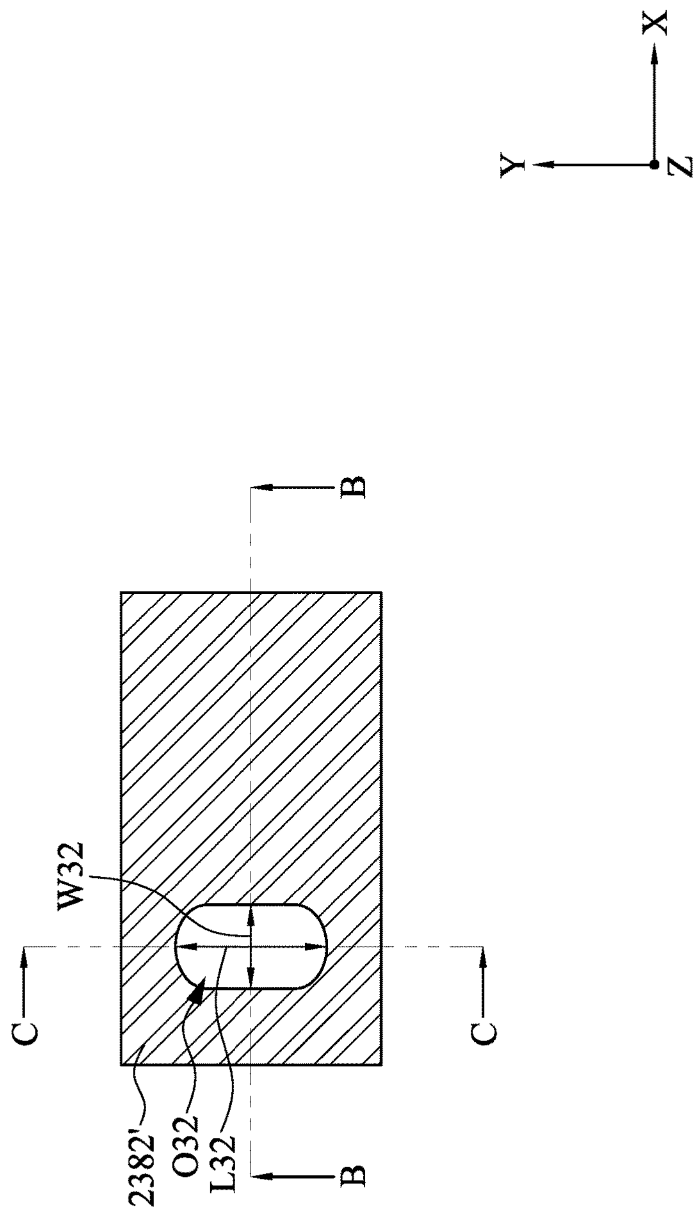
Figure 18B:
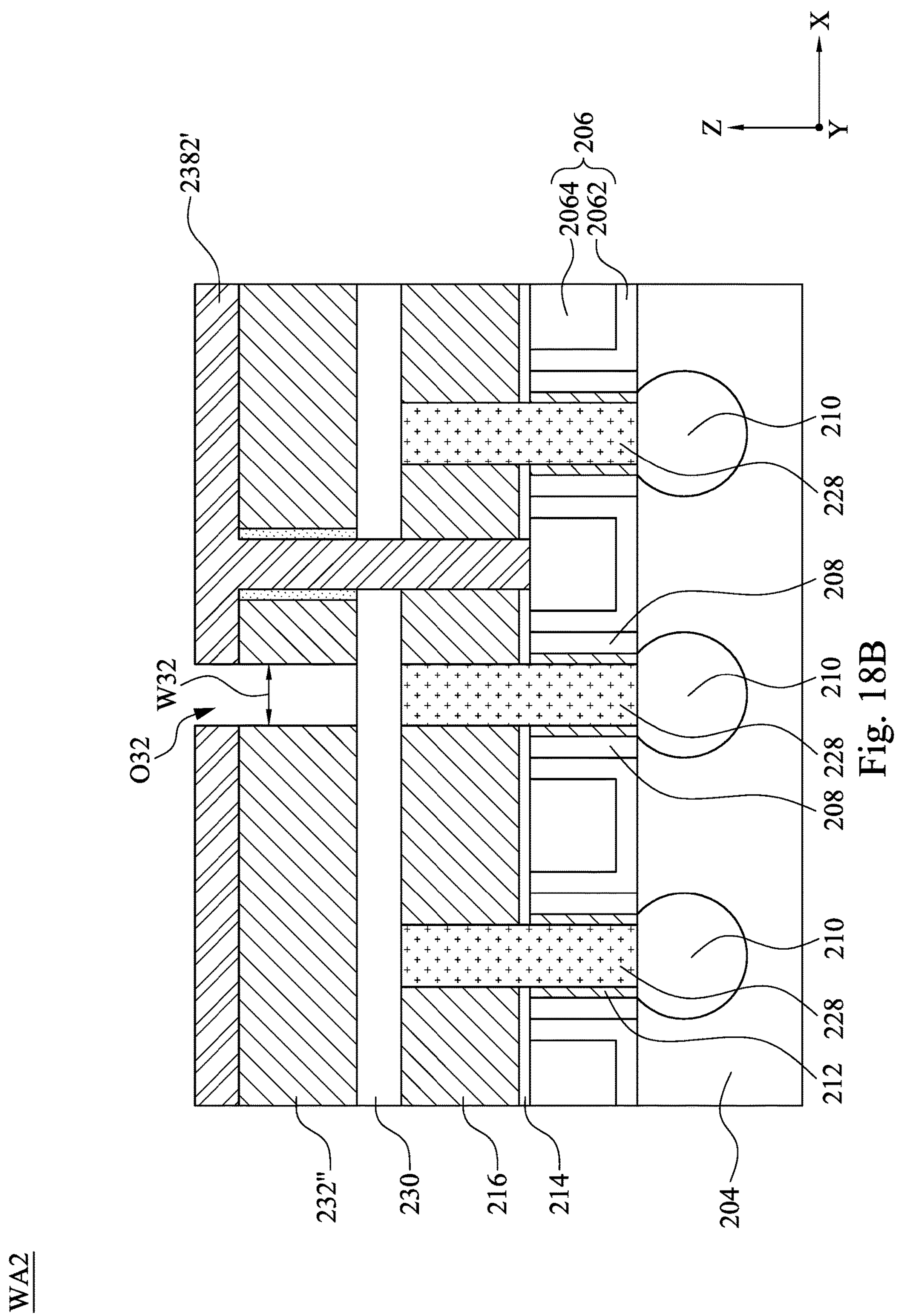
Figure 18C:
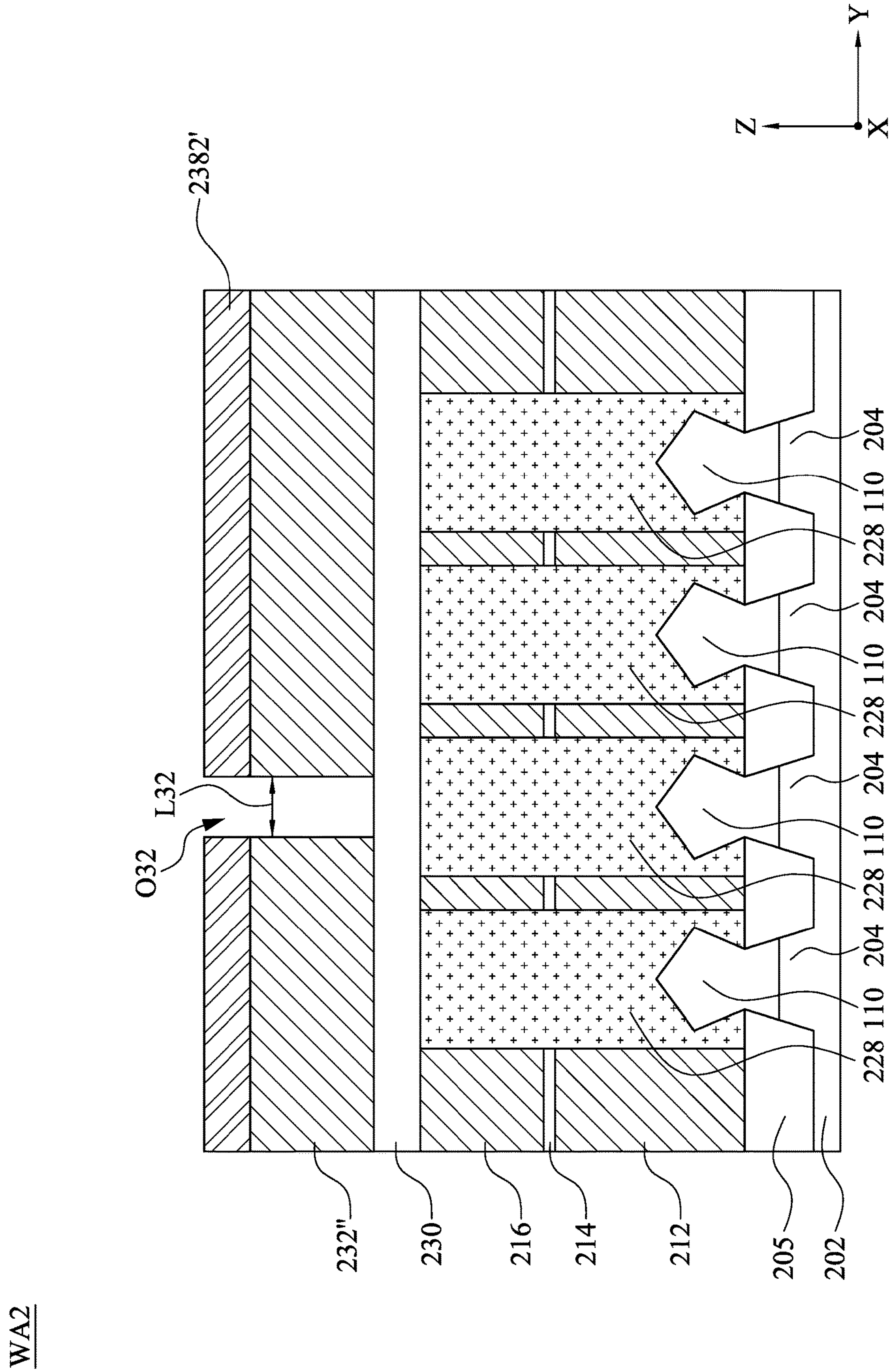

Returning to FIG. 11B, the method M2 then proceeds to block S209 where the third ILD layer is patterned using the second tri-layer photoresist mask as an etch mask to form a fourth opening. With reference to FIGS. 18A-18C, in some embodiments of block S203, a patterning process is performed on the third ILD layer 232' to transfer the pattern of the third opening O31 in the patterned top photoresist layer 2386 to the third ILD layer 232', resulting in a fourth opening O32 in the third ILD layer 232". Notably, the third ILD layer 232" undergo two separate patterning processes, wherein a previous patterning process is used to form gate contact opening and a later patterning process is used to form source/drain via opening. In some embodiments, the patterning process comprises one or more etching processes, where the second tri-layer photoresist mask 238 is used as an etch mask. The one or more etching processes may include anisotropic wet etching processes, anisotropic dry etching processes, or combinations thereof. During the patterning process, the patterned top layer 2386, the middle layer 2384 of the photoresist mask 238 may be consumed, and portions of the bottom layer 2382 may remain after the patterning process. In this way, the patterning process also results in a patterned bottom layer 2382' over the patterned ILD layer 232".

The patterned bottom layer 2382' and the patterned ILD layer 232" inherit the pattern in the top photoresist layer 2386, and thus the fourth opening O32 has substantially the same shape, size and position as the third opening O31 in the patterned top photoresist layer 2386. For example, the fourth opening O32 has a length L32 in Y-direction and a width W32 in X-direction, and the length L32 is greater than the width W32. The pattern of the fourth opening O32 vertically above the source/drain contact 228 can be transferred to the underlying ESL 230 in following steps, and thus the fourth opening O32 can be used to define the pattern of the source/drain via opening. In this way, the subsequently formed source/drain via opening will have a length in Y-direction greater than a width in X-direction.

The length L32 of the fourth opening O32 in Y-direction is in positive correlation with a contact area between the subsequently formed source/drain via and the source/drain contact 228. Stated differently, the greater the length L32 of the fourth opening O32, the larger the contact area between the subsequently formed source/drain via and the source/drain contact 228. Therefore, one or more lateral etching processes might be used to elongate the fourth openings O32 in Y-direction. However, if the patterned bottom layer 2382' and the third ILD layer 232" undergo the one or more lateral etching processes, the fourth opening O32 would be inevitably elongated in both X-direction and Y-direction, which in turn would lead to increased width W32 of the fourth opening O32, which in turn might cause unwanted shorting between the source/drain via and the gate contact subsequently formed in the gate contact opening O23. Therefore, in some embodiments of the present disclosure, a directional deposition process having a higher deposition rate in X-direction than in Y-direction is performed on the wafer WA2 (block S210 of the method M2), followed by a direction etching process having a higher etch rate in Y-direction than in X-direction (block S211 of the method M2). In this way, the fourth opening O32 can be elongated in Y-direction but substantially not in X-direction, as described below in greater detail.

Figure 19A:
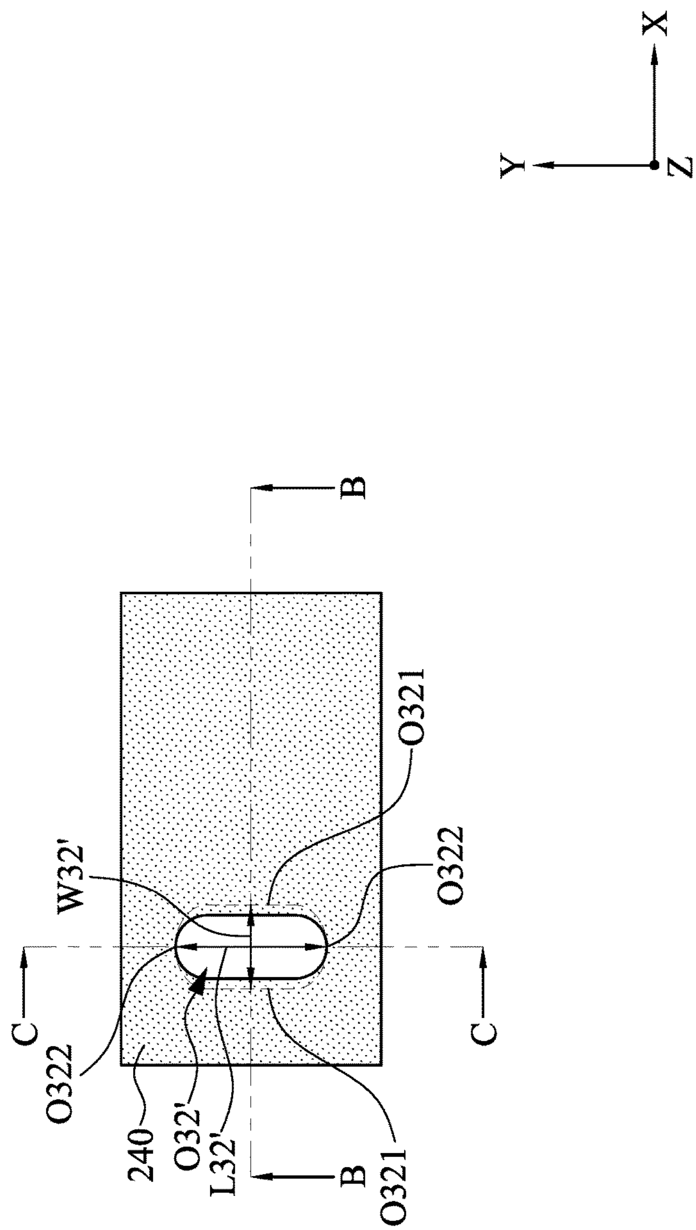
Figure 19B:
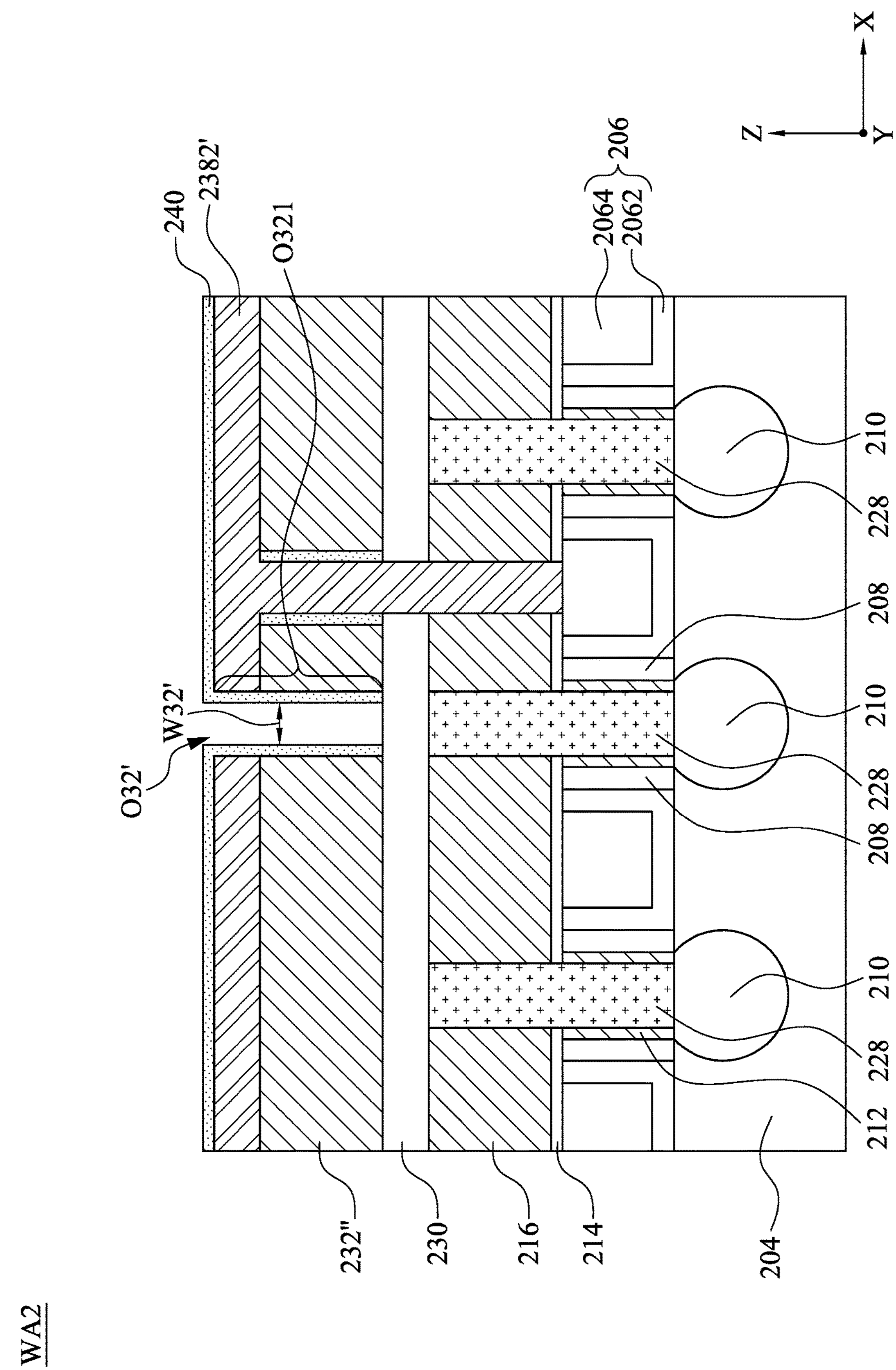
Figure 19C:
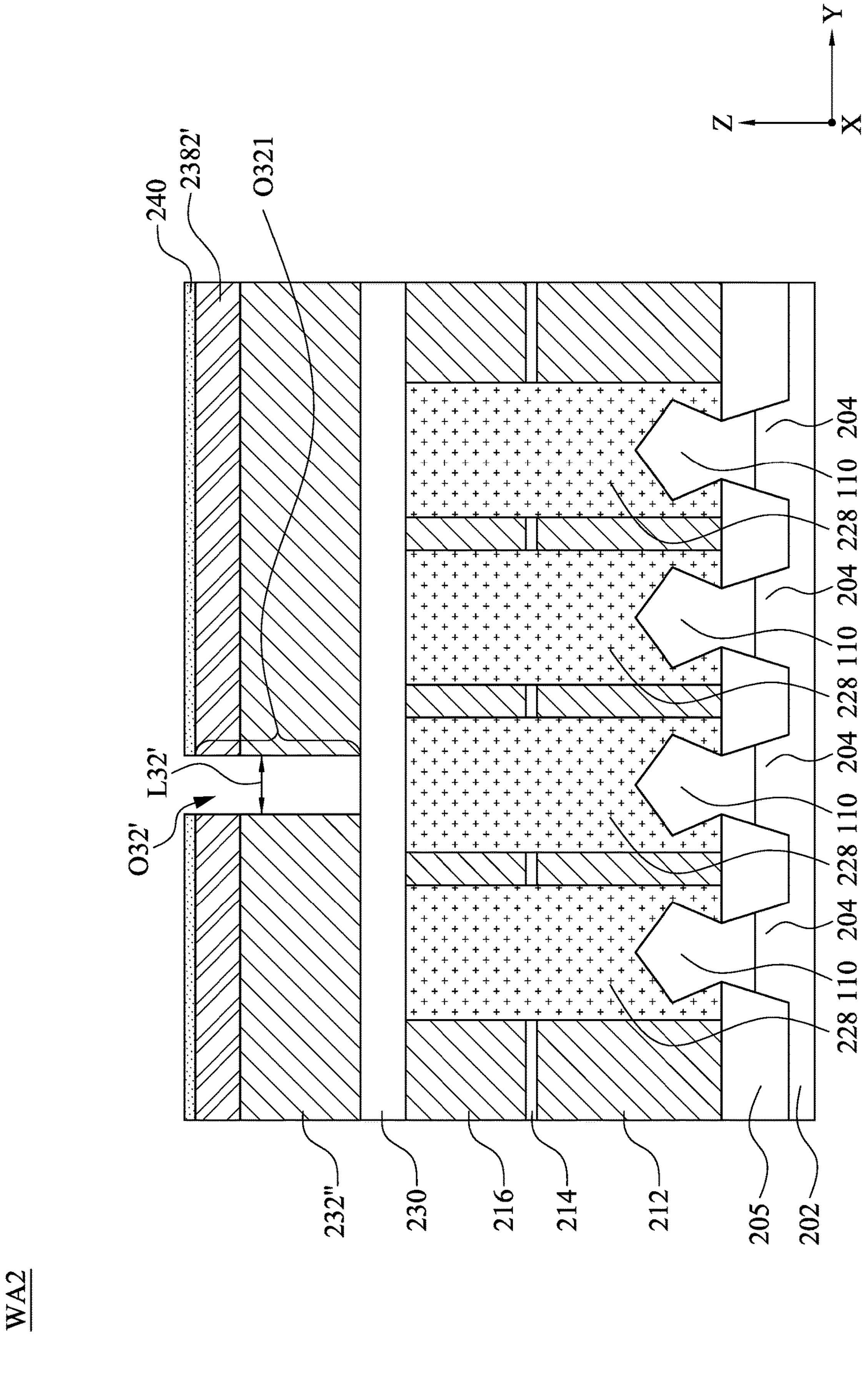

With reference to FIGS. 19A-19C, in some embodiments of block S210, a directional deposition process is performed to form a protective layer 240 on first sidewalls O321 of the fourth opening O32' that extend in Y-direction and substantially not on second sidewalls O322 of the fourth opening O32' that extend in X-direction. The directional deposition process is performed using directional ions, thus resulting in a higher deposition rate in X-direction than in Y-direction, so that the Y-directional sidewalls O321 as shown in FIG. 19A can be deposited with more polymers (e.g., carbon-containing polymers, chlorine-containing polymers and/or bromine-containing polymers) than the X-directional sidewalls O322 as shown in FIG. 19A. In some embodiments, a ratio of the deposition rate in X-direction to the deposition rate in Y-direction is in a range from about 10:1 to about 30:1.

The directional deposition process can be performed using, for example, the plasma tool 900 as illustrated in FIG. 38. In greater detail, the ions 922*a* and 922*b* can be extracted and directed to the wafer WA2. Because trajectories of the ions 922*a* and 922*b* can be controlled to extend in X-direction and Z-direction but substantially not in Y-direction in FIG. 38 as discussed previously, the ions 922*a* and 922*b* can be directed at first sidewalls O321 while substantially not being directed at the second sidewalls O322. In some embodiments, the process conditions are selected such that polymerization phenomenon resulting from ions is dominant over etching phenomenon resulting from ions, so that the ions 922*a* and 922*b* directed at the first sidewalls O321 but substantially not at second sidewalls O322 of the fourth opening O32' can result in deposition of polymers on first sidewalls O321 but substantially not on second sidewalls O322. These deposited polymers can be referred to as a protective layer (or polymer layer) 240. In some embodiments, process conditions of the directional deposition process are similar to those of the directional deposition process as discussed previously with respect to FIGS. 6A-6C, and are not repeated for the sake of brevity.

As a result of the directional deposition, the length L32' of the fourth opening O32' in Y-direction remains substantially the same as the length L32 of the fourth opening O32 (as shown in FIG. 18A), and the width W32' of the fourth opening O32' in X-direction is less than the width W32 of the fourth opening O32. The difference between the width W32' of the fourth opening O32' after directional deposition and the width W22 of the fourth opening O22 before directional deposition is substantially twice the thickness of the protective layer 240. In some embodiments, the directional deposition results in deposition of polymers over a top surface of the patterned bottom layer 2382', so that the protective layer 240 extends over the top surface of the patterned bottom layer 2382'. In some embodiments, the ESL 230 at a bottom of the fourth opening O32' may be free from coverage by the protective layer 240 (i.e., polymers) because of the shadowing effect resulting from slanted trajectories of the directional ions.

Figure 20A:
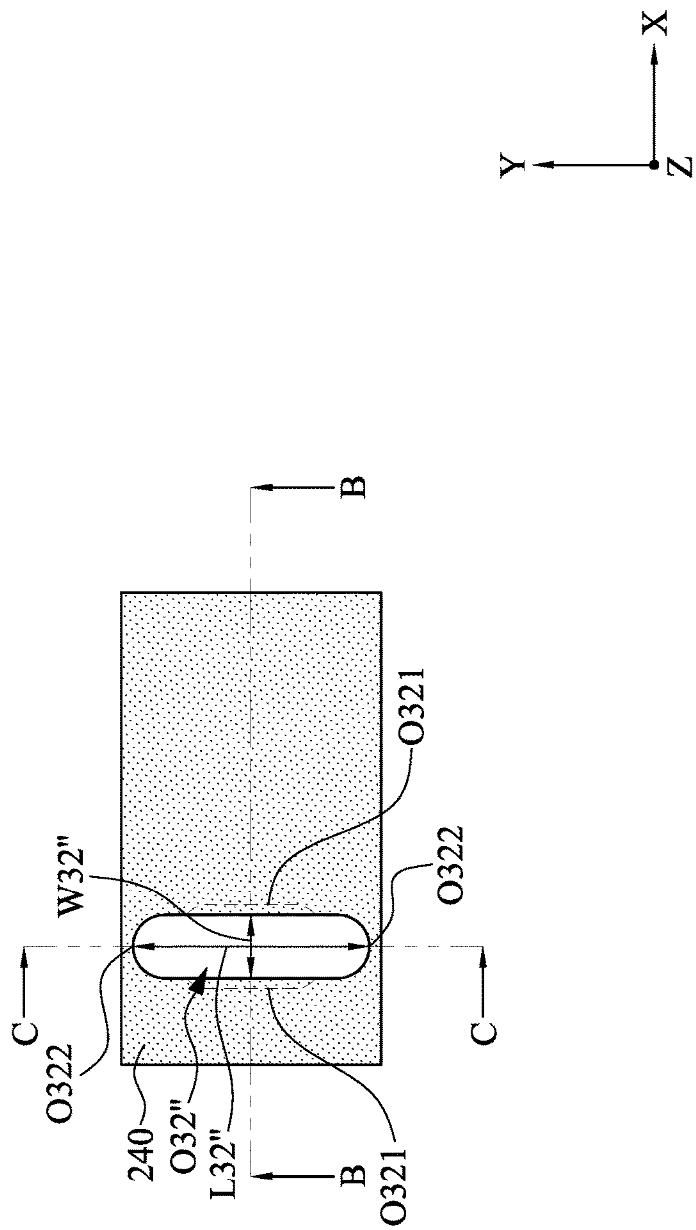
Figure 20B:
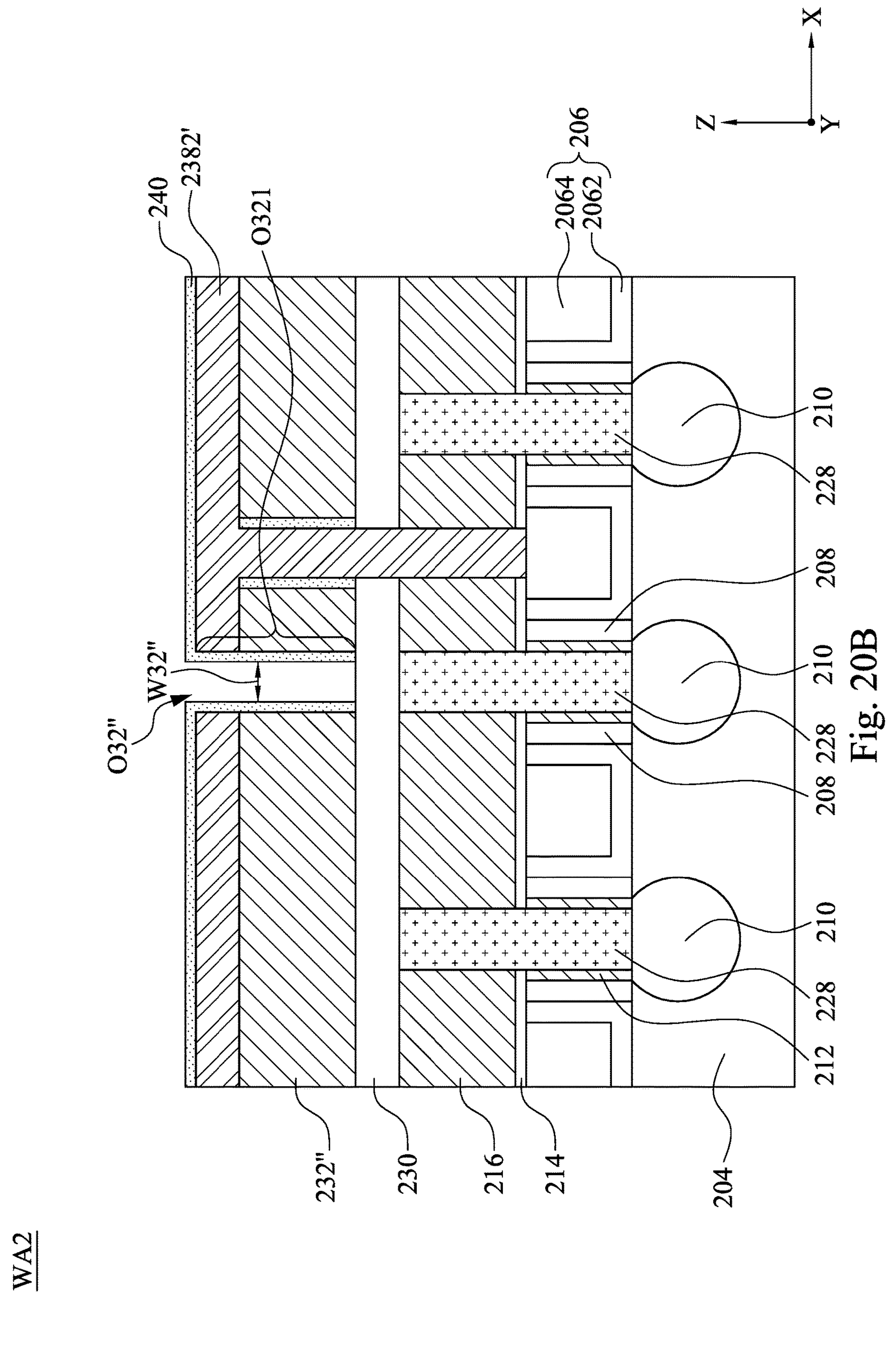
Figure 20C:
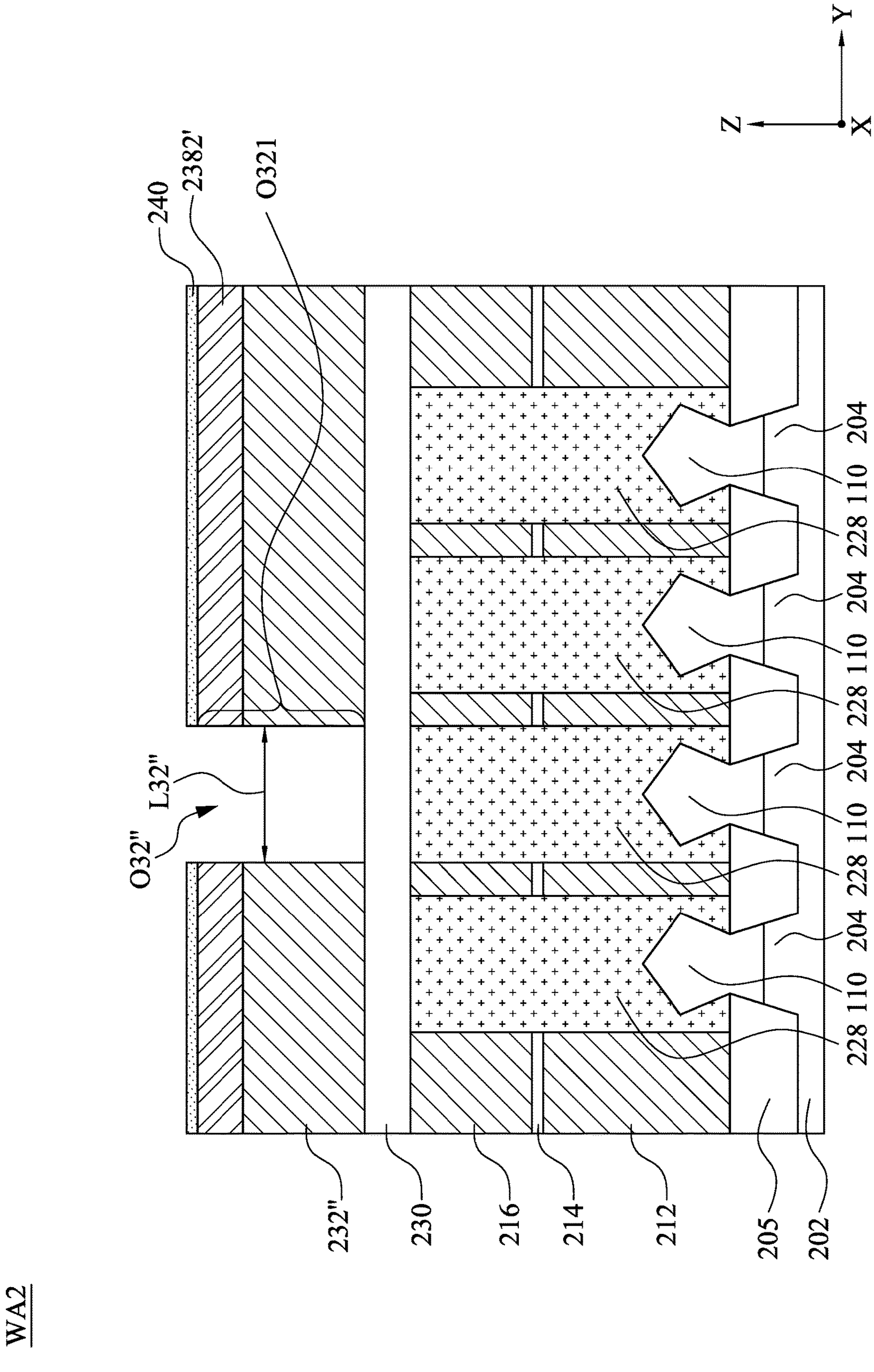

Returning to FIG. 11B, the method M2 then proceeds to block S211 where second sidewalls of the fourth opening are etched to elongate the fourth opening. In some embodiments of block S211, a directional etching process is performed on the second sidewalls O322 of the fourth opening O32', thus resulting in elongated opening O32" as shown in FIGS. 20A-20C. The directional etching process is performed using directional ions. For example, the directional etching process can be performed using the plasma tool 900 as illustrated in FIG. 38, as described below in detail.

After performing the direction deposition process on the wafer WA2 in the plasma tool 900, the wafer WA2 can be rotated about the Z-directional shaft 929 by about 88-92 degrees (e.g., about 90 degrees). In this way, the second sidewalls O322 of the fourth opening O32' can be arranged in X-direction in FIG. 38. After rotating the wafer WA2, the ions 922*a* and 922*b* can be extracted and directed to the wafer WA2. Because trajectories of the ions 922*a* and 922*b* extend in X-direction and Z-direction but substantially not in Y-direction in FIG. 38, the ions 922*a* and 922*b* can be directed at the second sidewalls O322 of the fourth opening O32' while substantially not being directed at the protective layer 240 alongside the first sidewall O321 of the fourth opening O32'. In some embodiments, the process conditions are selected such that etching phenomenon resulting from ions is dominant over polymerization phenomenon resulting from ions. As a result, the ions 922*a* and 922*b* can be used to perform a directional etching process that has a higher etch rate in X-direction than in Y-direction in FIG. 38. For example, a ratio of the etch rate in X-direction to the etch rate in Y-direction is in a range from about 10:1 to about 30:1. In greater detail, the ions 922*a* and 922*b* can be directed at the second sidewalls O322 but substantially not at first sidewalls O321 of the fourth opening O32', thus resulting in etching second sidewalls O322 but substantially not etching the protective layer 240 alongside the first sidewalls O321. In this way, the directional etching process can elongate the second openings O32' by etching the second sidewalls O322 but substantially not etching the first sidewalls O321, thus resulting in elongated openings O32" as illustrated in FIGS. 20A-20C. In some embodiments, process conditions of the directional etching process are similar to those of the directional etching process as discussed previously with respect to FIGS. 7A-7C, and are not repeated for the sake of brevity.

Referring to FIG. 20A, as a result of the directional etching, the length L32" of the elongated opening O32" is greater than the length L32' of the second opening O32' (as shown in FIG. 14A), but the W32" of the elongated opening O32" remains substantially the same as the width W32' of the second opening O32'. Because the elongated opening O32" has an increased length, the subsequently formed source/drain via that inherits the pattern of the elongated opening O32" can have an increased length in Y-direction, thus resulting in improved contact area between the subsequently formed source/drain via and the source/drain contact 228. Moreover, because the elongation process does not increase the width of the opening O32', the subsequently formed source/drain via that inherits the pattern of the elongated opening O32" will be separated from the gate contact subsequently formed in the gate contact opening, thus preventing unwanted shorting between the gate contact and the source/drain via. An example ratio of the resultant length L32" to the resultant width W32" is in a range from about 2.7:1 to about 4.6:1. In some embodiments, the directional etching process of block S211 may be in-situ performed with the directional deposition process of block S210, which in turn will prevent contamination on the wafer WA2.

Returning to FIG. 11B, the method M2 then proceeds to block S212 where the pattern of the elongated opening is transferred to an underlying layer to form a source/drain via opening. With reference to FIGS. 21A-21D, in some embodiments of block S212, a patterning process is performed on the ESL 230 to transfer the pattern of the elongated opening O32" to the ESL 230, resulting in a source/drain via opening O33 through the ESL 230 and exposing the source/drain contact 228. In some embodiments, the patterning process comprises one or more etching processes, where a combination of the protective layer 236, the patterned bottom layer 2382' and the patterned ILD 232" is used as an etch mask. The one or more etching processes may include anisotropic wet etching processes, anisotropic dry etching processes, or combinations thereof. During the patterning process, the patterned bottom layer 2382' may be consumed. In some embodiments, residues of the patterned bottom layer 2382' may be removed using suitable etchants, so that both the gate contact opening O23 and the source/drain via opening O33 are exposed.

Figure 21A:
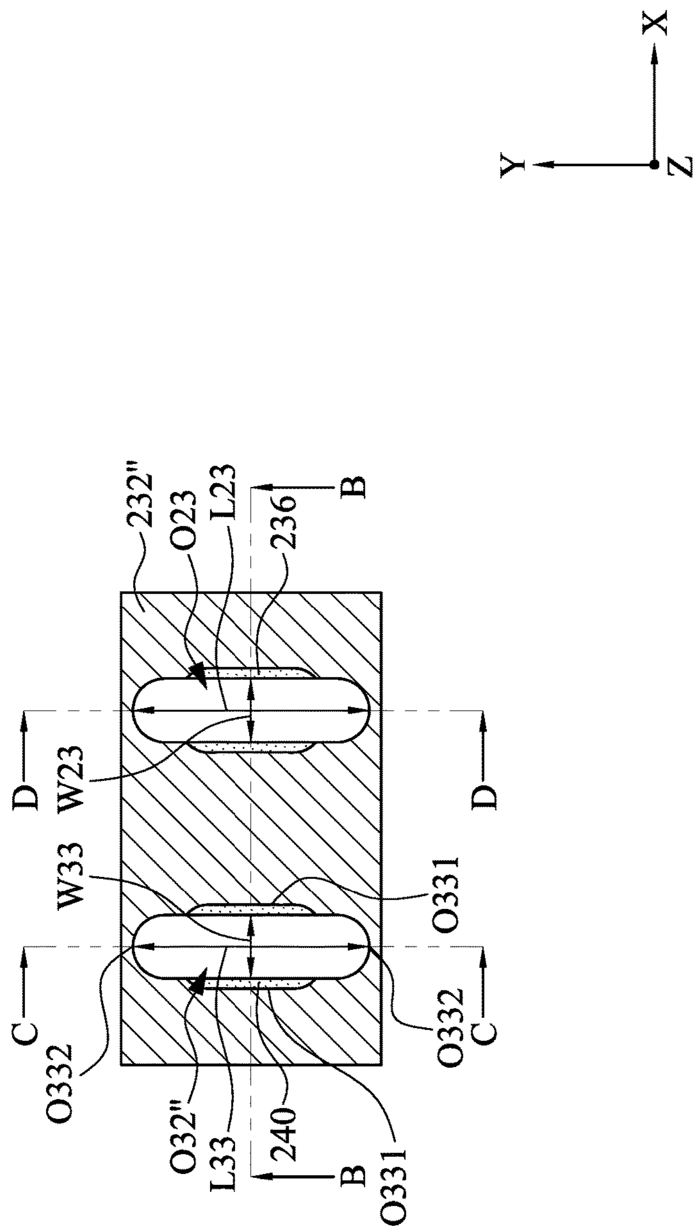
Figure 21B:
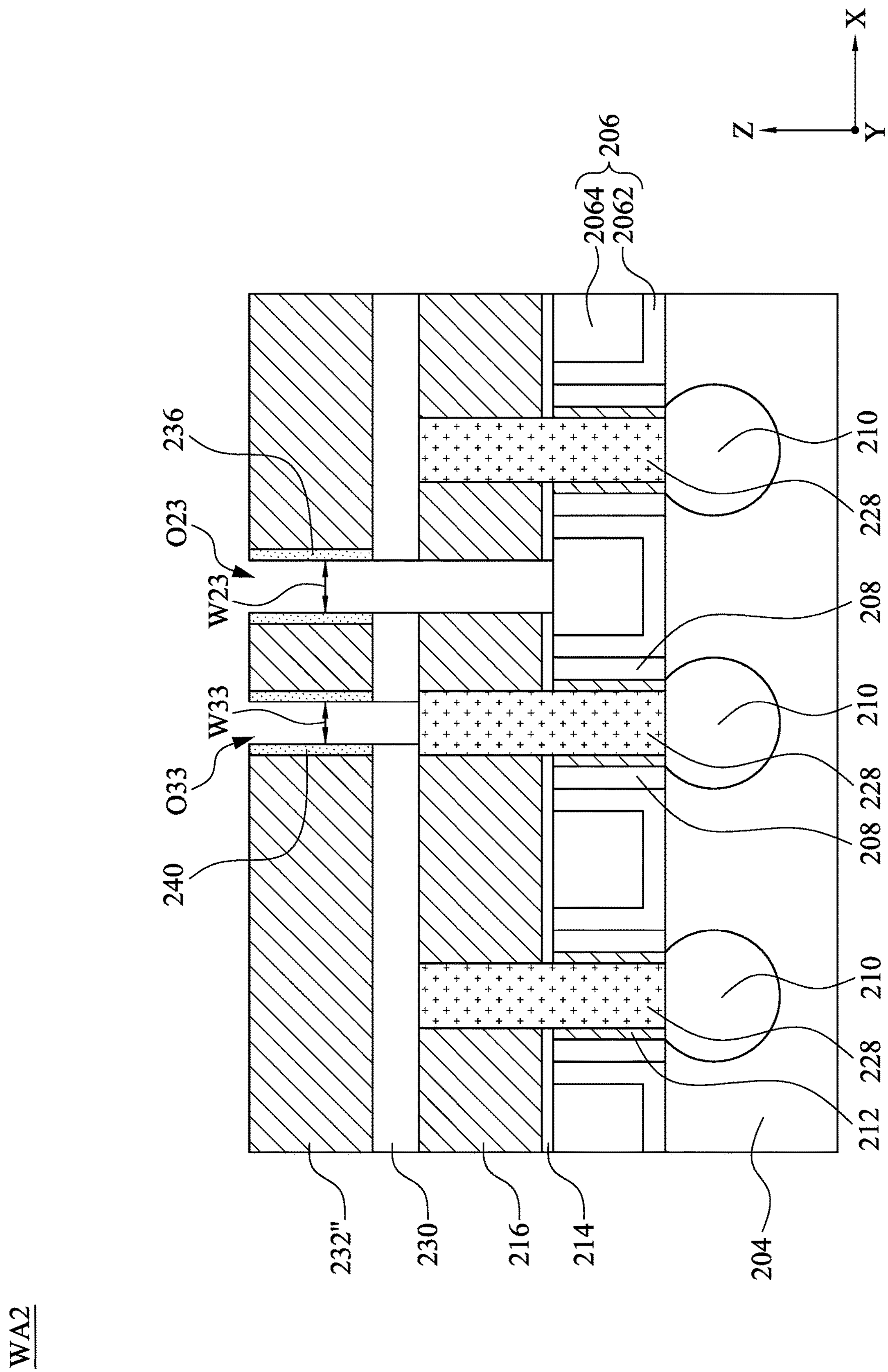
Figure 21C:
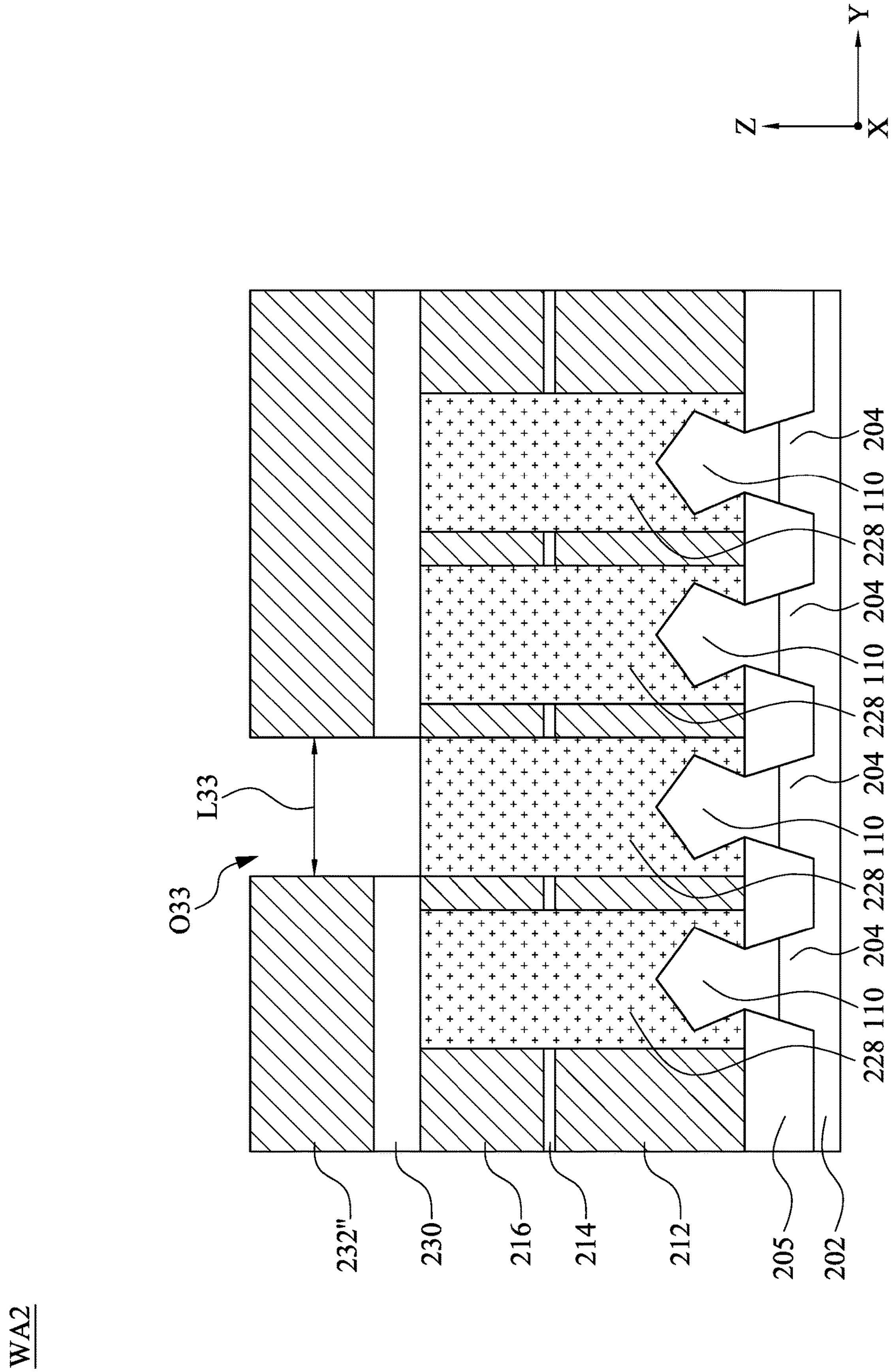
Figure 21D:
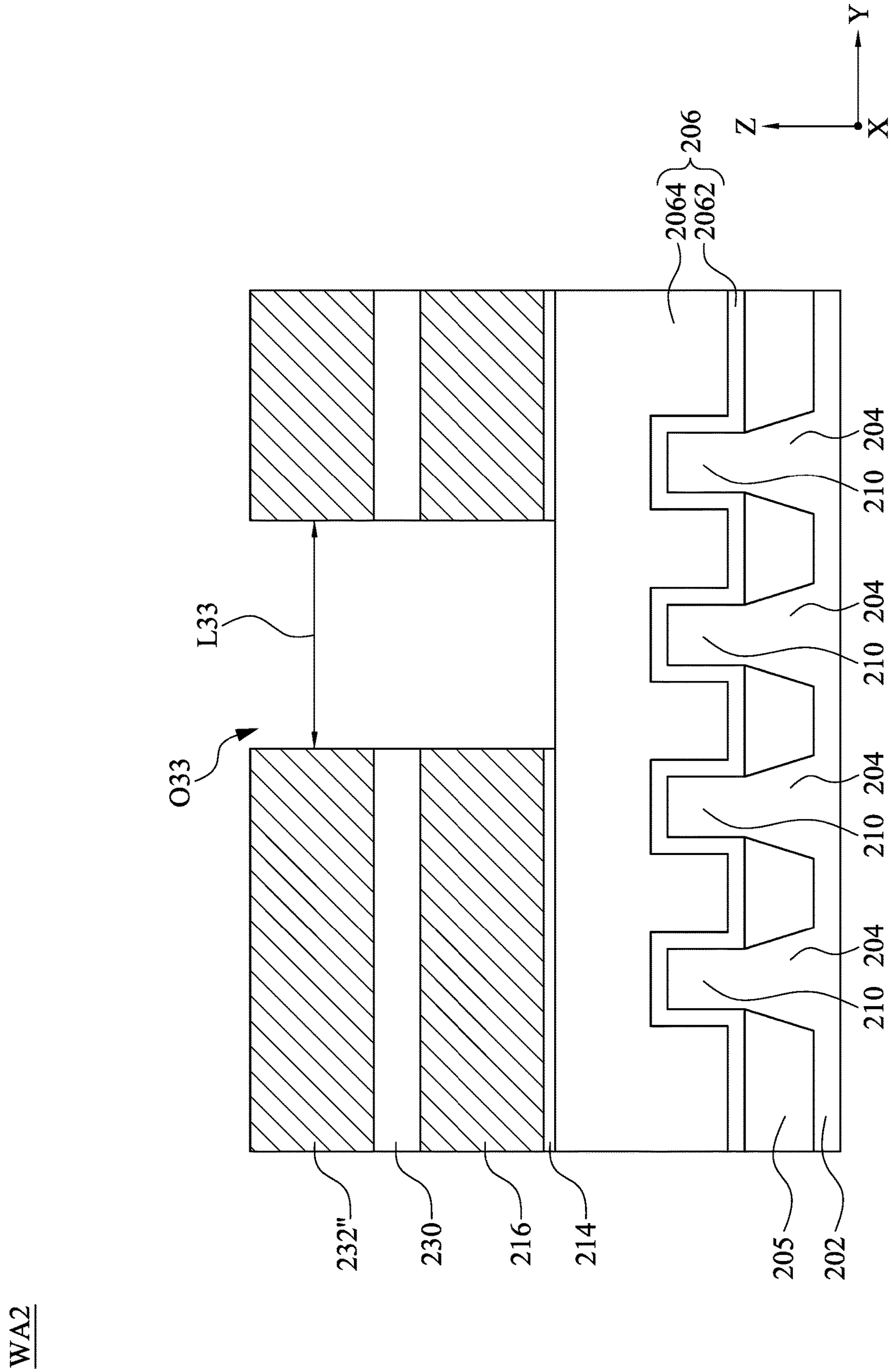
Figure 22A:
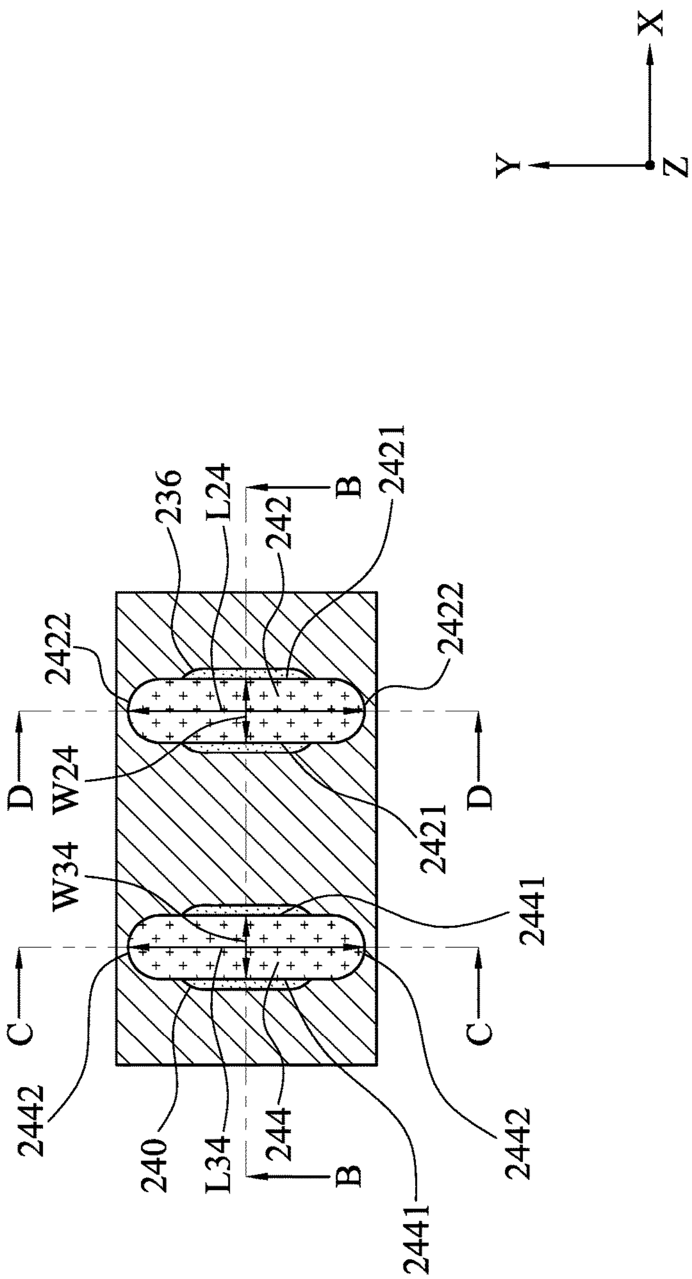
Figure 22B:
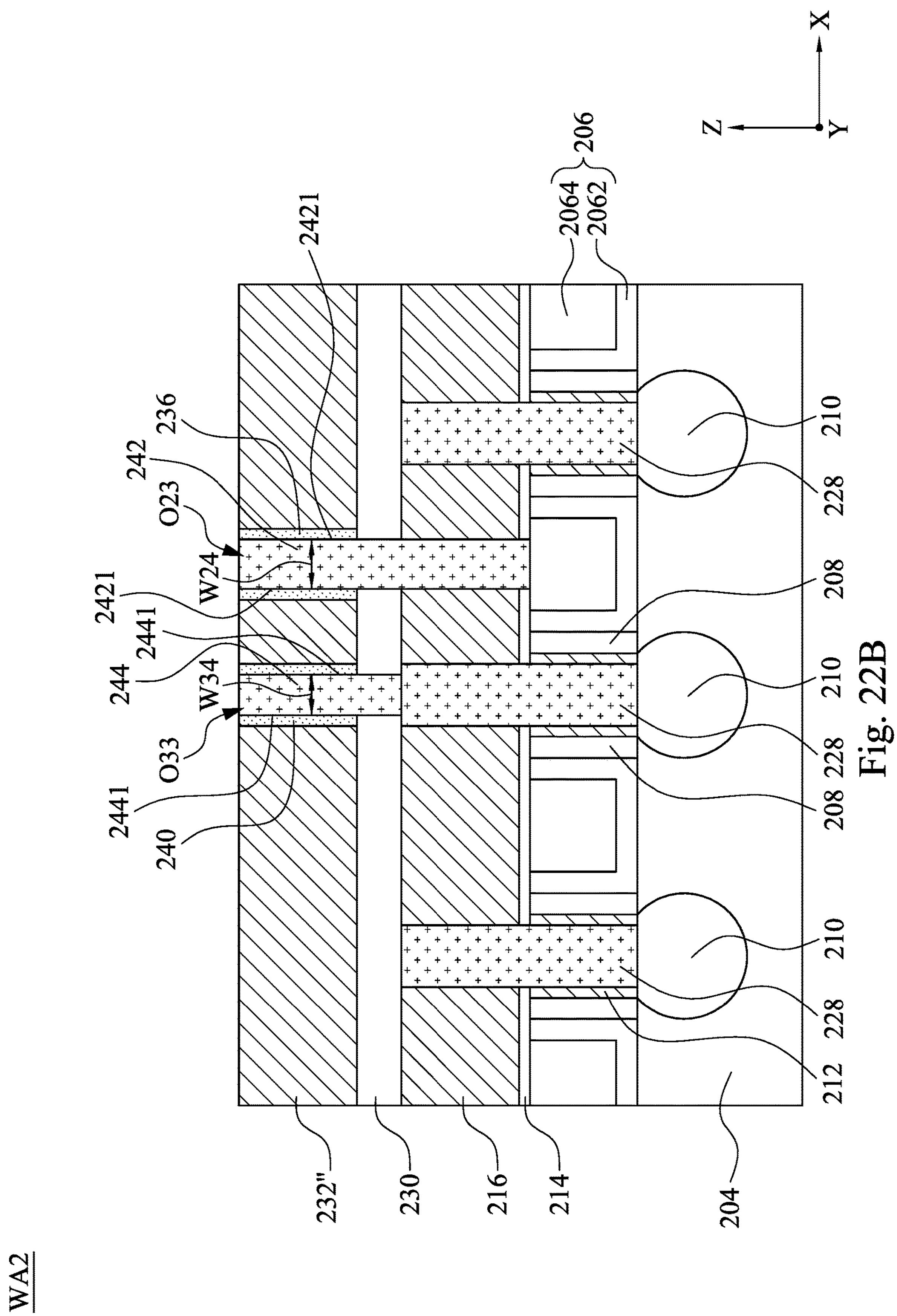
Figure 22C:
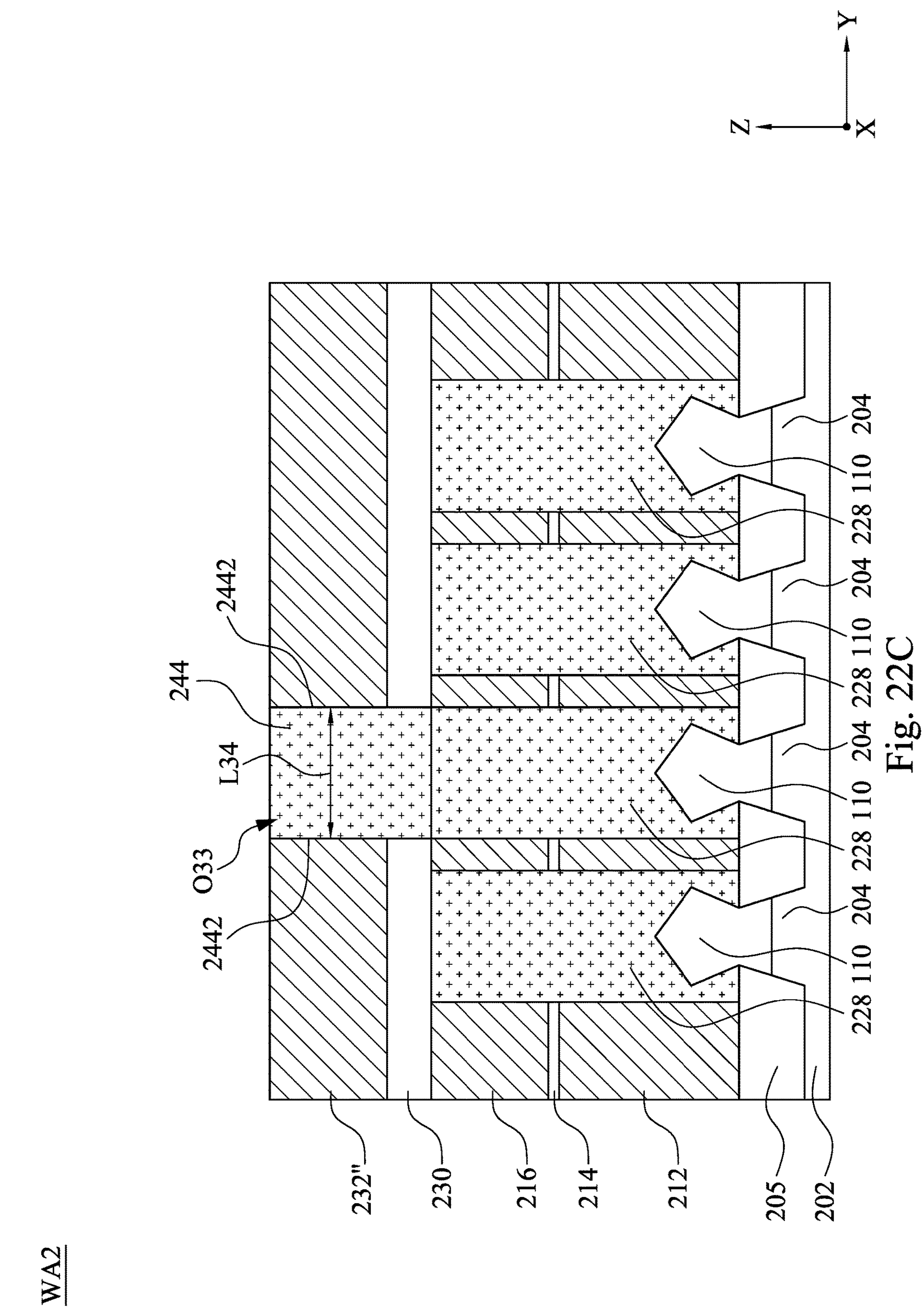
Figure 22D:
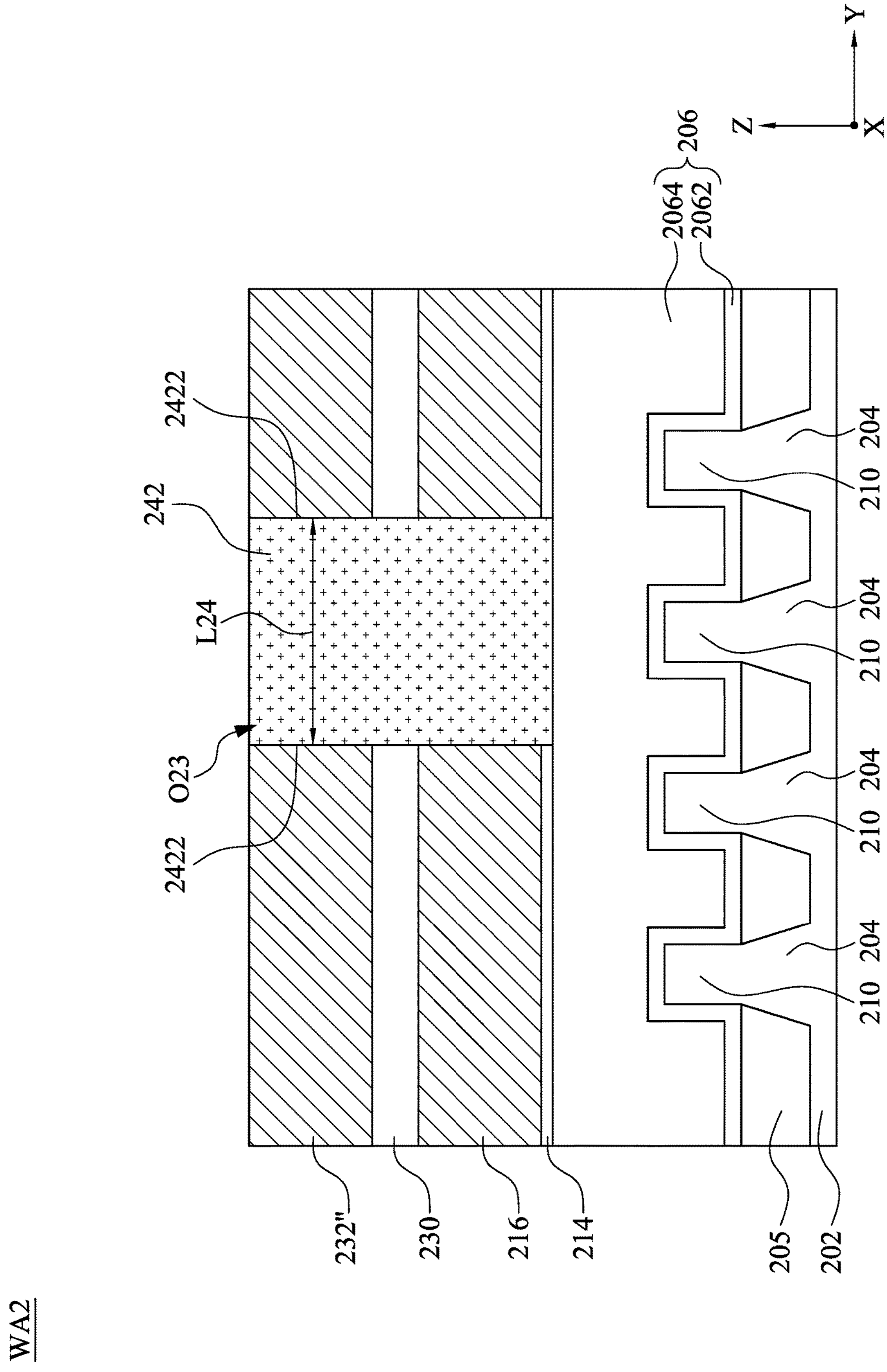

As a result of the patterning process, the source/drain via opening O33 inherits the pattern of the elongated opening O32" (as shown in FIGS. 20A-20C). In greater detail, the length L33 of the source/drain via opening O33 is substantially the same as the length L32" of the elongated opening O32", and the width W33 of the source/drain via opening O33 is substantially the same as the width W32" of the elongated opening O32". As shown in FIG. 21B, the width W33 of the source/drain via opening O33 and the width W23 of the gate contact opening O23 are controlled such that the source/drain via opening O33 and the gate contact opening O23 are separated from each other by the patterned ILD layer 232". This is advantageous for preventing shorting between the subsequently formed source/drain via and gate contact.

In some embodiments, the patterned third ILD layer 232" remains over the ESL 230, portions of the protective layer 240 remain alongside first sidewalls O331 of the source/drain via opening O33 that extends in Y-direction, and second sidewalls O332 of the source/drain via opening O33 that extends in X-direction are free from coverage by the protective layer 240.

In block S213 of the method M2 (shown in FIG. 11B), the gate contact opening O23 and the source/drain via opening O33 are filled with a conductive material using suitable deposition techniques. Thereafter, in block S214, the conductive material is planarized to form a gate contact 242 in the gate contact opening O23 and a source/drain via 244 in the source/drain via opening O33. The resulting structure is shown in FIGS. 22A-22D. The conductive material of the gate contact 242 and the source/drain via 244 includes, for example, any suitable metal such as Co, W, Ti, Ta, Cu, Al and/or Ni and/or nitride of Ti or Ta.

The gate contact 242 and the source/drain via 244 respectively inherit the pattern of the gate contact opening O23 and the source/drain via opening O33 (as shown in FIGS. 21A-21D). As a result, the length L24 of the gate contact 242 is substantially the same as the length L23 of the gate contact opening O23, the width W24 of the gate contact 242 is substantially the same as the width W23 of the gate contact opening O23, the length L34 of the source/drain via 244 is substantially the same as the length L33 of the source/drain via opening O33, the width W34 of the source/drain via 244 is substantially the same as the width W33 of the source/drain via opening O33. The width W24 of the gate contact 242 and the width W34 of the source/drain via 244 are controlled such that the gate contact 242 is separated from the source/drain via 244. The length L24 of the gate contact 242 is controlled such that the contact area between the gate contact 242 and the gate metal layer 2064 can be increased. The length L34 of the source/drain via 244 is controlled such that the contact area between the source/drain via 244 and the source/drain contact 228 can be increased.

In some embodiments, the gate contact 242 includes opposite first sidewalls 2421 extending substantially in Y-direction and opposite second sidewalls 2422 extending substantially in X-direction. The protective layer 236 (e.g., polymer layer) remains on the first sidewalls 2421 and is separated from the second sidewalls 2422. Similarly, the source/drain via 244 includes opposite first sidewalls 2441 extending substantially in Y-direction and opposite second sidewalls 2442 extending substantially in X-direction. The protective layer 240 (e.g., polymer layer) remains on the first sidewalls 2441 and is separated from the second sidewalls 2442. More particularly, the Y-directional sidewalls of the gate contact 242 and source/drain via 244 are partially covered by polymers, but the X-directional sidewalls of the gate contact 242 and source/drain via 244 are free from coverage by polymers.

Figure 23:
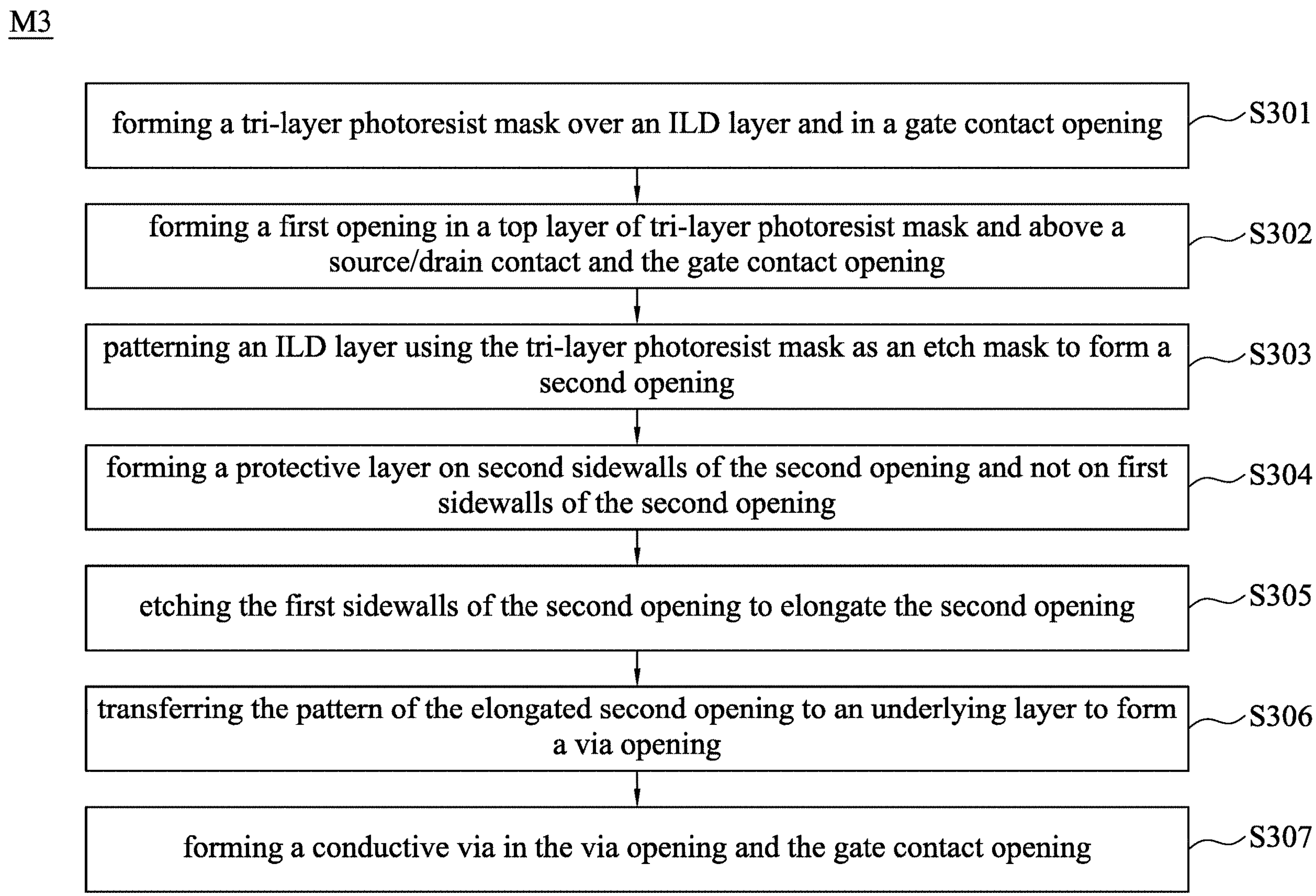
FIG. 23 is a flow chart of a method of forming a semiconductor device in accordance with some embodiments of the present disclosure.

FIG. 23 illustrates a method M3 that includes formation of an elongated via which is used to short a gate stack and a source/drain contact. FIGS. 24A-29B illustrate various processes at various stages of the method M3 of FIG. 23 in accordance with some embodiments of the present disclosure. Throughout the various views and illustrative embodiments, like reference numbers are used to designate like elements. In FIGS. 24A-29B, the "A" figures (e.g., FIGS. 24A, 25A, etc.) illustrate a cross-sectional view along X-direction, and the "B" figures (e.g., FIGS. 24B, 25B, etc.) illustrate another cross-sectional view along Y-direction. It is understood that additional operations can be provided before, during, and after the processes shown by FIGS. 24A-29B, and some of the operations described below can be replaced or eliminated, for additional embodiments of the method. The order of the operations/processes may be interchangeable.

Figure 17B:
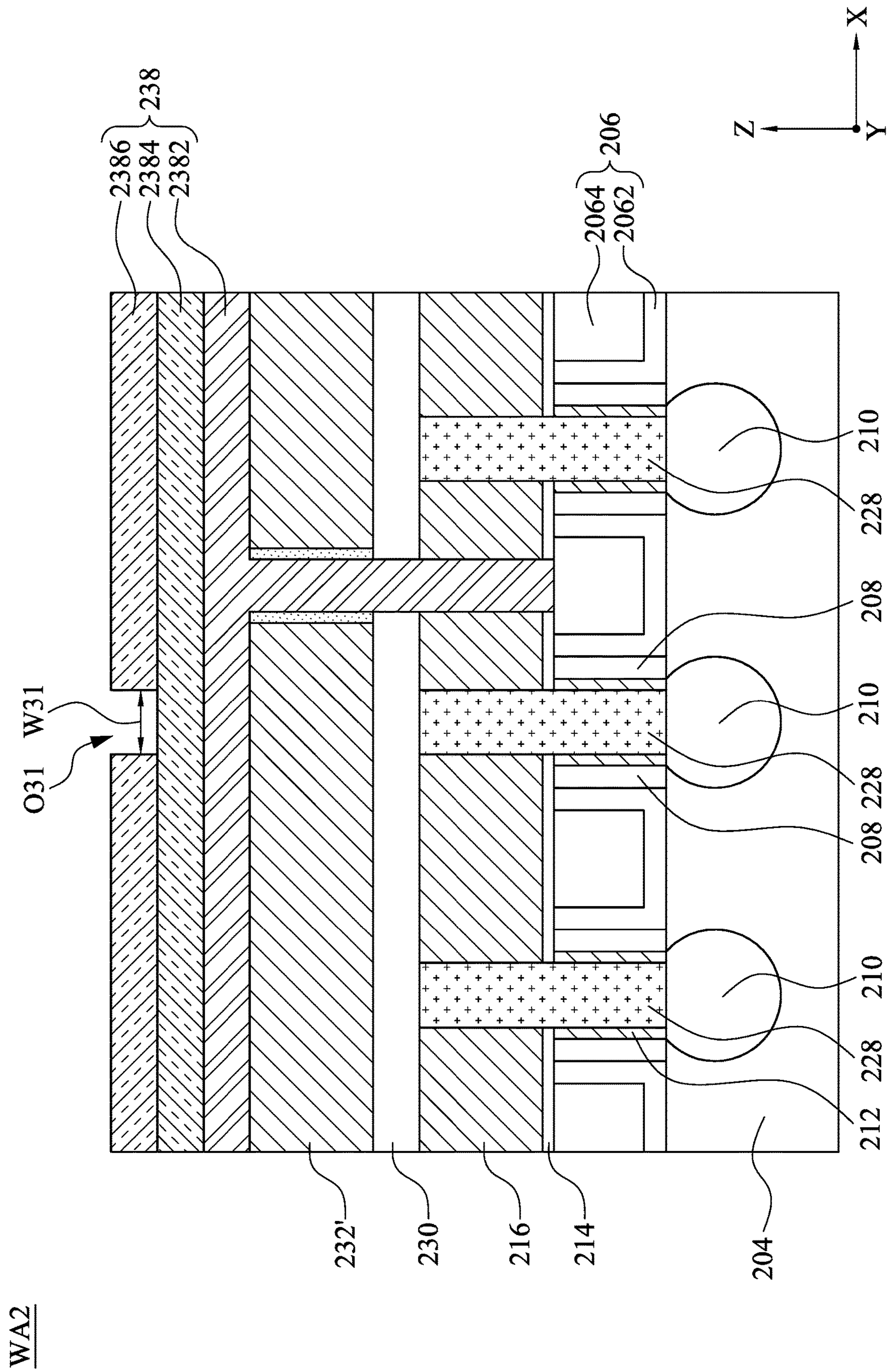
Figure 17C:
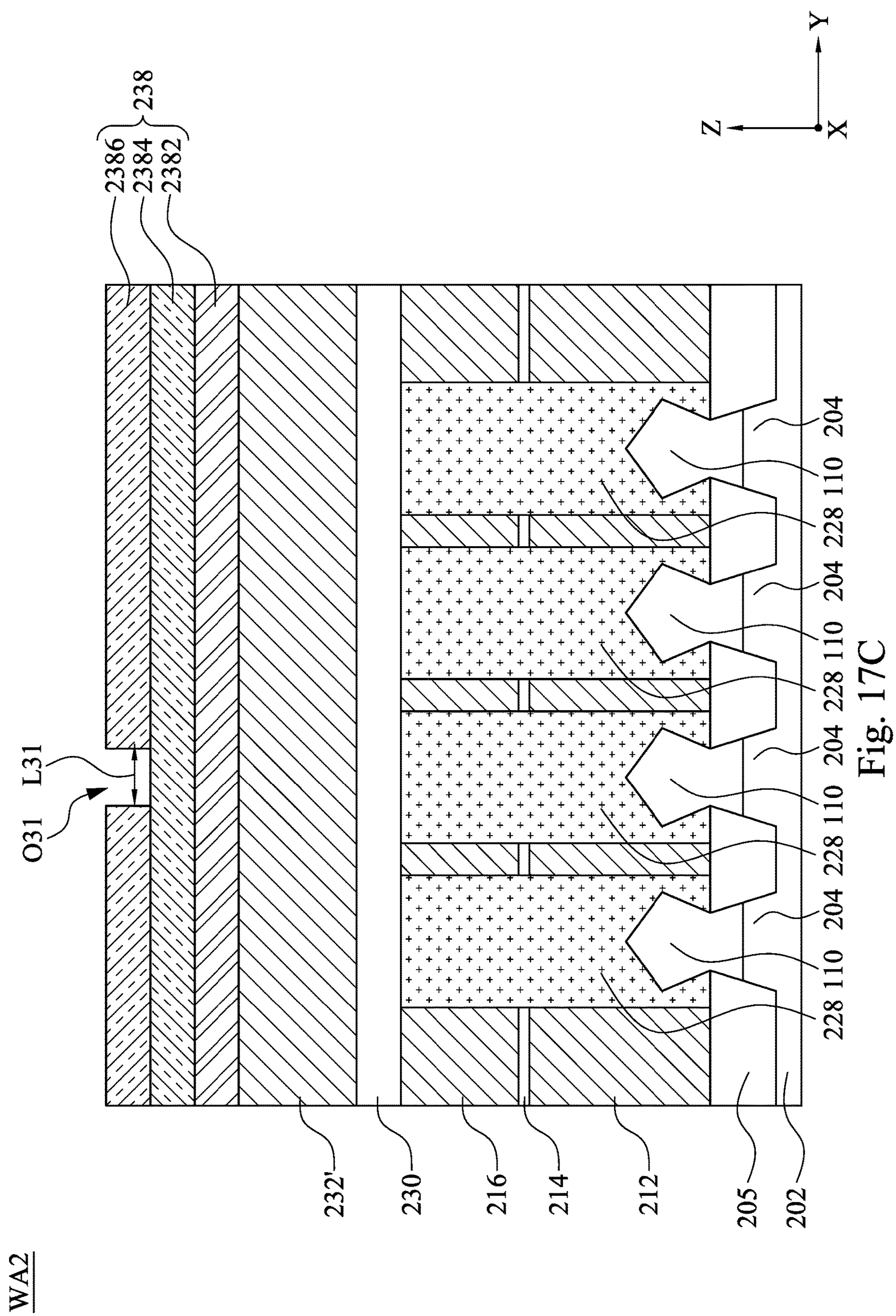
Figure 17D:
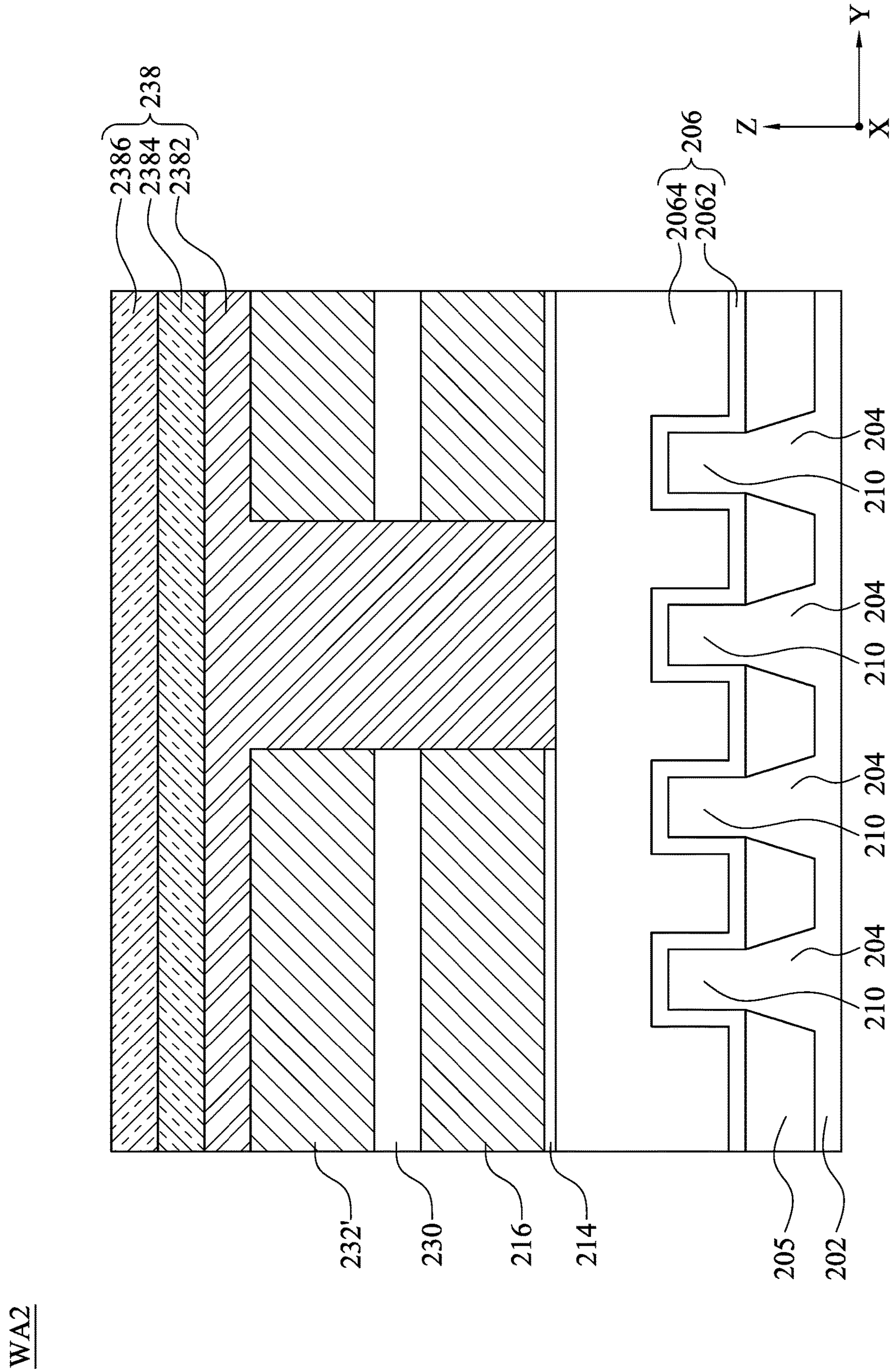
FIGS. 17D, 21D and 22D illustrate another cross-sectional view of a semiconductor device at various stages of the method of FIGS. 11A and 11B in accordance with some embodiments of the present disclosure.
Figure 24A:
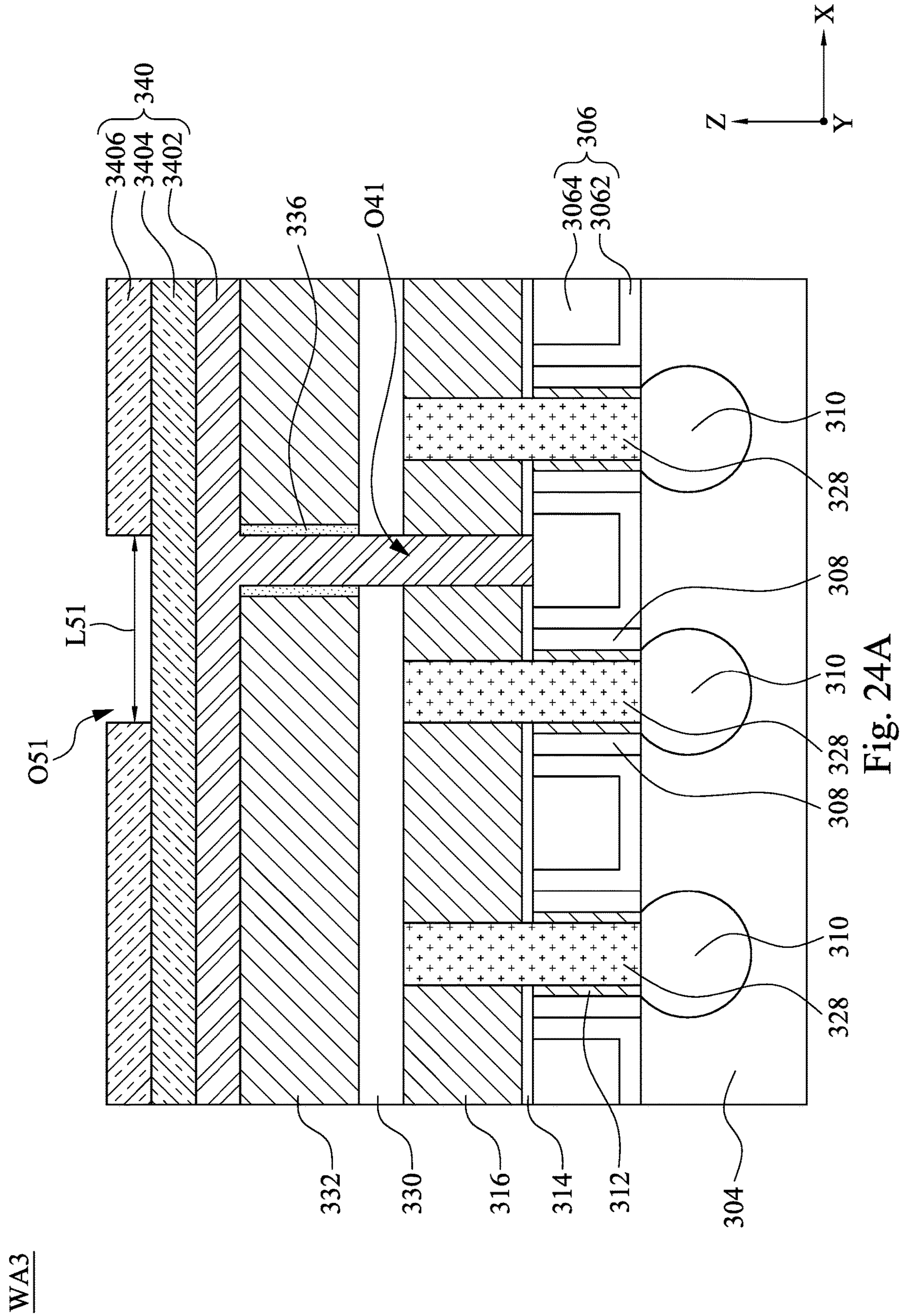
FIGS. 24A, 25A, 26A, 27A, 28A and 29A illustrate a cross-sectional view of a semiconductor device at various stages of the method of FIG. 23 in accordance with some embodiments of the present disclosure.
Figure 24B:
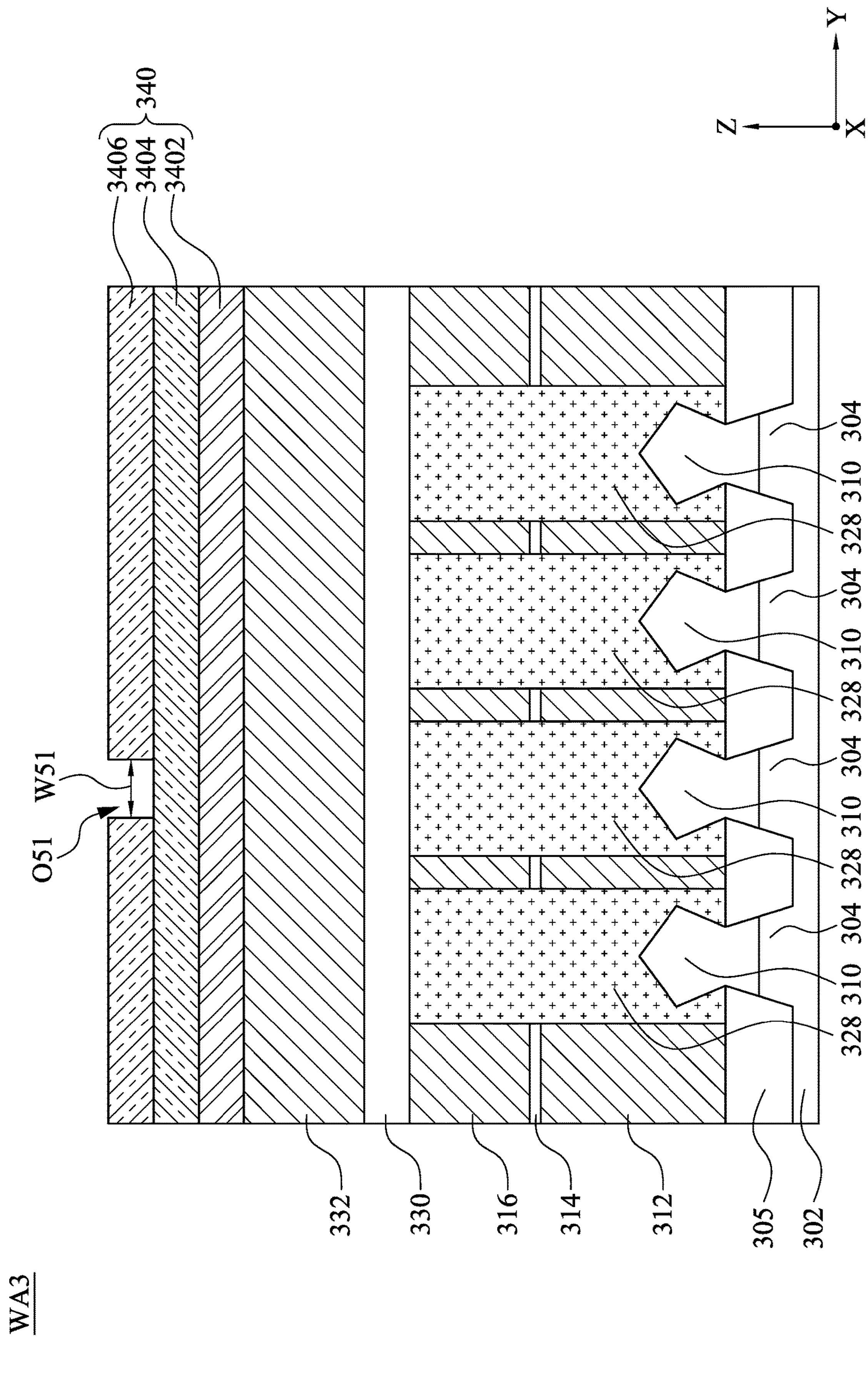
FIGS. 24B, 25B, 26B, 27B, 28B and 29B illustrate another cross-sectional view of a semiconductor device at various stages of the method of FIG. 23 in accordance with some embodiments of the present disclosure.

As illustrated in FIGS. 24A-24B, a semiconductor wafer WA3 is substantially similar to the semiconductor wafer WA2 as shown in FIGS. 17B and 17C in many respects, and includes a substrate 302, semiconductor fins 304, STIs 305, gate stacks 306 having gate dielectric layers 3062 and metal layers 3064, gate spacers 308, source/drain regions 310, a first ILD 312, a first ESL 314, a second ILD 316, source/drain contacts 328, an ESL 330 and a third ILD layer 332, each substantially as described above with respect to the substrate 202, semiconductor fins 204, STIs 205, gate stacks 206 having gate dielectric layers 2062 and metal layers 2064, gate spacers 208, source/drain regions 210, the first ILD 212, the first ESL 214, the second ILD 216, the source/drain contacts 228, the ESL 230 and the third ILD layer 332. The semiconductor wafer WA2 also includes an gate contact opening O41 that may be formed using, for example, an elongating process involving a directional deposition process and a directional etching process, as described above with respect to the gate contact opening O23. As a result, polymers resulting from the directional deposition process remain on particular sidewalls of the gate contact opening O41 and can referred to as a protective layer (or polymer layer) 336. In some other embodiments, the gate contact opening O41 is formed without using the directional deposition process and the directional etching process, and thus the protective layer 336 may be absent from the gate contact opening O41.

In block S301, a tri-layer photoresist mask 340 is formed over the third ILD layer 332 and in the gate contact opening O41. The tri-layer photoresist mask 340 includes a bottom layer 3402, a middle layer 3404 and a top layer 3406, respectively similar to the bottom layer 1222, the middle layer 1224 and the top layer 1226 of the tri-layer photoresist mask 122 as discussed previously with respect to FIGS. 3A-3C. Description about the bottom layer 3402, the middle layer 3404 and the top layer 3406 is thus not repeated for the sake of brevity. The gate contact opening O41 is overfilled with the bottom layer 3402 of the tri-layer photoresist mask 340.

In block S302, a first opening O51 is formed in the top layer 3406 and above the source/drain contact 328 and the gate contact opening O41. Formation of the first opening O51 includes irradiating the top layer 3406 and developing the top layer 3406 to remove portions of the top layer 3406. The first opening O51 has a length L51 in X-direction and a width W51 in Y-direction, and the length L51 is greater than the width W51.

Figure 25A:
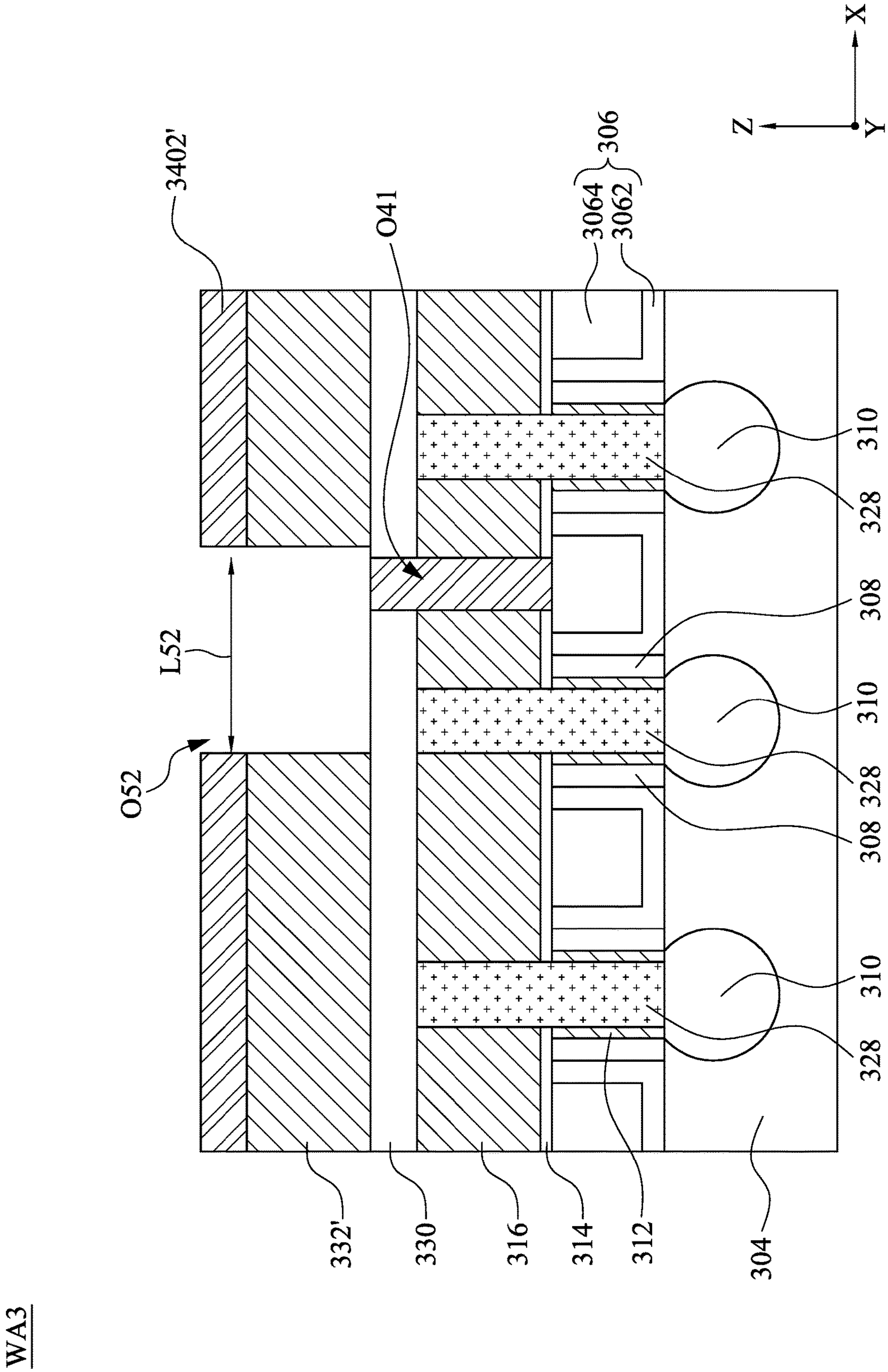
Figure 25B:
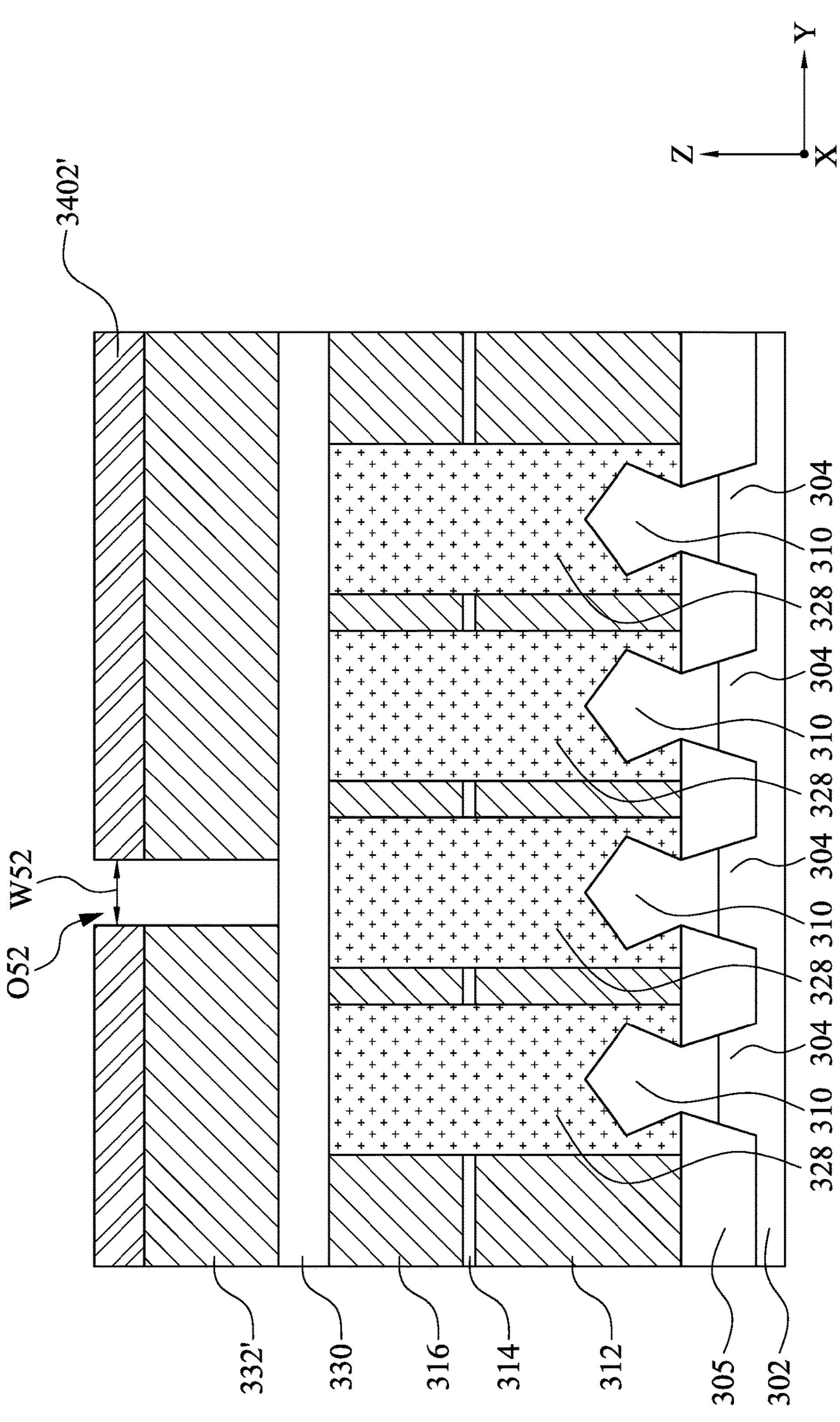

Returning to FIG. 23, the method M3 then proceeds to block S303 where the third ILD layer is patterned using the tri-layer photoresist mask as an etch mask to form a second opening. With reference to FIGS. 25A-25B, in some embodiments of block S303, a patterning process is performed on the third ILD layer 332 to transfer the pattern of the first opening O51 in the patterned top photoresist layer 3406 to the third ILD layer 332, resulting in a second opening O52 in the third ILD layer 332'. In some embodiments, the patterning process comprises one or more etching processes, where the tri-layer photoresist mask 340 is used as an etch mask. The one or more etching processes may include anisotropic wet etching processes, anisotropic dry etching processes, or combinations thereof. During the patterning process, the patterned top layer 3406 and the middle layer 3404 of the photoresist mask 234 may be consumed, and portions of the bottom layer 3402 may remain after the patterning process. In this way, the patterning process also results in a patterned bottom layer 3402' over the patterned ILD layer 332'.

The patterned bottom layer 3402' and the patterned ILD layer 332' inherit the pattern in the top photoresist layer 3406, and thus the second opening O52 has substantially the same shape, size and position as the first opening O51 in the patterned top photoresist layer 3406. For example, the second opening O52 has a length L52 in X-direction and a width W52 in Y-direction, and the length L52 is greater than the width W52.

Figure 26A:
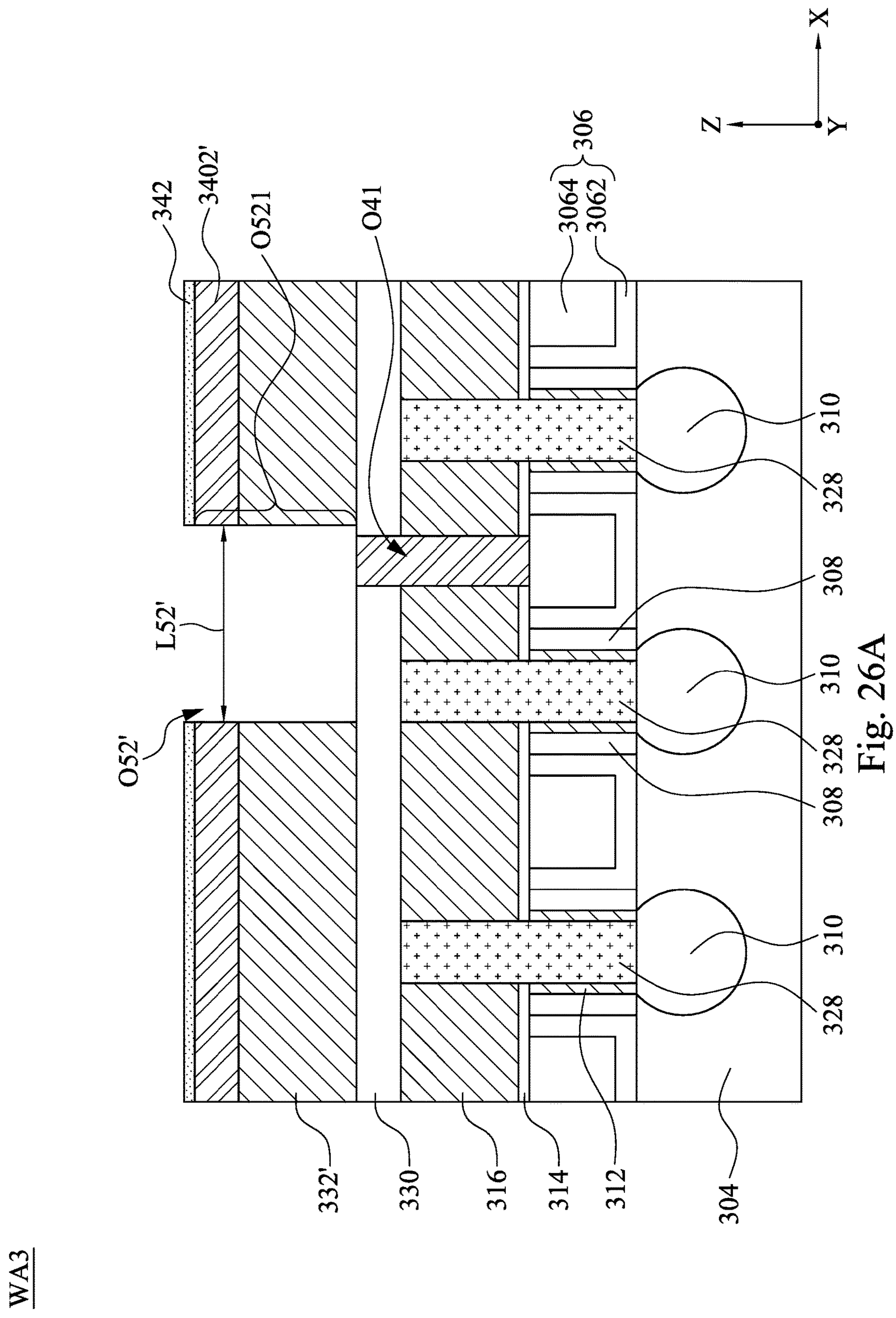
Figure 26B:
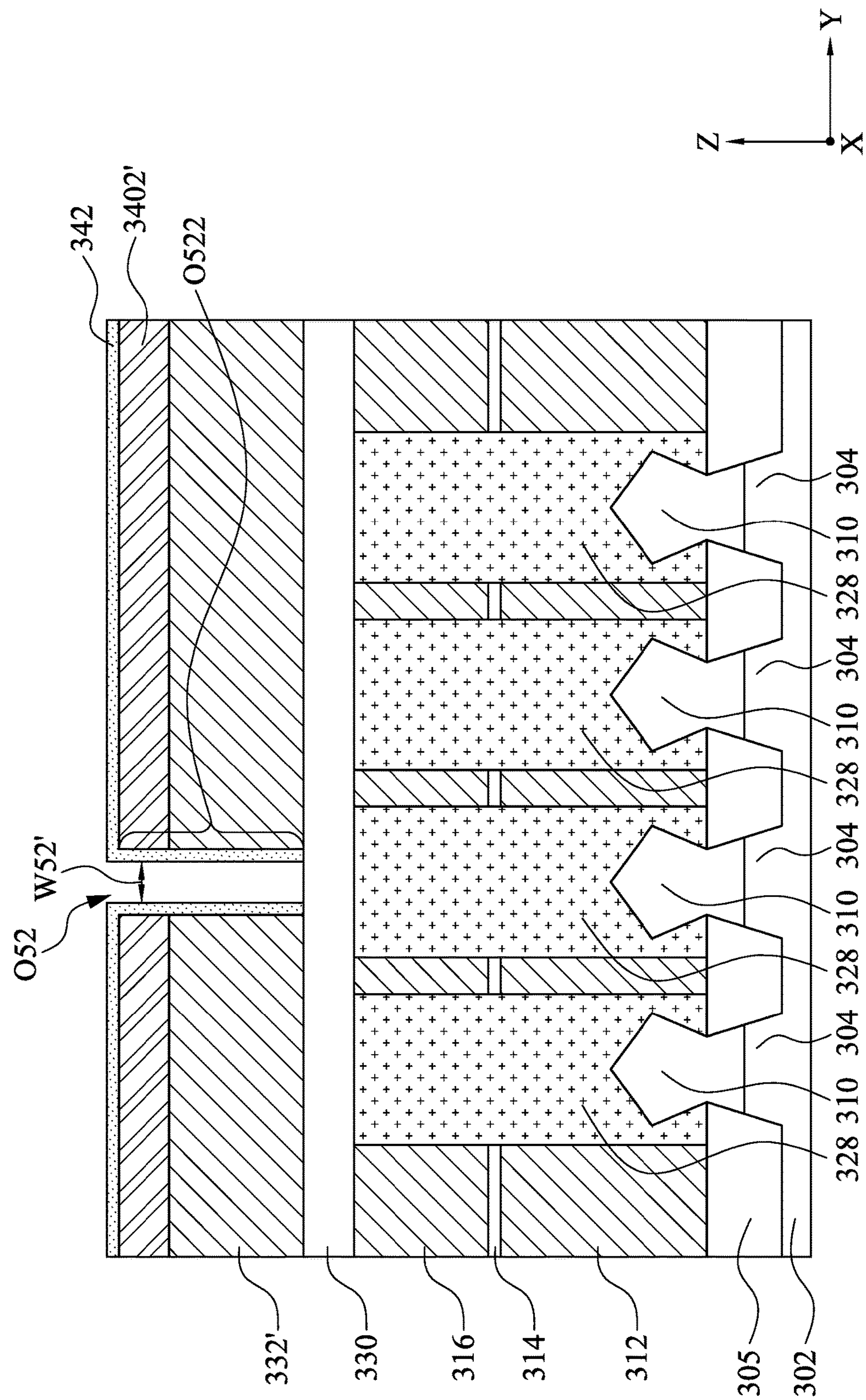

With reference to FIGS. 26A-26B, in some embodiments of block S304, a directional deposition process is performed to form a protective layer 342 on second sidewalls O522 of the second opening O52' that extend in X-direction (i.e., the direction extending into and out of the plane of the page of FIG. 26B) and substantially not on first sidewalls O521 of the second opening O52' that extend in Y-direction (i.e., the direction extending into and out of the plane of the page of FIG. 26A). The directional etching process may be performed using directional ions, thus resulting in a higher deposition rate in Y-direction than in X-direction, so that the second sidewalls O522 can be deposited with more polymers (e.g., carbon-containing polymers, chlorine-containing polymers and/or bromine-containing polymers) than the first sidewalls O521. For example, a ratio of the deposition rate in Y-direction to the deposition rate in X-direction is in a range from about 10:1 to about 30:1.

The directional deposition process can be performed using, for example, the plasma tool 900 as illustrated in FIG.

38. In greater detail, the ions 922*a* and 922*b* can be extracted and directed to the wafer WA2. Trajectories of the ions 922*a* and 922*b* can be controlled to extend in X-direction and Z-direction but substantially not in Y-direction in FIG. 38 as discussed previously. Therefore, the wafer WA3 can be orientated such that the ions 922*a* and 922*b* can be directed at second sidewalls O522 while substantially not being directed at the first sidewalls O521. In some embodiments, the process conditions are selected such that polymerization phenomenon resulting from ions is dominant over etching phenomenon resulting from ions, so that the ions 922*a* and 922*b* directed at the second sidewalls O522 but substantially not at first sidewalls O521 can result in deposition of polymers on second sidewalls O522 but substantially not on first sidewalls O521. These deposited polymers can be referred to as a protective layer (or polymer layer) 342. In some embodiments, process conditions of the directional deposition process are similar to those of the directional deposition process as discussed previously with respect to FIGS. 6A-6C, and are not repeated for the sake of brevity.

As a result of the directional deposition, the length L52' of the second opening O52' in X-direction remains substantially the same as the length L52 of the second opening O52 (as shown in FIG. 24A), and the width W52' of the second opening O52' in Y-direction is less than the width W52 of the second opening O52. The difference between the width W52' of the second opening O52' after directional deposition and the width W52 of the second opening O52 before directional deposition is substantially twice the thickness of the protective layer 342. In some embodiments, the directional deposition results in deposition of polymers over a top surface of the patterned bottom layer 3402', so that the protective layer 342 extends over the top surface of the patterned bottom layer 3402'. In some embodiments, the ESL 330 at a bottom of the second opening O52' may be free from coverage by the protective layer 342 (i.e., polymers) due to the shadowing effect resulting from the directional ions.

Figure 27A:
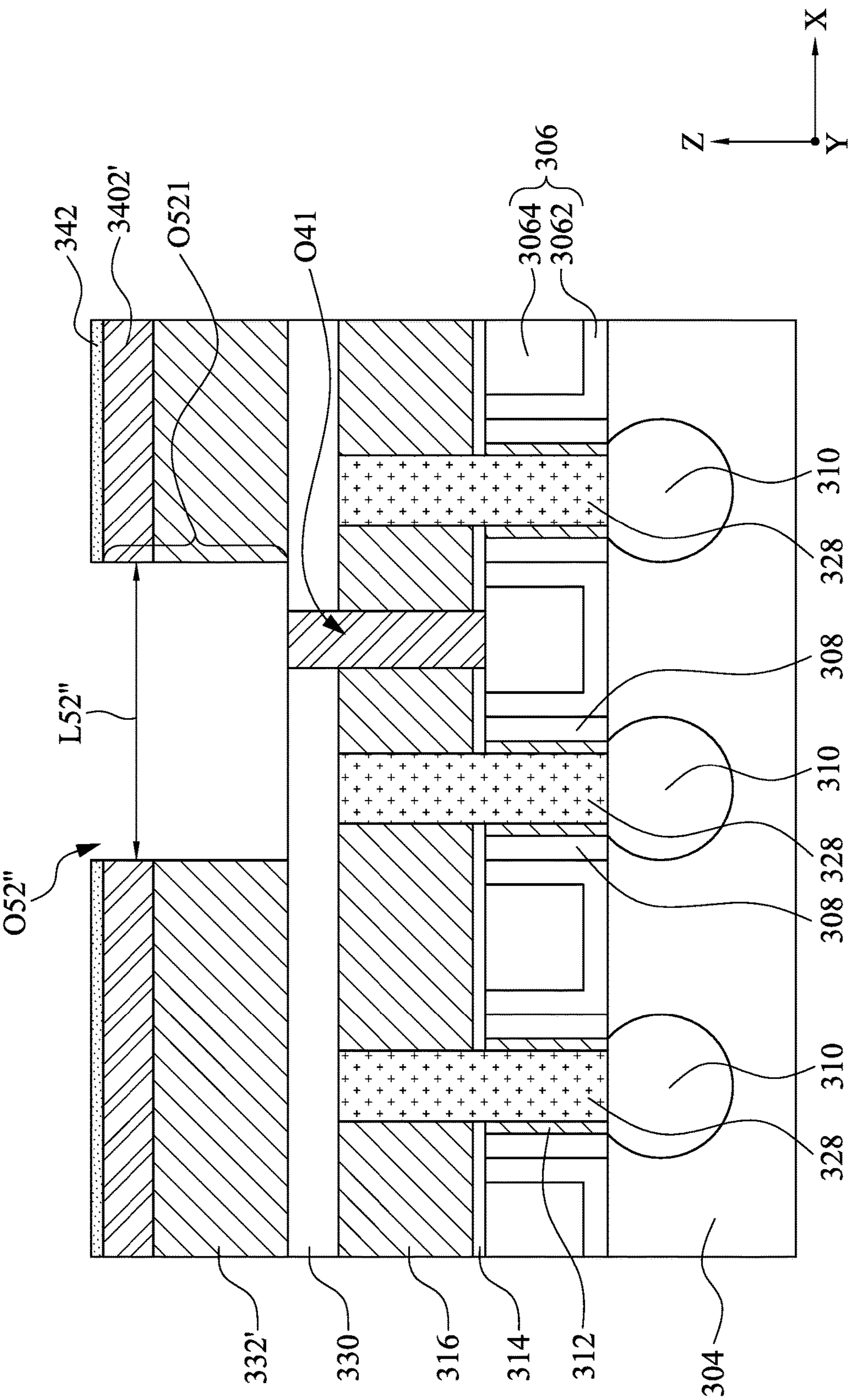
Figure 27B:
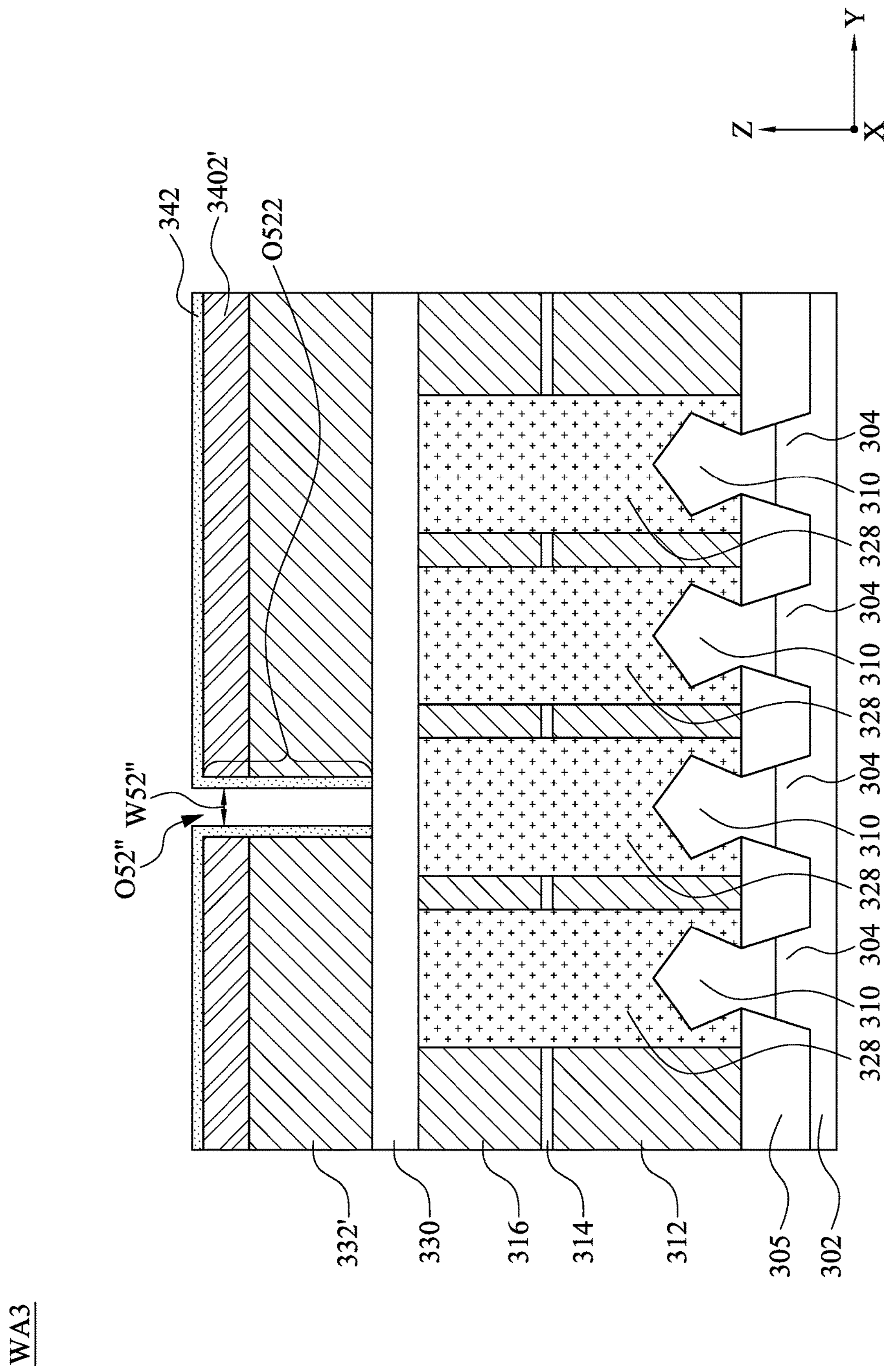

Returning to FIG. 23, the method M2 then proceeds to block S305 where first sidewalls of the second opening are etched to elongate the second opening. In some embodiments of block S205, a directional etching process is performed on the first sidewalls O521 of the second opening O52', thus resulting in elongated opening O52" as shown in FIGS. 27A-27B. The directional etching process is performed using directional ions. For example, the directional etching process can be performed using the plasma tool 900 as illustrated in FIG. 38, as described below in detail.

After performing the direction deposition process on the wafer WA3 in the plasma tool 900, the wafer WA3 can be rotated about the Z-directional shaft 929 by about 88-92 degrees (e.g., about 90 degrees). Thereafter, the ions 922*a* and 922*b* can be extracted and directed at the first sidewalls O521 of the second opening O52' while substantially not being directed at the protective layer 342 alongside the second sidewall O522 of the second opening O52'. In some embodiments, the process conditions are selected such that etching phenomenon resulting from ions is dominant over polymerization phenomenon resulting from ions. As a result, the ions 922*a* and 922*b* can result in etching first sidewalls O521 but substantially not etching the protective layer 342 alongside the second sidewalls O522. In this way, the directional etching process can elongate the second openings O52' by etching the first sidewalls O521 but substantially not etching the second sidewalls O522, thus resulting in elongated openings O52" as illustrated in FIGS. 27A-27B. In some embodiments, process conditions of the directional etching process are similar to those of the directional etching process as discussed previously with respect to FIGS. 7A-7C, and are not repeated for the sake of brevity.

As a result of the directional etching, the length L52" of the elongated opening O52" is greater than the length L52' of the second opening O52' (as shown in FIG. 26A), and the W52" of the elongated opening O52" remains substantially the same as the width W52' of the second opening O52'. In some embodiments where the gate contact opening O41 is formed using an elongation process as discussed previously with respect to FIGS. 12A-16C, a lengthwise direction of the gate contact opening O41 would be parallel to Y-direction (i.e., the direction extending into and out of the plane of the page of FIG. 27A), and thus perpendicular to the lengthwise direction of the elongated opening O52". An example ratio of the resultant length L52" to the resultant width W52" is in a range from about 2.7:1 to about 4.6:1. In some embodiments, the directional etching process of block S305 may be in-situ performed with the directional deposition process of block S304, which in turn will prevent contamination on the wafer WA3.

Figure 28A:
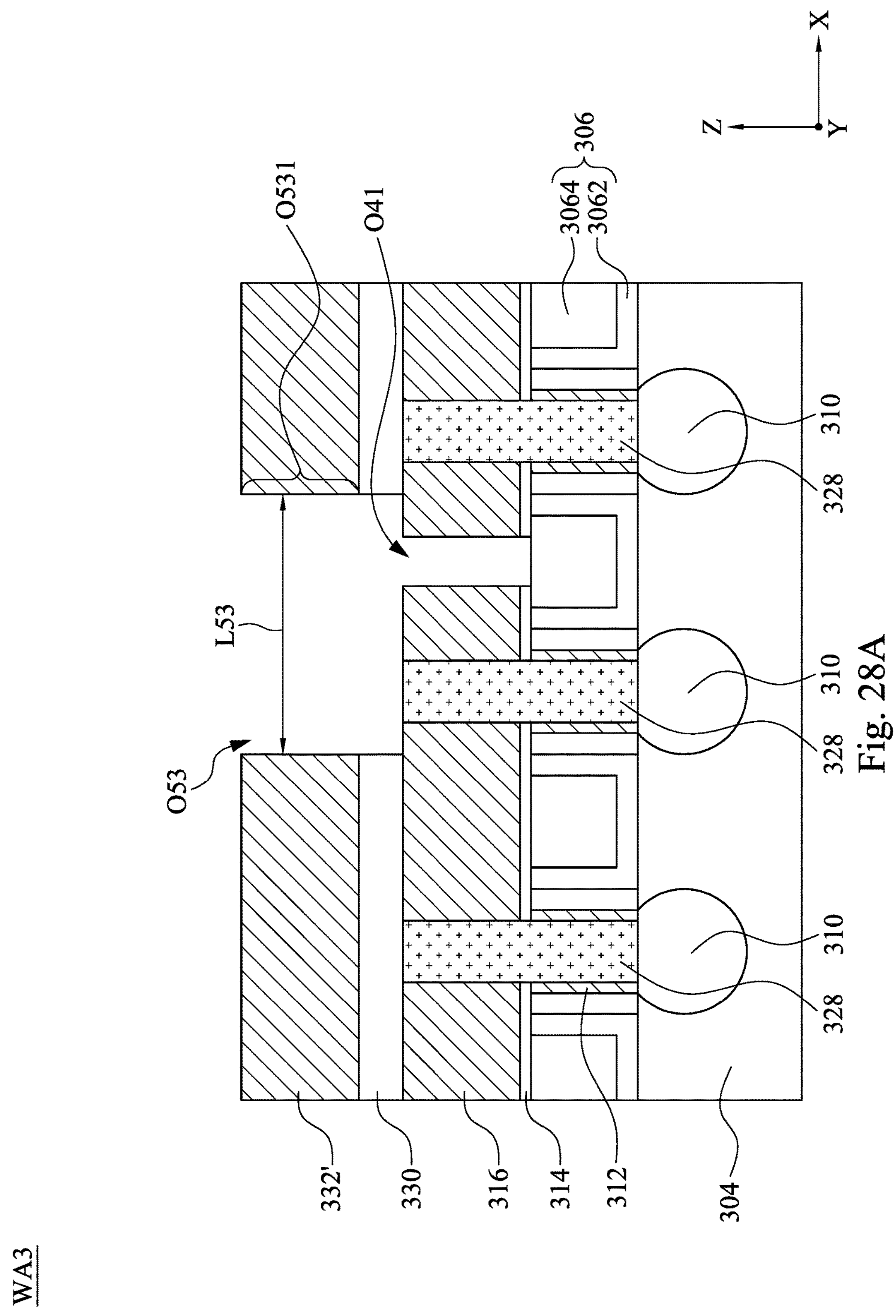
Figure 28B:
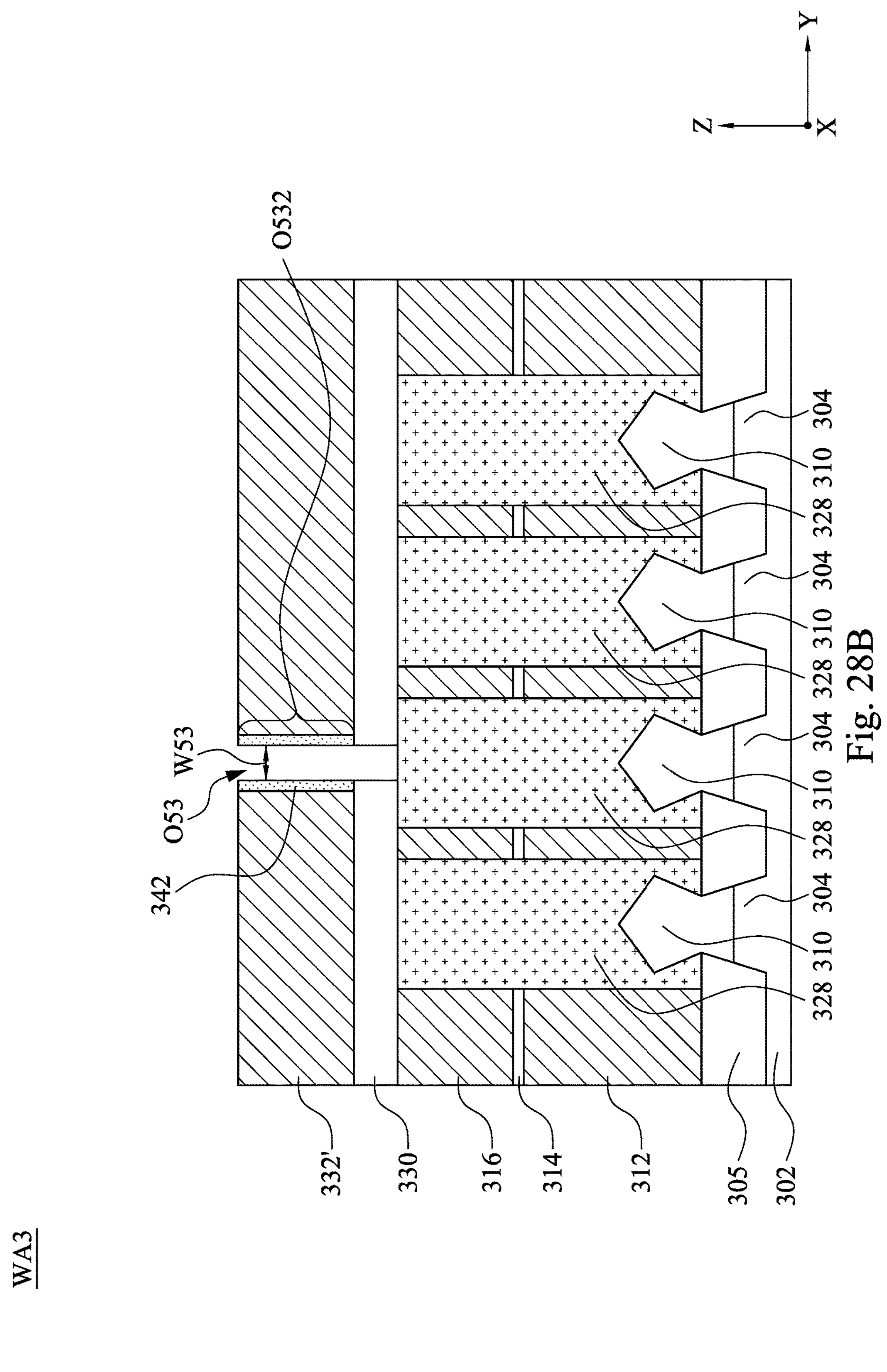

Returning to FIG. 23, the method M2 then proceeds to block S306 where the pattern of the elongated opening is transferred to an underlying layer to form a via opening. With reference to FIGS. 28A-28B, in some embodiments of block S306, a patterning process is performed on the ESL 330 to transfer the pattern of the elongated opening O52" to the ESL 330, resulting in a via opening O53 through the ESL 330 and exposing the source/drain contact 328. In some embodiments, the patterning process comprises one or more etching processes, where a combination of the protective layer 342, the patterned bottom layer 3402' and the patterned ILD 332 is used as an etch mask. The one or more etching processes may include anisotropic wet etching processes, anisotropic dry etching processes, or combinations thereof. During the patterning process, the patterned bottom layer 3402' may be consumed. In some embodiments, residues of the patterned bottom layer 3402' may be removed using suitable etchants, so that both the gate contact opening O41 and the via opening O53 are exposed. The gate contact opening O41 extends from a bottom of the via opening O53 to the gate metal layer 3604.

As a result of the patterning process, the via opening O53 inherits the pattern of the elongated opening O52" (as shown in FIGS. 27A-27B). In greater detail, the length L53 of the via opening O53 is substantially the same as the length L52" of the elongated opening O52", and the width W53 of the via opening O53 is substantially the same as the width W52" of the elongated opening O52".

In some embodiments, the patterned third ILD layer 332' remains over the ESL 330, portions of the protective layer 342 remain alongside second sidewalls O532 of the via opening O53 that extends in X-direction (i.e., the direction extending into and out of the plane of the page of FIG. 28B), and first sidewalls O531 of the via opening O53 that extends in Y-direction (i.e., the direction extending into and out of the plane of the page of FIG. 28A) are free from coverage by the protective layer 342.

Figure 29A:
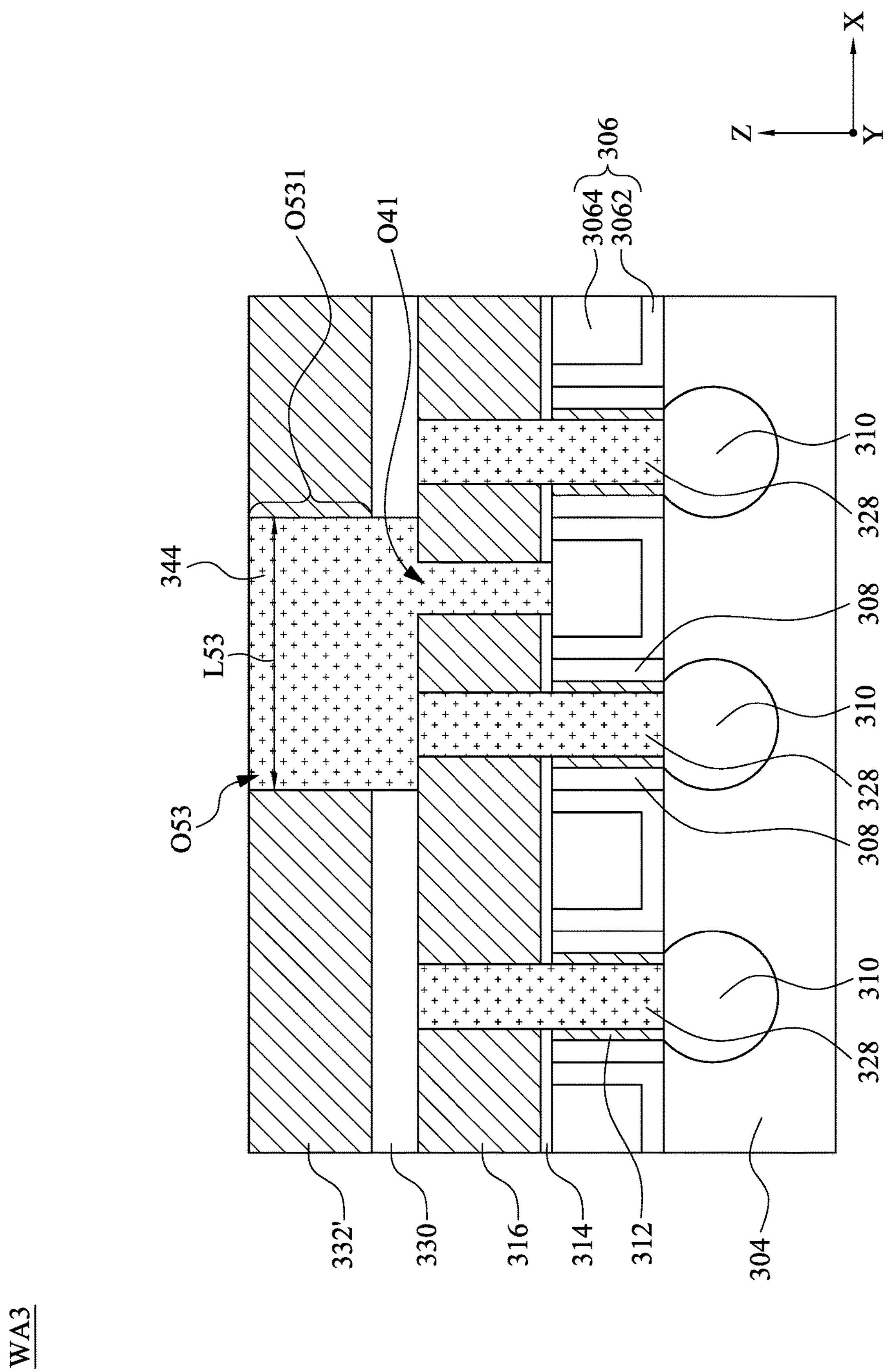
Figure 29B:
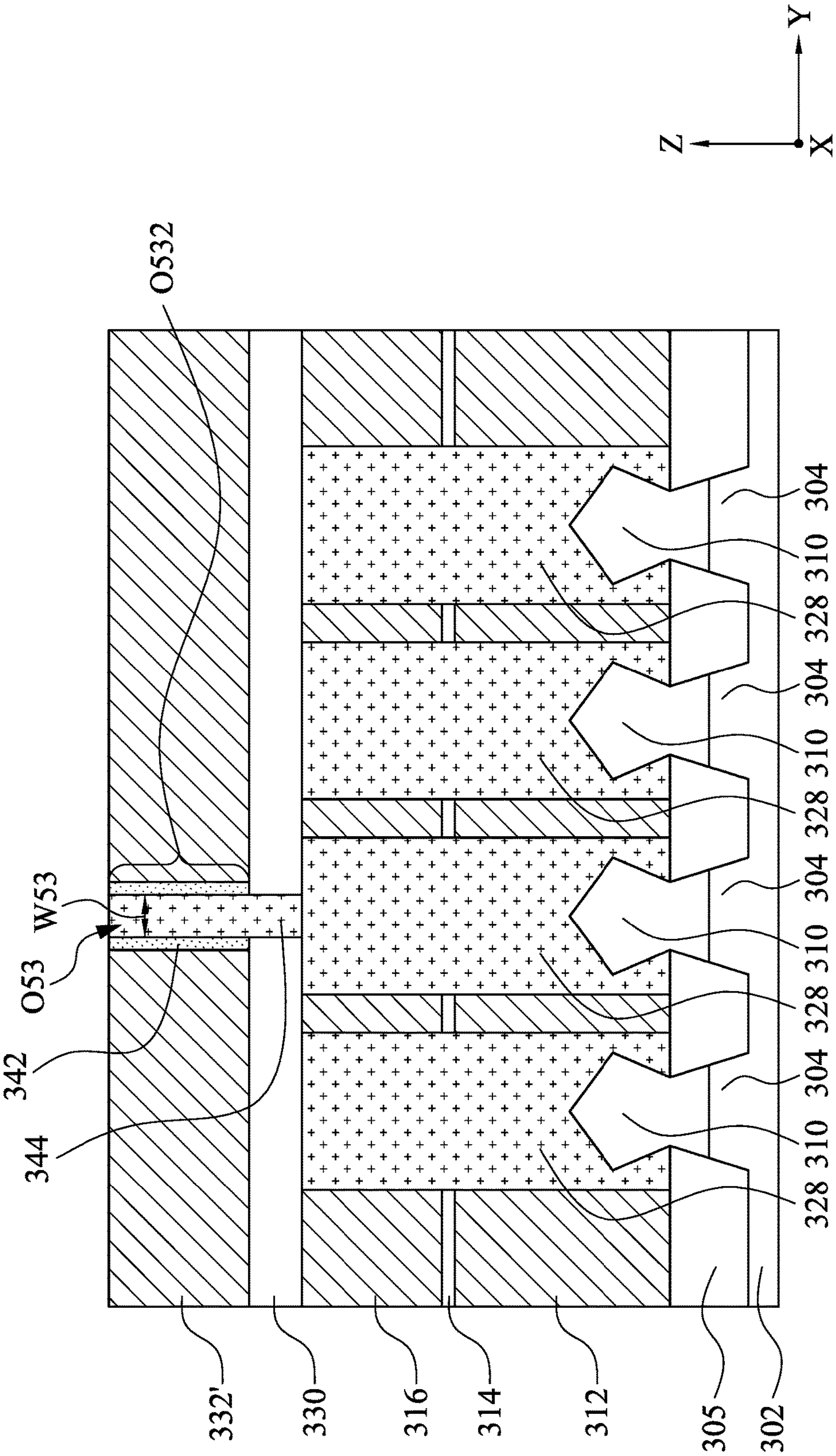

Thereafter, in block S307 of the method M3 (shown in FIG. 23), a conductive via 344 is formed in the gate contact opening O41 and the via opening O53, as shown in FIGS. 29A and 29B. Formation of the conductive via 344 includes, for example, overfilling the gate contact opening O41 and the via opening O53 with a conductive material, followed by performing a CMP process to remove the excess conductive material outside the gate contact opening O41 and the via opening O53. The conductive material of the conductive via 344 includes, for example, any suitable metal such as Co, W, Ti, Ta, Cu, Al and/or Ni and/or nitride of Ti or Ta.

Figure 30:
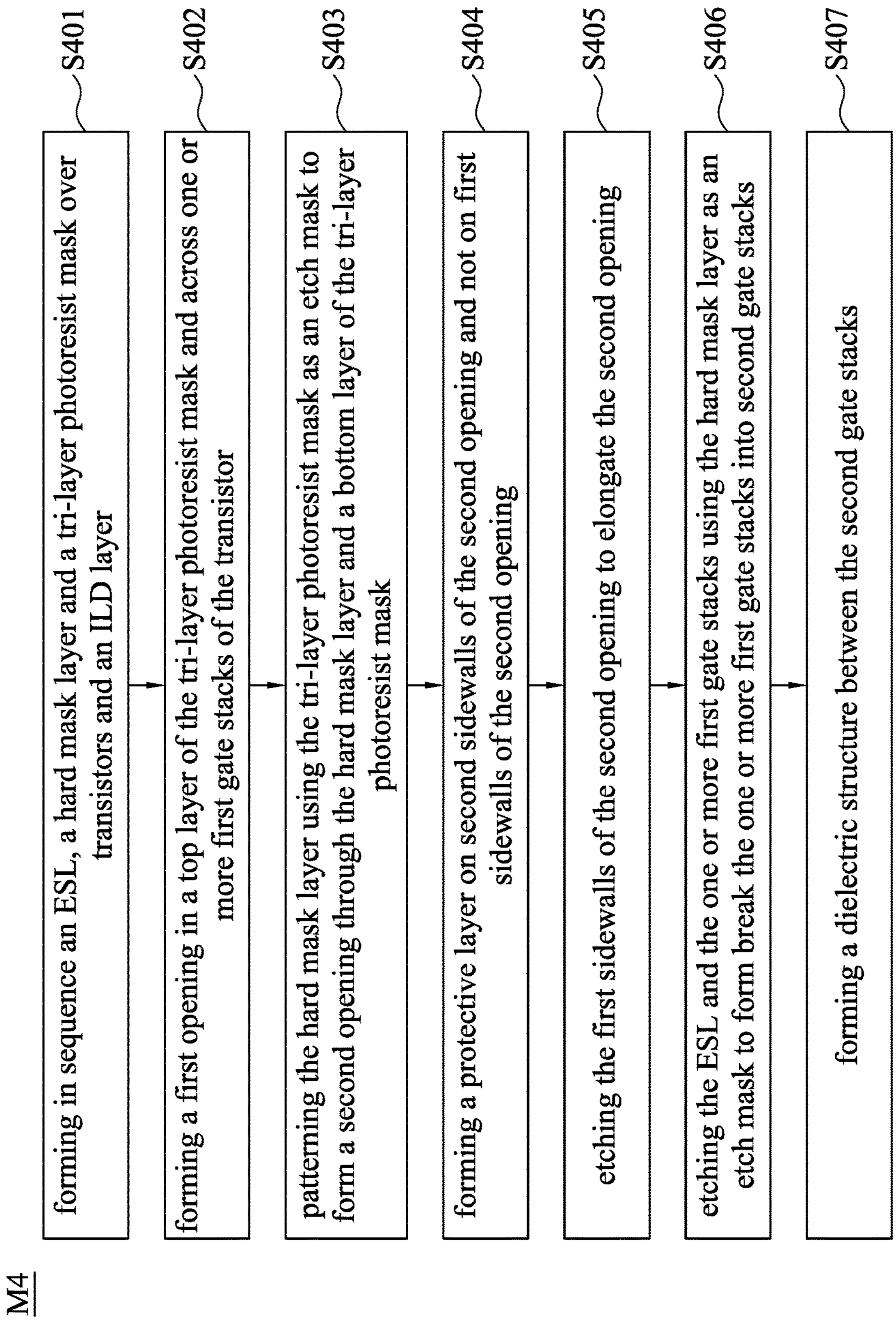
FIG. 30 is a flow chart of a method of forming a semiconductor device in accordance with some embodiments of the present disclosure.
Figure 31A:
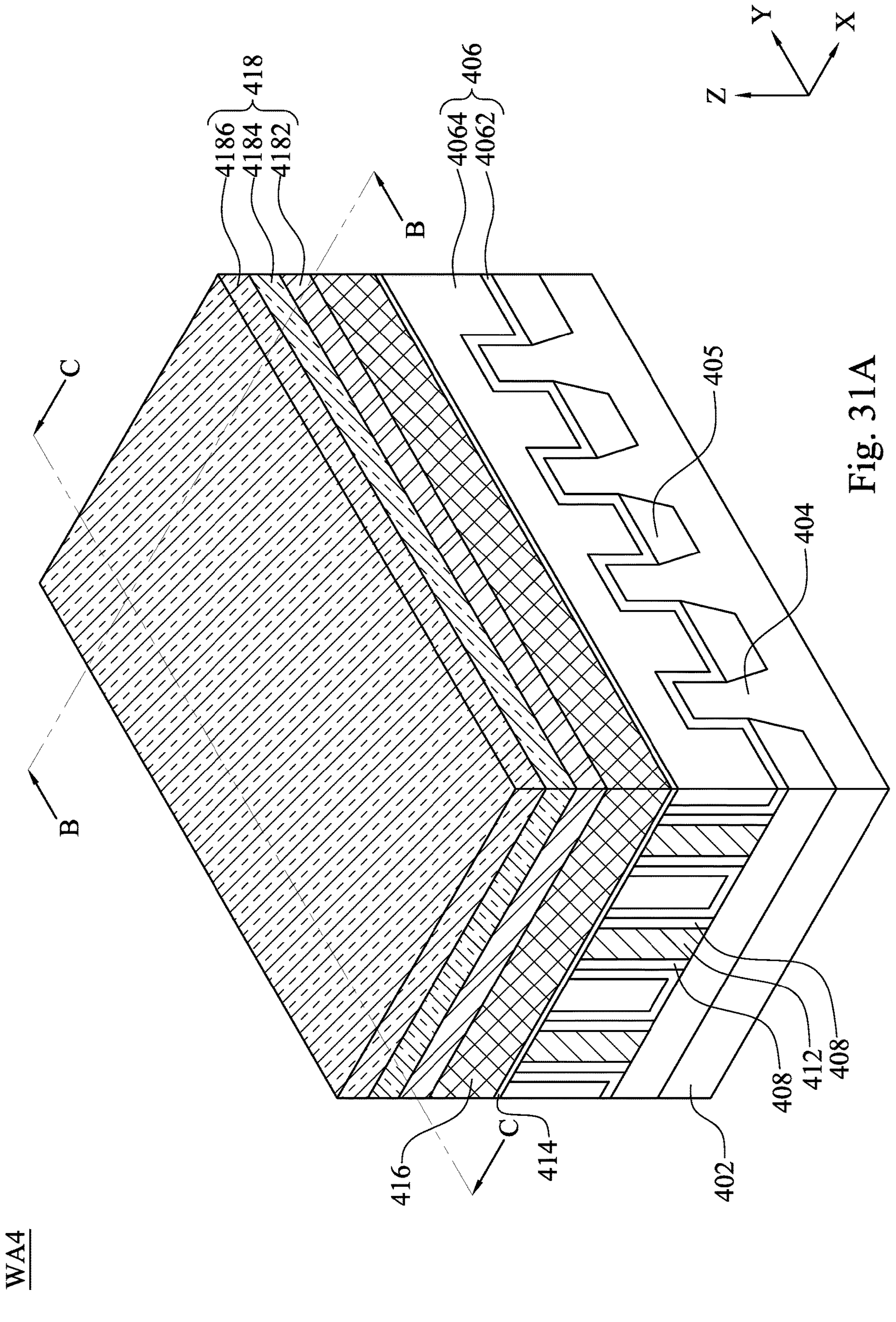
FIG. 31A illustrates a perspective view of a semiconductor device at various stages of the method of FIG. 30 in accordance with some embodiments of the present disclosure.
Figure 31B:
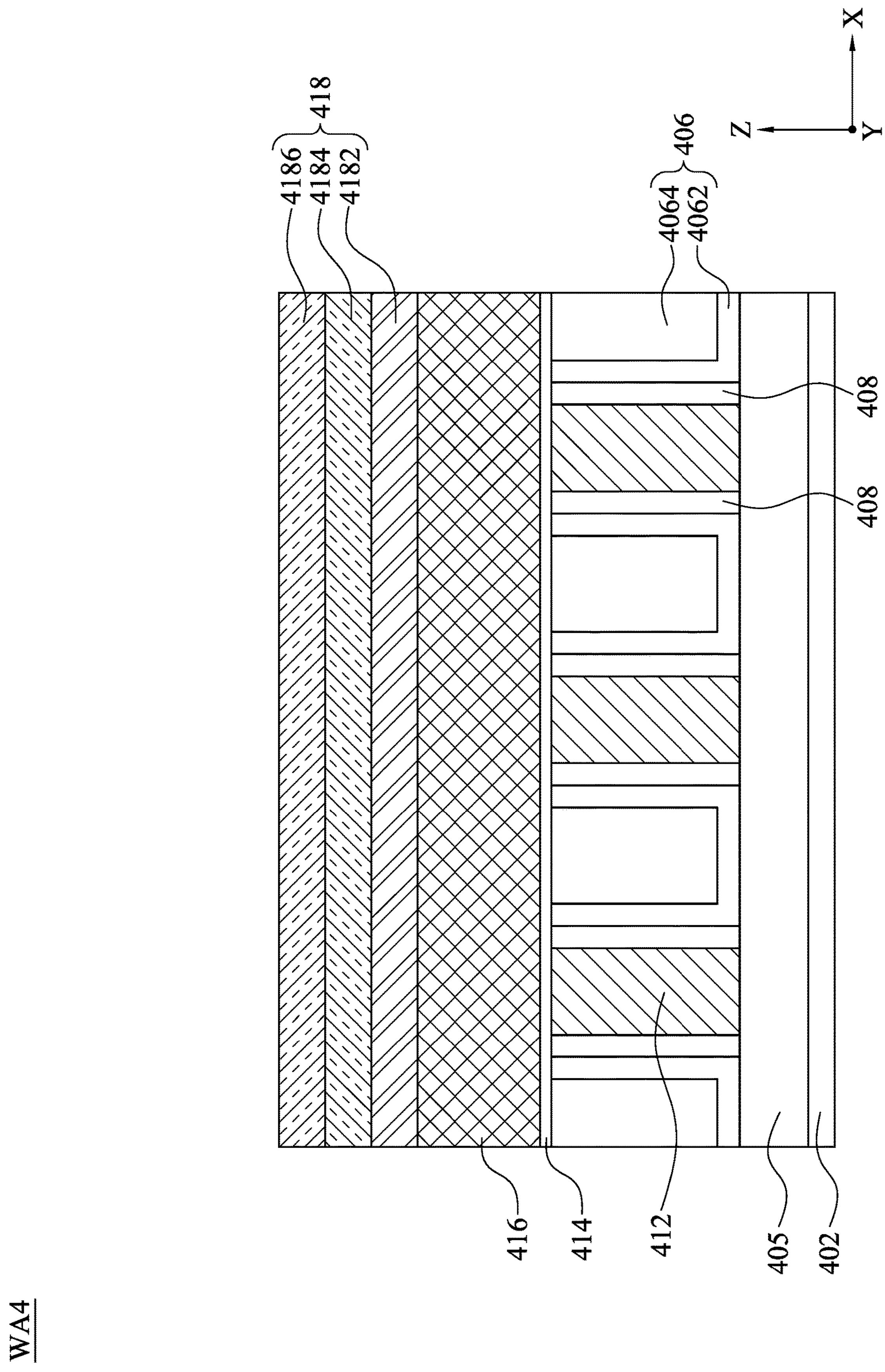
FIGS. 31B, 32B, 33B, 34B, 35B, 36B and 37B illustrate a cross-sectional view of a semiconductor device at various stages of the method of FIG. 30 in accordance with some embodiments of the present disclosure.
Figure 31C:
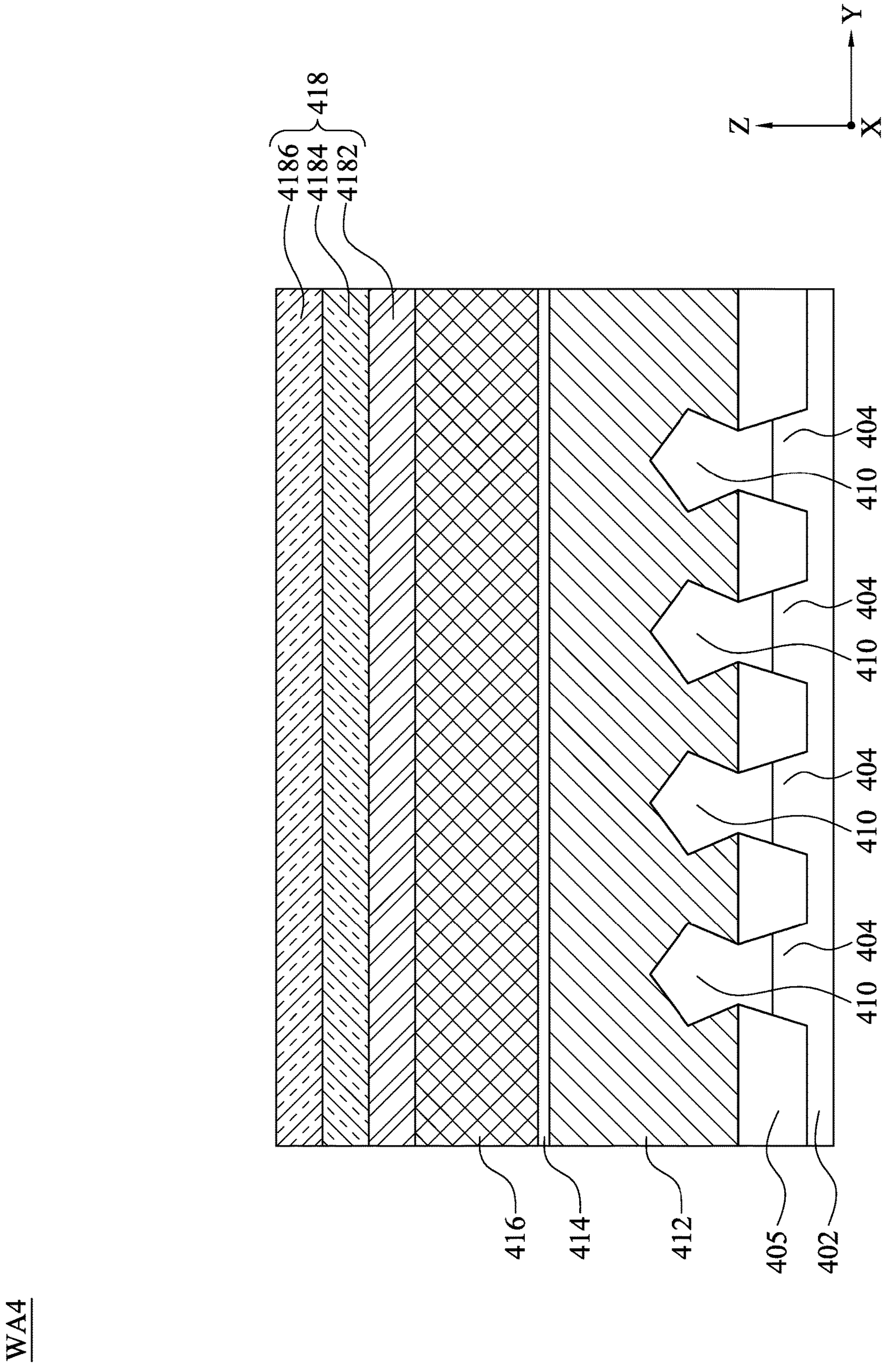
FIGS. 31C, 32C, 33C, 34C, 35C, 36C and 37C illustrate another cross-sectional view of a semiconductor device at various stages of the method of FIG. 30 in accordance with some embodiments of the present disclosure.

FIG. 30 illustrates a method M4 that includes a gate cut process (or referred to as a cut metal gate process) involving the directional deposition and directional etching as discussed previously. FIGS. 31A-37D illustrate various processes at various stages of the method M4 of FIG. 30 in accordance with some embodiments of the present disclosure. Throughout the various views and illustrative embodiments, like reference numbers are used to designate like elements. FIG. 31A illustrates a perspective view, FIG. 31B illustrates a cross-sectional view along X-direction corresponding the line B-B in FIG. 31A, and FIG. 31C illustrates a cross-sectional view along Y-direction corresponding the line C-C in FIG. 31A. In FIGS. 32A-37D, the "A" figures (e.g., FIGS. 32A, 33A, etc.) illustrate a top view, the "B" figures (e.g., FIGS. 32B, 33B, etc.) illustrate a cross-sectional view along X-direction corresponding the lines B-B illustrated in the "A" figures, the "C" figures (e.g., FIGS. 32C, 33C, etc.) illustrate a cross-sectional view along Y-direction corresponding the lines C-C illustrated in the "A" figures, and the "D" figures (e.g., FIGS. 36D and 37D) illustrate a cross-sectional view along Y-direction corresponding the lines D-D illustrated in the "A" figures. It is understood that additional operations can be provided before, during, and after the processes shown by FIGS. 31A-37D, and some of the operations described below can be replaced or eliminated, for additional embodiments of the method. The order of the operations/processes may be interchangeable.

As illustrated in FIGS. 31A-31C, a semiconductor wafer WA4 is substantially similar to the semiconductor wafer WA in many respects, and includes a substrate 402, semiconductor fins 404, STIs 405, gate stacks 406 having gate dielectric layers 4062 and metal layers 4064, gate spacers 408, source/drain regions 410 and an ILD layer 412, each substantially as described above with respect to the substrate 102, semiconductor fins 104, STIs 105, gate stacks 106 having gate dielectric layers 1062 and metal layers 1064, gate spacers 108, source/drain regions 110 and the first ILD layer 112.

In block S401, an ESL 414, a hard mask layer 416 and a tri-layer photoresist mask 418 are formed in sequence over the gate stacks 406 and the first ILD layer 112. In some embodiments, the ESL 414 may include titanium nitride or the like, and may be formed using a deposition process, such as CVD or PVD. In some embodiments, the hard mask layer 416 may include silicon nitride or the like, and may be formed using a deposition process, such as CVD or PVD. The tri-layer photoresist mask 418 includes a bottom layer 4182, a middle layer 4184 and a top layer 4186, respectively similar to the bottom layer 1222, the middle layer 1224 and the top layer 1226 of the tri-layer photoresist mask 122 as discussed previously with respect to FIGS. 3A-3C. Description about the bottom layer 4182, the middle layer 4184 and the top layer 4186 is thus not repeated for the sake of brevity.

Figure 32A:
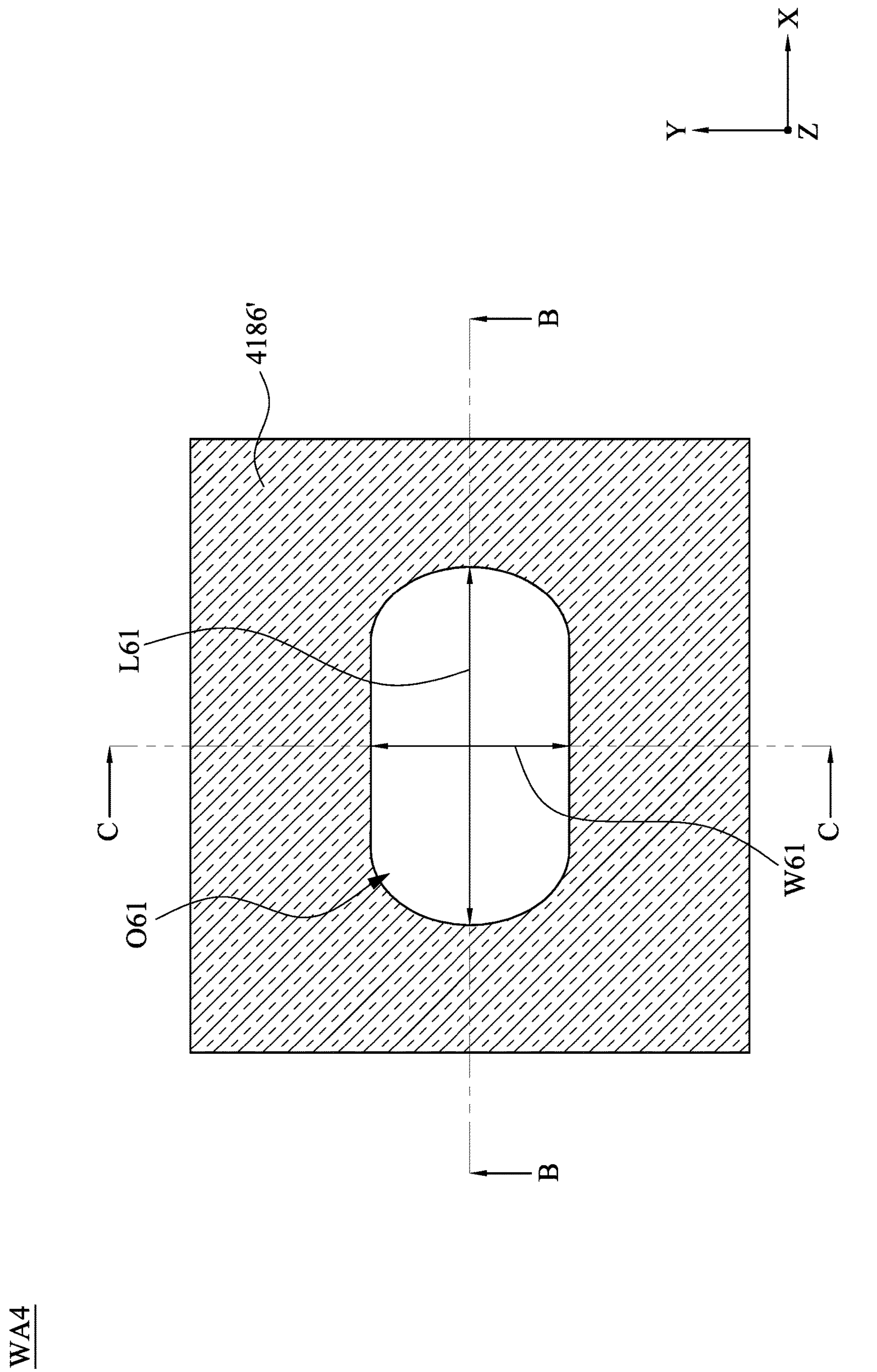
FIGS. 32A, 33A, 34A, 35A, 36A and 37A illustrate a top view of a semiconductor device at various stages of the method of FIG. 30 in accordance with some embodiments of the present disclosure.
Figure 32B:
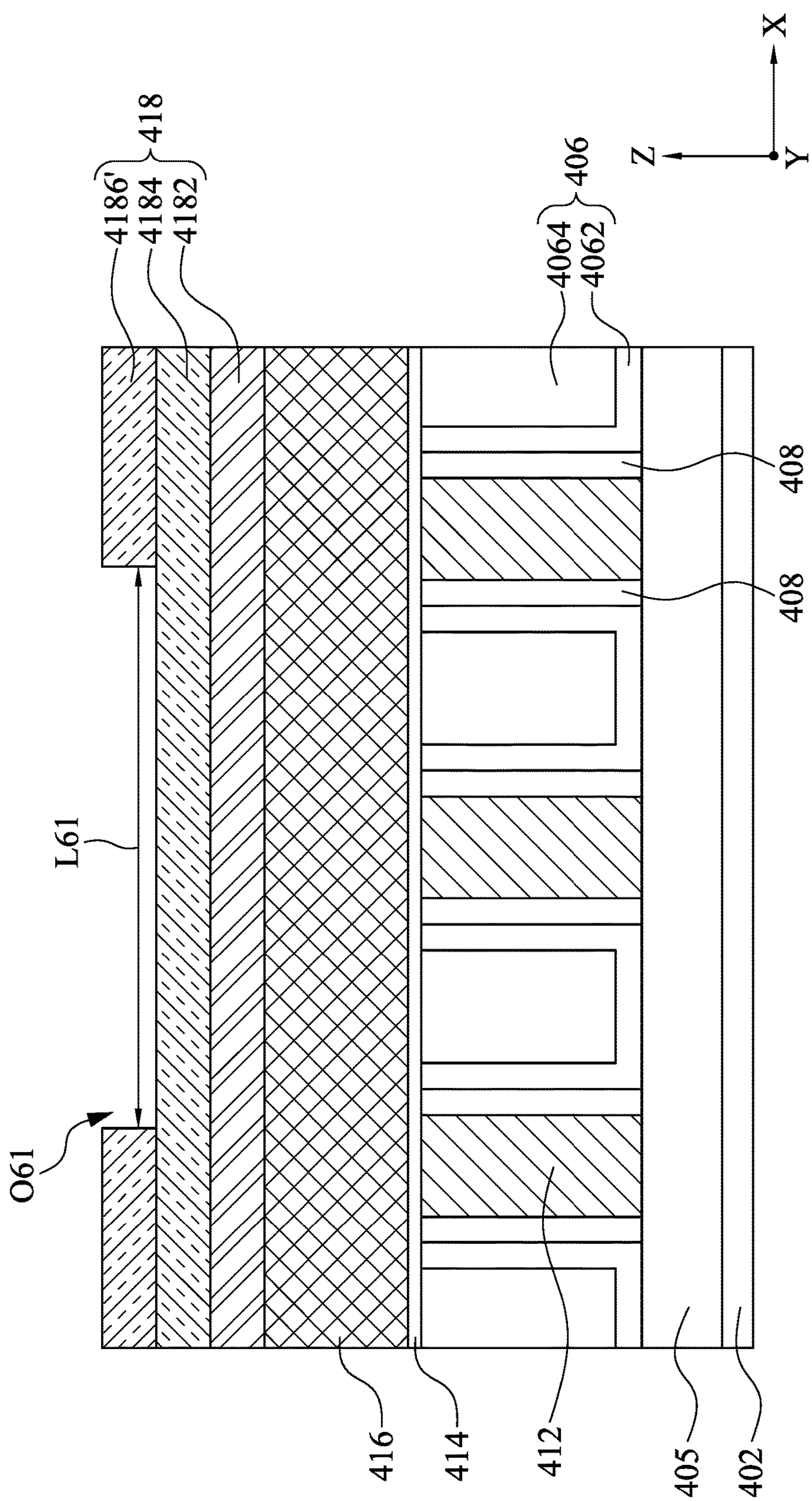
Figure 32C:
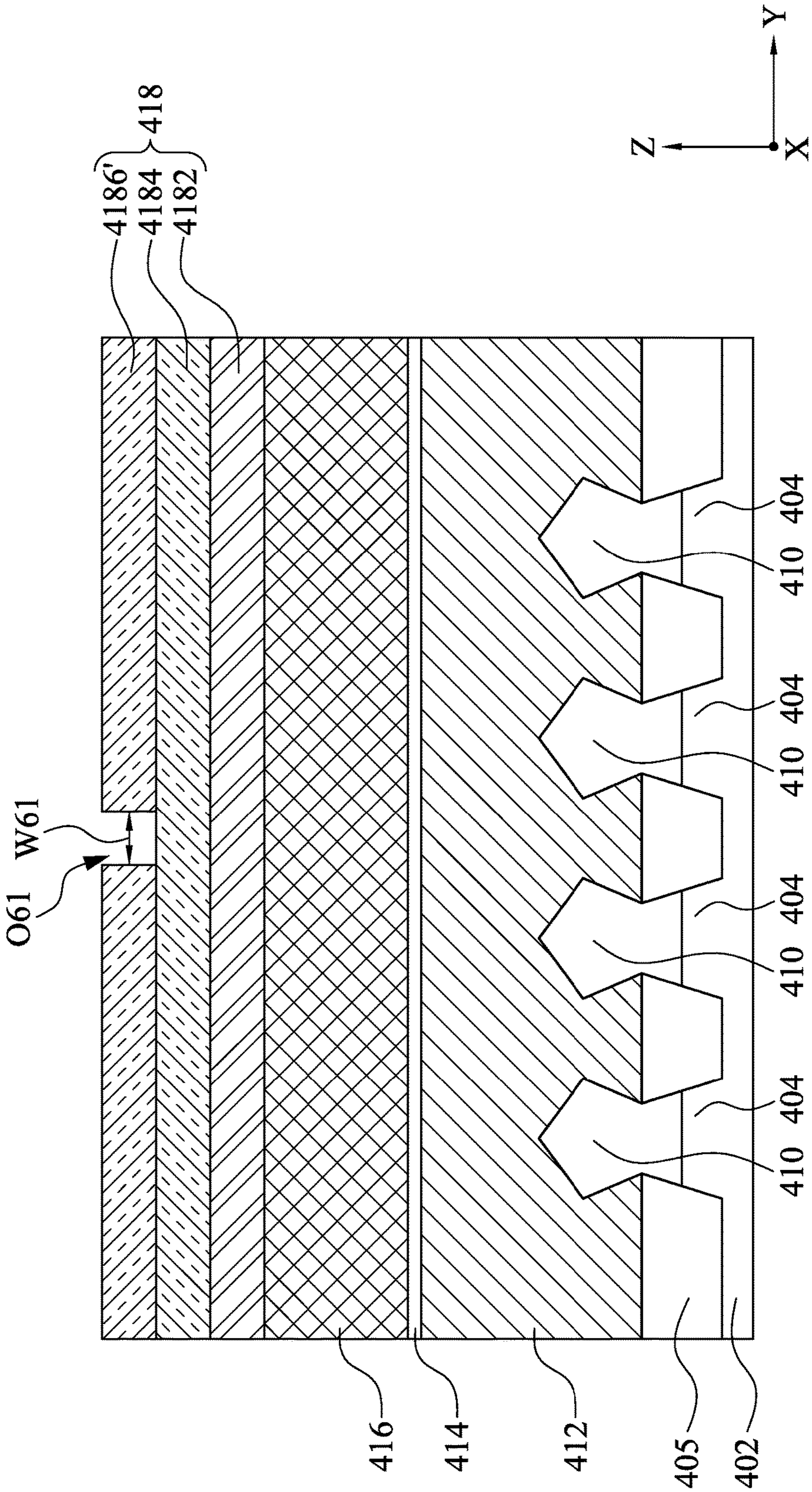

The method M4 then proceeds to block S402 where a first opening is formed in a top layer of the tri-layer photoresist mask and across one or more first gate stacks. With reference to FIGS. 32A-32C, in some embodiments of block S402, a first opening O61 is formed in the patterned top layer 4186' and across gate stacks 406. Formation of the first opening O61 includes irradiating the top layer 4186 and developing the top layer 4186 to remove portions of the top layer 4186, thus resulting in the patterned top layer 4186'. The first opening O61 in the patterned top photoresist layer 4186' is used to define the gate cut pattern (or gate cut opening), which will be described below in greater detail. As illustrated in FIG. 32A, the first opening O61 has a length L61 in X-direction and a width W61 in Y-direction, and the length L61 is greater than the width W61. Therefore, the subsequently formed gate cut pattern will have a length in X-direction greater than a width in Y-direction, which in turn may result in increased number of cut gates while preventing damaging the source/drain regions 410 during the gate cut process, which will be discussed below in greater detail.

Figure 33A:
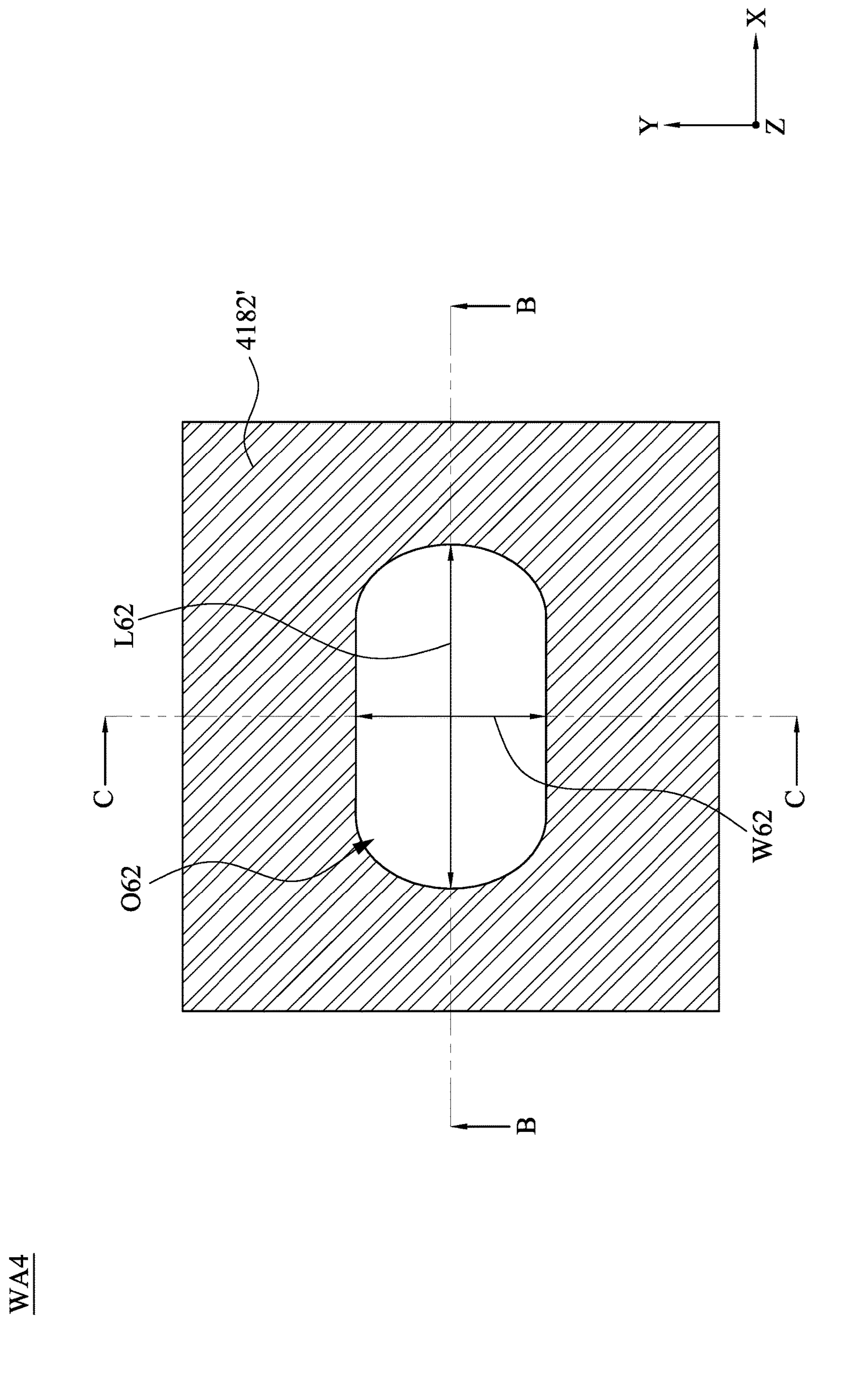
Figure 33B:
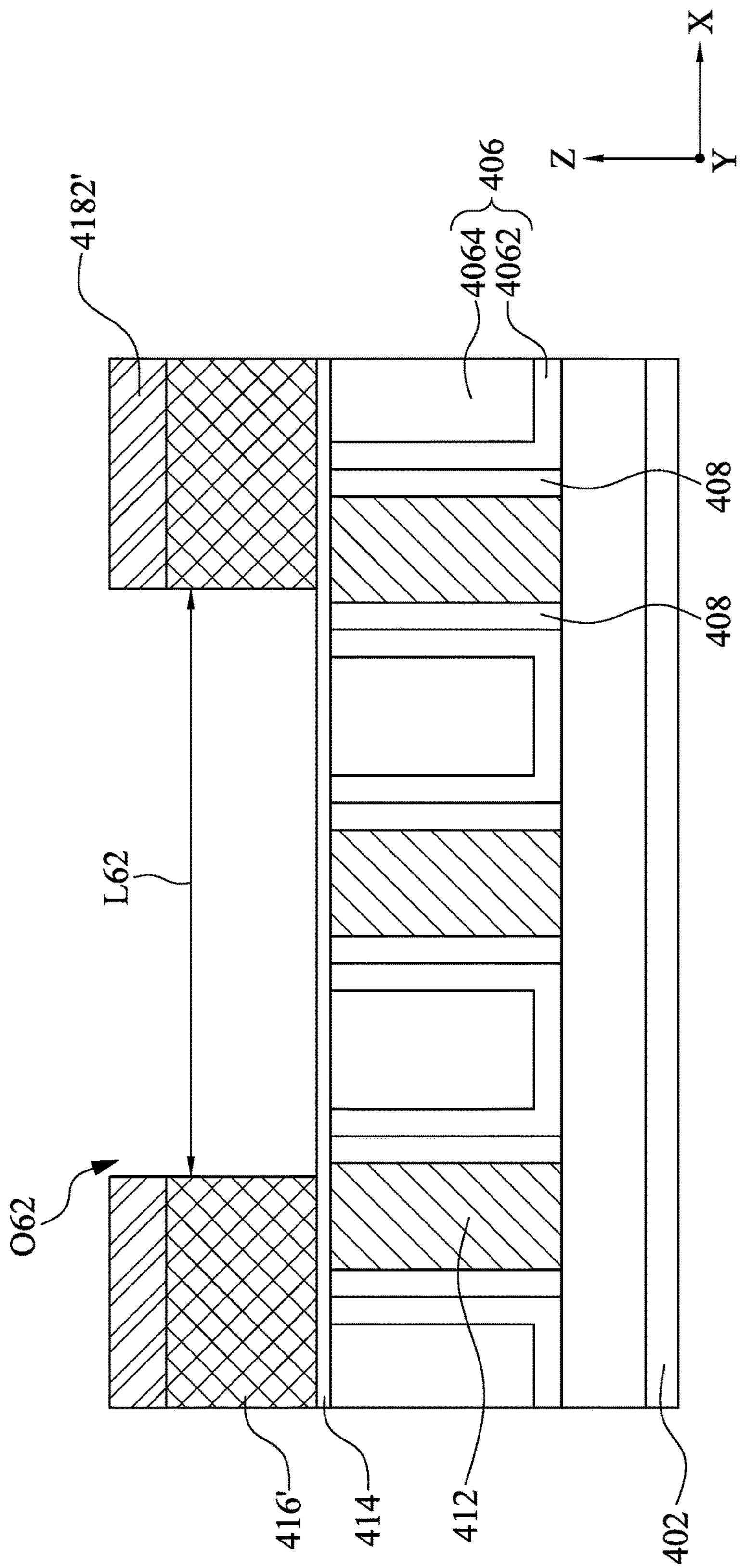
Figure 33C:
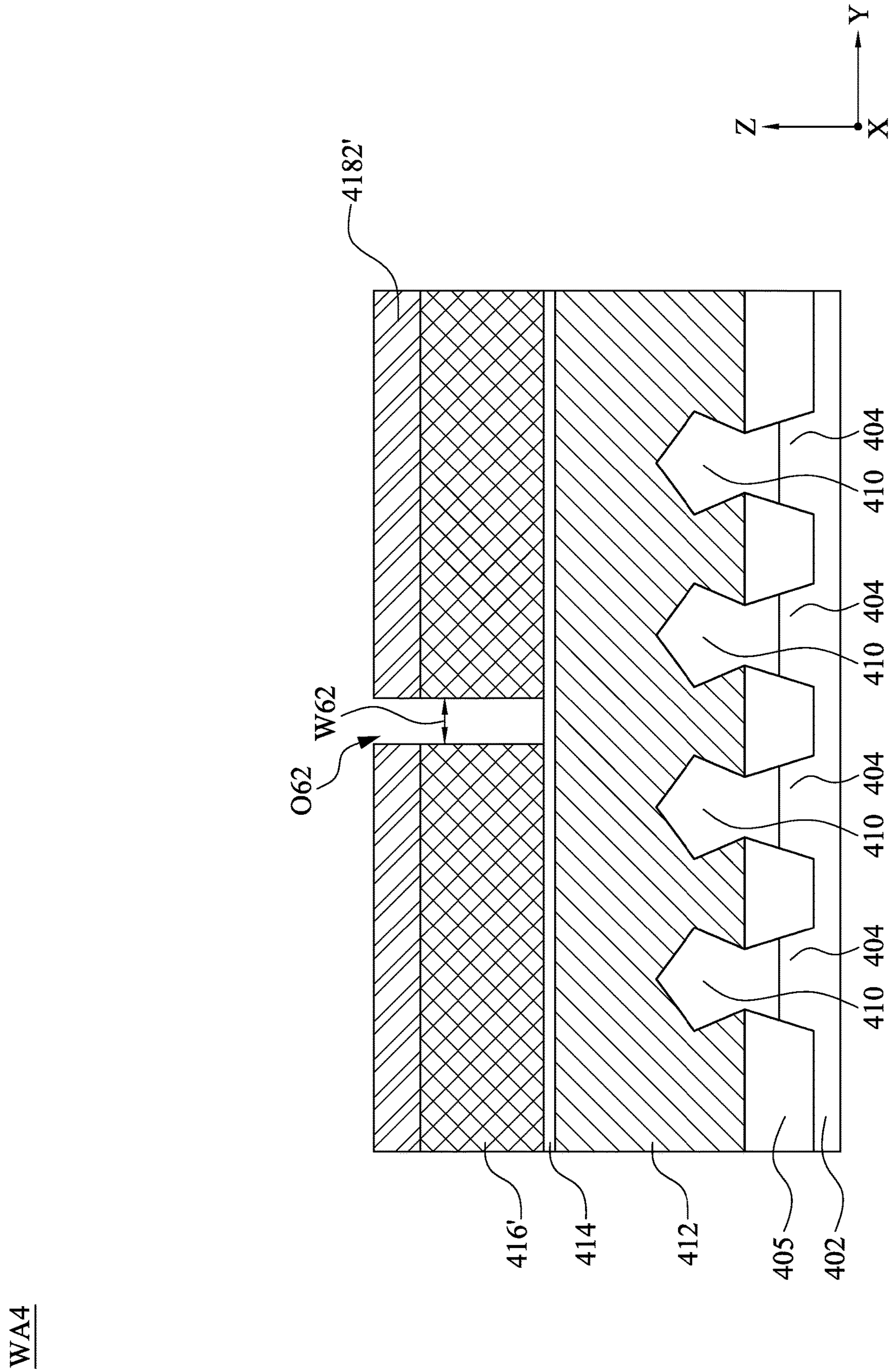

Returning to FIG. 30, the method M4 then proceeds to block S403 where the hard mask layer is patterned using the tri-layer photoresist mask as an etch mask to form a second openings. With reference to FIGS. 33A-33C, in some embodiments of block S403, a patterning process is performed on the hard mask layer 416 to transfer the pattern of the first opening O61 in the patterned top photoresist layer 4186' to the hard mask layer 416, resulting in a second opening O62 in the hard mask layer 416'. In some embodiments, the patterning process comprises one or more etching processes, where the tri-layer photoresist mask 418 is used as an etch mask. The one or more etching processes may include anisotropic wet etching processes, anisotropic dry etching processes, or combinations thereof. During the patterning process, the patterned top layer 4186' and the middle layer 4184 of the photoresist mask 418 may be consumed, and portions of the bottom layer 4182 may remain after the patterning process. In this way, the patterning process also results in a patterned bottom layer 4182' over the patterned hard mask layer 416'.

The patterned bottom layer 4182' and the patterned hard mask layer 416' inherit the pattern in the top photoresist layer 4186'. In this way, the second opening O62 may have substantially the same shape, size and position as the first opening O61 in the patterned top photoresist layer 4186'. For example, second opening O62 has a length L62 in X-direction and a width W62 in Y-direction, and the length L62 is greater than the width W62. The pattern of the second opening O62 across the gate stacks 406 can be used to define the gate cut pattern for dividing the gate stacks 406 in following steps.

Because the gate stacks 406 are arranged in X-direction, the length L62 of the second opening O62 in X-direction is in positive correlation with a number of gate stacks 406 to be cut. Stated differently, the greater the length L62 of the second opening O62, the more the gate stacks 406 to be cut. Therefore, one or more lateral etching processes might be used to elongate the second opening O62 in X-direction. However, if the patterned bottom layer 4182' and hard mask layer 416' undergo the one or more lateral etching processes, the second opening O62 would be inevitably elongated in both X-direction and Y-direction, which in turn would lead to increased width W62 of the second opening O62, which in turn might cause damage to the source/drain regions 410 arranged in Y-direction during the gate cut process. Therefore, in some embodiments of the present disclosure, a directional deposition process having a higher deposition rate in Y-direction than in X-direction is performed on the wafer WA4 (block S404 of the method M4), followed by a direction etching process having a higher etch rate in X-direction than in Y-direction (block S405 of the method M4). In this way, the second opening O62 can be elongated in X-direction but substantially not in Y-direction, as described below in greater detail.

Figure 34A:
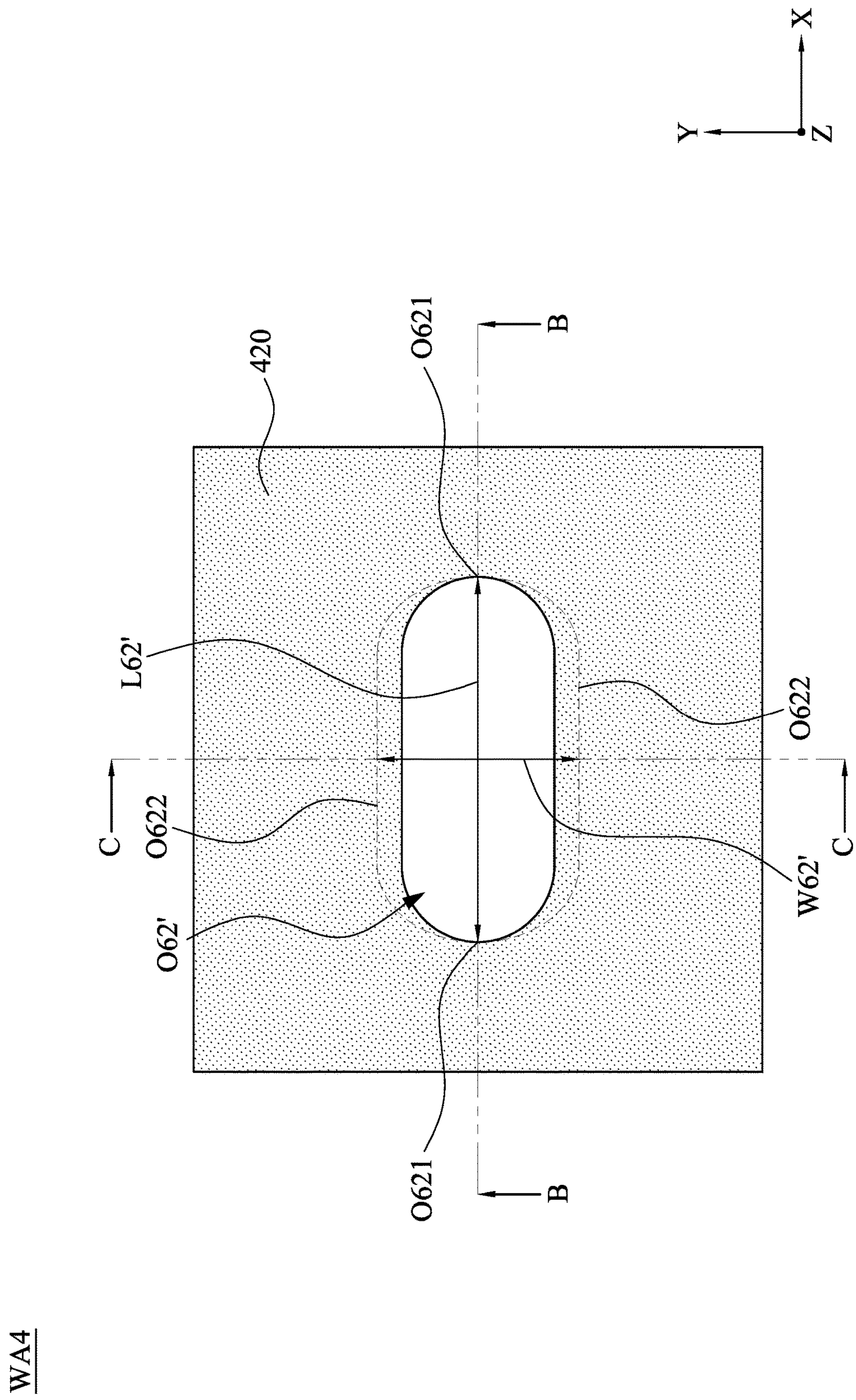
Figure 34B:
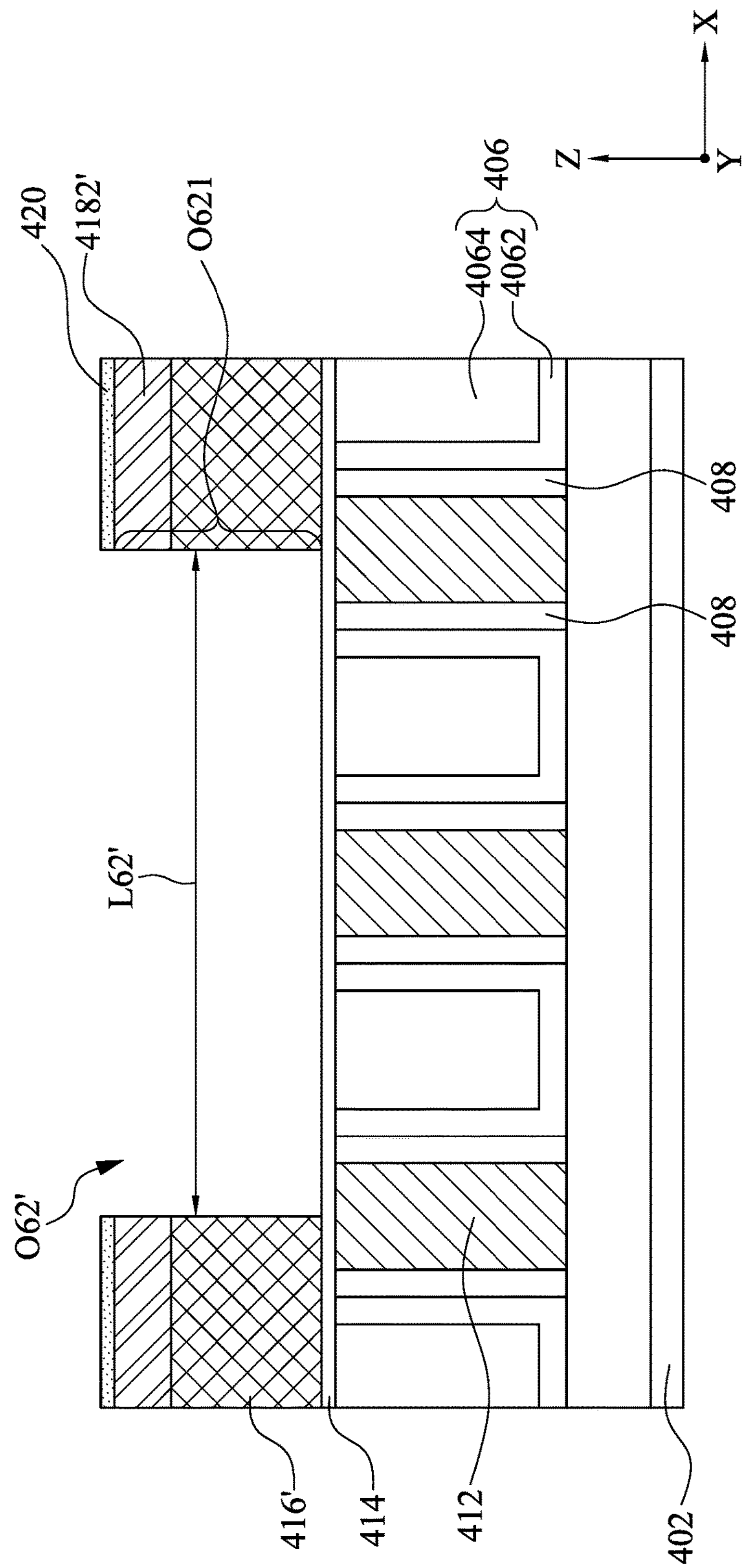
Figure 34C:
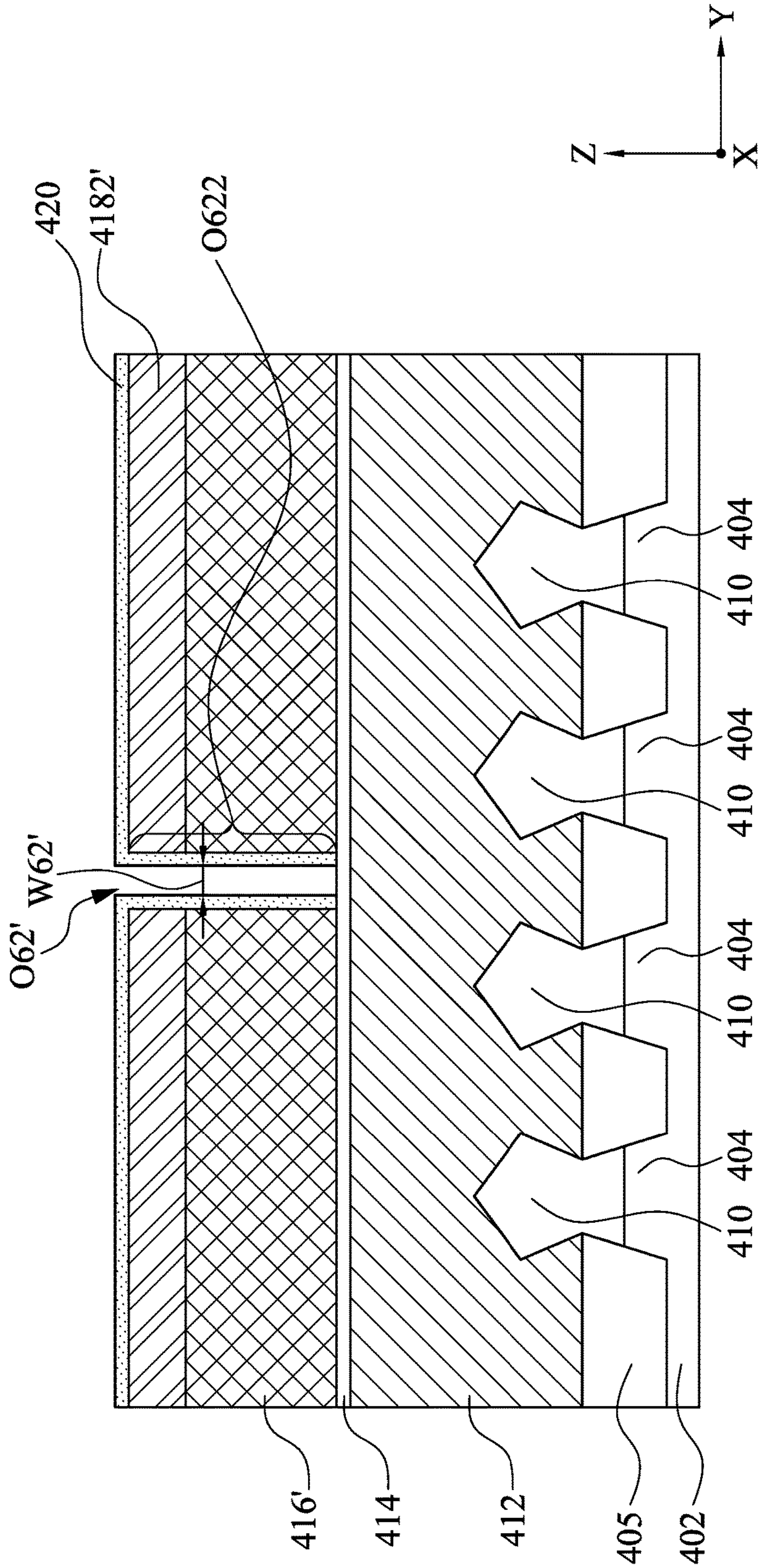

With reference to FIGS. 34A-34C, in some embodiments of block S404, a directional deposition process is performed to form a protective layer 420 on second sidewalls O622 of the second opening O62' that extend in X-direction and substantially not on first sidewalls O621 of the second opening O62' that extend in Y-direction. The directional deposition process is performed using directional ions, thus resulting in a higher deposition rate in Y-direction than in X-direction, so that the X-directional sidewalls O622 can be deposited with more polymers (e.g., carbon-containing polymers, chlorine-containing polymers and/or bromine-containing polymers) than the Y-directional sidewalls O621. In some embodiments, a ratio of the deposition rate in Y-direction to the deposition rate in X-direction is in a range from about 10:1 to about 30:1.

The directional deposition process can be performed using, for example, the plasma tool 900 as illustrated in FIG. 38. In greater detail, the ions 922*a* and 922*b* can be extracted and directed to the wafer WA4. Trajectories of the ions 922*a* and 922*b* can be controlled to extend in X-direction and Z-direction but substantially not in Y-direction in FIG. 38 as discussed previously. Therefore, the wafer WA4 can be orientated such that the ions 922*a* and 922*b* can be directed at second sidewalls O622 while substantially not being directed at the first sidewalls O621. In some embodiments, the process conditions are selected such that polymerization phenomenon resulting from ions is dominant over etching phenomenon resulting from ions, so that the ions 922*a* and 922*b* directed at the second sidewalls O622 but substantially not at first sidewalls O621 can result in deposition of polymers on second sidewalls O622 but substantially not on first sidewalls O621. These deposited polymers can be referred to as a protective layer (or polymer layer) 420. In some embodiments, process conditions of the directional deposition process are similar to those of the directional deposition process as discussed previously with respect to FIGS. 6A-6C, and are not repeated for the sake of brevity.

As a result of the directional deposition, the length L62' of the second opening O62' in X-direction remains substantially the same as the length L62 of the second opening O62 (as shown in FIG. 33A), and the width W62' of the second opening O62' in Y-direction is less than the width W62 of the second opening O62. The difference between the width W62' of the second opening O62' after directional deposition and the width W62 of the second opening O62 before directional deposition is substantially twice the thickness of the protective layer 420. In some embodiments, the directional deposition results in deposition of polymers over a top surface of the patterned bottom layer 4182', so that the protective layer 420 extends over the top surface of the patterned bottom layer 4182'. In some embodiments, the ESL 414 at a bottom of the second opening O62' may be free from coverage by the protective layer 420 (i.e., polymers) due to the shadowing effect resulting from the directional ions.

Figure 35A:
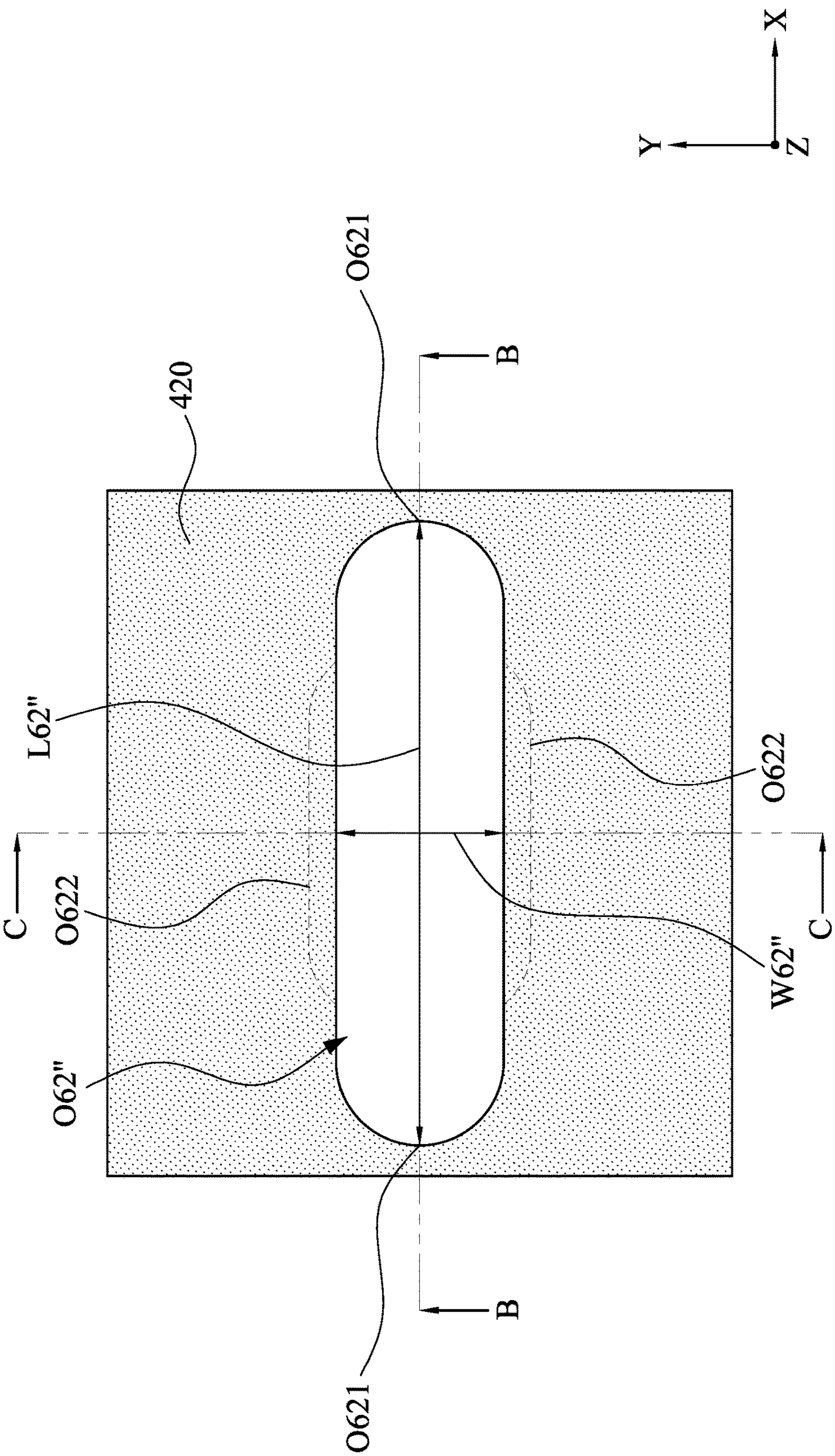
Figure 35B:
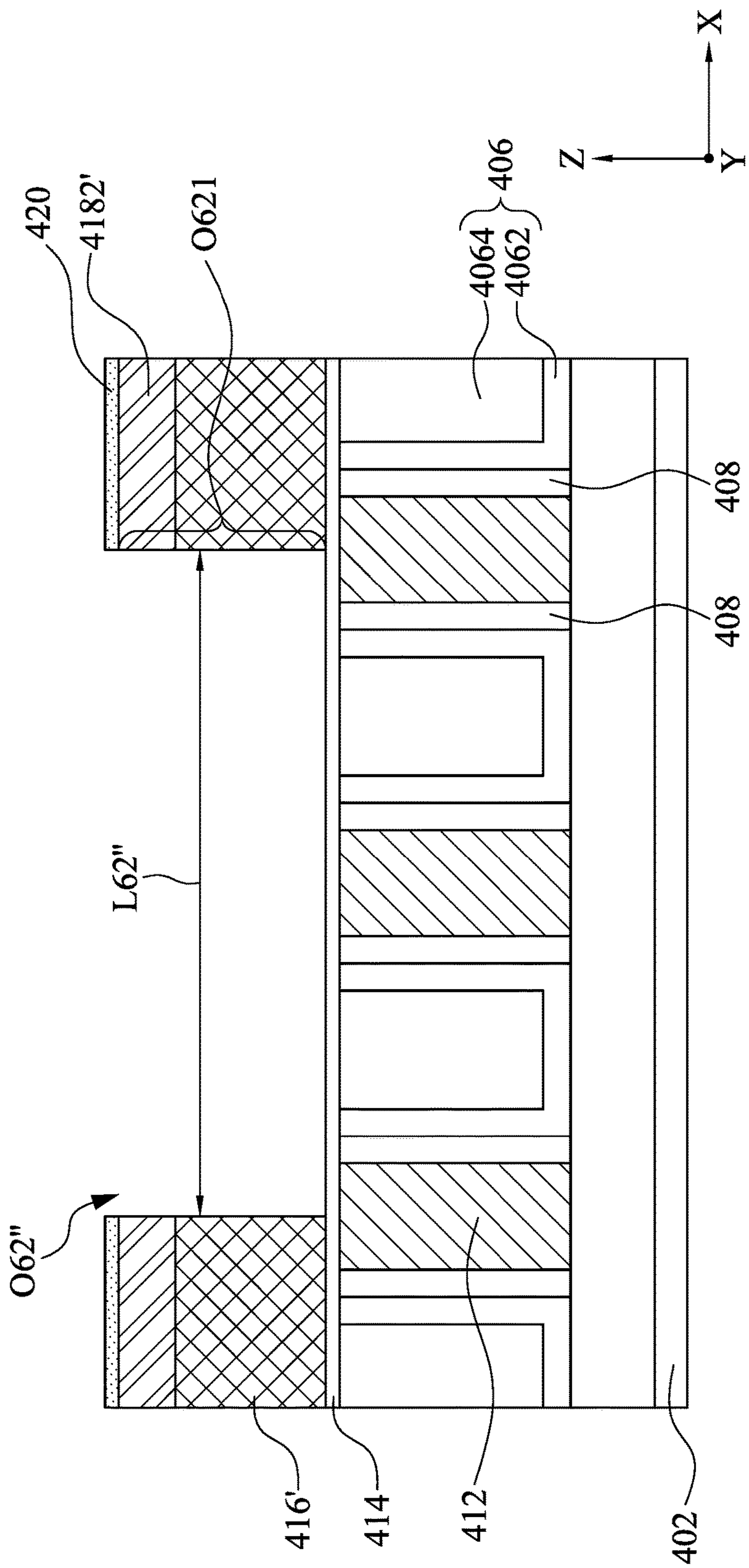
Figure 35C:
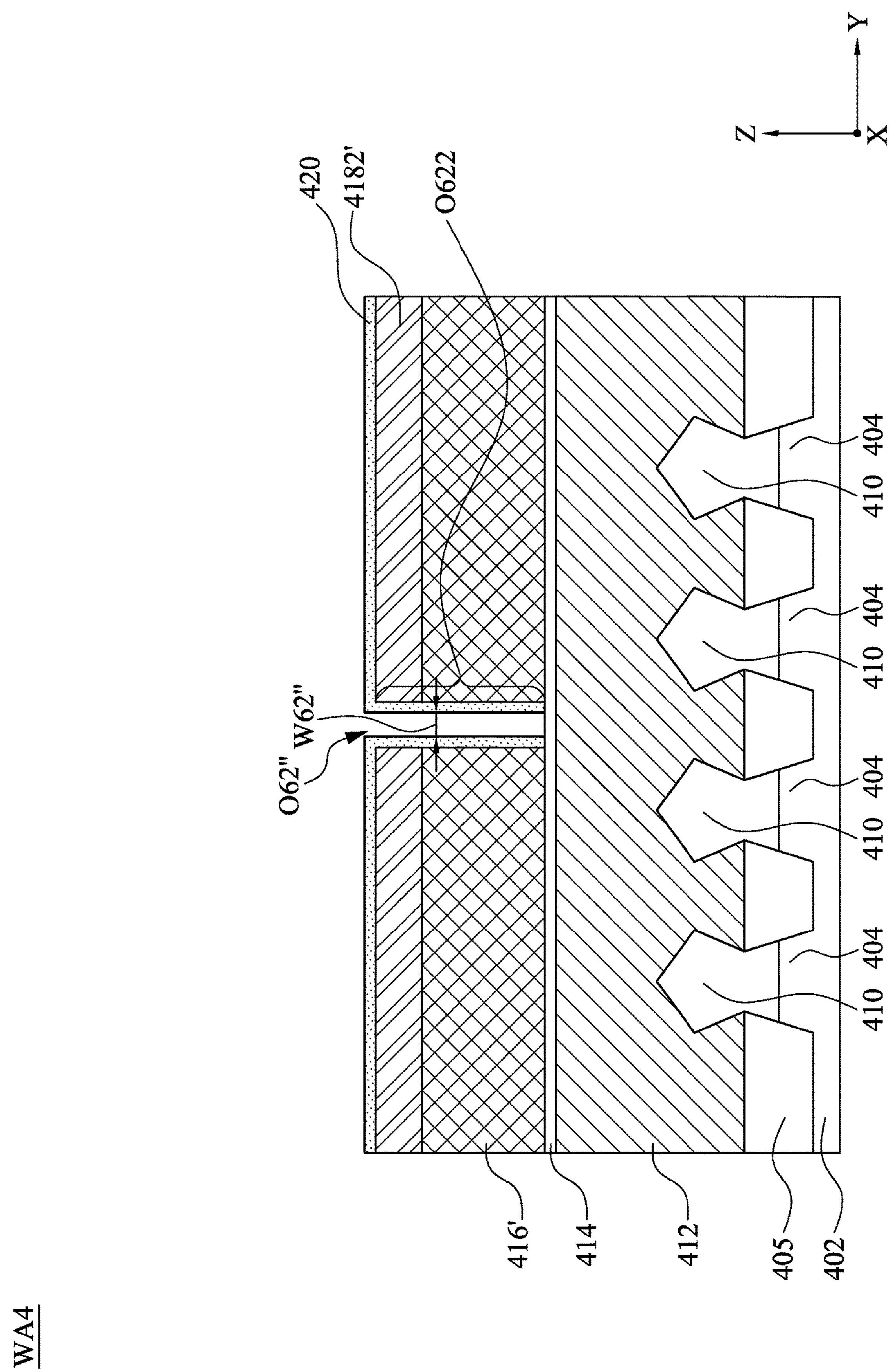

Returning to FIG. 30, the method M2 then proceeds to block S405 where first sidewalls of the second opening are etched to elongate the second opening. In some embodiments of block S405, a directional etching process is performed on the first sidewalls O621 of the second opening O62', thus resulting in elongated opening O62" as shown in FIGS. 35A-35C. The directional etching process is performed using directional ions. For example, the directional etching process can be performed using the plasma tool 900 as illustrated in FIG. 38, as described below in detail.

After performing the direction deposition process on the wafer WA4 in the plasma tool 900, the wafer WA4 can be rotated about the Z-directional shaft 929 by about 88-92 degrees (e.g., about 90 degrees). Thereafter, the ions 922*a* and 922*b* can be extracted and directed at the first sidewalls O621 of the second opening O62' while substantially not being directed at the protective layer 420 alongside the second sidewall O622 of the second opening O62'. In some embodiments, the process conditions are selected such that etching phenomenon resulting from ions is dominant over polymerization phenomenon resulting from ions. As a result, the ions 922*a* and 922*b* can result in etching first sidewalls O621 but substantially not etching the protective layer 420 alongside the second sidewalls O622. For example, a ratio of an etch rate of etching the first sidewalls O621 to an etch rate of etching the protective layer 420 alongside the second sidewalls O622 is in a range from about 10:1 to about 30:1. In this way, the directional etching process can elongate the second openings O62' by etching the first sidewalls O621 but substantially not etching the second sidewalls O622, thus resulting in elongated openings O62" as illustrated in FIGS. 35A-35C. In some embodiments, process conditions of the directional etching process are similar to those of the directional etching process as discussed previously with respect to FIGS. 7A-7C, and are not repeated for the sake of brevity.

As a result of the directional etching, the length L62" of the elongated opening O62" is greater than the length L62' of the second opening O62' (as shown in FIG. 34A), and the W62" of the elongated opening O62" remains substantially the same as the width W62' of the second opening O62'. Because the elongated opening O62" has an increased length in X-direction, the number of gate stacks 406 that will undergo a gate cut process can be increased. Moreover, because the elongation process does not increase the width of the opening O62" in Y-direction, damage to the source/drain regions 410 caused by the gate cut process can be prevented. An example ratio of the resultant length L62" to the resultant width W62" is in a range from about 2.7:1 to about 4.6:1. In some embodiments, the directional etching process of block S405 may be in-situ performed with the directional deposition process of block S404, which in turn will prevent contamination on the wafer WA4.

Returning to FIG. 30, the method M2 then proceeds to block S406 where the ESL and the one or more first gate stacks are etched using the hard mask layer as an etch mask to form break the one or more first gate stacks into second gate stacks. With reference to FIGS. 36A-36D, in some embodiments of block S406, one or more etching processes are performed on the wafer WA4 using a combination of the protective layer 420, the patterned bottom layer 4182' and the patterned hard mask layer 416' as an etch mask, resulting in a cut opening O63 that divides one or more long gate stacks 406 into short gate stacks 406' each including a gate dielectric layer 4062' and a gate metal layer 4064' over the gate dielectric layer 4062'. Therefore, the one or more etching processes can be referred to as a gate cut process. The one or more etching processes may include anisotropic wet etching processes, anisotropic dry etching processes, or combinations thereof. During the patterning process, the patterned bottom layer 4182' may be consumed. In some embodiments, residues of the patterned bottom layer 4182' may be removed using suitable etchants.

Figure 36A:
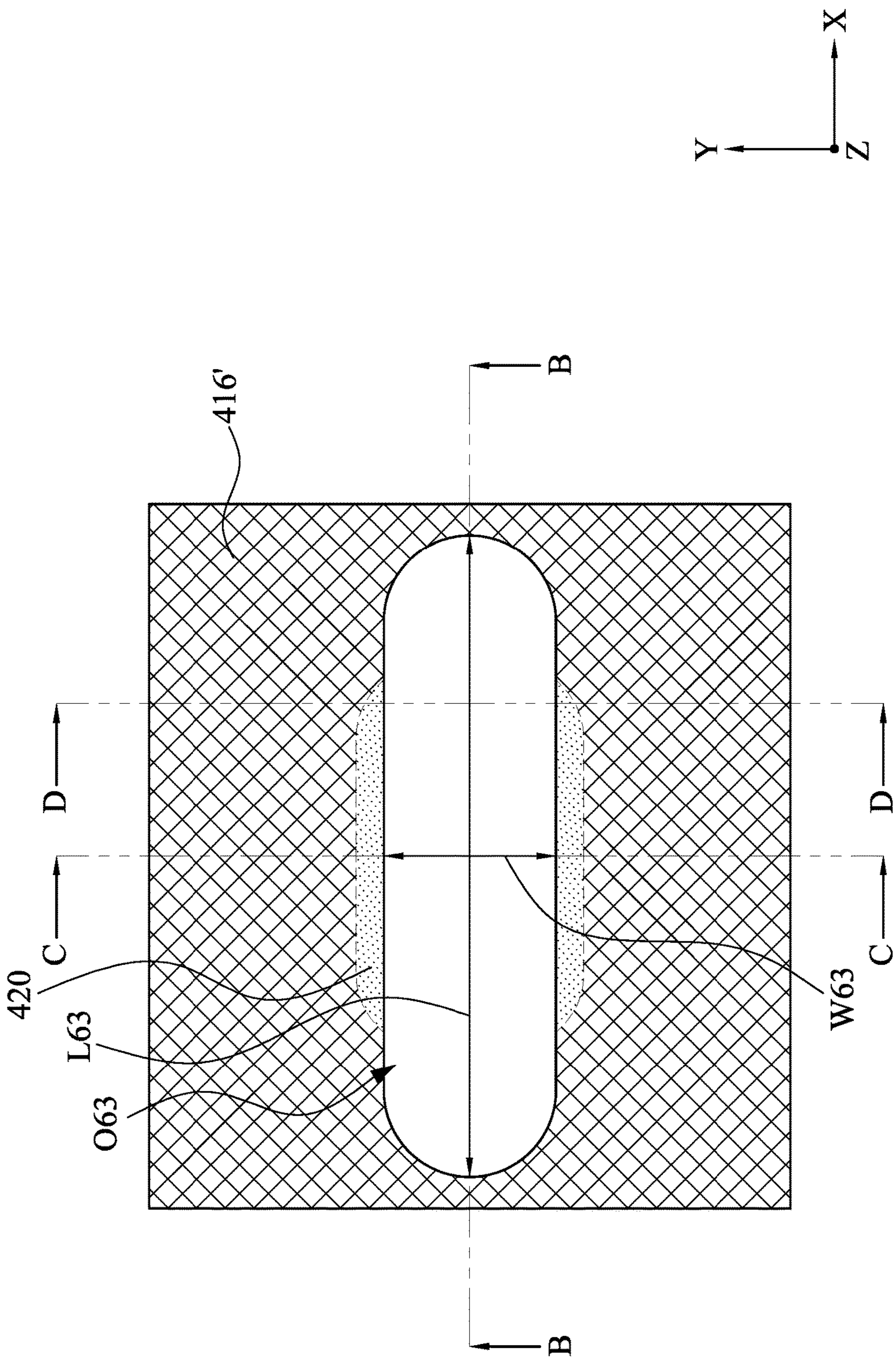
Figure 36B:
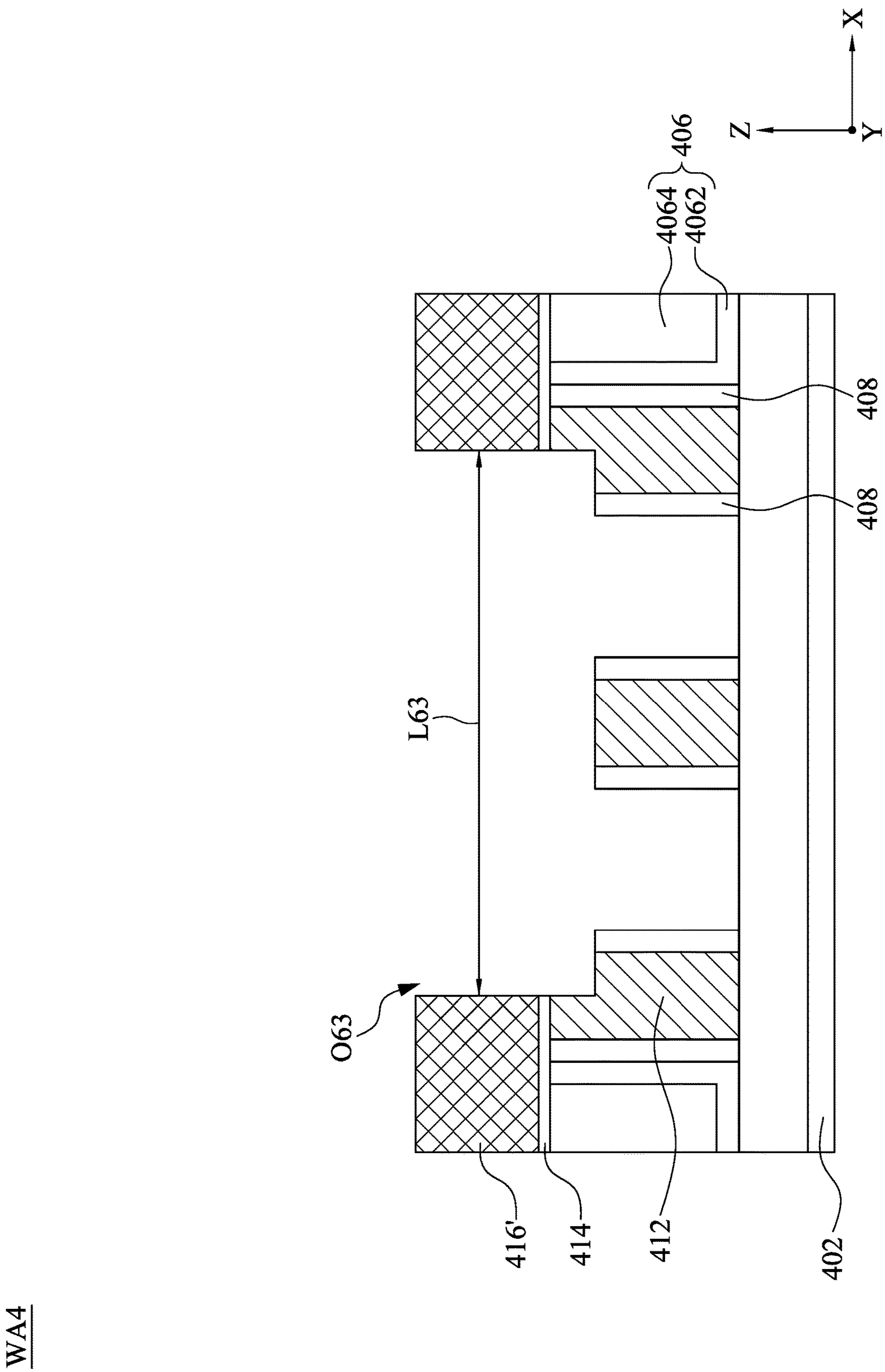
Figure 36C:
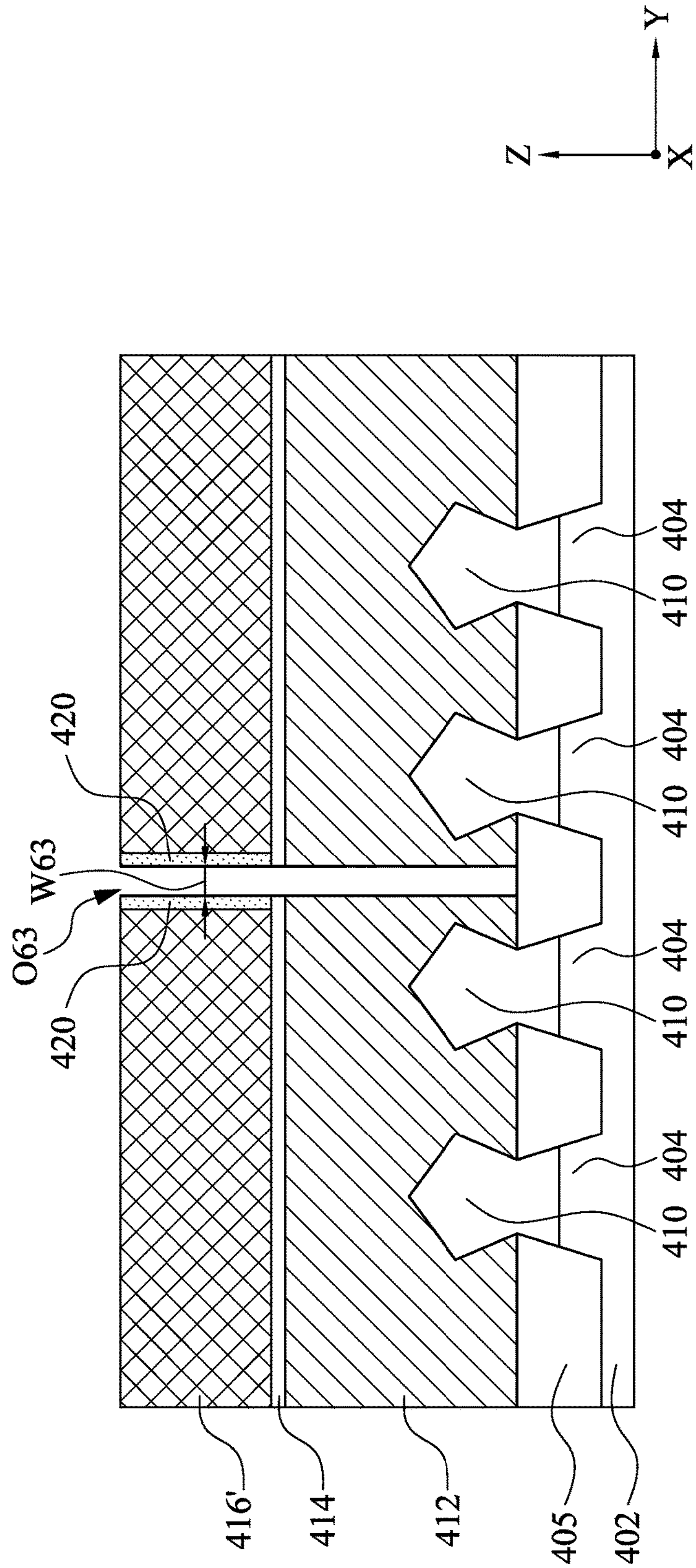
Figure 36D:
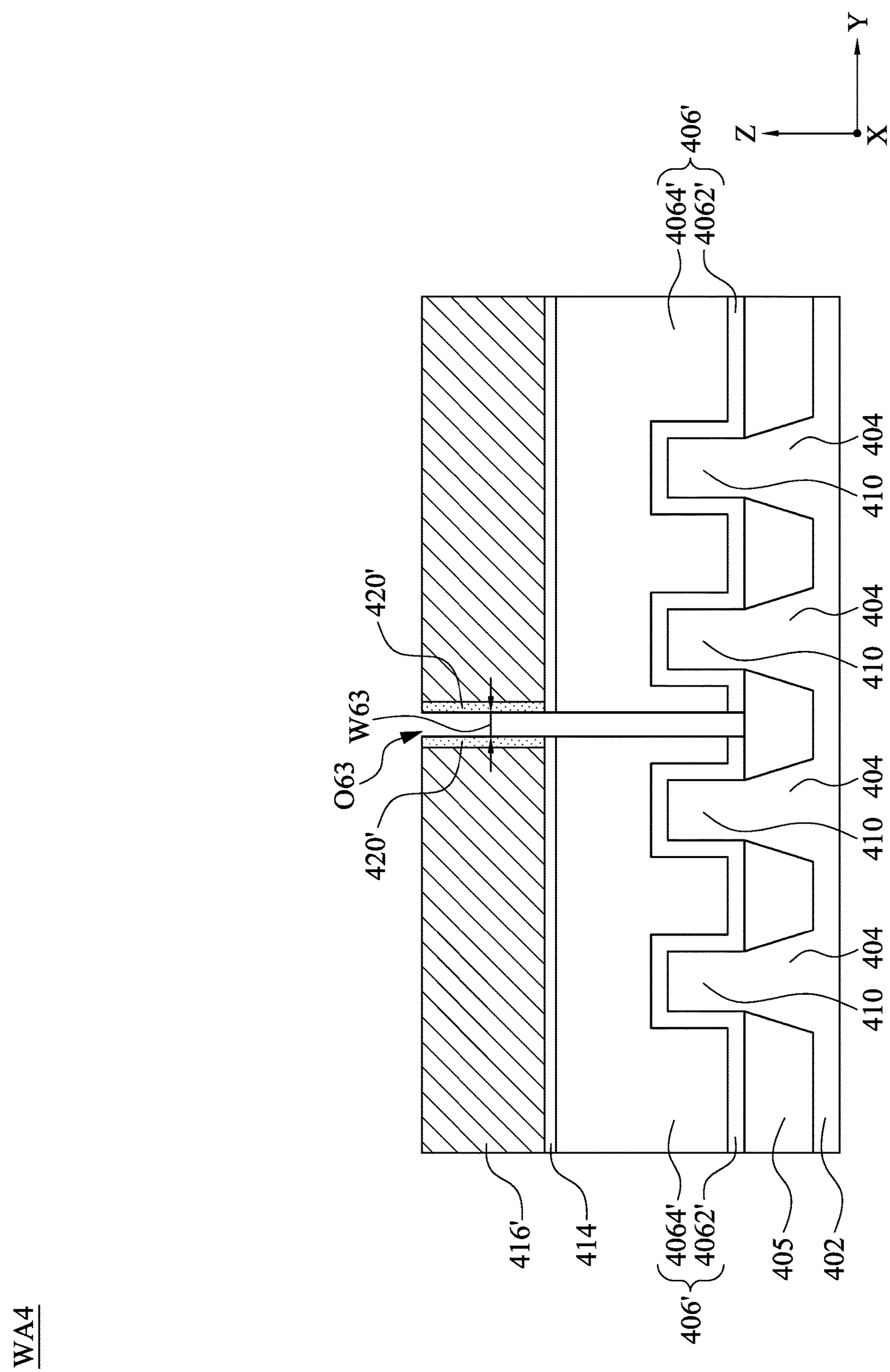
FIGS. 36D and 37D illustrate another cross-sectional view of a semiconductor device at various stages of the method of FIG. 30 in accordance with some embodiments of the present disclosure.
Figure 37A:
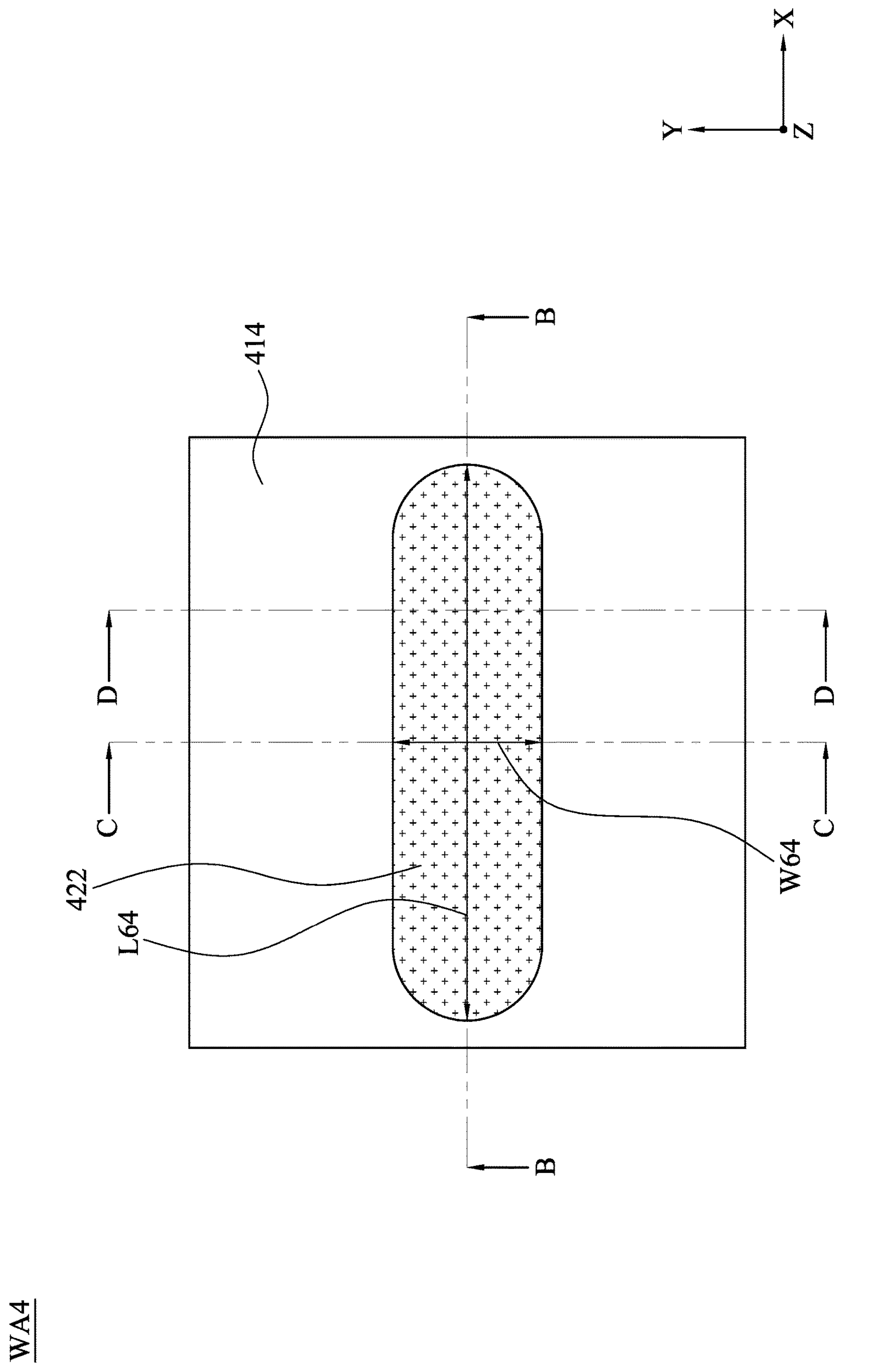
Figure 37B:
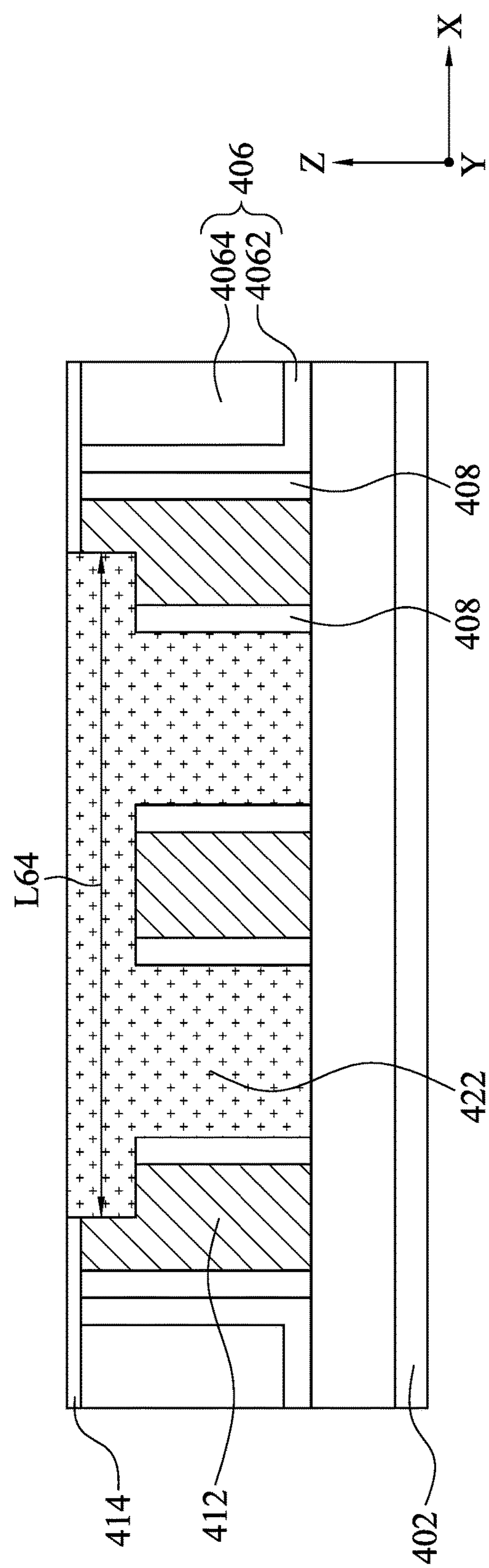
Figure 37C:
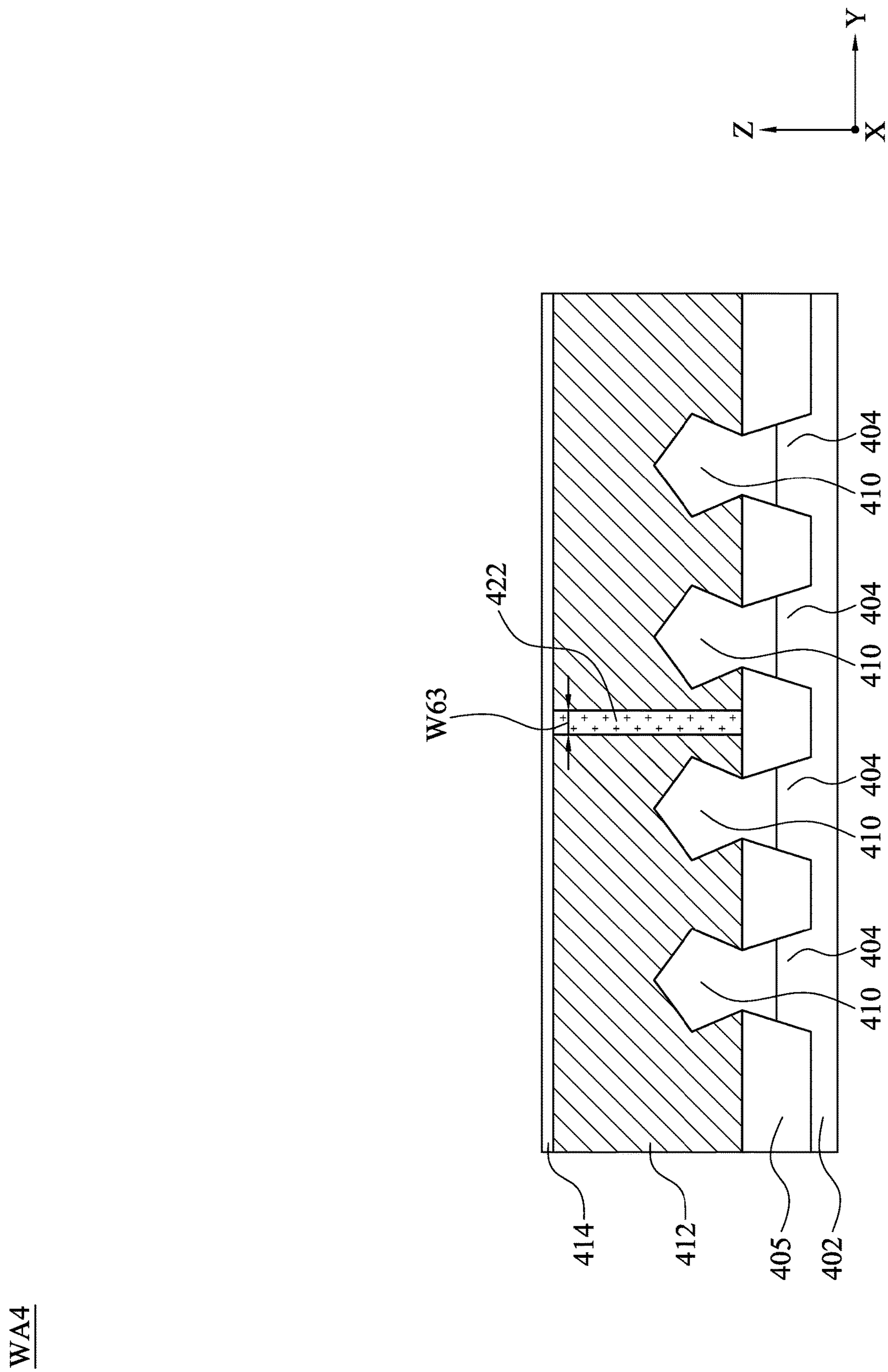
Figure 37D:
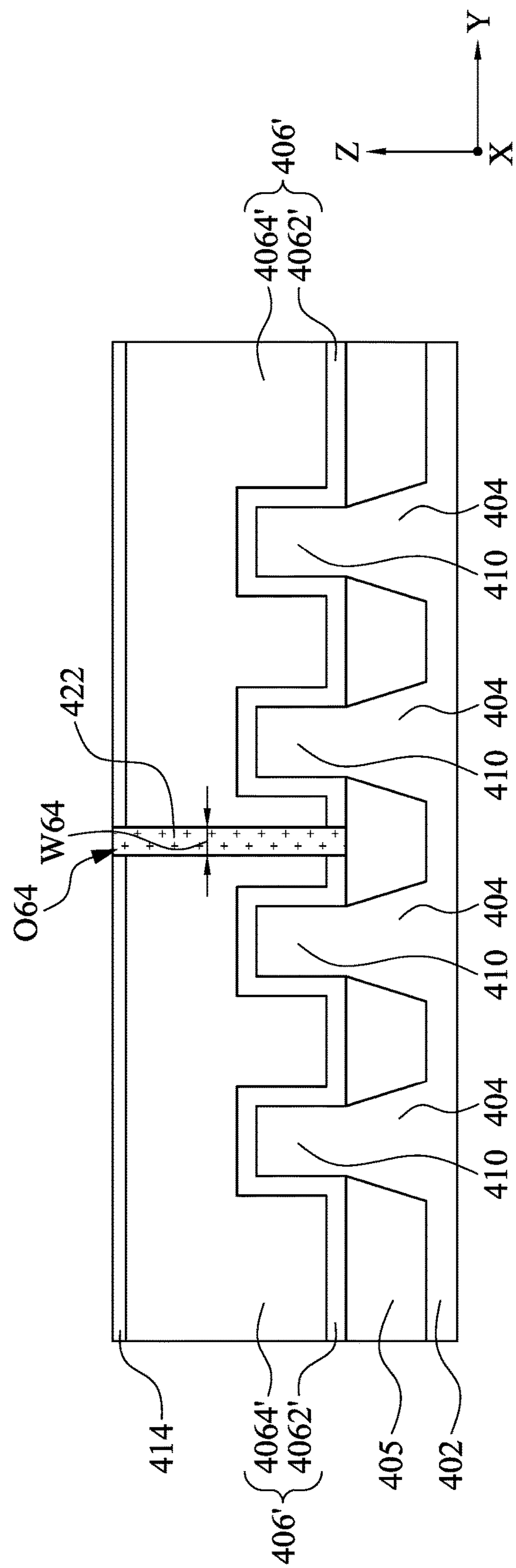

As a result of the patterning process, the cut opening O63 inherits the pattern of the elongated opening O62" (as shown in FIGS. 35A-35C). In greater detail, the length L63 of the cut opening O63 is substantially the same as the length L62" of the elongated opening O62", and the width W63 of the cut opening O63 is substantially the same as the width W62" of the elongated opening O62". As shown in FIG. 36C, the width W63 of the cut opening O63 is controlled such that the source/drain regions 410 arranged on opposite sides of the cut opening O63 along X-direction will not be exposed by the gate contact opening O23. This is advantageous for preventing damaging the source/drain regions 410 resulting from the etchants used in the patterning process.

Thereafter, in some embodiments of block S407 of the method M4 (as shown in FIG. 30), a dielectric structure 422 is deposited to overfill the cut opening O63, followed by a CMP process to remove excess materials of the dielectric structure 422 until reaching, for example, the ESL 414. The resulting structure is shown in FIGS. 37A-37D. The dielectric structure 422 may include suitable dielectric materials, such as silicon oxide, silicon nitride, silicon oxynitride, low-k dielectrics such as carbon doped oxides, extremely low-k dielectrics such as porous carbon doped silicon dioxide, combinations of these, or the like. In some embodiments, the ESL 414 may be removed by the CMP process as well.

The dielectric structure 422 inherits the pattern of the cut opening O63 (as shown in FIGS. 36A-36D), so that the dielectric structure 422 can separate and thus electrically isolate the adjacent short gate stacks 406'. Moreover, the length L64 of the dielectric structure 422 is substantially the same as the length L63 of the cut opening O63, and the width W64 of the dielectric structure 422 is substantially the same as the width W63 of the cut opening O63. The width W64 of the dielectric structure 422 is controlled such that the dielectric structure 422 is between and separated from the source/drain regions 410.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that a width of an opening can remain substantially unchanged when the opening undergoes an etching process to elongate the opening, because a directional deposition process is performed to cover first sidewalls of the opening but expose second sidewalls of the opening. Another advantage is that the directional deposition process and directional etching process for forming the elongated pattern can be performed using the same tool (e.g., the same plasma tool), thus preventing contamination on the wafer.

In some embodiments, a method includes forming a semiconductor fin on a substrate and extending in a first direction. A source/drain region is formed on the semiconductor fin and a first interlayer dielectric (ILD) layer over the source/drain region. A gate stack is formed across the semiconductor fin and extends in a second direction substantially perpendicular to the first direction. A patterned mask having a first opening is formed over the first ILD layer. A protective layer is formed in the first opening using a deposition process having a faster deposition rate in the first direction than in the second direction. After forming the protective layer, the first opening is elongated in the second direction. A second opening is formed in the first ILD layer and under the elongated first opening. A conductive material is formed in the second opening.

In some embodiments, a method includes forming a fin protruding above a substrate and extending in a first direction. A first gate stack is formed across the fin and extends in a second direction substantially perpendicular to the first direction. A patterned mask having an opening is formed over the first gate structure. A protective layer is formed in the opening in the patterned mask using a deposition process having a faster deposition rate in the second direction than in the first direction. The opening is elongated in the first direction after forming the protective layer. The first gate stack under the elongated opening is etched to break the first gate stack into a plurality of second gate stacks. A dielectric structure is formed between the second gate structures.

In some embodiments, a semiconductor device includes a semiconductor substrate, a source/drain region, a source/drain contact, a conductive via and a first polymer layer. The source/drain region is in the semiconductor substrate. The source/drain contact is over the source/drain region. The source/drain via is over the source/drain contact. The first polymer layer extends along a first sidewall of the conductive via and is separated from a second sidewall of the conductive via substantially perpendicular to the first sidewall of the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a semiconductor fin on a substrate and extending in a first direction;

forming a source/drain region on the semiconductor fin and a first interlayer dielectric (ILD) layer over the source/drain region;

forming a gate stack across the semiconductor fin and extending in a second direction substantially perpendicular to the first direction;

forming a patterned mask having a first opening over the first ILD layer;

forming a protective layer in the first opening using a deposition process having a faster deposition rate in the first direction than in the second direction;

after forming the protective layer, elongating the first opening in the second direction;

forming a second opening in the first ILD layer and under the elongated first opening; and forming a conductive material in the second opening.

2. The method of claim 1, wherein elongating the first opening comprises an etching process, and the etching process has a faster etch rate in the second direction than in the first direction.

3. The method of claim 1, wherein the protective layer is made of a polymer.

4. The method of claim 1, wherein forming the protective layer and elongating the first opening are performed in a same plasma tool.

5. The method of claim 4, further comprising:

rotating the substrate in the plasma tool after forming the protective layer and prior to elongating the first opening.

6. The method of claim 1, further comprising:

forming an etch stop layer to cover the first ILD layer prior to forming the patterned mask.

7. The method of claim 6, wherein the first ILD layer remains covered by the etch stop layer after elongating the first opening.

8. The method of claim 1, wherein forming the second opening in the first ILD layer is performed such that the source/drain region is exposed by the second opening.

9. The method of claim 1, wherein forming the second opening in the first ILD layer is performed such that the gate stack is exposed by the second opening.

10. The method of claim 1, further comprising:
forming a second ILD layer over the source/drain region prior to forming the first ILD layer; and
forming a source/drain contact in the second ILD layer prior to forming the first ILD layer, wherein forming the second opening in the first ILD layer is performed such that the source/drain contact is exposed.

11. A method, comprising:
forming a fin protruding from a substrate and extending in a first direction;
forming a first gate stack across the fin and extending in a second direction substantially perpendicular to the first direction;
forming a patterned mask having an opening over the first gate stack;
forming a protective layer in the opening in the patterned mask using a deposition process having a faster deposition rate in the second direction than in the first direction;
elongating the opening in the first direction after forming the protective layer;
etching the first gate stack under the elongated opening to break the first gate stack into a plurality of second gate stacks; and
forming a dielectric structure between the second gate stacks.

12. The method of claim 11, wherein elongating the opening in the patterned mask comprises an etching process, and the etching process has a faster etch rate in the first direction than in the second direction.

13. The method of claim 11, further comprising:
forming an etch stop layer to cover the first gate stack prior to forming the patterned mask.

14. The method of claim 13, wherein the first gate stack remains covered by the etch stop layer after elongating the opening.

15. The method of claim 11, wherein forming the protective layer and elongating the opening are performed using ions.

16. The method of claim 11, further comprising:
rotating the substrate between forming the protective layer and elongating the opening.

17. A method, comprising:
forming a fin structure extending along a first direction, source/drain regions on the fin structure, and a first interlayer dielectric (ILD) layer over the source/drain regions;
forming a gate stack extending along a second direction, with the source/drain regions on opposite sides of the gate stack;
forming a second ILD layer over the gate stack and source/drain contacts extending through both the first and second ILD layers to the source/drain regions;
forming a third ILD layer over the source/drain contacts and having a first opening;
elongating the first opening along the second direction by a first directional etching process;
after elongating the first opening, etching the second ILD layer, by using the third ILD layer as an etch mask, to form a gate contact opening that exposes the gate stack; and
forming a gate contact in the gate contact opening.

18. The method of claim 17, further comprising:
prior to elongating the first opening, depositing a protective layer in the first opening by using a directional deposition process having a faster deposition rate in the first direction than in the second direction.

19. The method of claim 17, further comprising:
forming a patterned mask layer to fill the gate contact opening prior to forming the gate contact;
with the patterned mask layer in place, etching a second opening in the third ILD layer;
elongating the second opening along the second direction by a second directional process;
after elongating the second opening, etching an etch stop layer between the second and third ILD layers, by using the third ILD layer as an etch mask, to form a source/drain via opening that exposes one of the source/drain contacts; and
forming a source/drain via in the source/drain via opening.

20. The method of claim 19, further comprising:
removing the patterned mask layer from the gate contact opening prior to forming the source/drain via, wherein the source/drain via is formed simultaneously with the gate contact.

* * * * *